United States Patent [19]

Azegami et al.

[11] Patent Number: 5,442,246
[45] Date of Patent: Aug. 15, 1995

[54] PROGRAMMABLE LOGIC CIRCUIT

[75] Inventors: Kengo Azegami; Koichi Yamashita, both of Kawasaki, Japan

[73] Assignee: Fujitsu Limited, Kawasaki, Japan

[21] Appl. No.: 128,223

[22] Filed: Sep. 29, 1993

[30] Foreign Application Priority Data

Sep. 29, 1992 [JP] Japan .................................. 4-260367
Aug. 30, 1993 [JP] Japan .................................. 5-214567

[51] Int. Cl.⁶ ........................................ H03K 19/177
[52] U.S. Cl. ........................................ 326/38; 326/41
[58] Field of Search ............... 307/443, 465, 465.1, 307/202.1, 482.1

[56] References Cited

U.S. PATENT DOCUMENTS

| | | | |
|---|---|---|---|
| 5,055,218 | 10/1991 | Galbraith et al. | 307/465 |
| 5,075,576 | 12/1991 | Cavlar | 307/443 X |
| 5,122,685 | 6/1992 | Chan et al. | 307/465 X |
| 5,126,599 | 6/1992 | Gobbi et al. | 307/465 |
| 5,140,193 | 8/1992 | Freeman et al. | 307/465 |
| 5,240,556 | 4/1993 | Shankar | 307/465.1 |

OTHER PUBLICATIONS

El-Ayat et al., "A CMOS Electrically Configurable Gate Array," IEEE Journal of Solid-State Circuits, vol. 24, No. 3, Jun. 1989, pp. 752-762.

Primary Examiner—David R. Hudspeth
Attorney, Agent, or Firm—Staas & Halsey

[57] ABSTRACT

A programmable logic circuit is provided with a plurality of logic cells including specific logic cells, at least two sub blocks, included in the specific logic cell, respectively having two or more inputs and one or more outputs and having only a predetermined combinational logic function by itself, and a switching circuit, included in the specific logic cell, and capable of independently connecting a path between the input and output of each sub block. An arbitrary combinational logic function and an arbitrary sequential logic function are realized by programming ON/OFF states of the switching circuit.

45 Claims, 116 Drawing Sheets

PROGRAMMABLE LOGIC CIRCUIT

BACKGROUND OF THE INVENTION

The present invention generally relates to programmable logic circuits, and more particularly to a programmable logic circuit which is often referred to as a field programmable gate array (FPGA).

Conventionally, semiconductor integrated circuit which has the function of realizing a desired logic circuit by interconnecting a plurality of programmable logic cells by a plurality of signal wires is known. Methods of determining the signal propagation paths within the logic circuit and the methods of determining the function to be realized by the logic cells can generally be categorized into the following two methods.

According to the first method, ON/OFF states of each switch within the signal propagation paths and functions to be realized are controlled based on data which are stored in memory cells that composes a static random access memory (SRAM). In this case, the configurations of the logic circuit which is realized are determined by the data stored in the memory cells of the SRAM, and thus, the semiconductor integrated circuit can be programmed a plurality of times.

On the other hand, according to the second method, the conductive states of fuses within the signal propagation paths are controlled, so as to determine the signal propagation paths and functions to be realized by the logic cells. In this case, the configurations of the logic circuit which is realized are determined by the conductive states of the fuses, and thus, the semiconductor integrated circuit cannot be programmed a plurality of times.

The basic structure of the logic cell can roughly be categorized into the following three kinds. According to the memory look-up table type logic cells, arbitrary functions are realized by using the inputs of the circuits as the address inputs of memories and the content of the memory cell specified by the previous memory address as the outputs of the circuits. This is done by writing the boolean truth table into the memory. According to the AND-OR plane type logic cells, arbitrary functions are realized by programming the AND plane and/or the OR plane thereof. Furthermore, according to the logic selection type logic cells, arbitrary functions are realized controlling the signal propagation paths using selection circuits such as multiplexers which can select outputs out of their applied inputs.

However, in the memory look-up table type logic cells, the number of memory cells for storing the output values increases exponentially with respect to the increase in the number of input signal wires. For this reason, the required memory capacity becomes large as the number of input signals to the logic circuit increases. Therefore, there was a problem that such programmable logic circuits comprising the memory look-up table type logic cells were difficult to realize.

In addition, in the case of the AND-OR plane type logic cells, there was a problem that complexity and redundancy of each plane became a great disturbance when forming large scale circuits.

Furthermore, in the case of the logic selection type logic cells, there was a problem that the scale of the selection circuit within the logic cell becomes large when the number of input signals to the logic circuit increases. Generally, it is known that the circuit scale of the selection circuit exponentially increases with respect to the increase in the number of input signals.

In each example of the basic architecture of the logic cell described above, the necessary number of logic cells to implement a logic circuit greatly changes when any part of any logic circuit's signal or design's logic change from positive logic to negative logic due to the modification of the logic circuit.

For this reason, there was a possibility that the mapping, a term which stands for implementing the logic circuit onto the set of logic cells, will fail if there is a modification or the like in the design specification of the logic circuit. In other words, there was a problem in that in order to reduce the circuit scale of the logic cell, an AND-OR type logic circuit is easily formed by certain set of logic cells but an OR-AND type logic circuit is difficult to form by the certain set of logic cells or vice versa.

On the other hand, the majority of the conventional logic cells have the structure shown in FIG. 1. In other words, a logic cell 100 is composed of a partial circuit 101 specialized for forming a combinational logic circuit, and a partial circuit 102 specialized for forming a sequential logic circuit, as shown in FIG. 1. The partial circuit 101 of the logic cell 100 is used when forming a combinational logic circuit, and the partial circuit 102 of the logic cell 100 is used when forming a sequential logic circuit. For this reason, if a logic circuit having a large number of combinational logic circuits is attempted to be mapped, the number of unused partial circuits 102 within this logic circuit becomes large. In addition, if a logic circuit having a large number of sequential logic circuits is attempted to be mapped, the number of unused partial circuits 101 within this logic circuit becomes large. Therefore, there was a problem that the utilization efficiency of the partial circuits 101 and 102 within the logic cell 100 becomes extremely poor depending on the structure, especially on the ratio of the combinational logic circuit part and the sequential logic circuit part within the logic circuit and the like, of the logic circuit which is to be mapped.

Unless it is known beforehand that either the combinational logic circuit or the sequential logic circuit will be used exclusively, the logic cell must be structured so that both the combinational logic and the sequential logic can be realized when forming the logic circuit. Normally, logic circuits are a combination of both a plurality of combinational logics and a plurality of sequential logics, and thus, it was necessary to provide both the partial circuit 101 and the partial circuit 102 within the logic cell 100 as shown in FIG. 1.

As a result, according to the conventional logic cell, there was a problem in that the utilization efficiency of each of the partial circuits within the logic cell, that is, the utilization efficiency of the logic cells within the logic circuit, cannot be improved regardless of the structure of the logic circuit which is to be mapped.

SUMMARY OF THE INVENTION

Accordingly, it is a general object of the present invention to provide a novel and useful programmable logic circuit in which the problems described above are eliminated.

Another and more specific object of the present invention is to provide a programmable logic circuit comprising a plurality of logic cells including specific logic cells, where the specific logic cell includes at least two sub blocks respectively having two or more inputs and one or more outputs and having only a predetermined combinational logic function by itself, and a switching circuit which can independently connect a path between the input and output of each sub block, and wherein an arbitrary combinational logic function and an arbitrary sequential logic function can be realized by programming ON/OFF states of the switching circuit. According to the programmable logic circuit of the present invention, it is possible to improve the utilization efficiency of the logic cells forming the programmable logic circuit regardless of the structure of the logic circuit which is realized.

Still another object of the present invention is to provide a programmable logic circuit comprising first through fourth transistors, and a plurality of programmable switches for coupling the first through fourth transistors and wirings, where each gate of the first through fourth transistors is coupled to an input wiring, and source or drain draw-out electrodes of the first through fourth transistors are coupled to arbitrary ones of first and second power supply lines, first and second output wirings, first and second high potential side protection wirings and first and second low potential side protection wirings via corresponding ones of first and second high potential side programmable switches, first and second low potential side programmable switches and first through fourteenth programmable switches. According to the programmable logic circuit of the present invention, it is possible to form a basic cell which is a minimum unit from four transistors and eighteen programmable switches. By appropriately programming the programmable switches of the basic cell, it is possible to form an inverter circuit, a power type inverter circuit, a transmission gate circuit, a 2-input NAND circuit, a 2-input NOR circuit or the like. In addition, it is possible to form other logic circuits by connecting two or more basic cells.

A further object of the present invention is to provide a programmable logic circuit comprising first through fourth transistors, and a plurality of programmable switches for coupling the first through fourth transistors and wirings, where each gate of the first through fourth transistors is coupled to an input wiring, and source or drain draw-out electrodes of the first through fourth transistors are coupled to arbitrary ones of first and second power supply lines, first and second output wirings, first and second high potential side protection wirings and first and second low potential side protection wirings via corresponding ones of first and second high potential side programmable switches, first and second low potential side programmable switches and first through sixteenth programmable switches. According to the programmable logic circuit of the present invention, it is possible to form a basic cell which is a minimum unit from four transistors and at least twenty programmable switches. By appropriately programming the programmable switches of the basic cell, it is possible to form an inverter circuit, a power type inverter circuit, a transmission gate circuit, a 2-input NAND circuit, a 2-input NOR circuit or the like. In addition, it is possible to form other logic circuits by connecting two or more basic cells.

Another object of the present invention is to provide a programmable logic circuit comprising first through eighth transistors, and a plurality of programmable switches for coupling the first through eighth transistors and wirings, where each gate of the first through eighth transistors is coupled to an input wiring, source or drain draw-out electrodes of the first through eighth transistors are coupled to arbitrary ones of first and second power supply lines and first and second output wirings via corresponding ones of first through fourth high potential side programmable switches, first through fourth low potential side programmable switches and first through twenty-second programmable switches. According to the programmable logic circuit of the present invention, it is possible to efficiently form a basic logic circuit such as a 3-input NAND circuit, a 3-input NOR circuit, a 4-input NAND circuit, a 4-input NOR circuit, a 3-input AND-OR inverter circuit and a 4-input AND-OR inverter circuit from eight transistors by appropriately programming the thirty programmable switches.

Other objects and further features of the present invention will be apparent from the following detailed description when read in conjunction with the accompanying drawings.

FIG. 120 in parts (*a*) and (*b*) is a diagram showing the structure of a 4-input NOR circuit which is obtained by programming the basic cell of the twentieth embodiment;

FIG. 121 in parts (*a*) and (*b*) is a diagram showing the structure of a 3-input AND-OR inverter circuit which is obtained by programming the basic cell of the twentieth embodiment;

FIG. 122 in parts (*a*) and (*b*) is a diagram showing the structure of a 4-input AND-OR inverter circuit which is obtained by programming the basic cell of the twentieth embodiment;

FIG. 123 in parts (*a*) and (*b*) is a diagram showing the structure of a 4-input AND-OR inverter circuit which is obtained by programming the basic cell of the twentieth embodiment;

FIG. 124 in parts (*a*) and (*b*) is a diagram showing the structure of a 4-input AND-OR inverter circuit which is obtained by programming the basic cell of the twentieth embodiment; and FIG. 125 in parts (*a*) and (*b*) is a diagram showing the structure of a 4-input AND-OR inverter circuit which is obtained by programming the basic cell of the twentieth embodiment.

DESCRIPTION OF THE PREFERRED EMBODIMENTS

Figure 1:
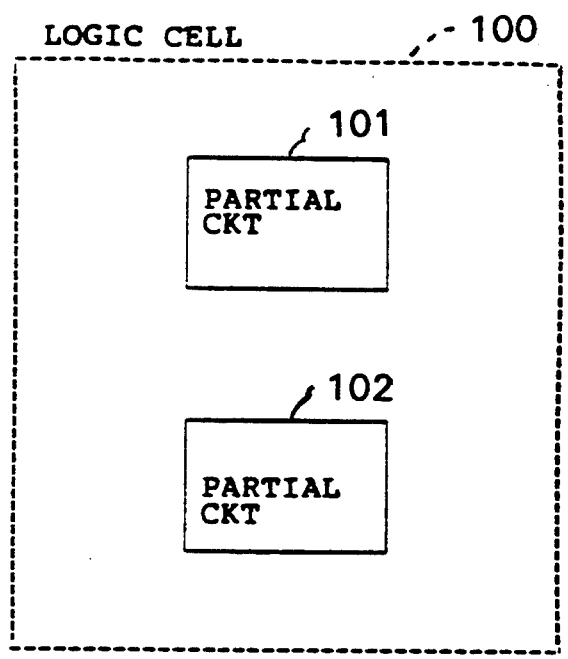
FIG. 1 is a block diagram showing an example of a conventional logic cell.
Figure 2:
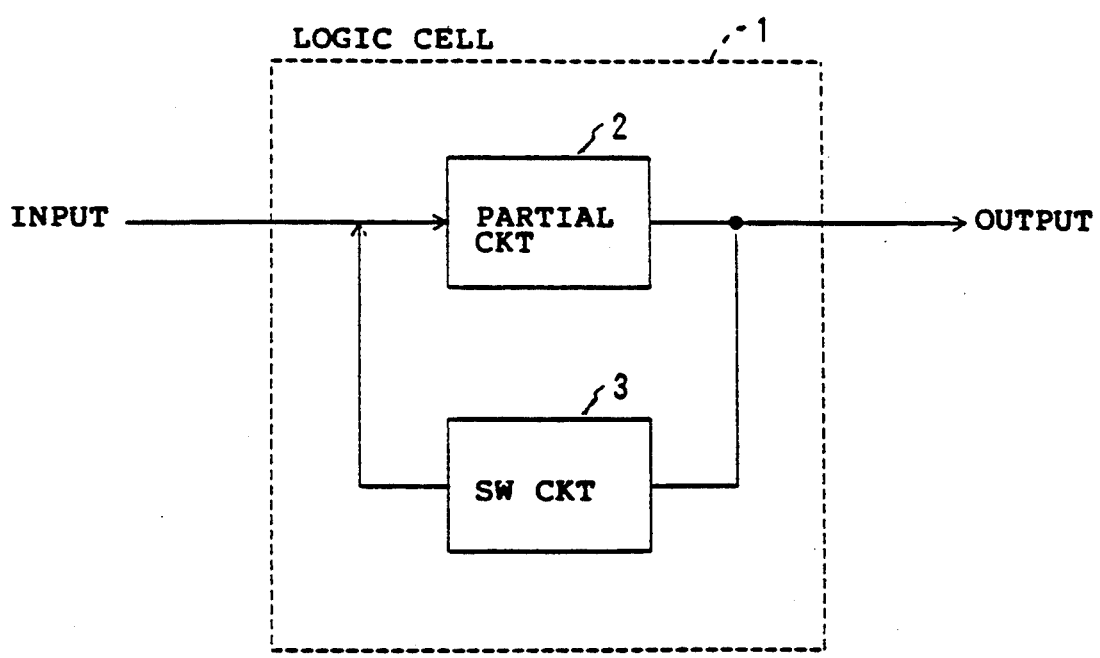
FIG. 2 is a system block diagram for explaining the operating principle of the present invention.

First, a description will be given of the operating principle of the present invention, by referring to FIG. 2. In FIG. 2, a logic cell 1 includes a partial circuit 2 for forming a combinational logic circuit and a switching circuit 3. The logic cell 1 is not provided with a partial circuit exclusively for forming a sequential logic circuit. The switching circuit 3 selectively feeds back an output of the partial circuit 2 to an input of the partial circuit 2. An inverting function may be provided at one of or both the input and output parts of the partial circuit 2.

A programmable logic circuit according to the present invention includes a plurality of such logic cells 1.

A combinational logic circuit is realized by the logic cell 1 when the switching circuit 3 of the logic cell 1 does not feed back the output of the partial circuit 2 to the input of the partial circuit 2. On the other hand, a sequential logic circuit is realized by the logic cell 1 when the switching circuit 3 of the logic cell 1 feeds back the output of the partial circuit 2 to the input of the partial circuit 2. Hence, an arbitrary logic can be realized by one logic cell 1 or by connecting a plurality of logic cells 1.

According to the present invention, the utilization efficiency of the partial circuit 2 within each logic cell 1, that is, the utilization efficiency of the logic cell 1, can be improved regardless of the structure of the logic circuit which is to be mapped. In addition, if the inverting function is provided at one of or both the input and output parts of the partial circuit 2, it is possible to further improve the utilization efficiency of the logic cell 1 by eliminating every inverter circuit which exists by itself among the elements forming the programmable logic circuit. As a result, it is also possible to improve the integration density of the programmable logic circuit.

Figure 3:
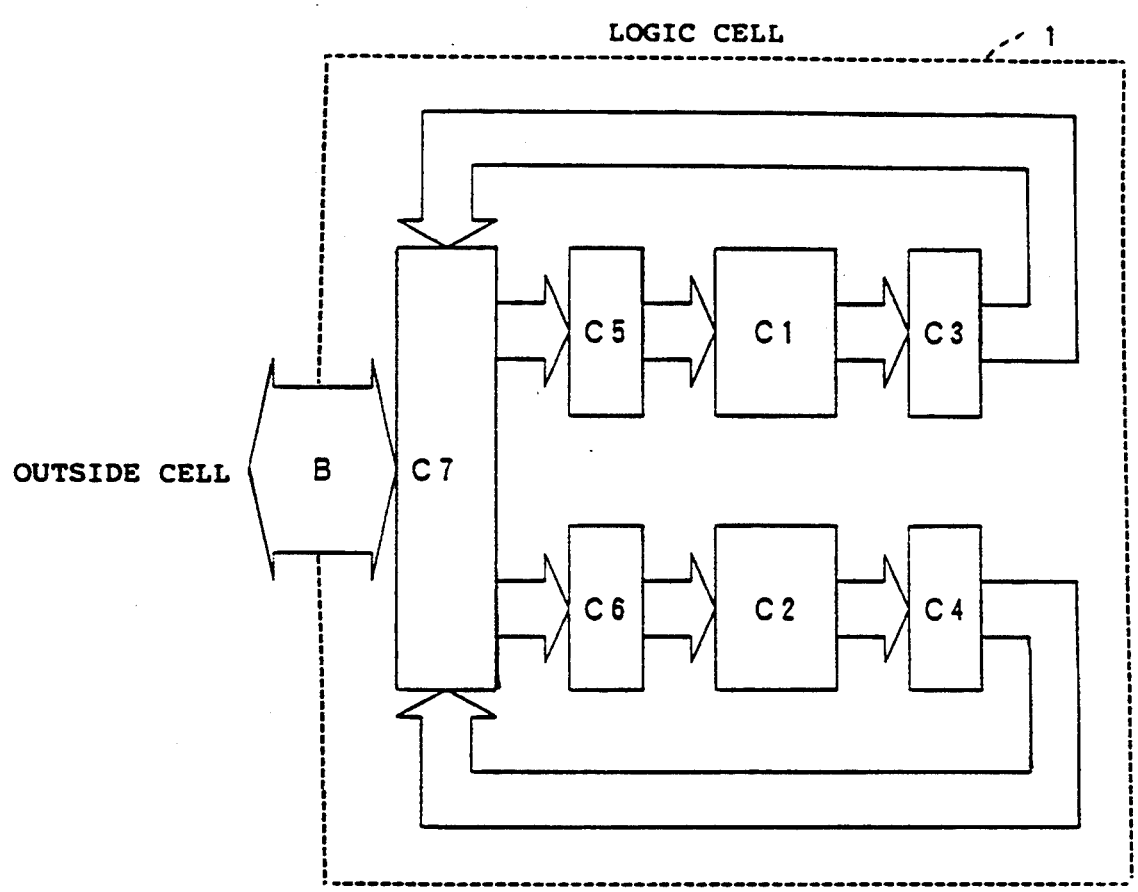
FIG. 3 is a system block diagram showing the structure of a logic cell which forms an essential part of a first embodiment of a programmable logic circuit according to the present invention.

Next, a description will be given of a first embodiment of the programmable logic circuit according to the present invention, by referring to FIG. 3. FIG. 3 shows the structure of the logic cell 1 which forms an essential part of this embodiment.

In FIG. 3, the logic cell 1 includes an input/output path B, basic logic circuits C1 and C2, inverter circuits C3 through C6, and a switching circuit C7. The input/output path B corresponds to the input and output of the logic cell 1 shown in FIG. 2. The basic logic circuits C1 and C2 are logic circuits respectively forming a basic part of the logic cell 1. The inverter circuits C3 through C6 respectively have the function of selectively inverting the logic of a part of or all signals input thereto. The inverter circuits C5 and C3 are respectively connected to the input side and the output side of the basic logic circuit C1. In addition, the inverter circuits C6 and C4 are respectively connected to the input side and the output side of the basic logic circuit C2. The basic logic circuits C1 and C2 and the inverter circuits C3 through C6 correspond to the partial circuit 2 shown in FIG. 2. The switching circuit C7 includes a plurality of switches, and has the function of selectively changing the external connections of the logic cell 1 and the internal connections of the logic cell 1. By selectively changing the internal connections of the logic cell 1, the switching circuit C7 can feed back a part of or all the outputs of the basic logic circuits C1 and C2 respectively obtained via the inverter circuits C3 and C4 to the inputs of the basic logic circuits C1 and C2 via the inverter circuits C5 and C6. The switching circuit C7 corresponds to the switching circuit 3 shown in FIG. 2.

The logic cell 1 functions as a normal combinational logic circuit when the selective connection between output signal lines of the input/output path B and input signal lines of the input/output path B is not made by the switching circuit C7. On the other hand, if the output signal lines of the input/output path B and the input signal lines of the input/output path B are selectively connected by programming the switches of the switching circuit C7, a signal propagation path C7 C5 C1 C3 C7 and a signal propagation path C7 C6 C2 C4 C7 are formed in FIG. 3 thus the logic cell 1 functions as a sequential logic circuit. In other words, the logic cell 1 can function as either the combinational logic circuit or the sequential logic circuit depending on how the switching circuit C7 is programmed.

The actual programmable logic circuit is provided with a plurality of such logic cells 1. In addition, the number of basic logic circuits within one logic cell is not limited to two. Furthermore, a part or all of the inverter circuits may be omitted.

Figure 4:
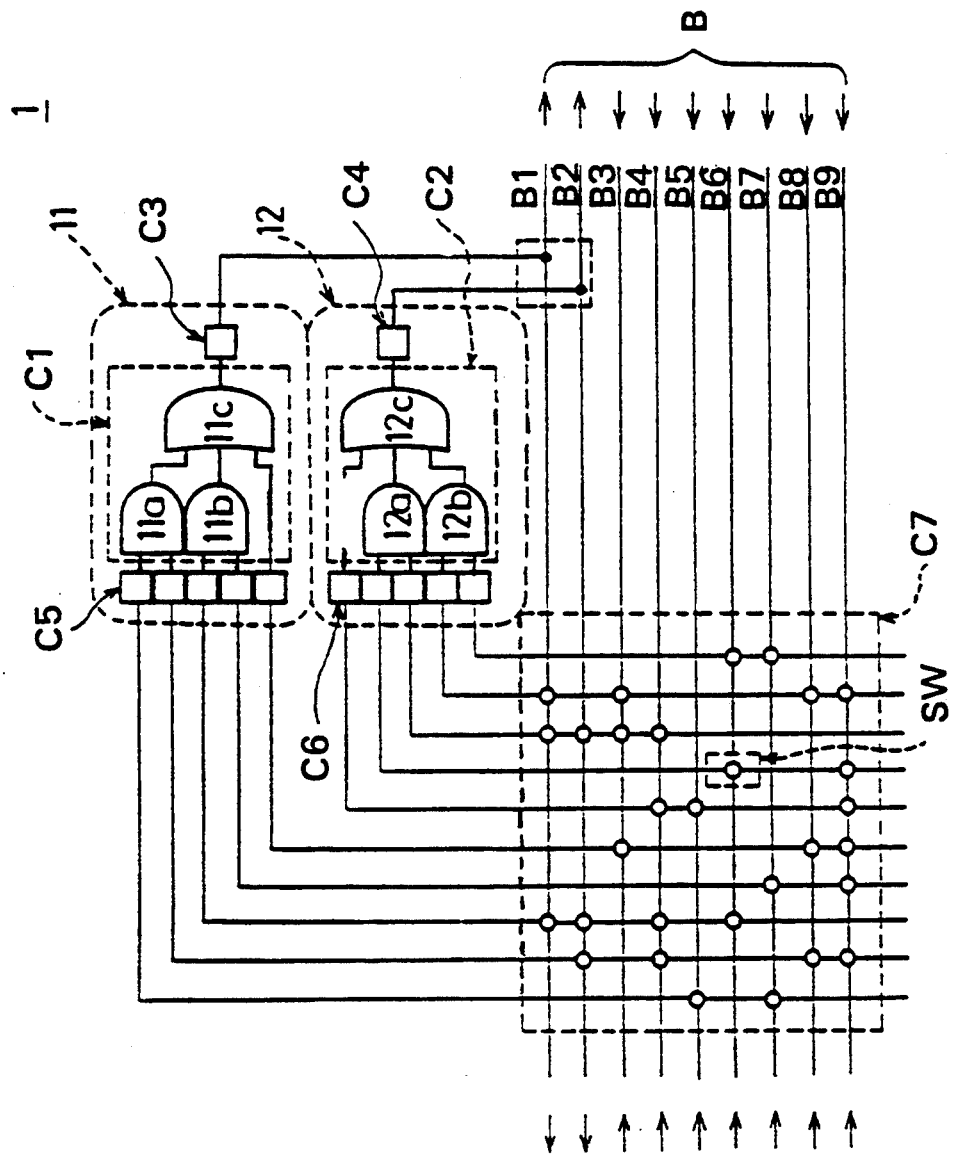
FIG. 4 is a circuit diagram showing a first embodiment of the internal structure of the logic cell.

FIG. 4 shows a first embodiment of the internal structure of the logic cell 1 shown in FIG. 3. In FIG. 4, a sub block 11 is made up of the basic logic circuit C1 and the inverter circuits C3 and C5, and corresponds to the partial circuit 2 shown in FIG. 2. In addition, a sub block 12 is made up of the basic logic circuit C2 and the inverter circuits C4 and C6, and corresponds to the partial circuit 2 shown in FIG. 2. The basic logic circuit C1 includes AND circuits 11a and 11b and an OR circuit 11c which are connected as shown. The basic logic circuit C2 includes AND circuits 12a and 12b and an OR circuit 12c which are connected as shown. In this embodiment, the inverter circuits C5 and C6 respectively include five programmable inverters. On the other hand, the inverter circuits C3 and C4 respectively include one programmable inverter.

In this embodiment, the input/output path B includes two output signal lines B1 and B2 and seven input signal lines B3 through B9, that is, a total of nine signal lines B1 through B9. Outputs of the sub blocks 11 and 12 are respectively connected to the output signal lines B1 and B2. The switching circuit C7 includes a plurality of programmable switches SW which are indicated by circular marks in FIG. 4. One or a plurality of programmable switches SW are provided with respect to each of the signal lines B1 through B9.

For example, if the three programmable switches SW provided with respect to the input signal line B3 are turned ON, a signal from the input signal line B3 is supplied to one inverter of the inverter circuit C5 and to two inverters of the inverter circuit C6. If each inverter of the inverter circuits C5 and C6 supplied with the signal from the input signal line B3 is programmed to invert the signal logic, the logic of the signal supplied from the input signal line B3 is inverted before being supplied to the corresponding basic logic circuits C1 and C2.

On the other hand, if the three programmable switches SW provided with respect to the output signal line B2 are turned ON, for example, a signal from the output signal line B2 is fed back to two inverters of the inverter circuit C5 and to one inverter of the inverter circuit C6. If each inverter of the inverter circuits C5 and C6 supplied with the signal from the output signal line B2 is programmed to invert the signal logic, the logic of the signal supplied from the output signal line B2 is inverted before being fed back to the basic logic circuits C1 and C2.

Hence, if at least one of the programmable switches SW provided with respect to the output signal lines B1 and B2 is turned ON, it is possible to make the logic cell 1 function as the sequential logic circuit. And, if all of the programmable switches provided with respect to the output signal lines B1 and B2 are turned OFF, it is possible to make the logic cell 1 function as the combinational logic circuit.

Figure 5:
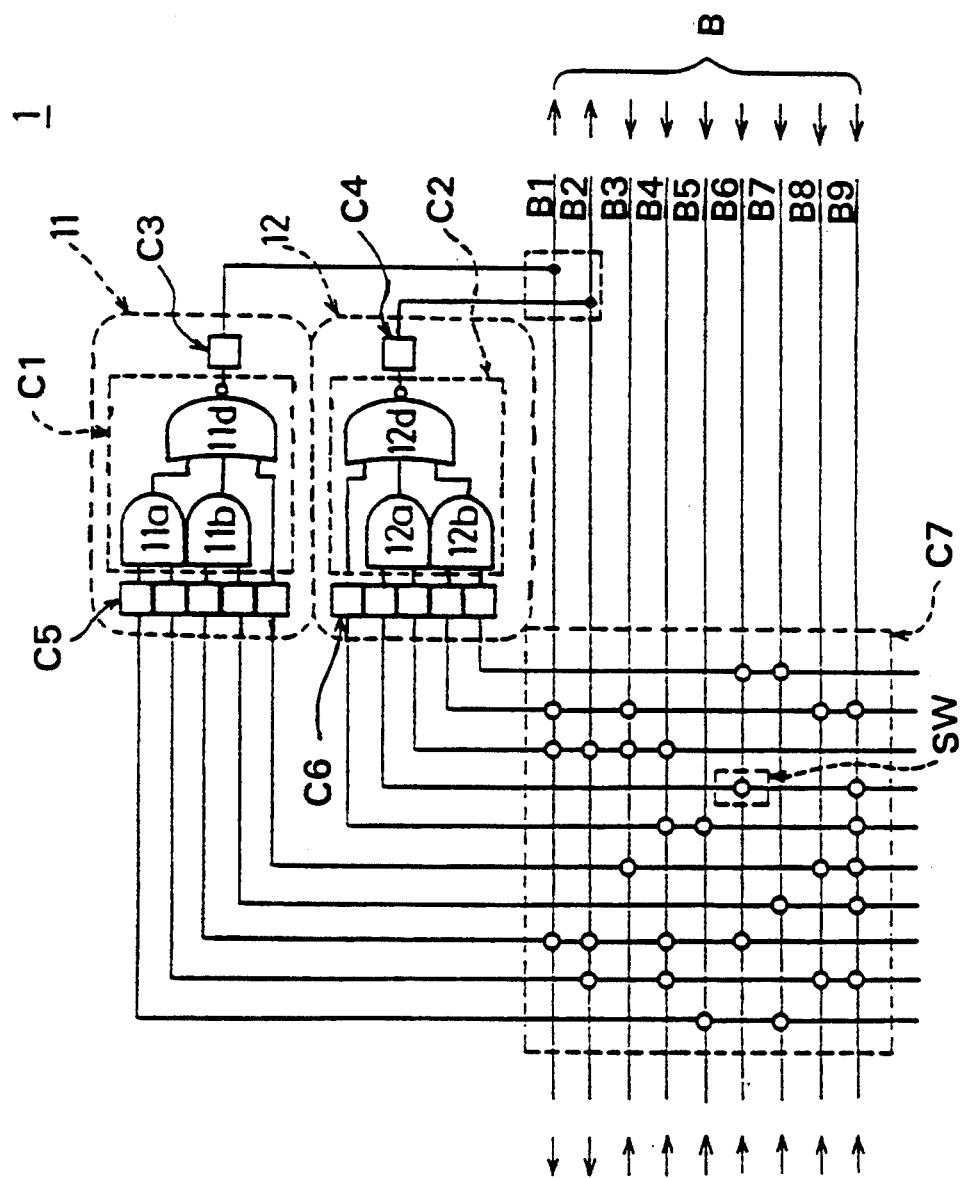
FIG. 5 is a circuit diagram showing a second embodiment of the internal structure of the logic cell.

FIG. 5 shows a second embodiment of the internal structure of the logic cell 1 shown in FIG. 3. In FIG. 5, those parts which are the same as those corresponding parts in FIG. 4 are designated by the same reference numerals, and a description thereof will be omitted.

In FIG. 4, the basic logic circuits C1 and C2 are respectively made up of an AND-OR circuit. But in FIG. 5, the basic logic circuits C1 and C2 are respectively made up of an AND-NOR circuit. In other words, the basic logic circuit C1 shown in FIG. 5 includes AND circuits 11a and 11b and a NOR circuit 11d which are connected as shown, and the basic logic circuit C2 includes AND circuits 12a and 12b and a NOR circuit 12d which are connected as shown.

Figure 6:
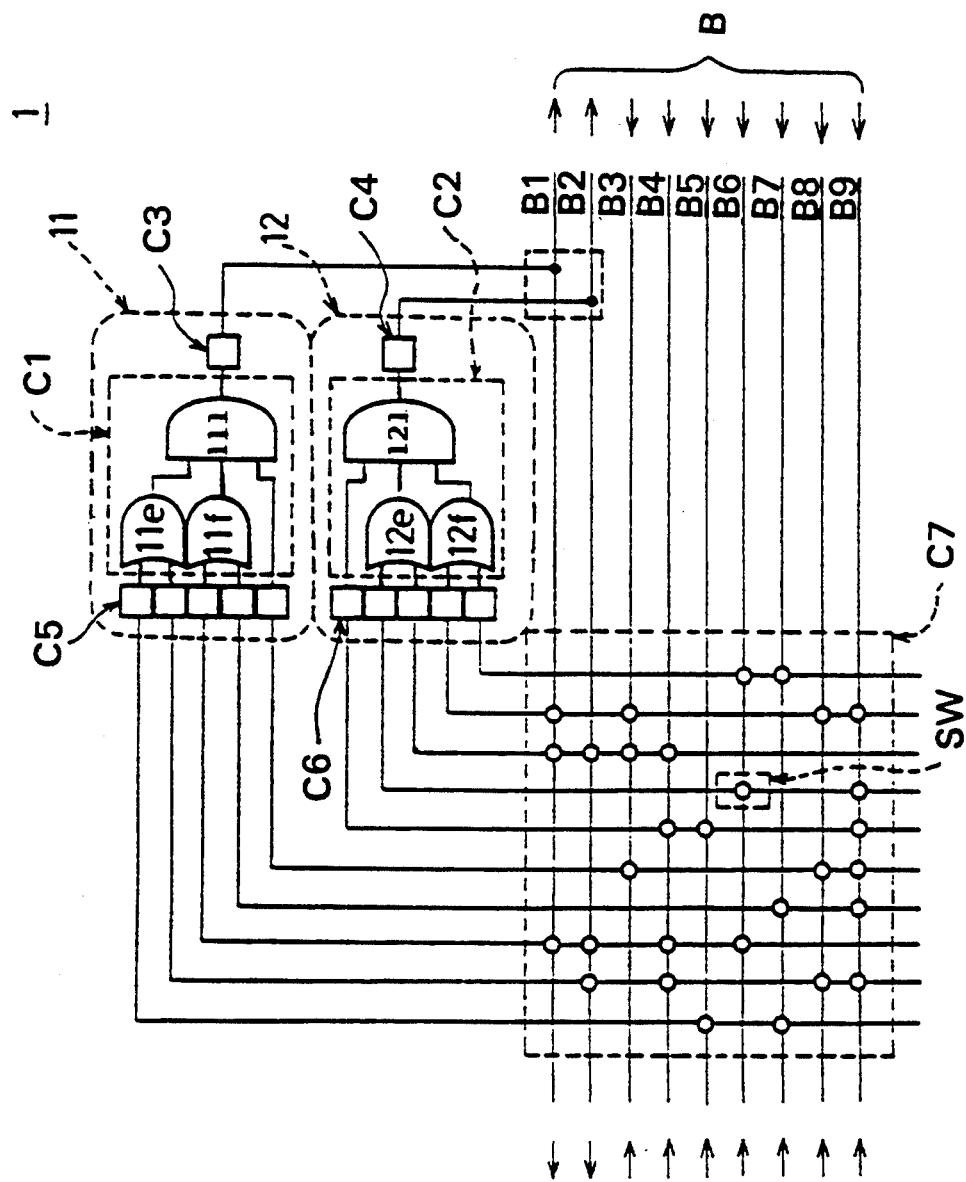
FIG. 6 is a circuit diagram showing a third embodiment of the internal structure of the logic cell.

FIG. 6 shows a third embodiment of the internal structure of the logic cell 1 shown in FIG. 3. In FIG. 6, those parts which are the same as those corresponding parts in FIG. 4 are designated by the same reference numerals, and a description thereof will be omitted.

In FIG. 4, the basic logic circuits C1 and C2 are respectively made up of an AND-OR circuit. But in FIG. 8, the basic logic circuits C1 and C2 are respectively made up of an OR-AND circuit. In other words, the basic logic circuit C1 shown in FIG. 6 includes OR circuits 11e and 11f and an AND circuit 111 which are connected as shown, and the basic logic circuit C2 includes OR circuits 12e and 12f and an AND circuit 121 which are connected as shown.

Figure 7:
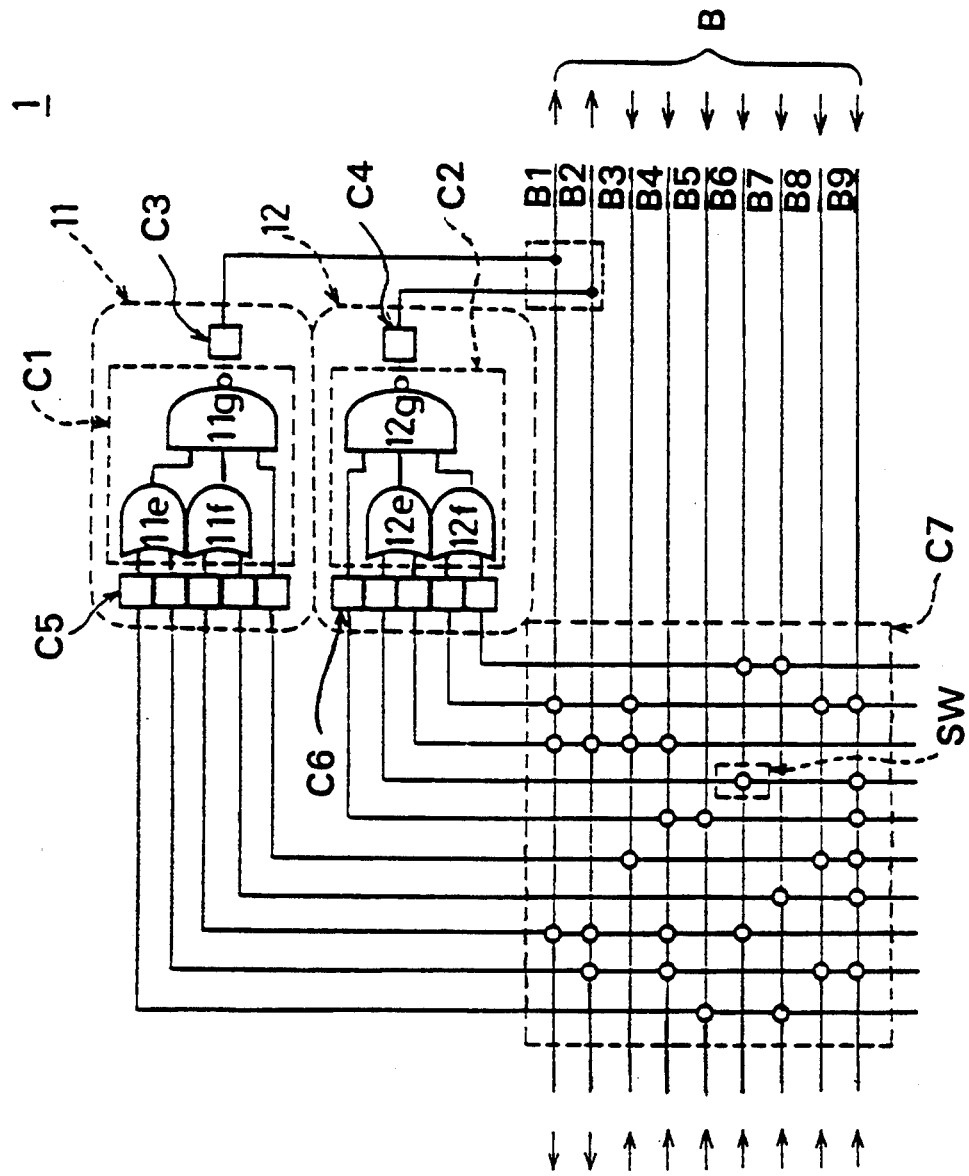
FIG. 7 is a circuit diagram showing a fourth embodiment of the internal structure of the logic cell.

FIG. 7 shows a fourth embodiment of the internal structure of the logic cell 1 shown in FIG. 3. In FIG. 7, those parts which are the same as those corresponding parts in FIGS. 4 and 6 are designated by the same reference numerals, and a description thereof will be omitted.

In FIG. 4, the basic logic circuits C1 and C2 are respectively made up of an AND-OR circuit. But in FIG. 7, the basic logic circuits C1 and C2 are respectively made up of an OR-NAND circuit. In other words, the basic logic circuit C1 shown in FIG. 7 includes OR circuits 11e and 11f and a NAND circuit 11g which are connected as shown, and the basic logic circuit C2 includes OR circuits 12e and 12f and a NAND circuit 12g which are connected as shown.

Figure 8:
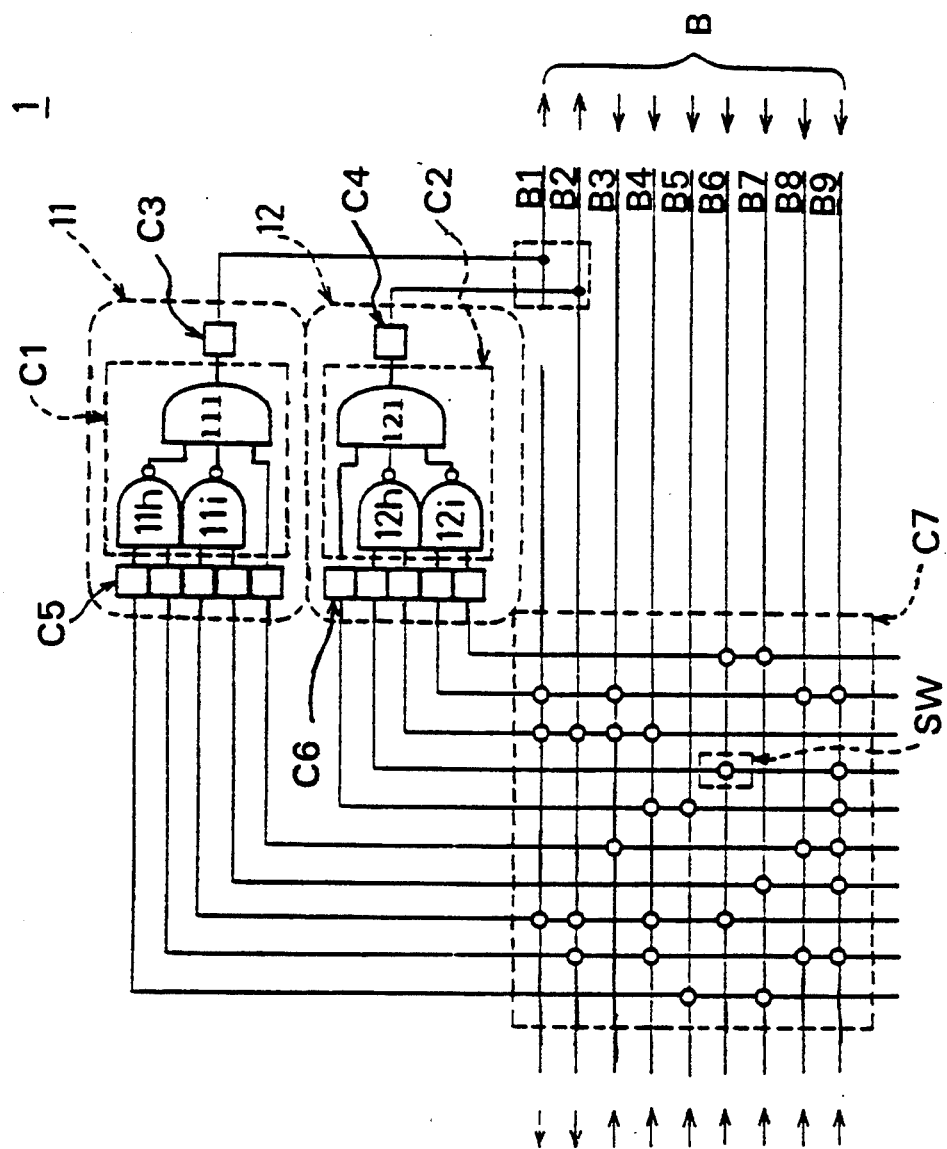
FIG. 8 is a circuit diagram showing a fifth embodiment of the internal structure of the logic cell.

FIG. 8 shows a fifth embodiment of the internal structure of the logic cell i shown in FIG. 3. In FIG. 8, those parts which are the same as those corresponding parts in FIG. 4 are designated by the same reference numerals, and a description thereof will be omitted.

In FIG. 4, the basic logic circuits C1 and C2 are respectively made up of an AND-OR circuit. But in FIG. 8, the basic logic circuits C1 and C2 are respectively made up of a NAND-AND circuit. In other words, the basic logic circuit C1 shown in FIG. 8 includes NAND circuits 11h and 11i and an AND circuit 11l which are connected as shown, and the basic logic circuit C2 includes NAND circuits 12h and 12i and an AND circuit 12l which are connected as shown.

Figure 9:
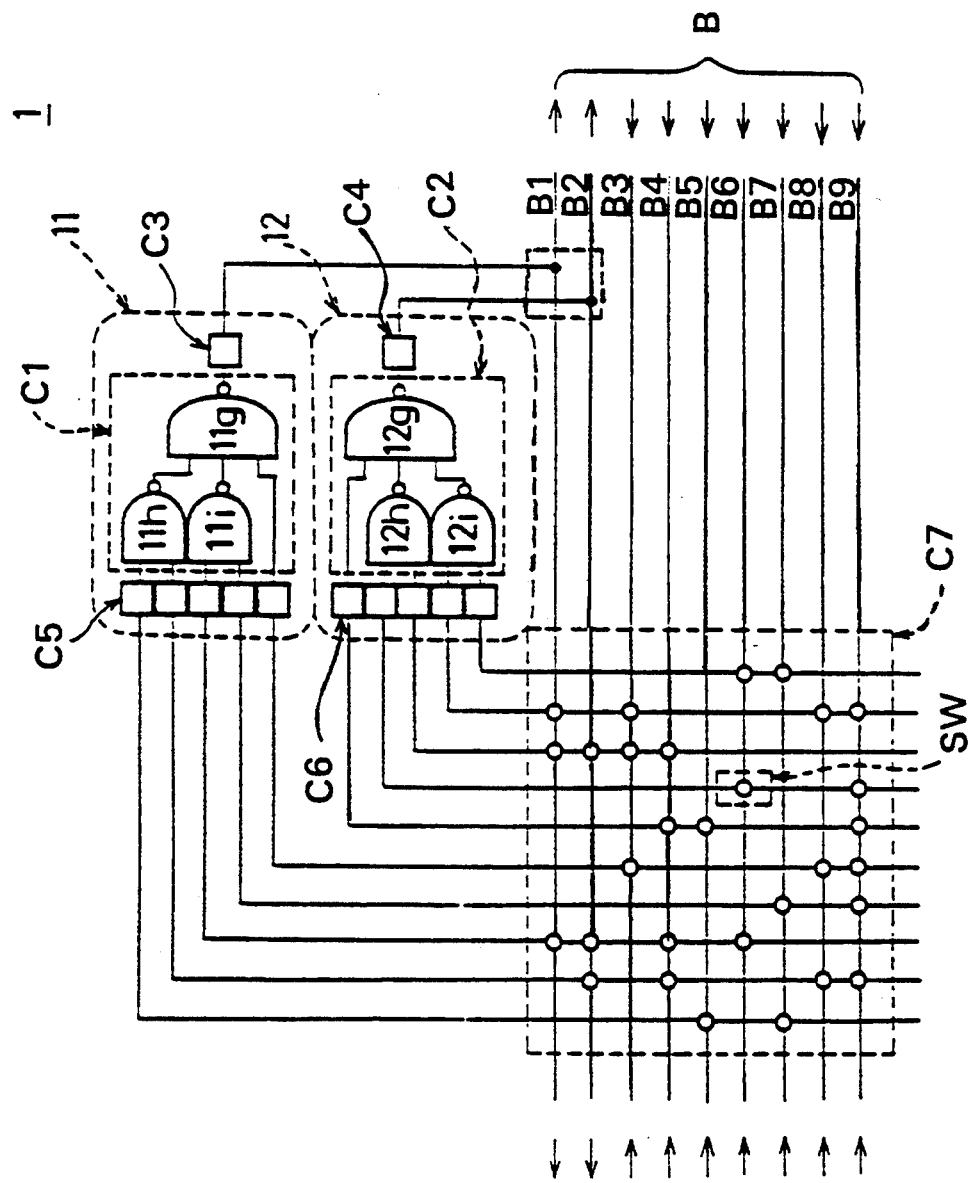
FIG. 9 is a circuit diagram showing a sixth embodiment of the internal structure of the logic cell.

FIG. 9 shows a sixth embodiment of the internal structure of the logic cell 1 shown in FIG. 3. In FIG. 9, those parts which are the same as those corresponding parts in FIGS. 7 and 8 are designated by the same reference numerals, and a description thereof will be omitted.

In FIG. 8, the basic logic circuits C1 and C2 are respectively made up of a NAND-AND circuit. But in FIG. 9, the basic logic circuits C1 and C2 are respectively made up of a NAND-NAND circuit. In other words, the basic logic circuit C1 shown in FIG. 9 includes NAND circuits 11h and 11i and a NAND circuit 11g which are connected as shown, and the basic logic circuit C2 includes NAND circuits 12h and 12i and a NAND circuit 12g which are connected as shown.

Figure 10:
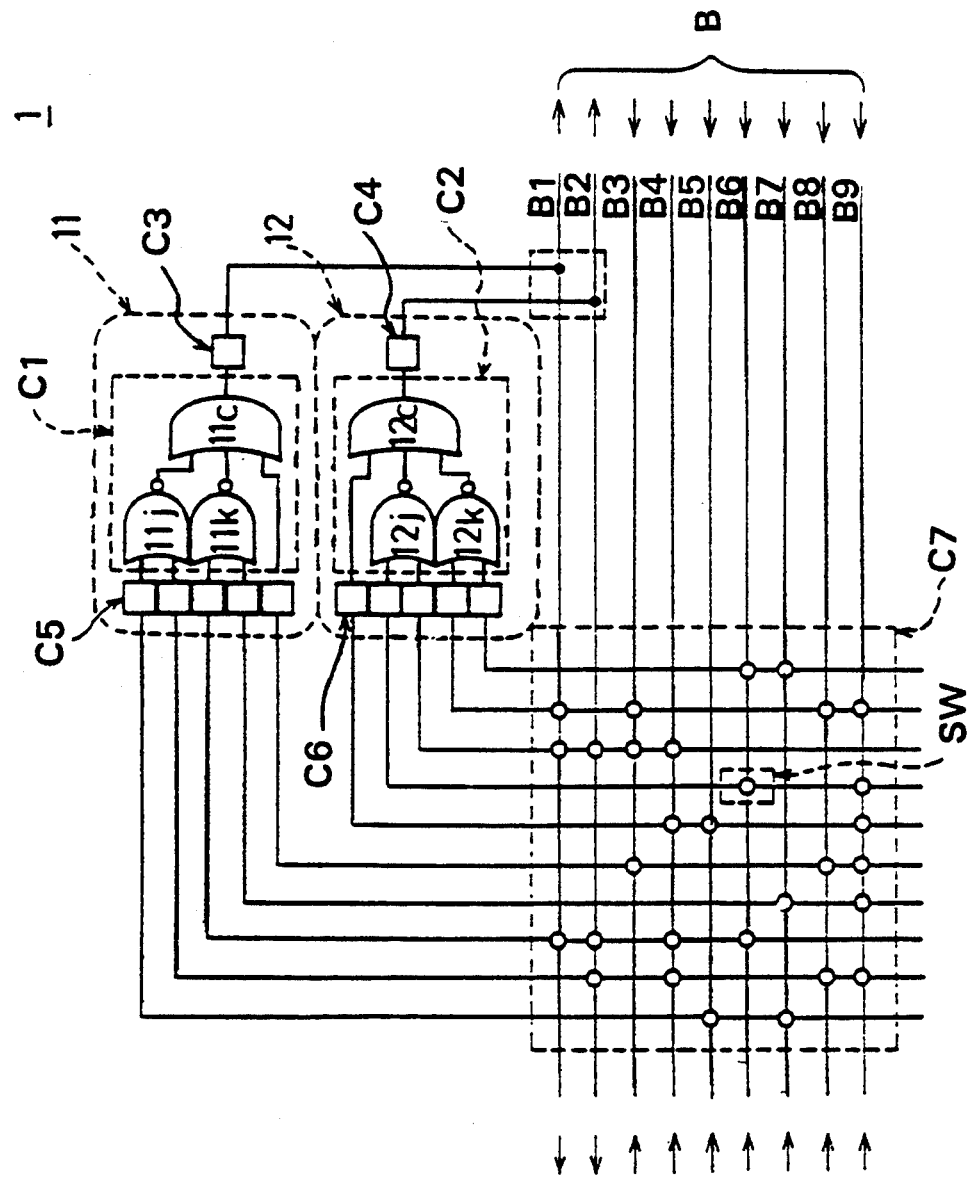
FIG. 10 is a circuit diagram showing a seventh embodiment of the internal structure of the logic cell.

FIG. 10 shows a seventh embodiment of the internal structure of the logic cell 1 shown in FIG. 3. In FIG. 10, those parts which are the same as those corresponding parts in FIG. 4 are designated by the same reference numerals, and a description thereof will be omitted.

In FIG. 4, the basic logic circuits C1 and C2 are respectively made up of an AND-OR circuit. But in FIG. 10, the basic logic circuits C1 and C2 are respectively made up of a NOR-OR circuit. In other words, the basic logic circuit C1 shown in FIG. 10 includes NOR circuits 11j and 11k and an OR circuit 11c which are connected as shown, and the basic logic circuit C2 includes NOR circuits 12j and 12k and an OR circuit 12c which are connected as shown.

Figure 11:
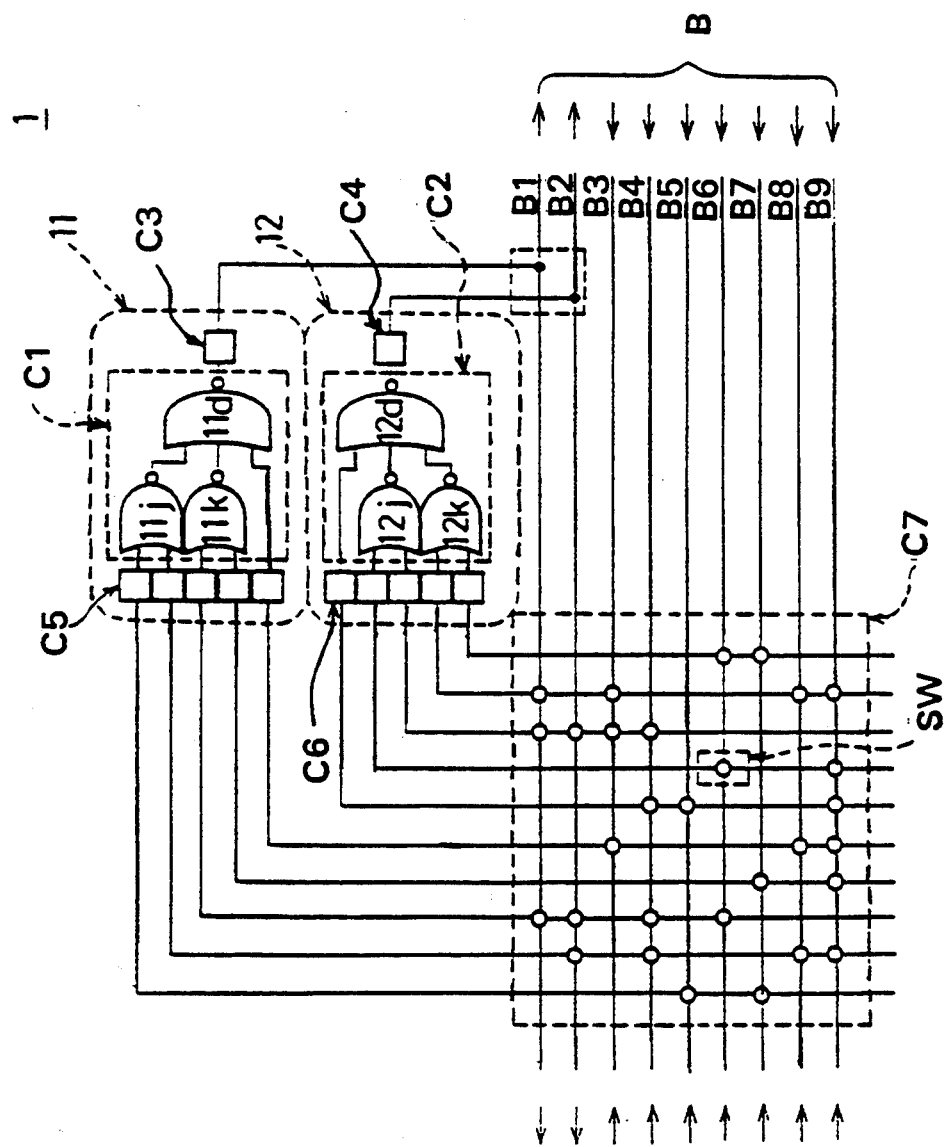
FIG. 11 is a circuit diagram showing an eighth embodiment of the internal structure of the logic cell.

FIG. 11 shows an eighth embodiment of the internal structure of the logic cell 1 shown in FIG. 3. In FIG. 11, those parts which are the same as those corresponding parts in FIGS. 5 and 10 are designated by the same reference numerals, and a description thereof will be omitted.

In FIG. 10, the basic logic circuits C1 and C2 are respectively made up of an NOR-OR circuit. But in FIG. 11, the basic logic circuits C1 and C2 are respectively made up of an NOR-NOR circuit. In other words, the basic logic circuit C1 shown in FIG. 11 includes NOR circuits 11j and 11k and a NOR circuit 11d which are connected as shown, and the basic logic circuit C2 includes NOR circuits 12j and 12k and a NOR circuit 12d which are connected as shown.

Figure 12:
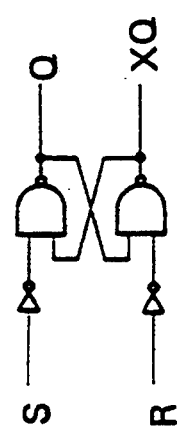
FIG. 12 in parts (a), (b), (c), (d) and (e) is a circuit diagram showing a sequential logic circuit which can be realized by the logic cell.
Figure 12:
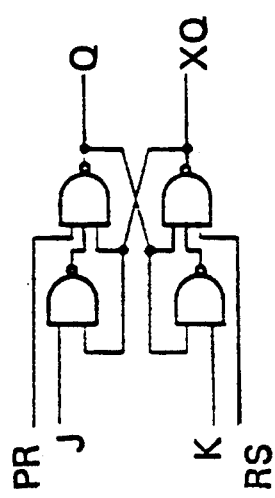
Figure 12:
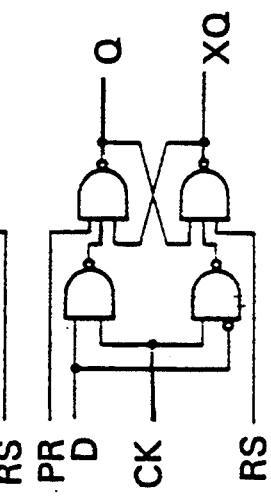
Figure 12:
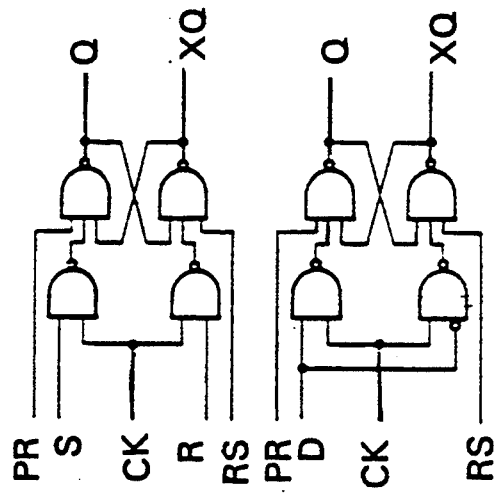
Figure 12:
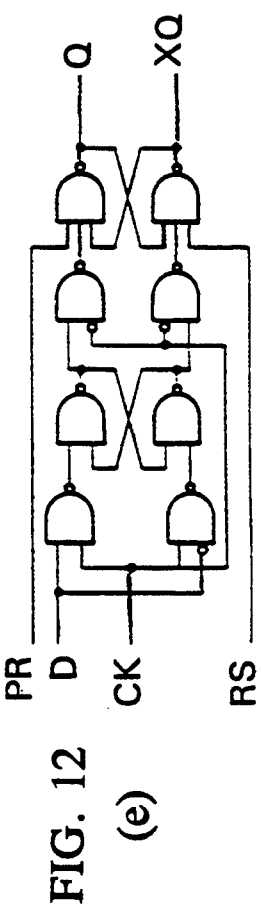

As described above, according to this embodiment of the programmable logic circuit, it is possible to realize sequential logic circuits such as flip-flop circuits shown in FIG. 12 by the logic cell 1, by arbitrarily controlling the ON/OFF states of the programmable switches SW of the switching circuit C7 within the logic cell 1 and the inverting/non-inverting states of the inverter circuits C3 through C6 within the logic cell 1. In FIG. 12, (a) shows a set reset (S-R) flip-flop, (b) shows a J-K flip-flop, (c) shows a S-R flip-flop having preset and reset terminals, and (d) and (e) show delay (D) flip-flops having preset and reset terminals.

As may be seen from the description given above, the basic logic circuits C1 and C2 are each formed by a combination of two or more circuits selected from AND, NAND, OR and NOR circuits. In addition, in either case where the logic of the input signals of the basic logic circuit is inverted or not inverted, the circuits which may be selected to form each basic logic circuit in a simplified form are an AND-OR circuit, an OR-AND circuit, an AND-NOR circuit and an OR-NAND circuit. This may be proven by the following Lemmata 1 and 2.

(Lemma 1)

In either case where the logic of the input signals of the basic logic circuit is inverted or not inverted, the circuits which may be selected to form the basic logic circuit in a simplified form are an AND-OR circuit, an OR-AND circuit, an AND-NOR circuit and an OR-NAND circuit.

(Proof 1)

If it is assumed that "in either case where the logic of the input signals of the basic logic circuit is inverted or not inverted, the circuits which may be selected to form the basic logic circuit in a simplified form are other than an AND-OR circuit, an OR-AND circuit, an AND-NOR circuit and an OR-NAND circuit", the simplified form of the circuits which form the basic logic circuit would all be a single stage combinational logic circuit having multiple inputs and a single output such as a NAND circuit, an AND circuit, an OR circuit and a NOR circuit. Accordingly, it becomes impossible to describe an exclusive-OR or an exclusive-NOR by a single logic cell. For this reason, it is necessary that "in either case where the logic of the input signals of the basic logic circuit is inverted or not inverted, the circuits which may be selected to form the basic logic circuit in a simplified form are an AND-OR circuit, an OR-AND circuit, an AND-NOR circuit and an OR-NAND circuit".

(Lemma 2)

If in either case where the logic of the input signals of the basic logic circuit is inverted or not inverted, the circuits which may be selected to form each basic logic circuit in a simplified form are an AND-OR circuit, an OR-AND circuit, an AND-NOR circuit and an OR-NAND circuit, it is possible to form all of the sequential logic circuits shown in FIG. 12.

(Proof 2)

If the circuits in the simplified form are an AND-OR circuit, an OR-AND circuit, an AND-NOR circuit and an OR-NAND circuit, the logic circuits which invert the logic of all input signals of the basic logic circuit all become one of (1) a NOR-OR circuit, (2) a NOR-NOR circuit, (3) a NAND-AND circuit and (4) a NAND-NAND circuit. In the cases (1) and (3), the logic of the output signals of the basic logic circuit is also inverted. Therefore, it is evident that "if in either case where the logic of the input signals of the basic logic circuit is inverted or not inverted, the circuits which may be selected to form the basic logic circuit in a simplified form are an AND-OR circuit, an OR-AND circuit, an AND-NOR circuit and an OR-NAND circuit, it is possible to form all of the sequential logic circuits shown in FIG. 12". In addition, in FIG. 12, it is of course possible to replace the NAND circuit by a NOR circuit.

Next, a description will be given of the connections of the programmable switch SW of the switching circuit C7 and the signal lines B1 through B9 of the input-/output path B, by referring to FIG. 13.

Figure 13:
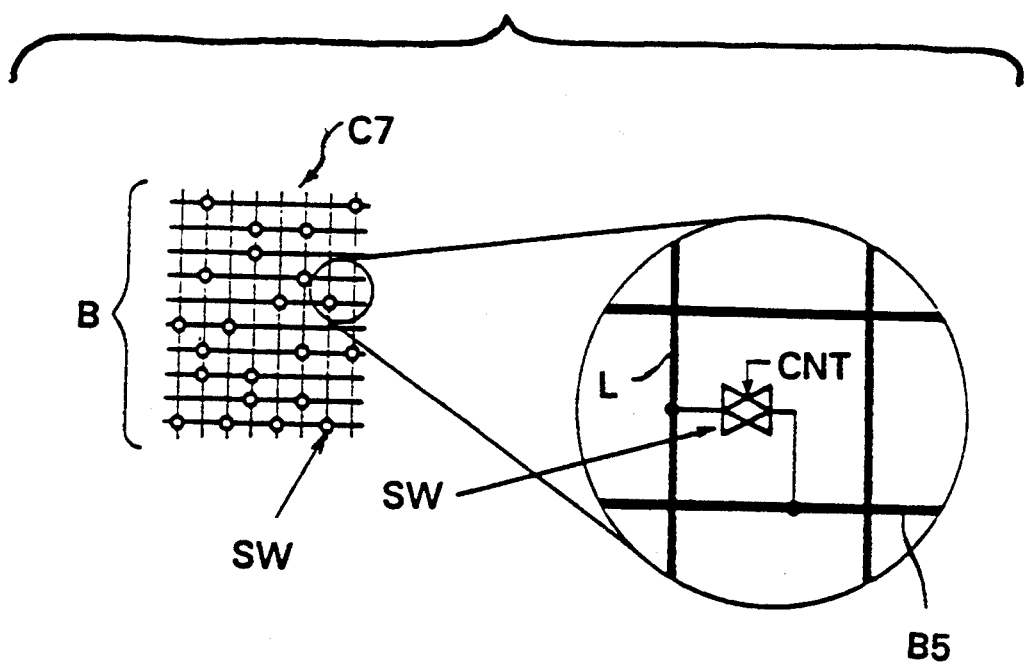
FIG. 13 is a diagram for explaining the connection of a programmable switch of a switching circuit and signal lines of an input/output path.

As shown on an enlarged scale on the right side of FIG. 13, the programmable switch SW is connected to one signal line of the input/output path B and to one signal line which connects to the sub block C1 or C2. The programmable switch SW is turned ON/OFF by a control signal CNT which is supplied to a control terminal of the programmable switch SW. In the particular case shown in FIG. 13, the programmable switch SW is connected to the input signal line B5 and a signal line L which connects to the sub block C2.

Figure 14:
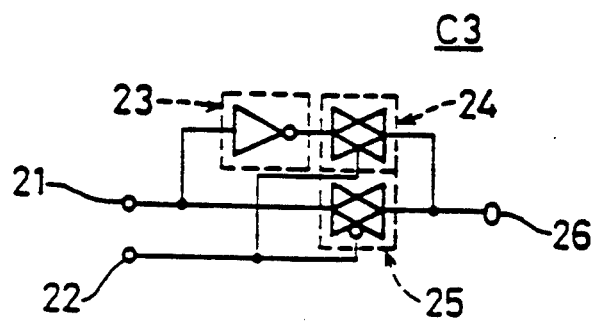
FIG. 14 is a circuit diagram showing an embodiment of a inverter circuit.

FIG. 14 shows an embodiment of the inverter circuit C3. The inverter circuit C3 includes an inverter 23 and switches 24 and 25 which are connected as shown in FIG. 14. A signal from an input terminal 21 is supplied to the switch 24 via the inverter 23 on one hand, and is supplied directly to the switch 25 on the other. A control signal which determines whether the inverter circuit C3 is to output the input signal as it is (that is, unchanged) or to invert the input signal before outputting the same is applied to a control terminal 22. The control signal from the control terminal 22 is supplied as it is to a control terminal of the switch 24, and is inverted before being supplied to a control terminal of the switch 25. Outputs of the switches 24 and 25 are both connected to an output terminal 28. Hence, if a low-level control signal is applied to the control terminal 22, for example, the input signal applied to the input terminal 21 is inverted and output from the output terminal 26. On the other hand, if a high-level control signal is applied to the control terminal 22, the input signal applied to the input terminal 21 is output as it is from the output terminal 26.

The inverter circuit C4 may have the same structure shown in FIG. 14. In addition, since the inverter circuits C5 and C6 each have five input signals, these inverter circuits C5 and C8 can respectively be realized by providing five circuits each having the structure shown in FIG. 14.

Figure 15:
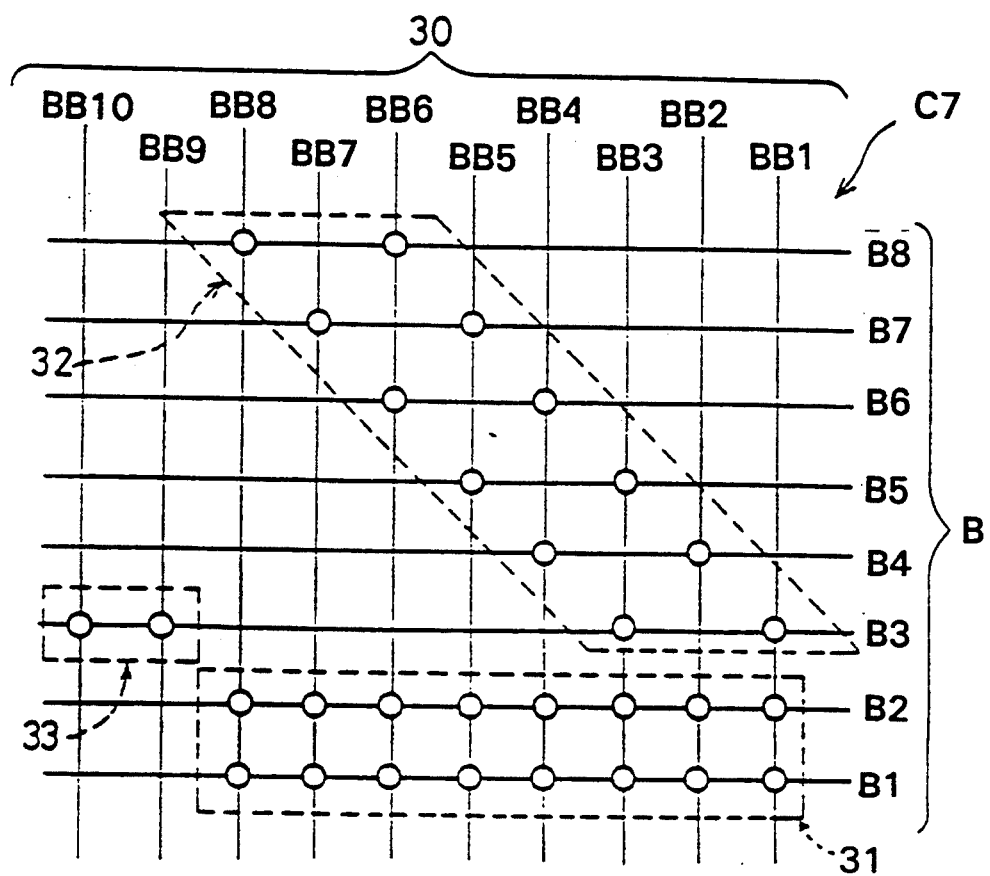
FIG. 15 is a diagram showing an embodiment of the connection between an inter-cell path and the switching circuit.

Next, a description will be given of the connections of the logic cells 1, by referring to FIG. 15. FIG. 15 shows an embodiment of the connection of the switching circuit C7 and an inter-cell path 30 which is a group of signal lines connecting the logic cells 1. In FIG. 15, those parts which are the same as those corresponding parts in FIG. 4 are designated by the same reference numerals, and a description thereof will be omitted.

In FIG. 15, each programmable switch SW of the switching circuit C7 is connected to an arbitrary one of the signals lines B1 through B8 of the input/output path B and to an arbitrary one of signal lines BB1 through BB10 of the inter-cell path 30. In this embodiment, the signal lines BB9 and BB10 are used to transfer clock signals. A switch group 31 is provided with respect to the output signal lines B1 and B2 of the input/output path B. Because the programmable switches SW of the switch group 31 are provided with respect to each of the signal lines BB1 through BB10, the output signal lines B1 and B2 of the logic cell 1 are freely connectable to the signal lines BB1 through BB8 of the inter-cell path 30. In addition, a switch group 32 is provided with respect to the signal lines B2 through B8 of the input-/output path B. Since the programmable switches SW of the switch group 32 are only provided with respect to predetermined ones of the signal lines BB1 through BB8, the input signal lines B3 through B8 of the logic cell 1 is connectable to predetermined ones of the signal lines BB1 through BB8 of the inter-cell path 30. Further, a switch group 33 is provided with respect to the input signal line B3 of the input/output path B. Hence, the input signal line B3 of the input/output path B is connectable to the signal lines BB9 and BB10 of the inter-cell path 30 via the programmable switches SW of the switch group 33.

Of course, it is possible to provide one programmable switch SW with respect to each of the signal lines B1 through B8 and each of the signal lines BB1 through BB10.

Figure 16:
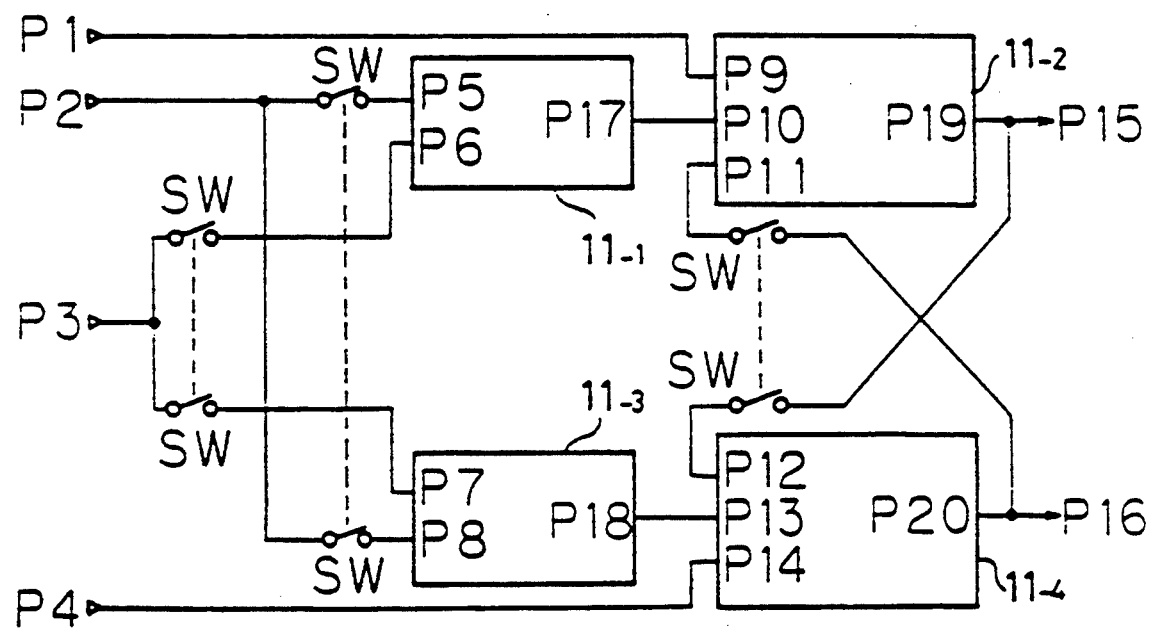
FIG. 16 is a circuit diagram showing a second embodiment of the programmable logic circuit according to the present invention which can realize a sequential logic circuit using a plurality of sub blocks.
Figure 17:
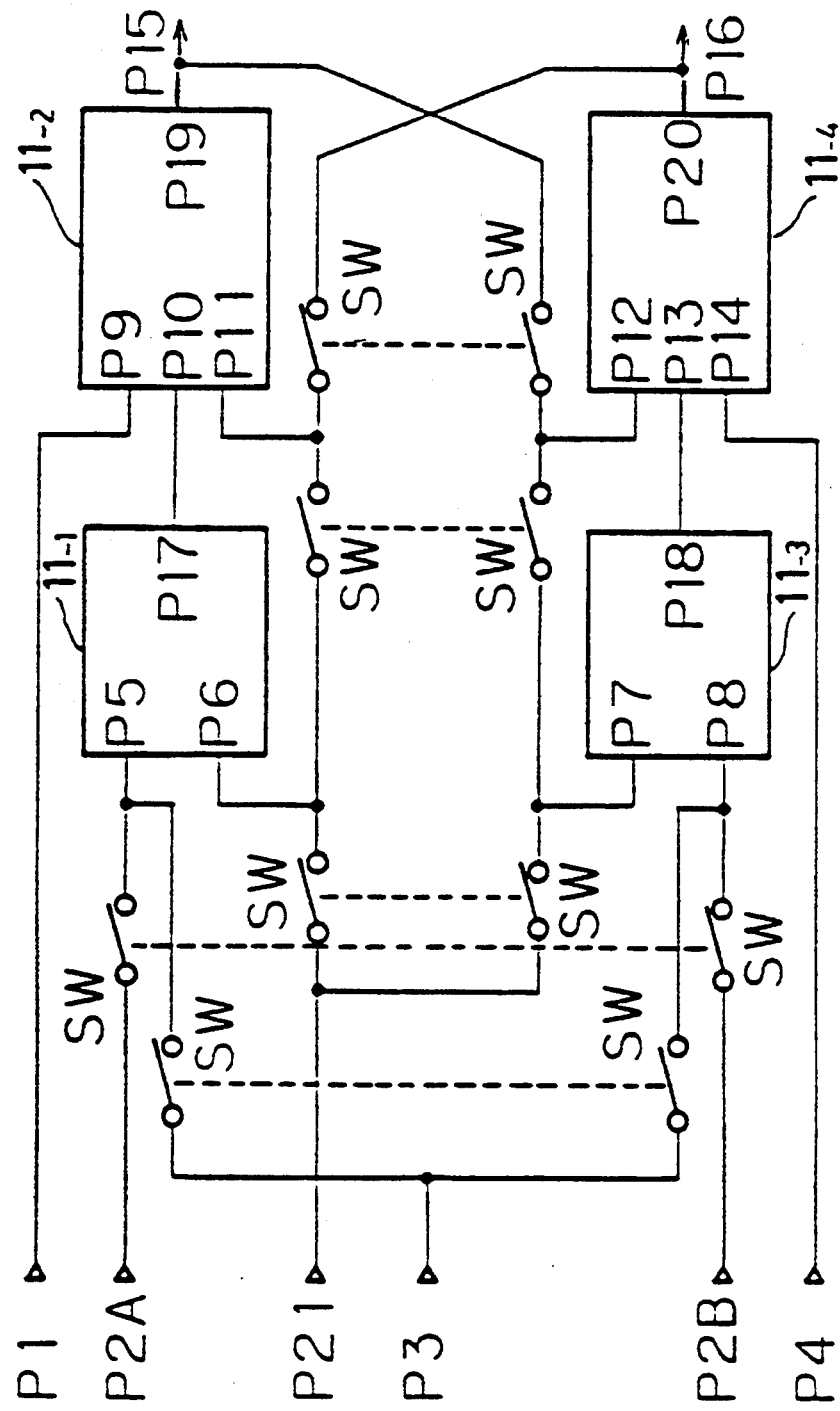
FIG. 17 is a circuit diagram showing a third embodiment of the programmable logic circuit according to the present invention which can realize a sequential logic circuit using a plurality of sub blocks.
Figure 18:
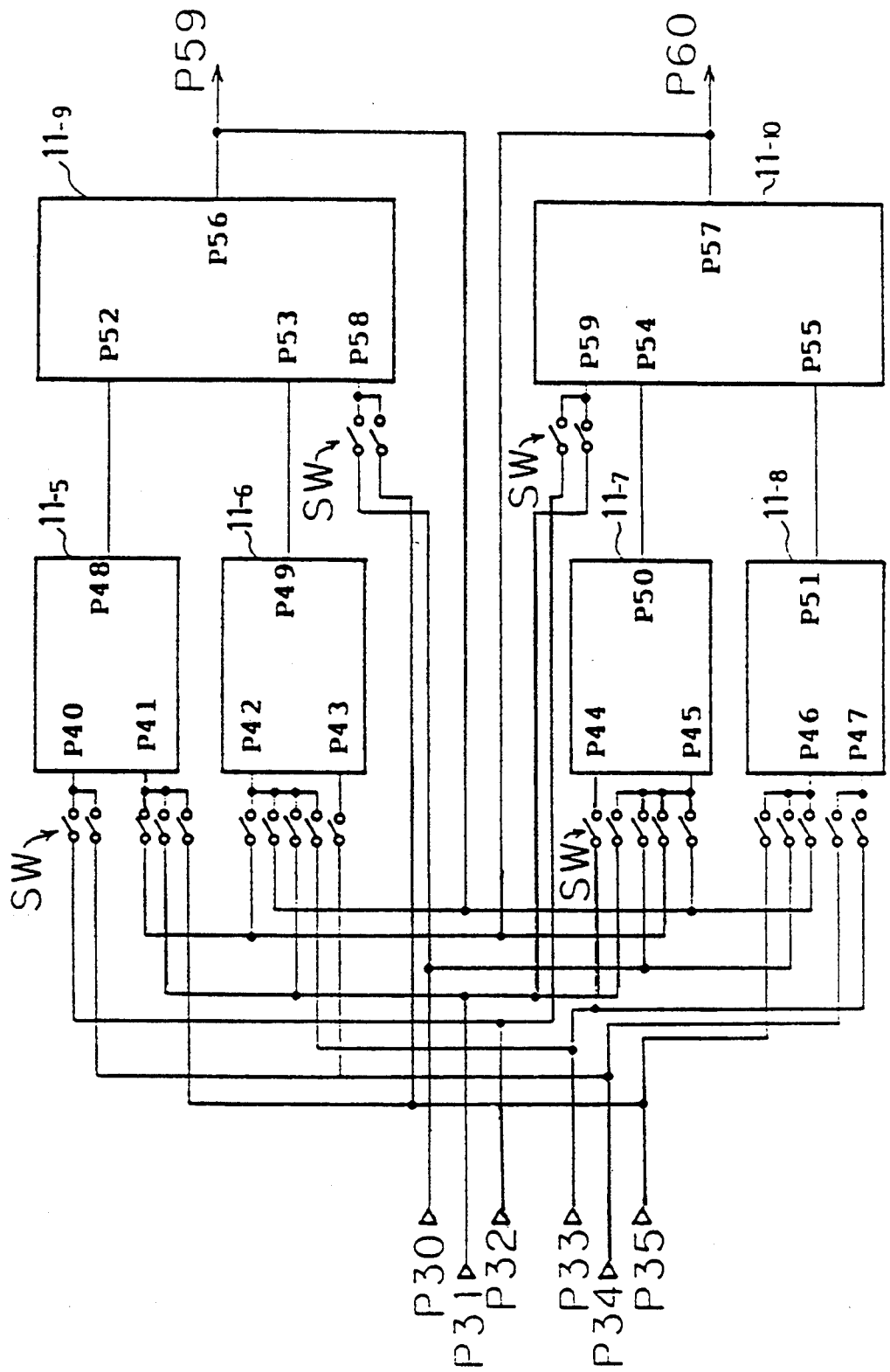
FIG. 18 is a circuit diagram showing a fourth embodiment of the programmable logic circuit according to the present invention which can realize a sequential logic circuit using a plurality of sub blocks.

FIGS. 16 through 18 respectively show second through fourth embodiments of the programmable logic circuit according to the present invention which can realize a sequential logic circuit using a plurality of sub blocks 11 described above.

The second embodiment of the programmable logic circuit shown in FIG. 16 includes four sub blocks 11-1 through 11-4 and a plurality of programmable switches SW which are connected as shown. This programmable logic circuit can function as a combinational logic circuit or a sequential logic circuit such as a flip-flop depending on the ON/OFF states of the programmable switches SW. In this embodiment, the programmable logic circuit is provided with four input terminals P1 through P4 and two output terminals P15 and P16. A programmable switch SW is provided between the input terminal P2 and an input terminal P5 of the sub block 11-1, between the input terminal P3 and an input terminal P6 of the sub block 11-1, between the input terminal P3 and an input terminal P7 of the sub block 11-3, between the input terminal P2 and an input terminal P8 of the sub block 11-3, between the output terminal P15 and an input terminal P12 of the sub block 11-4, and between the output terminal P16 and an input terminal P11 of the sub block 11-2. In addition, the input terminal P1 is connected to an input terminal P9 of the sub block 11-2, and the input terminal P4 is connected to an input terminal P14 of the sub block 11-4. Furthermore, an output terminal P17 of the sub block 11-1 is connected to an input terminal P10 of the sub block 11-2, and an output terminal P18 of the sub block 11-3 is connected to an input terminal P13 of the sub block 11-4. In each pair of programmable switches SW which are connected by the dotted lines in FIG. 16, the programmable switches SW which form the pair are linked and are turned ON/OFF simultaneously.

The third embodiment of the programmable logic circuit shown in FIG. 17 includes four sub blocks 11-1 through 11-4 and a plurality of programmable switches SW which are connected as shown. This programmable logic circuit also functions as a combinational logic circuit or a sequential logic circuit such as a flip-flop depending on the ON/OFF states of the programmable switches SW. In FIG. 17, those parts which are the same as those corresponding parts in FIG. 16 are designated by the same reference numerals, and a description thereof will be omitted.

In this embodiment, six input terminals P1, P2A, P2B, P3, P4 and P21 and two output terminals P15 and P16 are provided. In addition, a programmable switch SW is further provided between the input terminal P2A and the input terminal P5 of the sub block 11-1, between the input terminal P2B and the input terminal P8 of the sub block 11-3, between the input terminal P21 and the input terminal P6 of the sub block 11-1, between the input terminal P21 and the input terminal P7 of the sub block 11-3, between the input terminal P6 of the sub block 11-1 and the input terminal P11 of the sub block 11-2, and between the input terminal P7 of the sub block 11-3 and the input terminal P12 of the sub block 11-4. In each pair of programmable switches SW which are connected by the dotted lines in FIG. 17, the programmable switches SW which form the pair are linked and are turned ON/OFF simultaneously.

The fourth embodiment of the programmable logic circuit shown in FIG. 18 includes six sub blocks 11-5 through 11-10 and a plurality of programmable switches SW which are connected as shown. This programmable logic circuit also functions as a combinational logic circuit or a sequential logic circuit such as a flip-flop depending on the ON/OFF states of the programmable switches SW.

In this embodiment, six input terminals P30 through P35 and two output terminal P59 and P60 are provided. A programmable switch SW is provided between the input terminal P30 and an input terminal P58 of the sub block 11-9, between the input terminal P30 and an input terminal P45 of the sub block 11-7, between the input terminal P30 and an input terminal P46 of the sub block 11-8, between the input terminal P31 and an input terminal P41 of the sub block 11-5, between the input terminal P31 and an input terminal P42 of the sub block 11-6, between the input terminal P31 and an input terminal P59 of the sub block 11-10, between the input terminal P31 and the input terminal P45 of the sub block 11-7, between the input terminal P32 and an input terminal P40 of the sub block 11-5, between the input terminal P32 and an input terminal P59 of the sub block 11-5, between the input terminal P32 and the input terminal P59 of the sub block 11-10, between the input terminal P33 and the input terminal P42 of the sub block 11-6, between the input terminal P33 and an input terminal P44 of the sub block 11-7, between the input terminal P33 and an input terminal P47 of the sub block 11-8, between the input terminal P34 and the input terminal P40 of the sub block 11-5, between the input terminal P34 and an input terminal P43 of the sub block 11-6, between the input terminal P34 and the input terminal P47 of the sub block 11-8, between the input terminal P35 and the input terminal P41 of the sub block 11-5, between the input terminal P35 and an input terminal P58 of the sub block 11-9, between the input terminal P35 and an input terminal P46 of the sub block 11-8, between an output terminal P56 of the sub block 11-9 and the input terminal P43 of the sub block 11-6, between the output terminal P56 of the sub block 11-9 and the input terminal P45 of the sub block 11-7, between the output terminal P56 of the sub block 11-9 and the input terminal P46 of the sub block 11-8, between an output terminal P57 of the sub block 11-10 and the input terminal P41 of the sub block 11-5, between the output terminal P57 of the sub block 11-10 and the input terminal P42 of the sub block 11-6, and between the output terminal P57 of the sub block 11-10 and the input terminal P45 of the sub block 11-7.

An output terminal P48 of the sub block 11-5 is connected to an input terminal P52 of the sub block 11-9, and an output terminal P49 of the sub block 11-6 is connected to an input terminal P53 of the sub block 11-9. An output terminal P50 of the sub block 11-7 is connected to an input terminal P54 of the sub block 11-10, and an output terminal P51 of the sub block 11-8 is connected to an input terminal P55 of the sub block 11-10. An output terminal P56 of the sub block 11-9 is connected to the output terminal P59 of the programmable logic circuit, and an output terminal P57 of the sub block 11-10 is connected to the output terminal P60 of the programmable logic circuit.

In this embodiment, it is possible to realize at least one kind of sequential logic circuit out of the R-S flip-flop, the clocked R-S (RS-CK) flip-flop, the D flip-flop and the J-K flip-flop by suitably controlling the ON/OFF states of the programmable switches SW. In addition, it is also possible to realize at least one kind of combinational logic circuit out of the AND circuit, the NAND circuit, the OR circuit, the NOR circuit, the exclusive-OR circuit, the exclusive-NOR circuit and a half-adder circuit.

Figure 19:
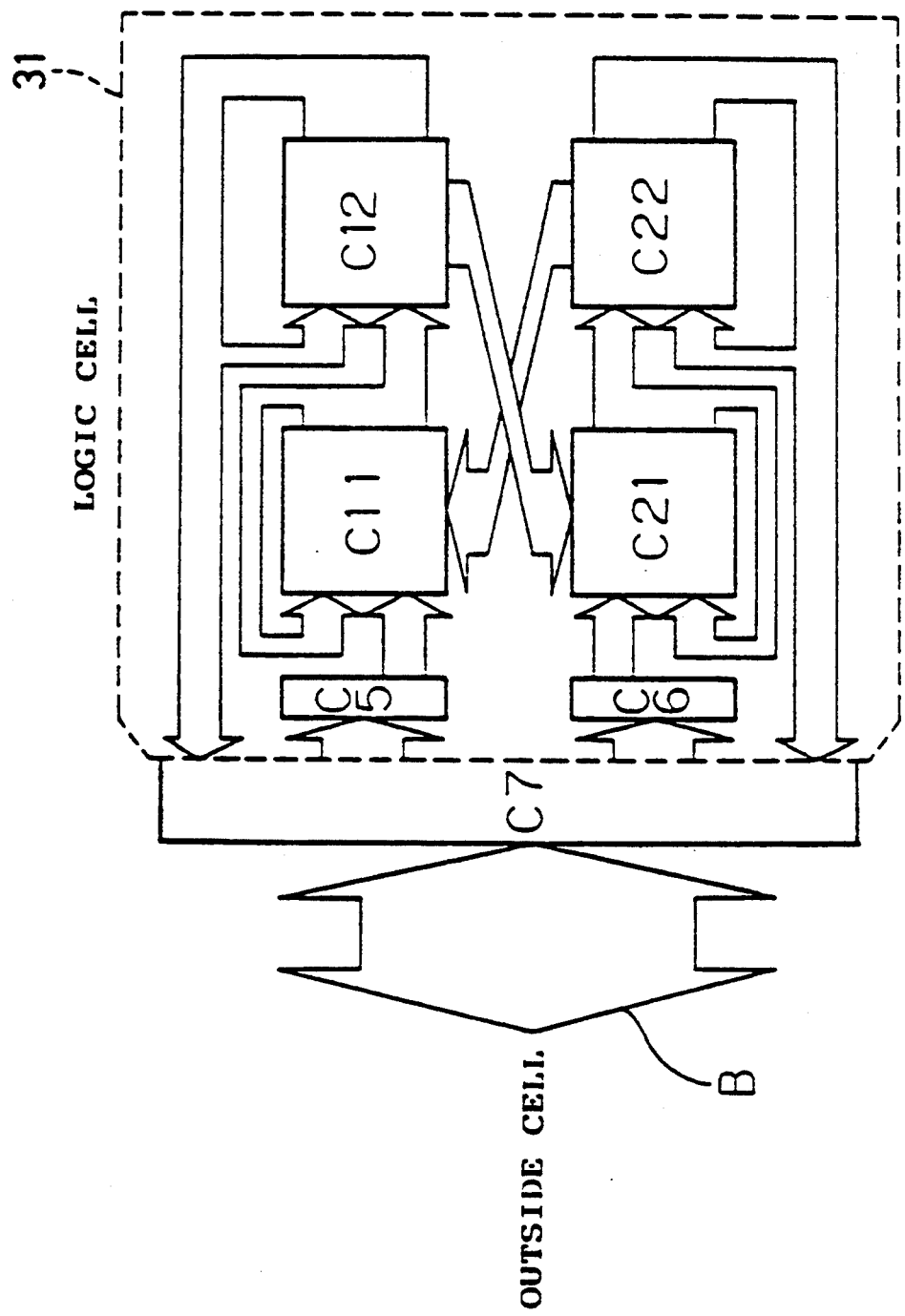
FIG. 19 is a system block diagram showing a fifth embodiment of the programmable logic circuit according to the present invention.

Next, a description will be given of a fifth embodiment of the programmable logic circuit according to the present invention, by referring to FIG. 19. FIG. 19 shoes the structure of a logic cell 31 which forms an essential part of this embodiment.

The logic cell 31 includes an input/output path B, basic logic circuits C11, C12, C21 and C22, inverter circuits C5 and C6, and a switching circuit C7. The input/output path B corresponds to the input and output of the logic cell 1 shown in FIG. 2. The basic logic circuits C11, C12, C21 and C22 are logic circuits forming basic parts of the logic cell 31. The inverter circuits C5 and C6 respectively have the function of selectively inverting the logic of a part of or all the input signals thereof. The inverter circuit C5 is connected to the input side of the basic logic circuit C11. Outputs of the basic logic circuits C11 and C21 are input to the corresponding basic logic circuits C12 and C22, and are also fed back to the inputs of the basic logic circuits C11 and C21. In addition, outputs of the basic logic circuits C12 and C22 are input to the switching circuit C7, and are also fed back to the basic logic circuits C12 and C22. Furthermore, the outputs of the basic logic circuits C12 and C22 are input to the corresponding basic logic circuits C21 and C11. On the other hand, the inverter circuit C6 is connected to the input side of the basic logic circuit C21. The basic logic circuits C11, C12, C21 and C22, and the inverter circuits C5 and C6 correspond to the partial circuit 2 shown in FIG. 2.

The switching circuit C7 includes a plurality of programmable switches, and has the function of selectively changing the external connections and the internal connections of the logic cell 31. By selectively changing the internal connections of the logic cell 31, the switching circuit C7 enables feedback of a part of or all the outputs of the basic logic circuits C11 and C21 obtained via the basic logic circuits C12 and C22 to the inputs of the basic logic circuits C11 and C21 via the inverter circuits C5 and C6. The switching circuit C7 corresponds to the switching circuit 3 shown in FIG. 2.

The logic cell 31 functions as a normal combinational logic circuit if the switching circuit C7 makes no selective connections between the output signal lines and the input signal lines of the input/output path B. On the other hand, if the output signal lines and the input signal lines of the input/output path B are selectively connected by programming the programmable switches of the switching circuit C7, a signal propagation path C7 C5 C11 C12 C7 and a signal propagation path C7 C6 C21 C22 C7, for example, are formed in FIG. 19, and the logic cell 31 functions as a sequential logic circuit. In other words, the logic cell 31 can function as a combinational logic circuit or a sequential logic circuit depending on the programming of the programmable switches within the switching circuit C7.

The actual programmable logic circuit is provided with a plurality of such logic cells 31. In addition, the number of basic logic circuits within the logic cell 31 is not limited to four. Moreover, it is possible to omit a part of the inverter circuit.

Figure 20:
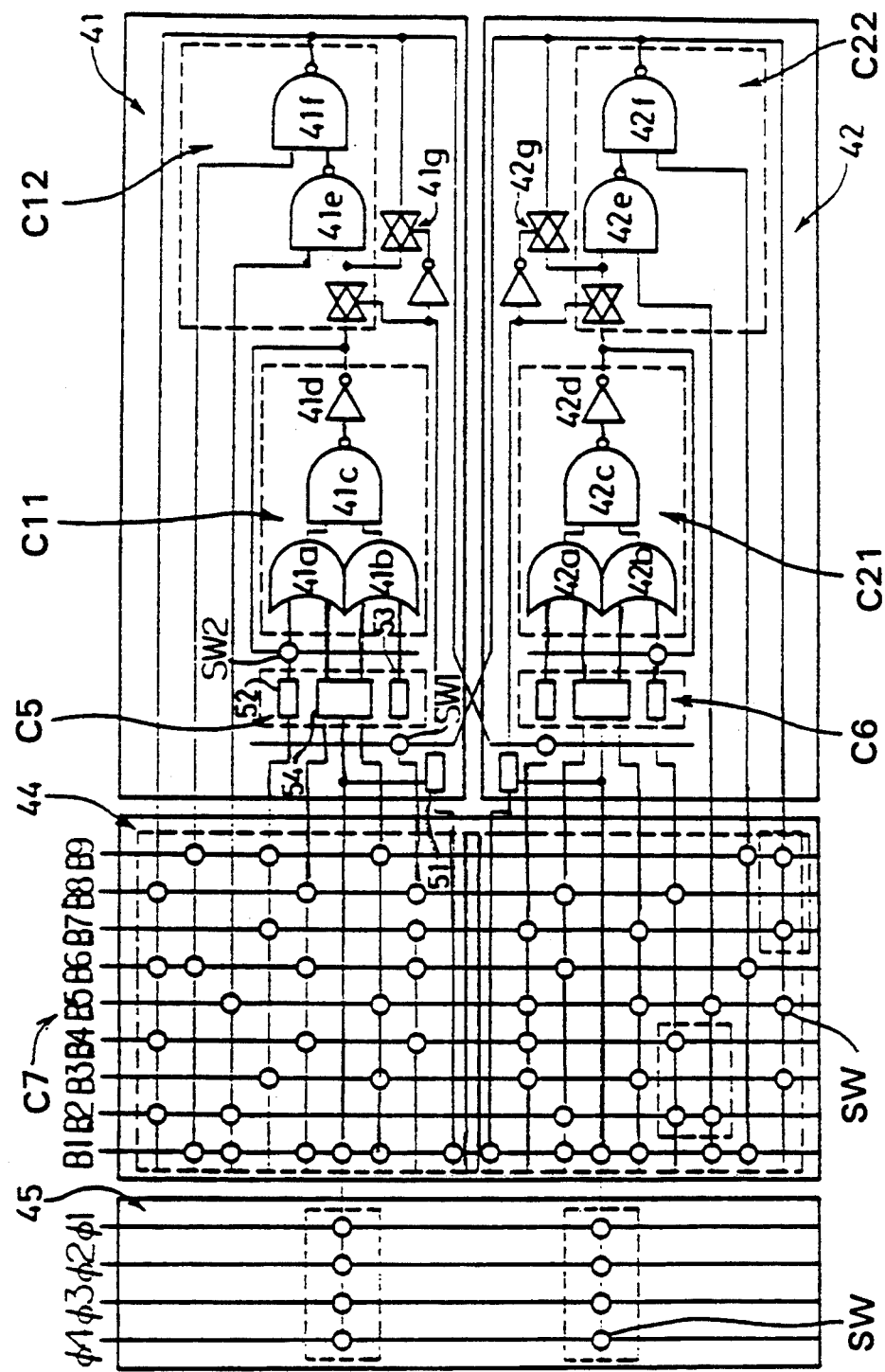
FIG. 20 is a circuit diagram showing the structure of a logic cell which forms an essential part of the fifth embodiment of the programmable logic circuit.

FIG. 20 shows an embodiment of the structure of the logic cell 31 shown in FIG. 19. In FIG. 20, a sub block 41 includes the basic logic circuits C11 and C12 and the inverter circuit C5, and corresponds to the partial circuit 2 shown in FIG. 2. A sub block 42 includes the basic logic circuits C21 and C22 and the inverter circuit C6, and corresponds to the partial circuit 2 shown in FIG. 2. The basic logic circuit C11 includes OR circuits 41a and 41b, an AND circuit 41c and an inverter circuit 41d which are connected as shown. The basic logic circuit C12 includes NAND circuits 41e and 41f and a switching circuit 41g which are connected as shown. In this embodiment, the switching circuit 41g is regarded as a part of the basic logic circuit C12 for the sake of convenience, however, the switching circuit 41g may be regarded as a part of the basic logic circuit C11, for example. Similarly, the basic logic circuit C21 includes OR circuits 42a and 42b, an AND circuit and an inverter circuit 42d which are connected as shown. The basic logic circuit C22 includes NAND circuits 42e and 42f and a switching circuit 42f which are connected as shown. In this embodiment, the switching circuit 42g is regarded as a part of the basic logic circuit C22 for the sake of convenience, however, the switching circuit 42g may be regarded as a part of the basic logic circuit C21, for example. The switching circuits 41g and 42g respectively include two switching elements and one inverter.

The inverter circuits C5 and C6 respectively include programmable inverters. The programmable inverter may have the structure described above in conjunction with FIG. 14. The inverter circuit may be provided at the input side and/or the output side of an arbitrary sub block. Further, the inverter circuit may be provided only with respect to one ore more arbitrary signal lines of the sub block.

In this embodiment, the input/output path B includes two output signal lines and fourteen input signal lines, that is, a total of sixteen signal lines. The outputs of the sub blocks 41 and 42 are connected to the output signal lines of the input/output path B. The switching circuit C7 includes a local signal distributor 44 and a global signal distributor 45. The local signal distributor 44 and the global signal distributor 45 respectively include a plurality of programmable switches SW which are indicated by circular marks in FIG. 20. In the local signal distributor 44, one or a plurality of programmable switches SW are provided with respect to each signal line of the input/output path B. On the other hand, in the global signal distributor 45, a plurality of programmable switches SW are provided with respect to specific input signal lines (two input signal lines in this embodiment) of the input/output path B.

The local signal distributor 44 is provided with respect to local signal lines S1 through S9, so as to exchange signals with neighboring logic cells. In other words, the local signal distributor 44 is used to select the signal to be applied to the sub block 41. The programmable switches SW within the local signal distributor 44 are arranged at positions such that each of the sub blocks 41 and 42 can easily realize the combinational logic circuits which are frequently used when designing the programmable logic circuit.

The global signal distributor 45 is provided with respect to global signal lines $\phi 1$ through $\phi 4$, so as to connect the global signal lines $\phi 1$ through $\phi 4$ to the sub blocks 41 and 42. The programmable switches SW within the global signal distributor 45 are arranged at positions such that one or a plurality of specific input lines of the input/output path B can be connected to each of the global signal lines $\phi 1$ through $\phi 4$. Of course, it is possible to provide the programmable switches SW within the global signal distributor 45 only with respect to arbitrary one or ones of the global signal lines $\phi 1$ through $\phi 4$.

Each of the basic logic circuits C11, C12, C21 and C22 have a path which can feed back the output thereof to the input thereof via the programmable switch SW. Accordingly, each of the basic logic circuits C11, C12, C21 and C22 can function as sequential logic circuits by turning ON the programmable switches SW associated therewith. For this reason, the sub block 41 which includes the basic logic circuits C11 and C12 and the sub block 42 which includes the basic logic circuits C21 and C22 can both function as sequential logic circuits. In addition, if the basic logic circuits C11 and C12 within the sub block 41 and the basic logic circuits C21 and C22 within the sub block 42 are made to function as sequential logic circuits and reference signals having mutually different phases are applied to the basic logic circuits C11, C12, C21 and C22, it is possible to realize a master-slave type sequential logic circuit.

In this embodiment, each sub block includes two basic logic circuits. However, each sub block may include only one basic logic circuit as in the first embodiment, or include three or more basic logic circuits.

As may be readily understood from the description given heretofore, each of the basic logic circuits C11, C12, C21 and C22 are formed by a combination of two or more circuits selected from AND, NAND, OR and NOR circuits. In addition, in either case where the logic of the input signals of the basic logic circuit is inverted or not inverted, the circuits which may be selected to form each basic logic circuit in a simplified form are an AND-OR circuit, an OR-AND circuit, an AND-NOR circuit and an OR-NAND circuit. This may be proven by the following Lemmata 3 and 4.

(Lemma 3)

In either case where the logic of the input signals of the basic logic circuit is inverted or not inverted, the circuits which may be selected to form the basic logic circuit in a simplified form are an AND-OR circuit, an OR-AND circuit, an AND-NOR circuit and an OR-NAND circuit.

(Proof 3)

If it is assumed that "in either case where the logic of the input signals of the basic logic circuit is inverted or not inverted, the circuits which may be selected to form the basic logic circuit in a simplified form are other than an AND-OR circuit, an OR-AND circuit, an AND-NOR circuit and an OR-NAND circuit", the simplified form of the circuits which form the basic logic circuit would all be a single stage combinational logic circuit having multiple inputs and a single output such as a NAND circuit, an AND circuit, an OR circuit and a NOR circuit. Accordingly, it becomes impossible to describe an exclusive-OR or an exclusive-NOR by a single logic cell. For this reason, it is necessary that "in either case where the logic of the input signals of the basic logic circuit is inverted or not inverted, the circuits which may be selected to form the basic logic circuit in a simplified form are an AND-OR circuit, an OR-AND circuit, an AND-NOR circuit and an OR-NAND circuit".

(Lemma 4)

If in either case where the logic of the input signals of the basic logic circuit is inverted or not inverted, the circuits which may be selected to form each basic logic circuit in a simplified form are an AND-OR circuit, an OR-AND circuit, an AND-NOR circuit and an OR-NAND circuit, it is possible to form all of the sequential logic circuits shown in FIG. 12.

(Proof 4)

(A) If the circuits in the simplified form are an AND-OR circuit, an OR-AND circuit, an AND-NOR circuit and an OR-NAND circuit, the logic circuits which invert the logic of all input signals of the basic logic circuit all become one of (1) a NOR-OR circuit, (2) a NOR-NOR circuit, (3) a NAND-AND circuit and (4) a NAND-NAND circuit. In the cases (1) and (3), the logic of the output signals of the basic logic circuit is also inverted. Therefore, it is evident that "if in either case where the logic of the input signals of the basic logic circuit is inverted or not inverted, the circuits which may be selected to form the basic logic circuit in a simplified form are an AND-OR circuit, an OR-AND circuit, an AND-NOR circuit and an OR-NAND circuit, it is possible to form all of the sequential logic circuits shown in FIG. 12". In addition, in FIG. 12, it is of course possible to replace the NAND circuit by a NOR circuit.

(B) Furthermore, if the circuits in the simplified form are an AND-OR circuit, an OR-AND circuit, an AND-NOR circuit and an OR-NAND circuit, it is possible to form a D flip-flop by inverting the logic of desired input signals of the basic logic circuit and providing a feedback path. Hence, when the two D flip-flops formed in this manner are denoted by Fa and Fb, the sequential logic circuit which is formed becomes a master-slave type flip-flop if the output end of the D flip-flop Fa is connected to the input end of the D flip-flop Fb, a reference signal $\phi$ is applied to the D flip-flop Fa and an inverted reference signal $\phi^*$ is applied to the D flip-flop Fb.

In FIG. 20, the structure of the inverter circuits C5 and C6 is not limited to that shown in FIG. 14. For example, in the embodiment shown in FIG. 20, each of the inverter circuits C5 and C6 are made up of selectors 51, 52 and 53, a selective inverting circuit 54, and switches SW1 and SW2 which are connected as shown.

Figure 21:
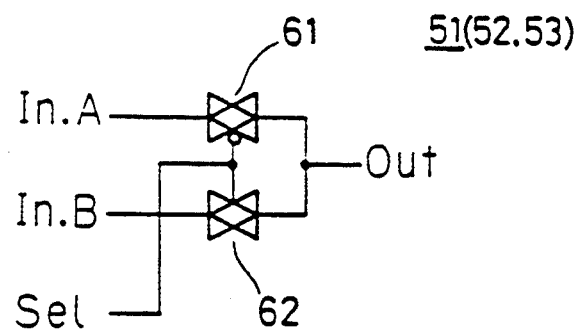
FIG. 21 is a circuit diagram showing an embodiment of a selector.

FIG. 21 shows an embodiment of the structure of the selector 51. The selectors 52 and 53 may have the same structure as the selector 51. The selector 51 includes switching elements 61 and 62 which are connected as shown in FIG. 21. Input signals In.A and In.B are respectively applied to the switching elements 61 and 62, and output ends of the switching elements 61 and 62 are connected to output an output signal Out. A control signal Sel is applied to an inverting control terminal of the switching element 61 and to a non-inverting control terminal of the switching element 62.

Figure 22:
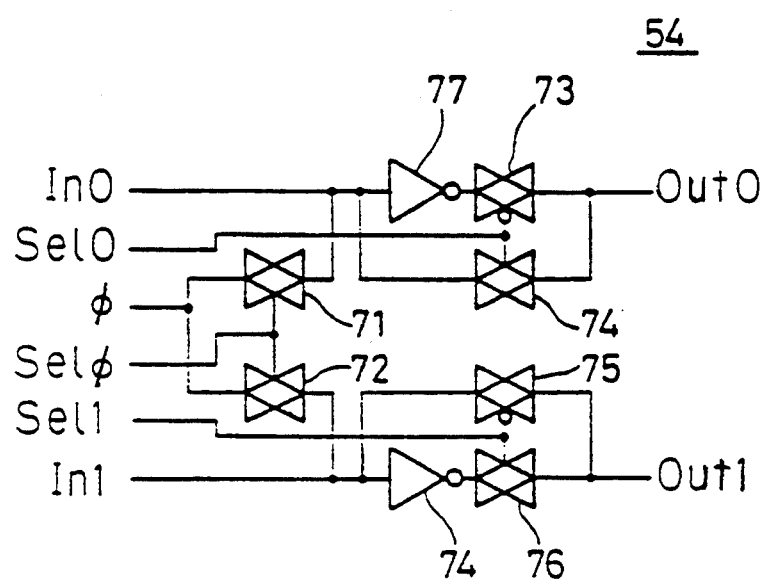
FIG. 22 is a circuit diagram showing an embodiment of a selective inverting circuit.

FIG. 22 shows an embodiment of the structure of the selective inverting circuit 54. The selective inverting circuit 54 includes switching elements 71 through 76 and inverters 77 and 78 which are connected as shown in FIG. 22. In this case, two input signals In0 and In1, one reference signal $\phi$ and three control signals Sel0, Sel1 and Sel2 are applied to the selective inverting circuit 54, and two output signals Out0 and Out1 are output from the selective inverting circuit 54 depending on the signals applied thereto.

The switches SW1 and SW2 may have the same structure as the programmable switches SW.

Figure 23:
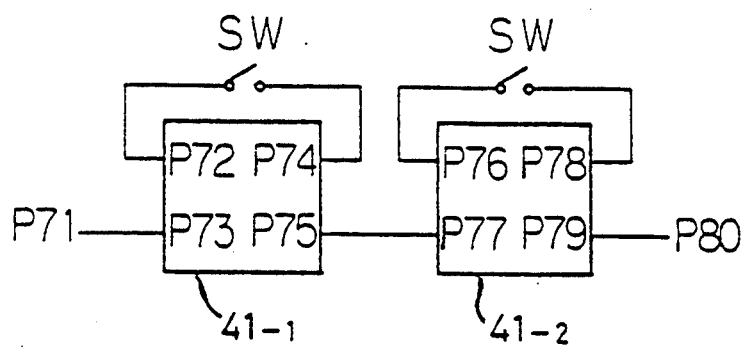
FIG. 23 is a circuit diagram showing a sixth embodiment of the programmable logic circuit according to the present invention which can realize a sequential logic circuit using a plurality of sub blocks.
Figure 24:
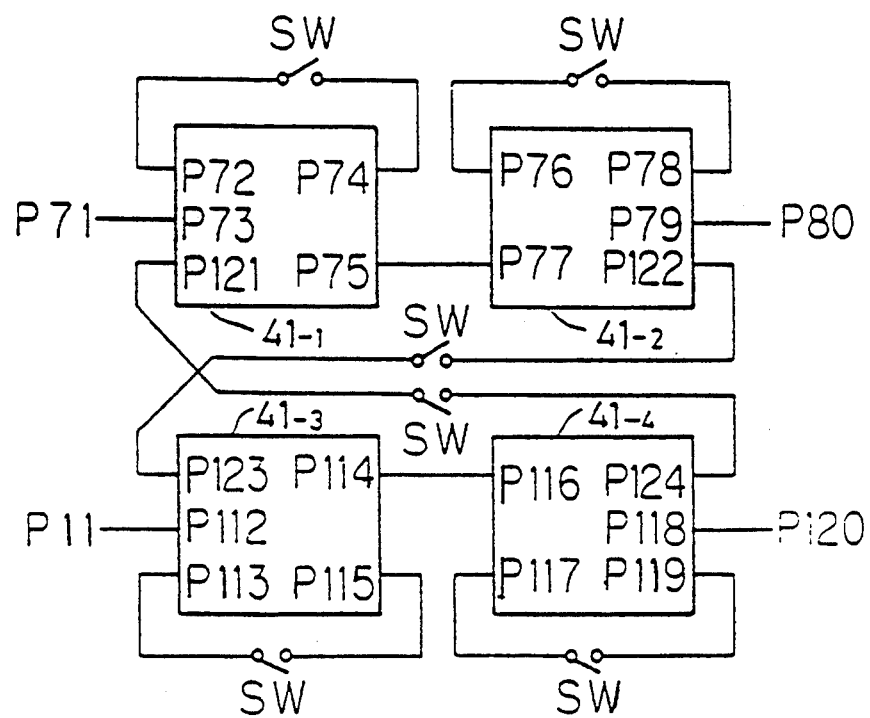
FIG. 24 is a circuit diagram showing a seventh embodiment of the programmable logic circuit according to the present invention which can realize a sequential logic circuit using a plurality of sub blocks.

FIGS. 23 and 24 respectively show sixth and seventh embodiments of the programmable logic circuit according to the present invention which can realize sequential logic circuits using a plurality of sub blocks 41.

The sixth embodiment of the programmable logic circuit shown in FIG. 23 includes two sub blocks 41-1 and 41-2 and two programmable switches SW which are connected as shown. This programmable logic circuit functions as a combinational logic circuit or a sequential logic circuit such as a flip-flop depending on the ON/OFF states of the programmable switches SW. In this embodiment, the programmable logic circuit is provided with one input terminal P71 and one output terminal P80. A programmable switch SW is provided between an input terminal P72 of the sub block 41-1 and an output terminal P74 of the sub block 41-1, and between an input terminal P76 of the sub block 41-2 and an output terminal P78 of the sub block 41-2. In addition, the input terminal P71 is connected to an input terminal P73 of the sub block 41-1, and an output terminal P79 of the sub block 41-2 is connected to the output terminal P80. Further, an output terminal P75 of the sub block 41-1 is connected to an input terminal P77 of the sub block 41-2.

The seventh embodiment of the programmable logic circuit shown in FIG. 24 includes four sub blocks 41-1 through 41-4 and six programmable switches SW which are connected as shown. This programmable logic circuit functions as a combinational logic circuit or a sequential logic circuit such as a flip-flop depending on the ON/OFF states of the programmable switches SW. In this embodiment, the programmable logic circuit is provided with two input terminals P71 and P111 and two output terminal P80 and P120. A programmable switch SW is provided between the input terminal P72 of the sub block 41-1 and the output terminal P74 of the sub block 41-1, between the input terminal P76 of the sub block 41-2 and the output terminal P78 of the sub block 41-2, between an input terminal P113 of the sub block 41-3 and an output terminal P115 of the sub block 41-3, between an input terminal P117 of the sub block 41-4 and an output terminal P119 of the sub block 41-4, between an input terminal P121 of the sub block 41-1 and an output terminal P124 of the sub block 41-4, and between an input terminal P123 of the sub block 41-3 and an output terminal P122 of the sub block 41-2.

In addition, the input terminal P71 is connected to the input terminal P73 of the sub block 41-1, and the input terminal P111 is connected to an input terminal P112 of the sub block 41-3. Further, the output terminal P75 of the sub block 41-1 is connected to the input terminal P80 of the sub block 41-2, and an output terminal P115 of the sub block 41-3 is connected to an input terminal P117 of the sub block 41-4. The output terminal P79 of the sub block 41-2 is connected to the output terminal P80, and an output terminal P118 of the sub block 41-4 is connected to the output terminal P120.

The ON/OFF states of each of the programmable switches SW of the switching circuit C7 can be controlled by various control methods. A description will hereunder be given of four typical control methods, by referring to FIGS. 25 through 28.

Figure 25:
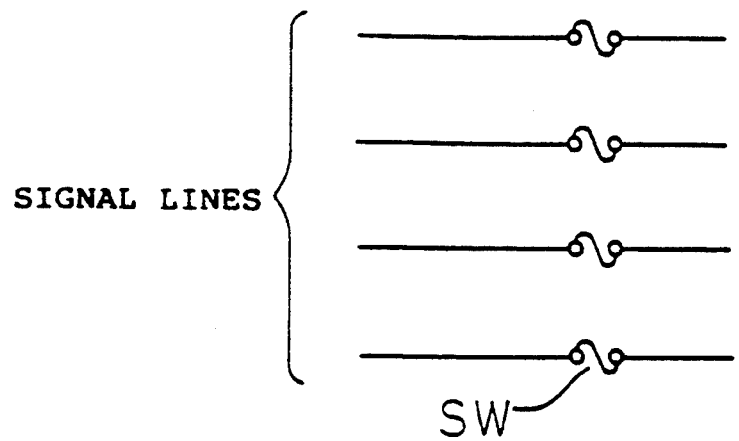
FIG. 25 is a diagram for explaining a first method of controlling programmable switches.

FIG. 25 is a diagram for explaining a first control method. In this case, each programmable switch SW itself is a fuse or anti-fuse. Accordingly, the ON/OFF state of each programmable switch SW is fixedly programmed by melting the fuse to make a disconnection or by melting the anti-fuse to make a short-circuit.

Figure 26:
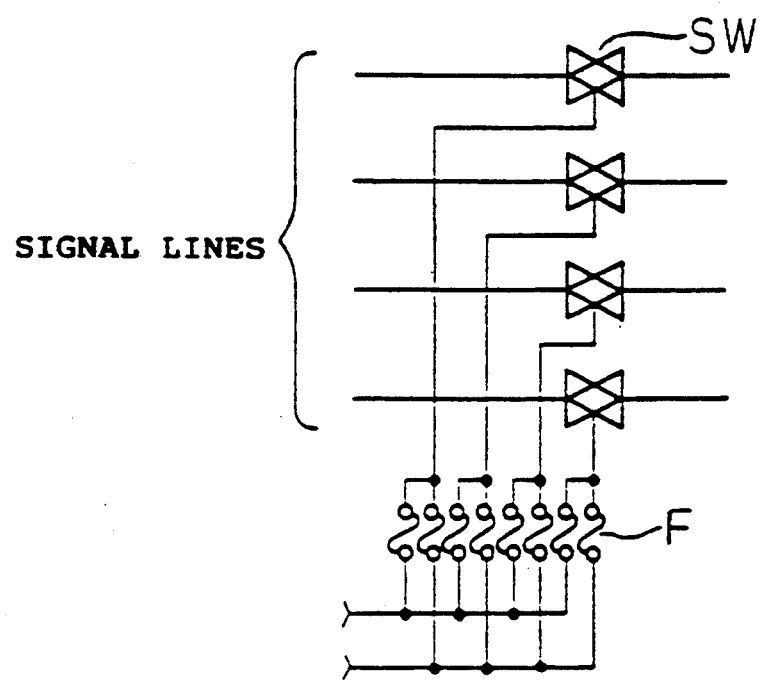
FIG. 26 is a diagram for explaining a second method of controlling the programmable switches.

FIG. 26 is a diagram for explaining a second control method. In this case, the ON/OFF state of each programmable switch SW is controlled by a signal which is received via a fuse or anti-fuse F. Hence, the ON/OFF state of each programmable switch SW is fixedly programmed.

Figure 27:
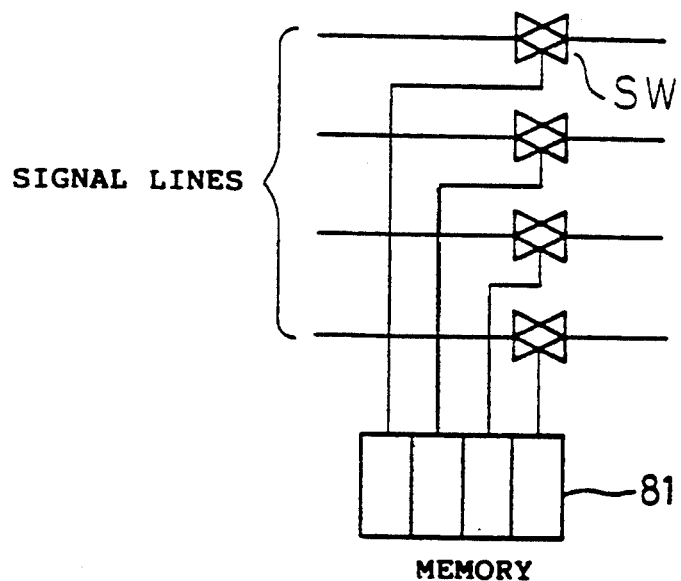
FIG. 27 is a diagram for explaining a third method of controlling the programmable switches.

FIG. 27 is a diagram for explaining a third control method. In this case, the ON/OFF state of each programmable switch SW is controlled by a signal from a corresponding bit of a memory 81. Hence, the ON/OFF state of each programmable switch SW can be programmed freely by rewriting the content of the memory 81.

Figure 28:
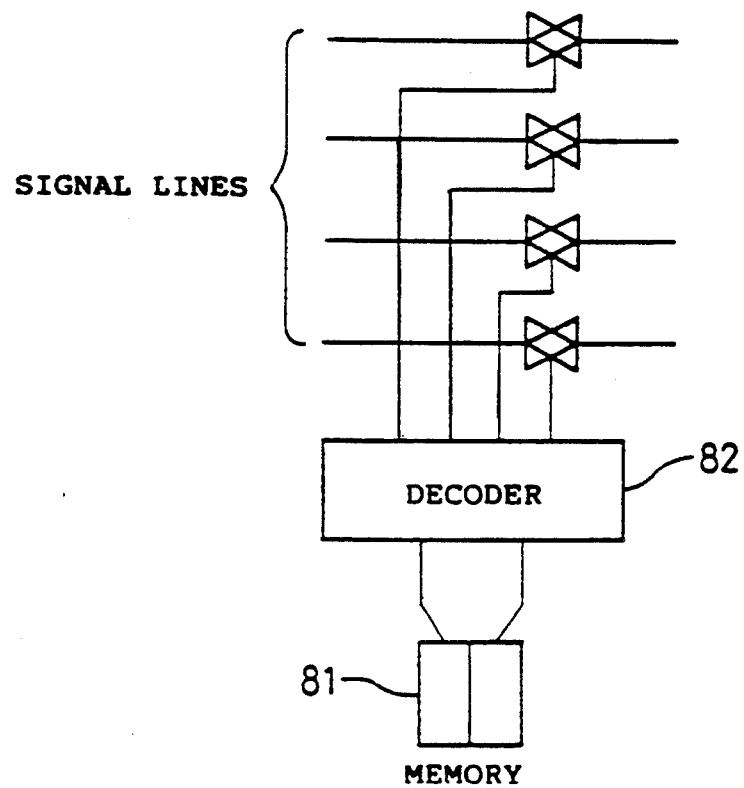
FIG. 28 is a diagram for explaining a fourth method of controlling the programmable switches.

FIG. 28 is a diagram for explaining a fourth control method. In this case, the ON/OFF state of each programmable switch SW is controlled by a signal output from a decoder 82 which decodes an output of the memory 81. Accordingly, the ON/OFF state of each programmable switch SW can also be programmed freely by rewriting the content of the memory 81. In addition, the number of bits of the memory 81 shown in FIG. 27 corresponds to the number of programmable switches SW, but in the case shown in FIG. 28, the same number of programmable switches SW can be controlled using the memory 81 having a smaller number of bits compared to the case shown in FIG. 27 because the decoder 82 is used in FIG. 28.

When employing the third or fourth control method described above, the memory 81 may be provided outside (that is, externally to) the programmable logic circuit or inside the programmable logic circuit.

Figure 29:
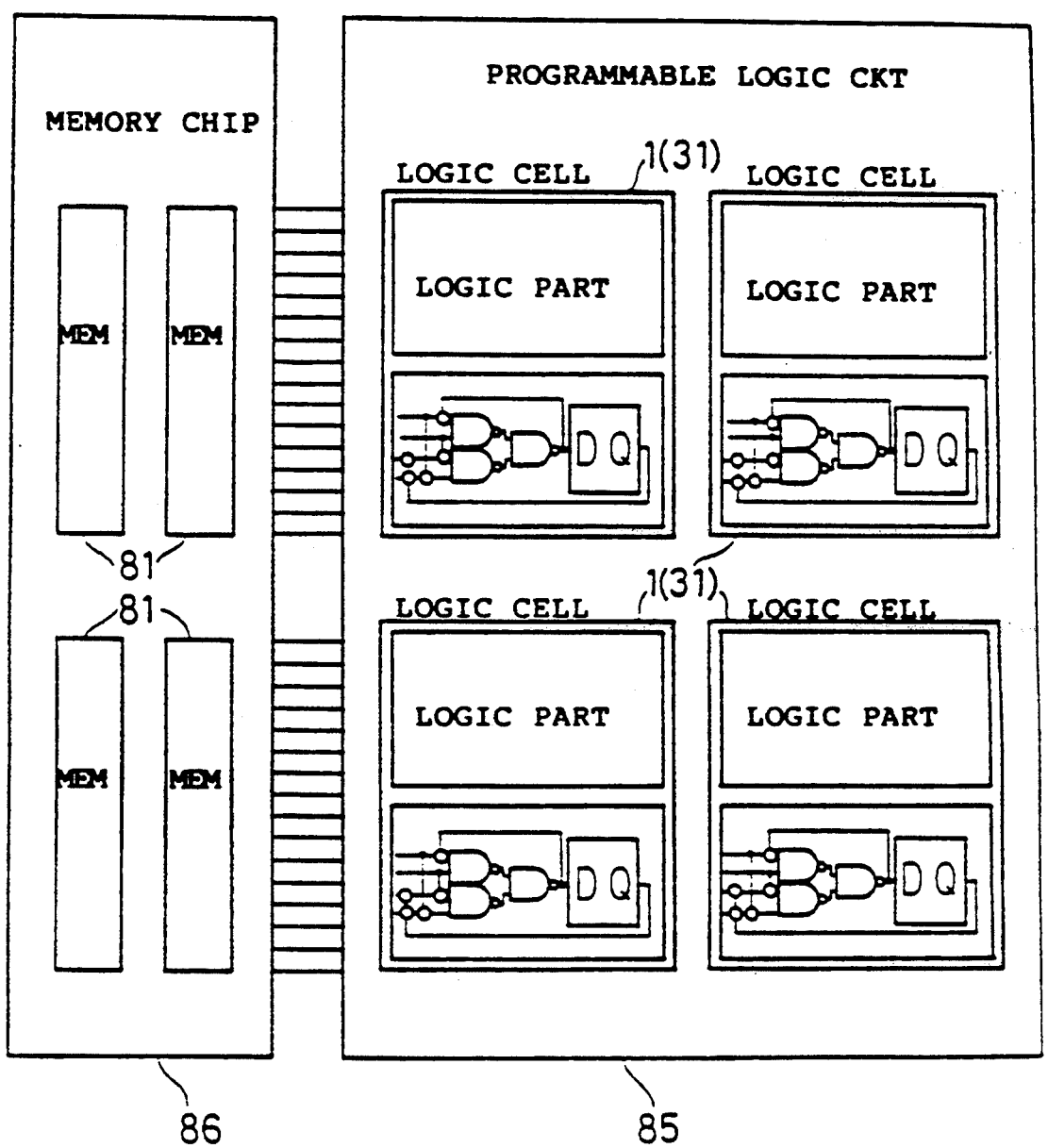
FIG. 29 is a plan view showing a case where memories are provided externally to the programmable logic circuit.

FIG. 29 shows a case where the memory 81 which is provided with respect to each logic cell 1 or 31 is provided outside a programmable logic circuit (FPGA) 85. In other words, each memory 81 is provided within an external memory chip 86 which is independent of the programmable logic circuit 85. Each memory 81 within the memory chip 86 is connected to a corresponding logic cell 1 or 31 within the programmable logic circuit 85.

Figure 30:
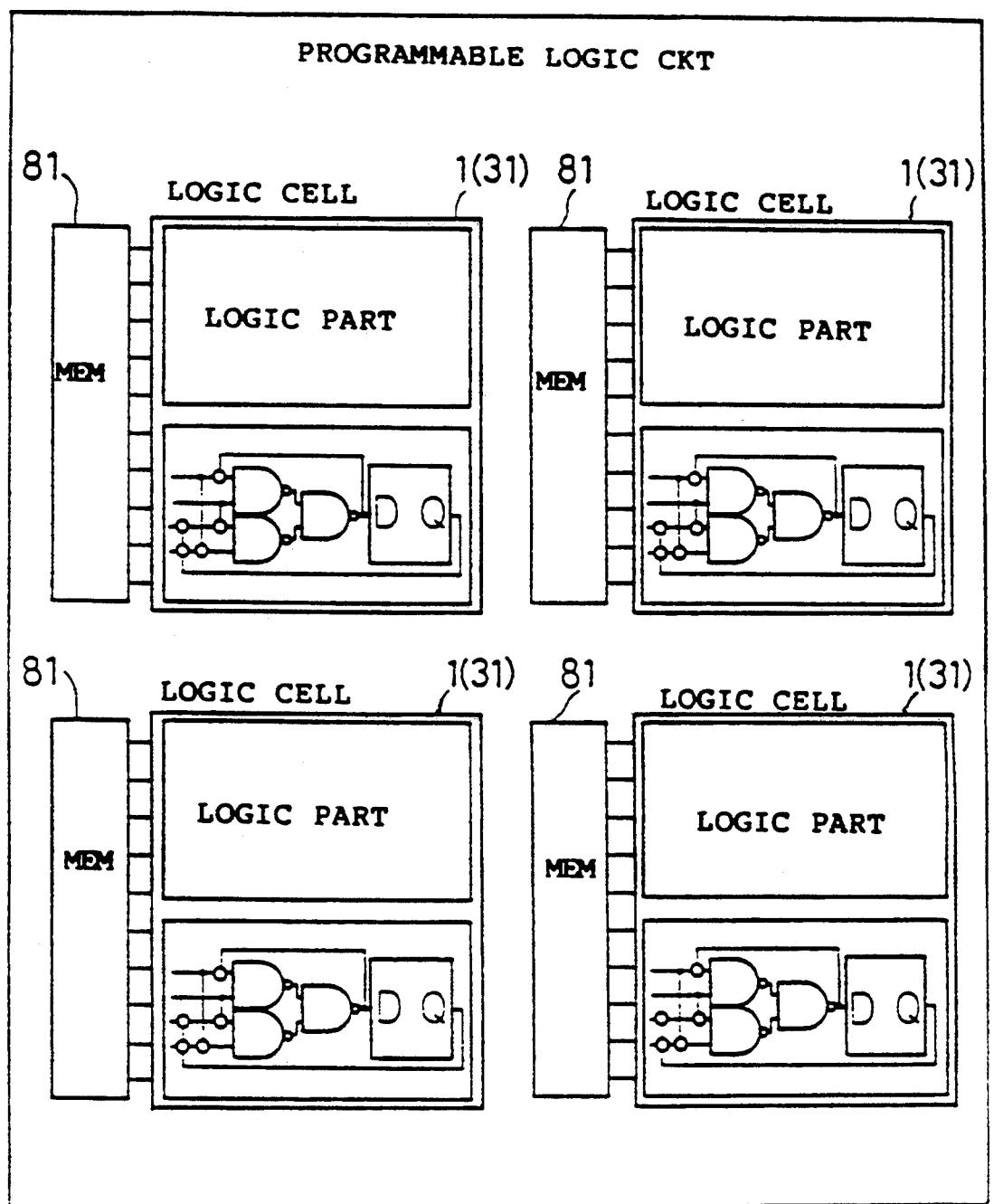
FIG. 30 is a plan view showing a case where the memories are provided inside the programmable logic circuit.

FIG. 30 shows a case where the memory 81 which is provided with respect to each logic cell 1 or 31 is provided inside the programmable logic circuit 85. In other words, each memory 81 is connected to the corresponding logic cell 1 or 31 within the programmable logic circuit 85.

Figure 31:
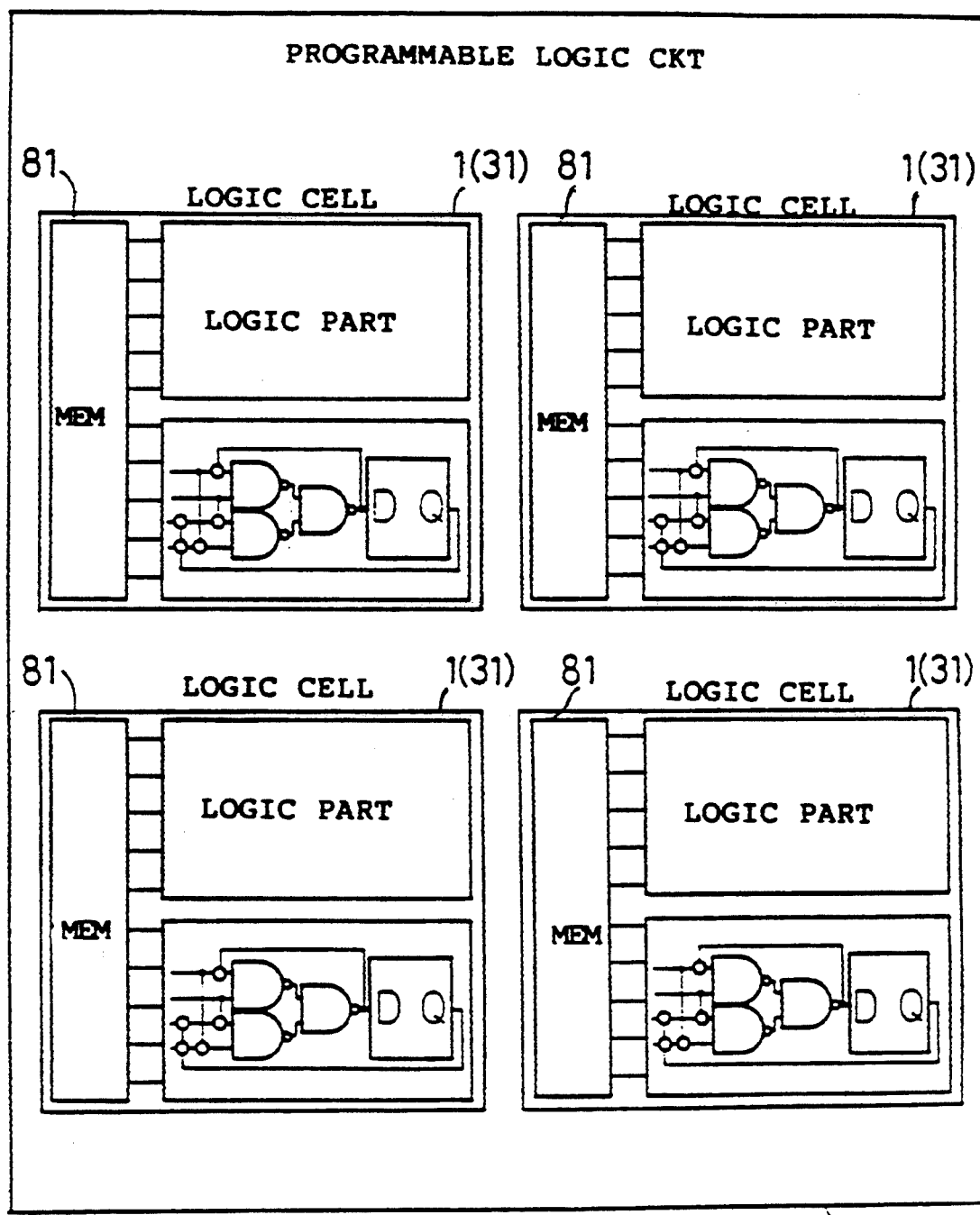
FIG. 31 is a plan view showing another case where the memories are provided within the programmable logic circuit.

FIG. 31 shows a case where the memory 81 which is provided with respect to each logic cell 1 or 31 is provided inside the programmable logic circuit 85. In this case, each memory 81 is provided within the corresponding logic cell 1 or 31 and is connected to a desired part of this logic cell 1 or 31.

If the number of programmable switches SW required to form the switching circuit C7 is denoted by N and the number of bits of the memory 81 required to control the ON/OFF states of all of the programmable switches SW is denoted by M, a relationship $M \geq \text{floor}(\log^2 N)$ always stands if an operation floor(F(x)) is defined as an operation which returns a minimum integer greater than or equal to the value F(x).

Figure 32:
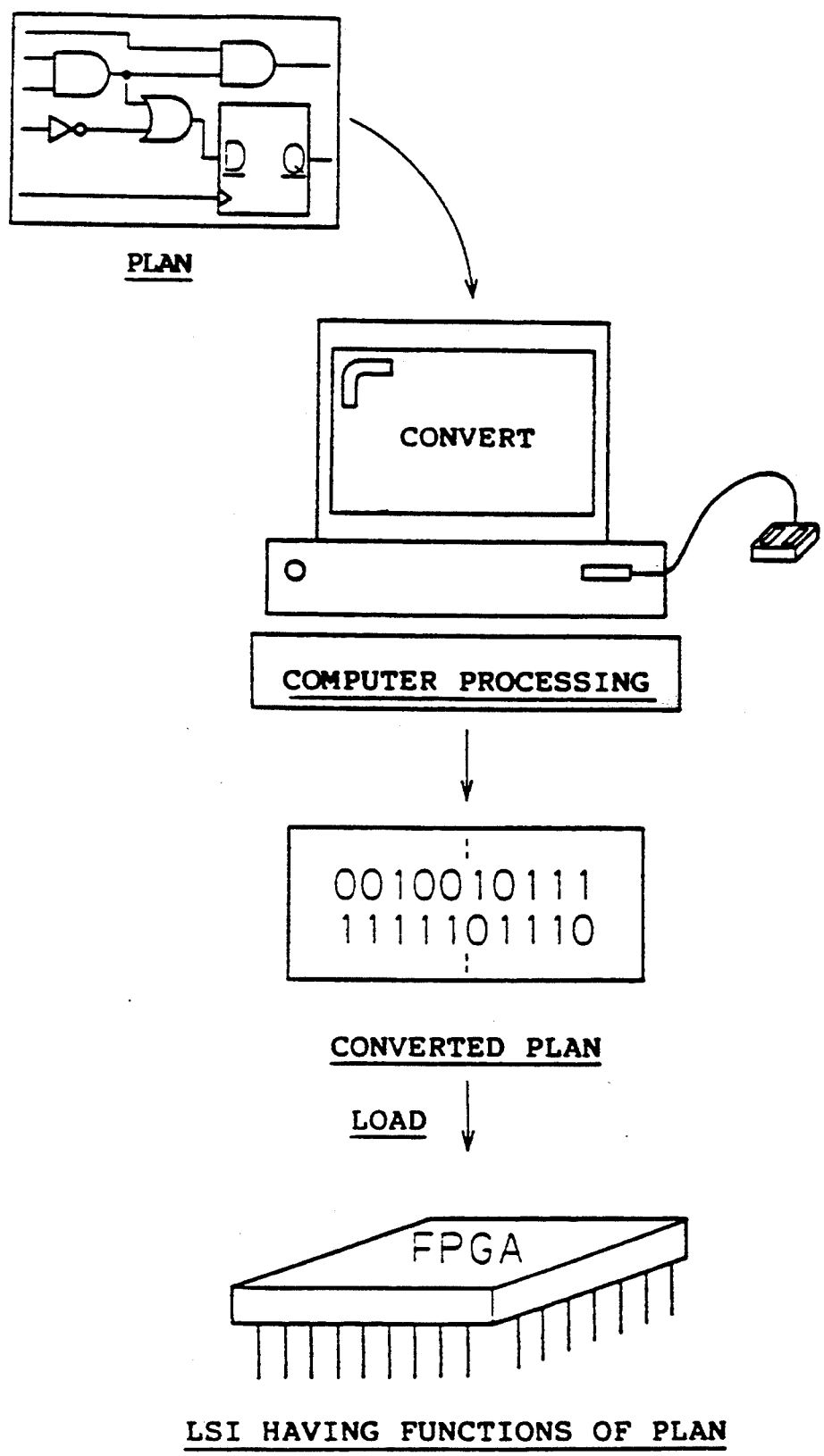
FIG. 32 is a diagram for explaining the determination of ON/OFF states of the programmable switches.

The value of each bit of the memory 81, that is, the ON/OFF state of each programmable switch SW, is determined as shown in FIG. 32. First, a plan of a desired logic circuit is made. Then, a computer processing is made based on this plan, and connections within the programmable logic circuit 85 for realizing the functions of the desired logic circuit are obtained. Next, the ON/OFF states of each of the programmable switches which are required to realize the obtained connections are determined, and data for realizing the determined ON/OFF states of these programmable switches SW are written into the memory 81.

Figure 33:
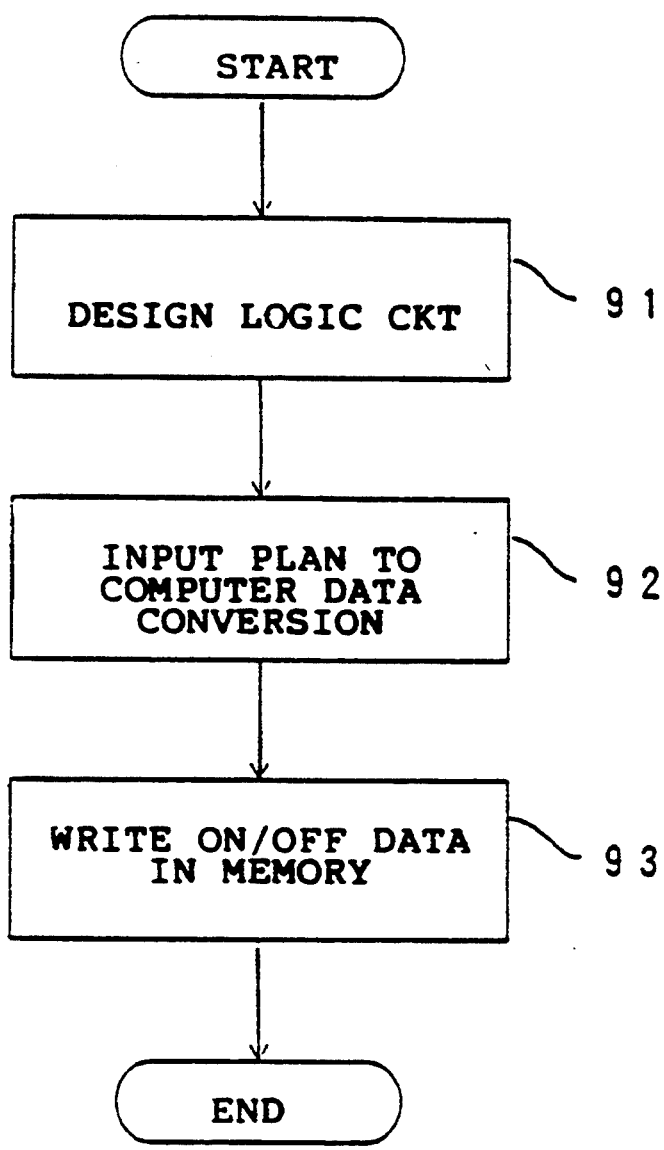
FIG. 33 is a flow chart for explaining a process of determining the ON/OFF states of the programmable switches.

These processes are shown in a flow chart in FIG. 33. In FIG. 33, a step 91 designs the desired logic circuit using an arbitrary design tool. A step S92 inputs the plan of the desired logic circuit to a computer, and converts the data of the plan into the data related to the ON/OFF states of the programmable switches SW within the programmable logic circuit 85. A step 93 writes the data related to the ON/OFF states of the programmable switches SW into the memory 81 which is inside or outside the programmable logic circuit 85, so as to carry out the programming so that the programmable logic circuit 85 functions as the desired logic circuit.

In order to freely connect the logic cells, it is necessary to increase the number of signal lines connecting the logic cells and to increase the number of programmable switches. However, as the numbers of signal lines and programmable switches become large, a large area is required on the chip of the programmable logic circuit in order to provide the input/output path. In addition if the number of programmable switches is large, the memory capacity required to store the data related to the ON/OFF states of the programmable switches becomes large, and consequently, a large number of memory cells must be provided. Accordingly, a description will next be given of an embodiment which can eliminate these problems.

Figure 34:
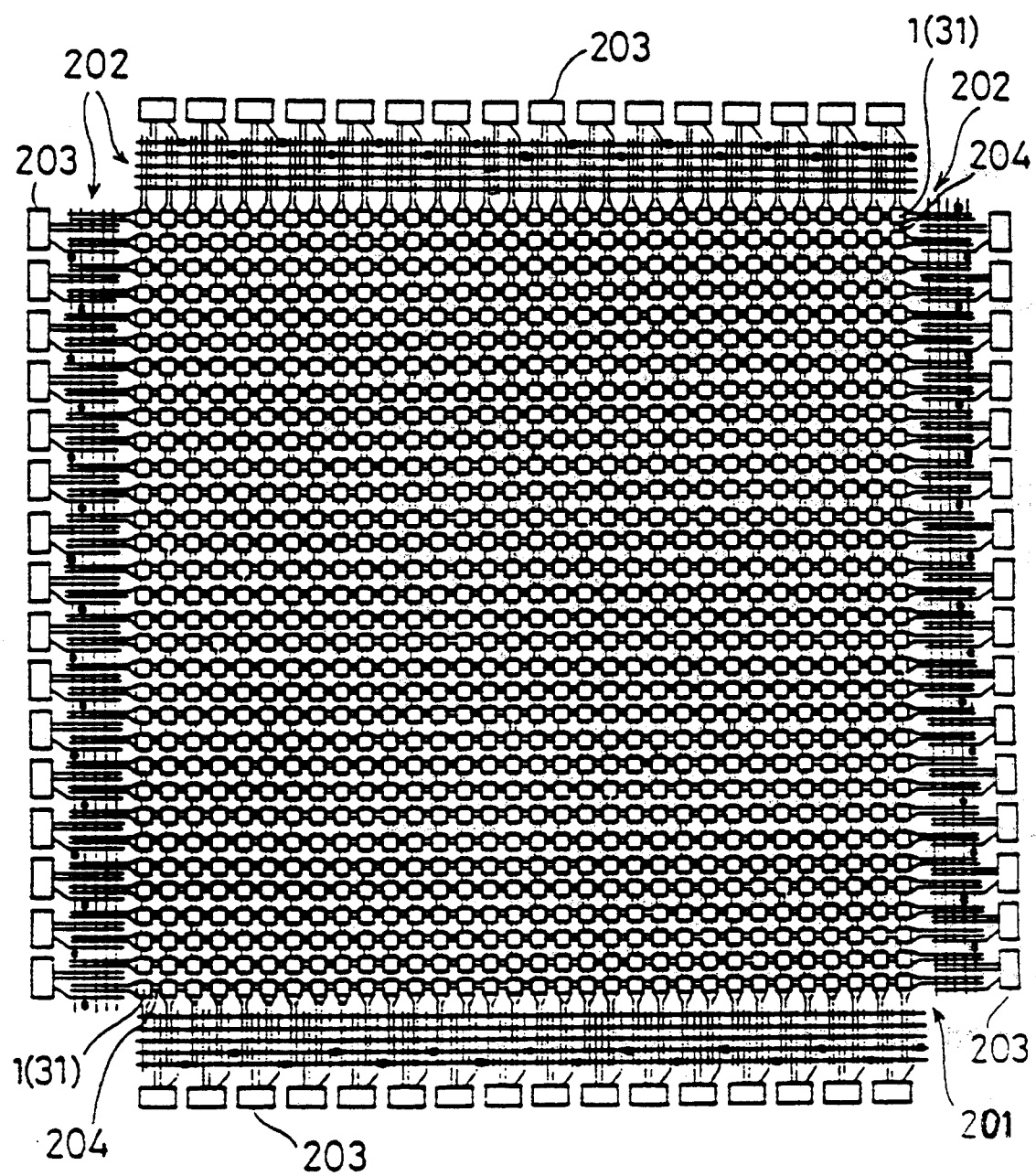
FIG. 34 is a plan view showing an eighth embodiment of the programmable logic circuit according to the present invention.

FIG. 34 is a plan view showing an eighth embodiment of the programmable logic circuit according to the present invention. In FIG. 34, $32 \times 32 = 1024$ logic cells 1 (or 31) are provided in a matrix arrangement within a cell region 201 at the central part of the programmable logic circuit. Two mutually adjacent logic cells 1 are connected via an inter-cell path 204 which includes two signal lines. Input/output paths 202 are provided on the outside of the cell region 201. The input/output path 202 includes two signal lines which respectively are constantly maintained to a fixed logic signal level, and a plurality of signal lines which are divided by a plurality of programmable switches SW. 16×4=64 input/output pads 203 are provided on the outside of the input/output paths 202.

If the signal transmitting direction of the input/output pads 203 is constant, the two signal lines having the fixed logic signal level are connected to the signal lines for controlling the signal transmitting direction of the input/output pads 203. The signal lines which are divided by the programmable switches SW are used to input the signals from the logic cells 1 to the input/output pads 203 or to input the signals from the input/output pads 203 to the logic cells 1. The signal lines for determining the signal transmitting direction of the input/output pads 203 are coupled to the two signal lines having the fixed logic signal level and to the plurality of signals lines which are divided by the programmable switches SW, via programmable switches SW. Other signal lines of the input/output pads 203 are coupled to the plurality of signal lines which are divided by the programmable switches SW, via programmable switches SW.

In other words, each logic cell 1 is a partial hardware corresponding to a minimum unit for realizing a certain function by hardware. Hence, all logic circuits can be realized by a combination of the logic cells 1. The logic cell 1 has the following three basic functions.

1) The logic cell 1 realizes various combinational logic circuits and sequential logic circuits such as a flip-flop which are frequently used when designing a logic circuit, by programming the logic cell 1;
2) The logic cell 1 outputs signals to the input/output paths 202; and
3) The logic cell 1 inputs signals from the input/output paths 202.

The input/output path 202 is a group of signal lines for exchanging signals between the logic cells 1 and the input/output pads 203. The signals which are input from outside the programmable logic circuit via the input/output pads 203 and the signals which are output outside the programmable logic circuit from the logic cells 1 all pass through the input/output path 202. In this embodiment, the input/output path 202 includes an arbitrary number of normal signal lines, and an arbitrary number of signal lines which are divided by the programmable switches SW. The input/output path 202 has the following four basic functions.

1) The input/output path 202 inputs the signals from the input/output pads 203;
2) The input/output path 202 outputs the signals to the input/output pads 203;
3) The input/output path 202 inputs the signals from the logic cells 1; and
4) The input/output path 202 outputs the signals to the logic cells 1.

The input/output pad 203 is a partial hardware for carrying out all input and output operations of the logic circuit. The input/output pad 203 has the following three basic functions.

1) The input/output pad 203 outputs to the input/output path 202 the signals which are received from outside the programmable logic circuit;
2) The input/output pad 203 outputs to the outside of the programmable logic circuit the signal which is output to the input/output path 202 from the logic cell 1; and
3) The input/output pad 203 carries out the operations 1) and 2) above simultaneously, while the signal transmitting direction is controlled by the signal which is output to the input/output path 202 from the logic cell 1.

In the case of the operations 1) and 2) above, the signal transmitting direction is constant. Hence, a direction control terminal of the input/output pad 203 is connected to the signal line which holds the logic signal level "1" or "0".

Figure 35A:
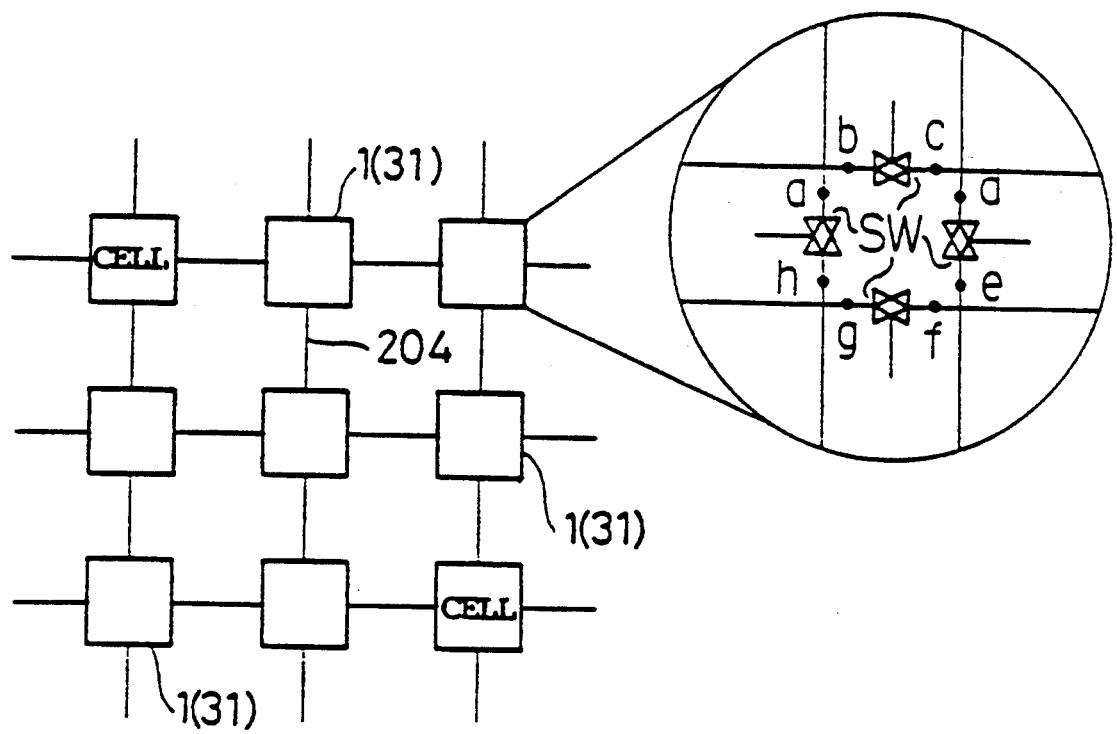
FIG. 35 in parts (a) and (b) is a diagram for explaining the connections between the logic cell and the inter-cell paths.
Figure 35B:
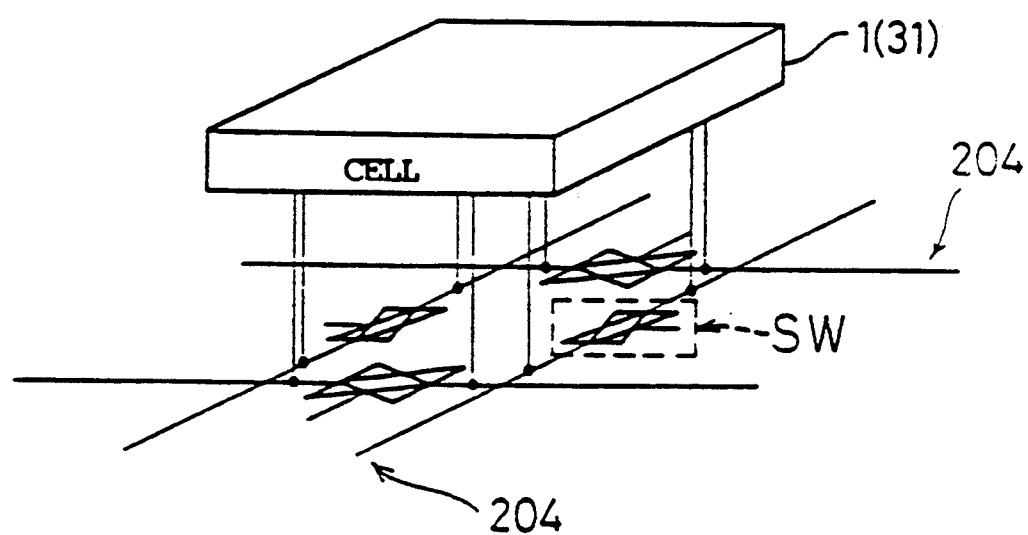

FIG. 35 is a diagram for explaining the connections of the logic cells 1 and the inter-cell paths 204. As shown on an enlarged scale on the right side of FIG. 35(a), each logic cell 1 is connected to an inter-cell path 204 extending in the vertical direction and to an inter-cell path 204 extending in the horizontal direction. The logic cell 1 is connected to the signal lines forming the inter-cell path 204 which extends in the vertical direction via nodes (or signal sample points) a, d, e and h, and is connected to the signal lines forming the inter-cell path 204 which extends in the horizontal direction via nodes b, c, f and g. A programmable switch SW is provided between the nodes a and h, between the nodes b and c, between the nodes d and e, and between the nodes f and g. The user determines whether to use the inter-cell path 204 provided between the logic cells 1 as a long-distance wiring or a short-distance wiring by programming these programmable switches SW. In other words, the nodes for making all signal inputs and outputs with respect to the logic cell 1 are provided on both sides of each programmable switch SW, and the logic cell 1 is provided above an intersecting part of the two inter-cell paths 204 which respectively extend in the vertical and horizontal directions, as indicated in a perspective view in FIG. 35(b).

Figure 36:
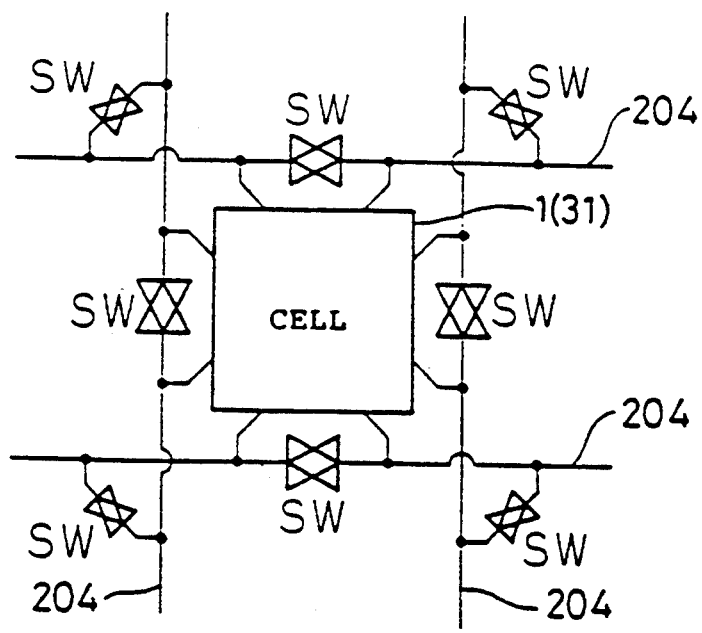
FIG. 36 is a circuit diagram showing the connection of the logic cell and the inter-cell paths including the programmable switches.

FIG. 36 shows the connections of the logic cell 1 and the inter-cell paths 204, including the programmable switches SW. As shown in FIG. 36, the signal lines forming the inter-cell path 204 which extends in the vertical direction are coupled to the signal lines forming the inter-cell path 204 which extends in the horizontal direction via the programmable switches SW. Hence, it is possible to connect the signal lines forming the inter-cell path 204 which extends in the vertical direction and the signal lines forming the inter-cell path 204 which extends in the horizontal direction.

Figure 37:
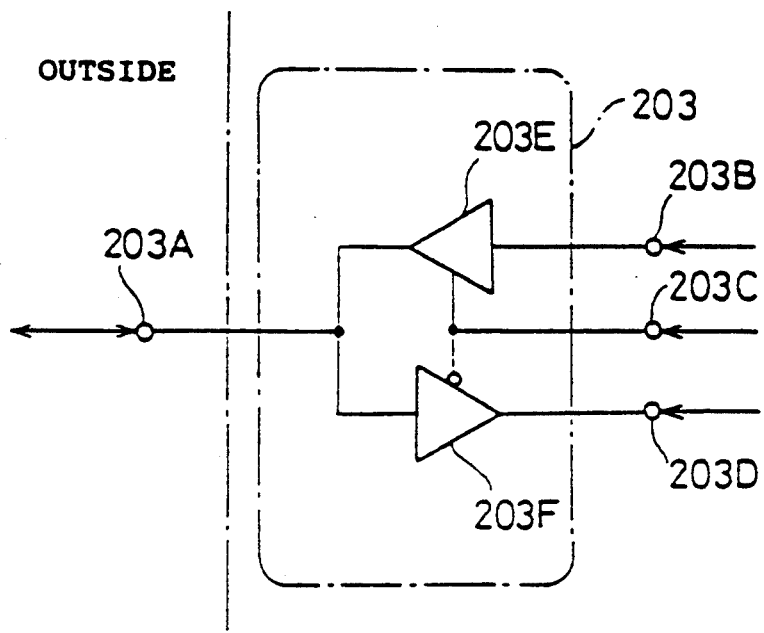
FIG. 37 is a circuit diagram showing an embodiment of an input/output pad.

FIG. 37 shows an embodiment of the input/output pad 203. The input/output pad 203 includes terminals 203A, 203B and 203C, and buffers 203E and 203F. The terminal 203A is connected to an input/output terminal of the programmable logic circuit. All signal inputs and outputs between the programmable logic circuit and the outside are made via this terminal 203A. An output of the buffer 203E is connected to the terminal 203A, and an input of the buffer 203E is connected to the terminal 203B. On the other hand, an input of the buffer 203F is connected to the terminal 203A, and an output of the buffer 203F is connected to the terminal 203D. A signal which is to be output outside the programmable logic circuit from the logic cell 1 is input to the terminal 203B. In addition, a signal which is to be input to the logic cell 1 from outside the programmable logic circuit is input to the terminal 203D. A control signal which determines the signal transmitting direction of the input/output pad 203 is supplied to the direction control terminal 203C of the input/output pad 203. This control signal is supplied as it is to the buffer 203E, and is inverted before being supplied to the buffer 203F. Hence, one of the buffer 203E and 203F is always ON while the other is OFF.

Next, a description will be given of embodiments of the input/output path 202 which connects the input/output pads 203 and the logic cells 1, by referring to FIGS. 38 through 40.

Figure 38:
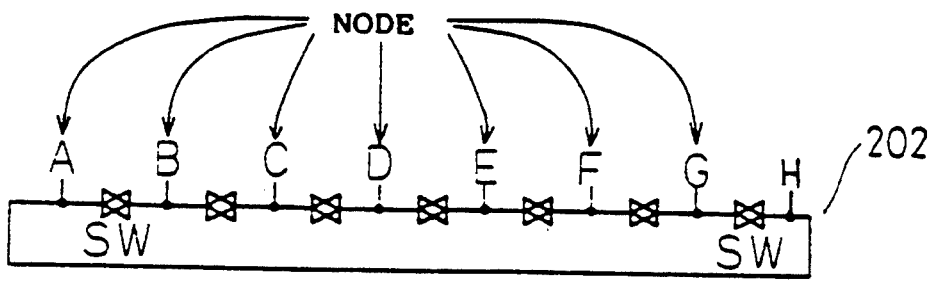
FIG. 38 is a diagram showing an embodiment of an input/output path.

In the embodiment shown in FIG. 38, a signal line which forms the input/output path 202 is provided in a loop shape, and a plurality of programmable switches SW are inserted in the loop. The terminals 203B, 203C and 203D of the input/output pad 203 are connected to arbitrary ones of nodes A, B, . . . Thus, it is possible to shorten the communication time between the nodes A and H, for example.

Figure 39:
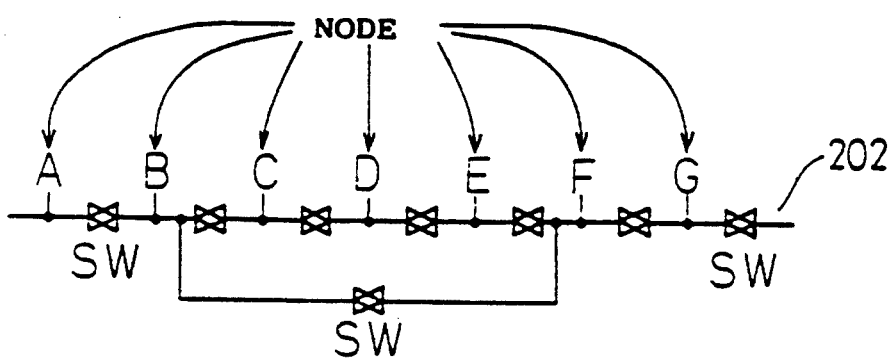
FIG. 39 is a diagram showing another embodiment of the input/output path.

In the embodiment shown in FIG. 39, a plurality of programmable switches SW are inserted in a signal line which forms the input/output path 202. In addition, a programmable switch SW is also inserted between the nodes B and F. The terminals 203B, 203C and 203D of the input/output pad 203 are connected to arbitrary ones of the nodes A, B, . . . Hence, it is possible to shorten the communication time between the nodes B and F, for example.

Figure 40:
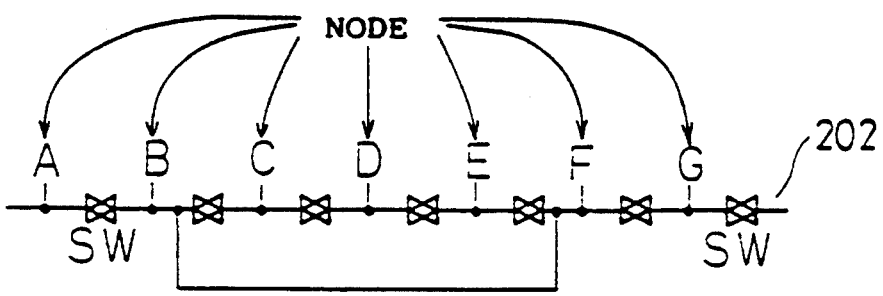
FIG. 40 is a diagram showing still another embodiment of the input/output path.

In the embodiment shown in FIG. 40, a plurality of programmable switches SW are inserted in a signal line which forms the input/output path 202. In addition, a fixed wiring is provided between the nodes B and F. The terminals 203B, 203C and 203D of the input/output pad 203 are connected to arbitrary ones of the nodes A, B, . . . Thus, it is possible to shorten the communication time between the nodes B and F, for example.

Figure 41:
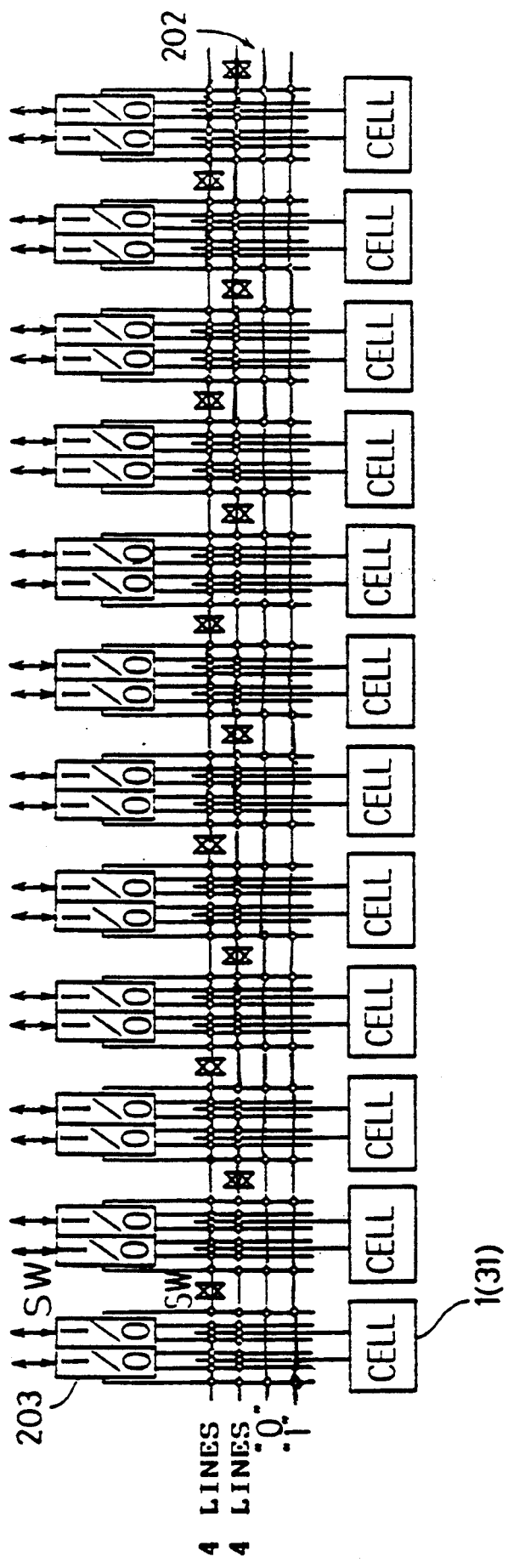
FIG. 41 is a diagram showing an essential part of a first embodiment of the connections between the input/output pads and the logic cells via the input/output path.

FIG. 41 shows an essential part of a first embodiment of the connections between the input/output pads 203 and the logic cells 1 by the input/output paths 202 shown in FIG. 38. In FIG. 41, the programmable switches SW connecting the input/output path 202, the input/output pad 203 and the logic cell 1 are indicated by a circular mark, while the programmable switches SW within the input/output path 202 is indicated by a symbol of a switching element. In this embodiment, four input/output pads 203 and two logic cells 1 are coupled between a pair of programmable switches SW which are provided in the input/output path 202.

Figure 42:
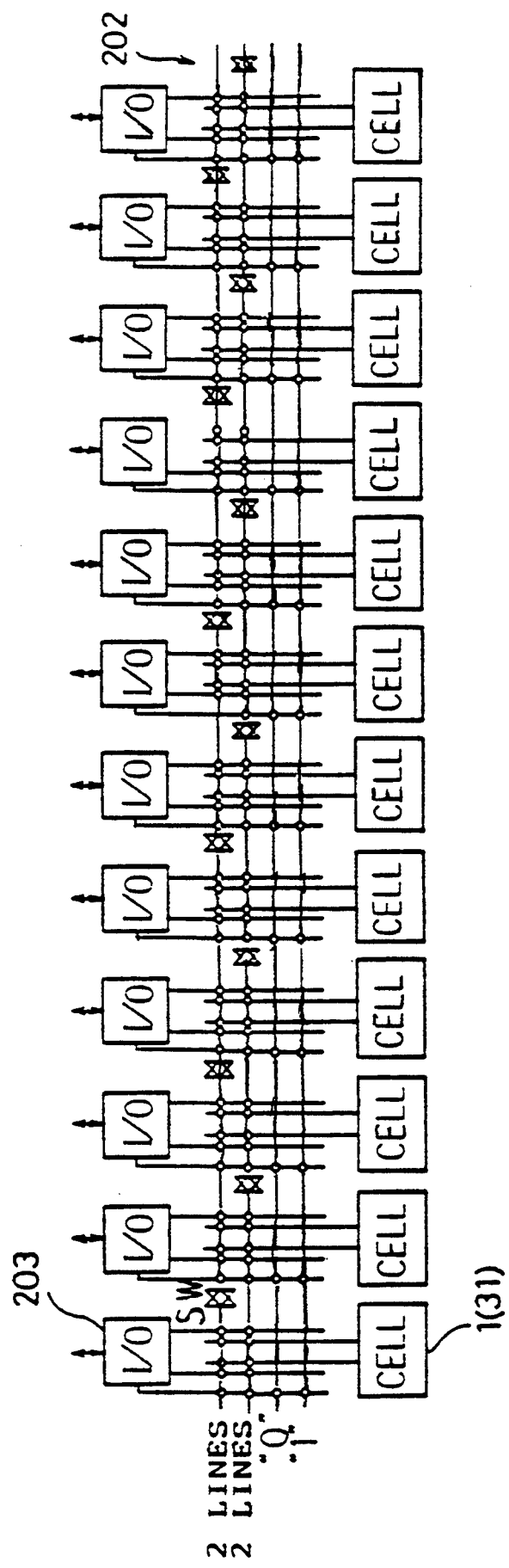
FIG. 42 is a diagram showing an essential part of a second embodiment of the connections between the input/output pads and the logic cells via the input/output path.

FIG. 42 shows an essential part of a second embodiment of the connections between the input/output pads 203 and the logic cells i by the input/output paths 202 shown in FIG. 38. In FIG. 42, the programmable switches SW connecting the input/output path 202, the input/output pad 203 and the logic cell i are indicated by a circular mark, while the programmable switches SW within the input/output path 202 is indicated by a symbol of a switching element. In this embodiment, two input/output pads 203 and two logic cells 1 are coupled between a pair of programmable switches SW which are provided in the input/output path 202.

Figure 43:
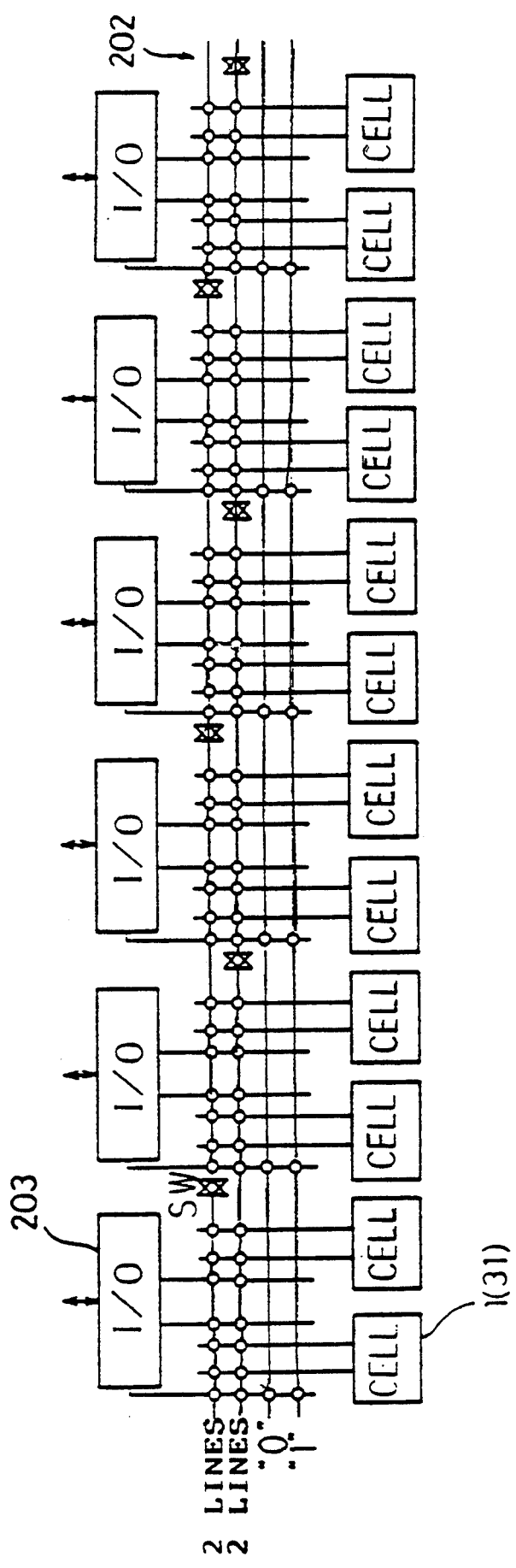
FIG. 43 is a diagram showing an essential part of a third embodiment of the connections between the input/output pads and the logic cells via the input/output path.

FIG. 43 shows an essential part of a third embodiment of the connections between the input/output pads 203 and the logic cells 1 by the input/output paths 202 shown in FIG. 38. In FIG. 43, the programmable switches SW connecting the input/output path 202, the input/output pad 203 and the logic cell 1 are indicated by a circular mark, while the programmable switches SW within the input/output path 202 is indicated by a symbol of a switching element. In this embodiment, two input/output pads 203 and four logic cells 1 are coupled between a pair of programmable switches SW which are provided in the input/output path 202.

Next, a description will be given of each embodiment of the inter-cell path 204, by referring to FIGS. 44 through 46. For the sake of convenience, it will be assumed that the sub block 11 of the logic cell has the structure shown in FIG. 7 and has four inputs and one output.

Figure 44:
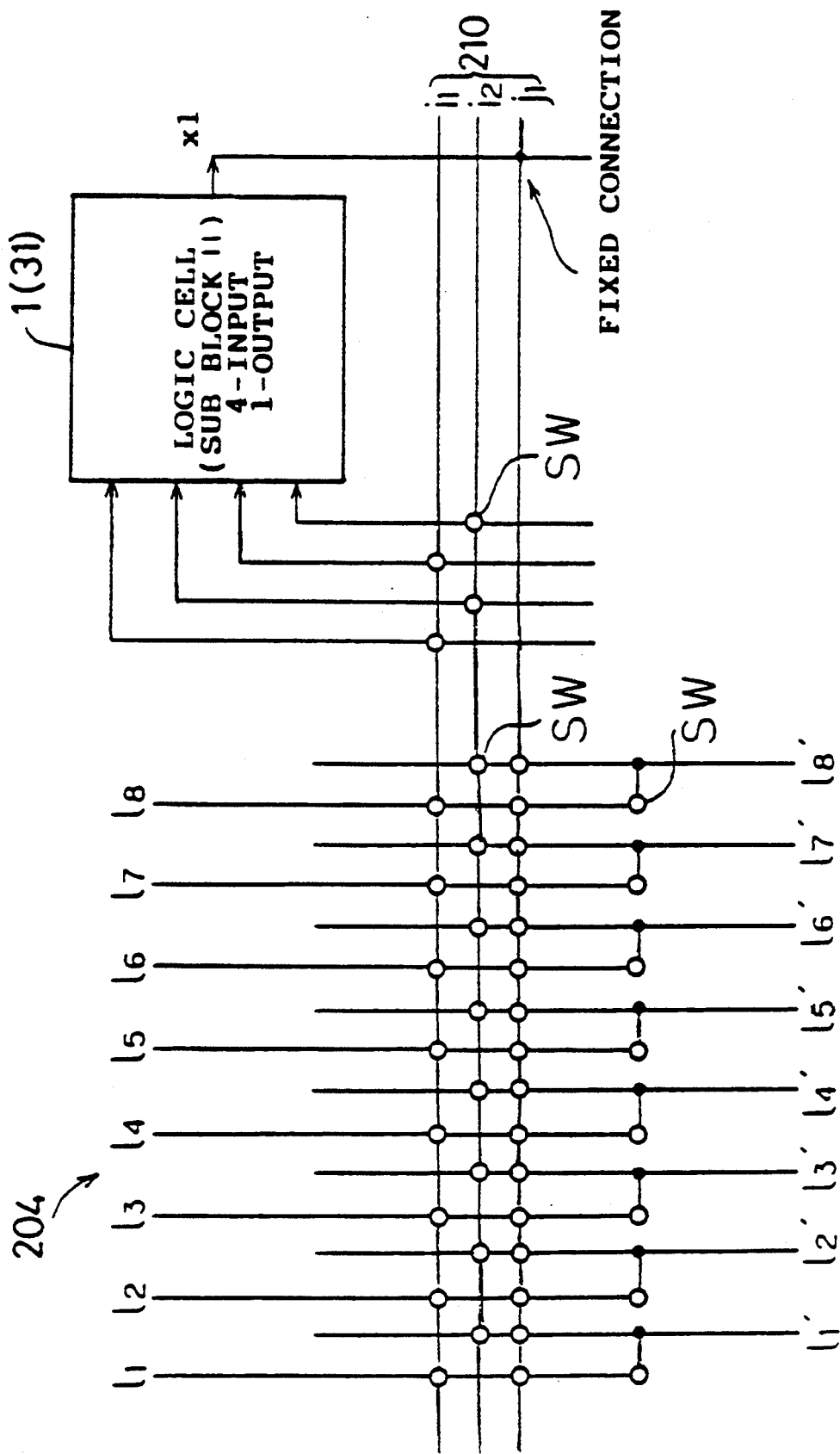
FIG. 44 is a diagram for explaining an embodiment of the inter-cell path.

In the embodiment shown in FIG. 44, mutual wirings 11 through 18 and 11' through 18' are coupled via the programmable switches SW in a shape of the teeth of a comb. For example, an internal bus 210 including three signal lines i1, i2 and j1 is coupled to the sub block 11 of the logic cell 1 via the programmable switches SW. More particularly, each input of the sub block 11 is coupled to at least one of the signal lines i1 and i2 of the internal bus 210 via the programmable switch SW. In addition, an output of the sub block 11 is fixedly connected to the signal line j1 of the internal bus 210, and the signal line j1 is coupled to each of the mutual wirings 11 through 18 and 11' through 18' of the inter-cell path 204 via the programmable switches SW. In this embodiment, a total of 44 ($=8+8+16+8+4$) programmable switches SW are provided, and each of the inputs and output of the sub block 11 can be connected to arbitrary ones of the mutual wirings 11 through 18 and 11' through 18' of the inter-cell path 204. In other words, a relationship $L \geq T+m$ stands, where L denotes the number of signal lines of the internal bus 210, T denotes the number of sum terms or product terms of the OR-AND representation within the sub block 11 of the logic cell 1, and m denotes the number of outputs of the sub block 11.

In the embodiment shown in FIG. 44, two OR circuits 11e and 11f are provided within the sub block 11, and the number of sum terms is "2", so that the above relationship is $L \geq 2+1=3$.

Figure 45:
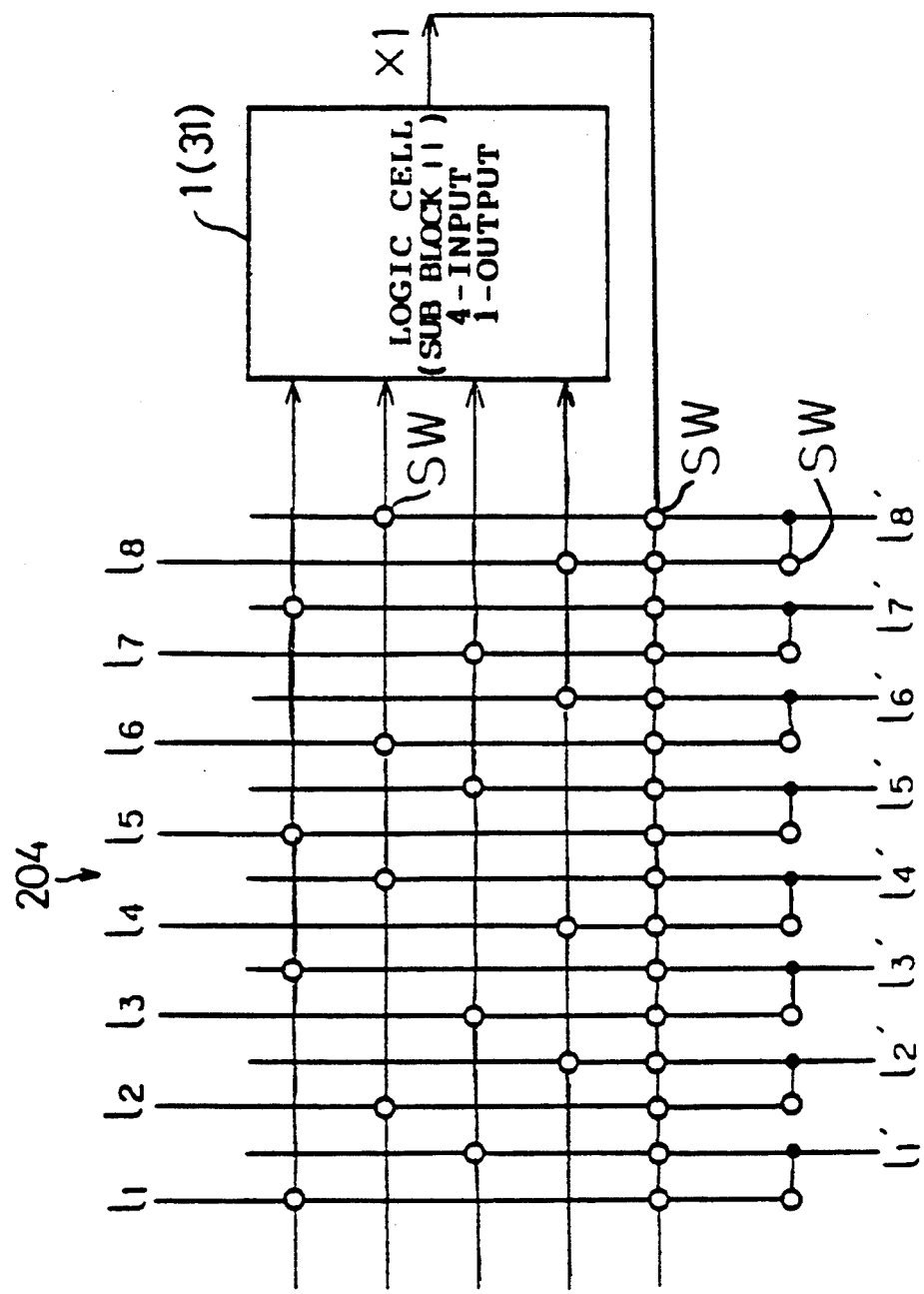
FIG. 45 is a diagram for explaining another embodiment of the inter-cell path.

In the embodiment shown in FIG. 45, mutual wirings 11 through 18 and 11' through 18' are coupled via the programmable switches SW in a shape of the teeth of a comb. No internal bus 210 is provided, and the output of the sub block 11 of the logic cell 1 is coupled to the inputs of the sub block 11 via one signal line and programmable switches SW. More particularly, each input of the sub block 11 is coupled to at least one of the mutual wirings 11 through 18 and 11' through 18' of the inter-cell path 204 via the programmable switches SW. Further, the output of the sub block 11 is coupled to each of the mutual wirings 11 through 18 and 11' through 18' via programmable switches SW. In this embodiment, a total of 40 ($=(4+4+4+4)+16+8$) programmable switches SW are provided, and each of the inputs and output of the sub block 11 can be connected to arbitrary ones of the mutual wirings 11 through 18 and 11' through 18' of the inter-cell path 204.

Figure 46:
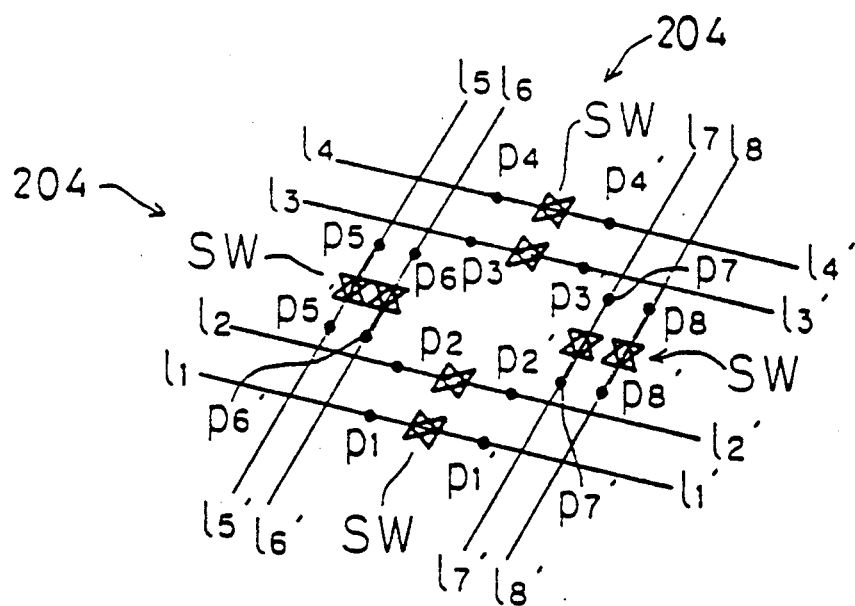
FIG. 46 is a perspective view showing the connection of each input of the sub block of the logic cell and each mutual wiring of the inter-cell path.

FIG. 46 is a perspective view showing the connections of each input of the sub block 11 shown in FIG. 45 and the mutual wirings 11 through 18 and 11' through 18'. Each input of the sub block 11 is connected to the mutual wirings 11 through 18 and 11' through 18' via respective nodes P1 through P8 and P1' through P8'.

Figure 47:
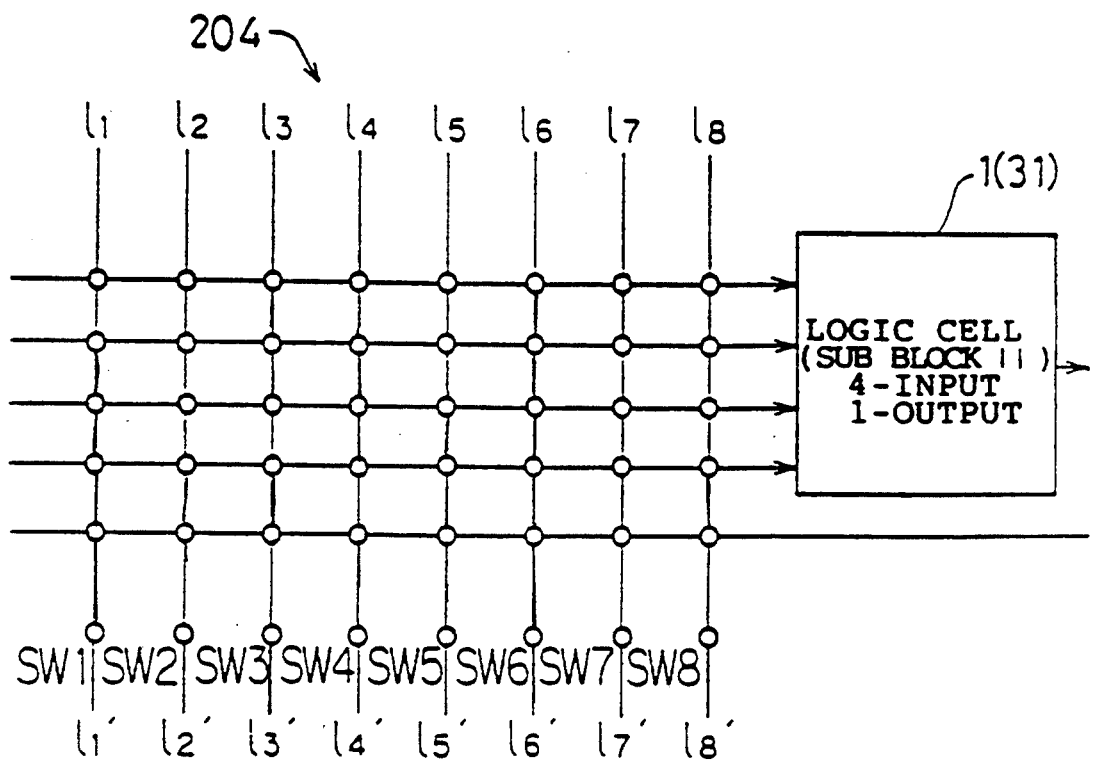
FIG. 47 is a diagram for explaining the connection of the sub block of the logic cell and the mutual wiring of the inter-cell path according to a bus wiring system.

If the sub block 11 of the logic cell 1 and the mutual wirings 11 through 18 and 11' through 18' of the inter-cell path 204 are connected according to the so-called bus wiring system, the programmable switch SW must be provided with respect to each input of the sub block 11 and each of the mutual wirings 11 through 18 and 11' through 18', as shown in FIG. 47. For this reason, 48 ($=8\times5+8$) programmable switches SW is required for the case shown in FIG. 47. However, the connection to the mutual wirings 11' through 18' can only be made via specific programmable switches SW1 through SW8.

On the other hand, the connections to the mutual wirings 11 through 18 and 11' through 18' can be made via the programmable switches more freely in the embodiments shown in FIGS. 44 and 45. In addition, the number of programmable switches SW required can be reduced compared to that required in the case shown in FIG. 47. Hence, the embodiments shown in FIGS. 44 and 45 can reduce the area occupied by the wirings (and programmable switches SW) which are required to mutually connect the logic cells 1. In the embodiment shown in FIG. 44, the input to the sub block 11 of the logic cell 1 is restricted by the use of the internal bus 210, but the embodiment shown in FIG. 45 does not introduce such a restriction. According to the embodiment shown in FIG. 45, the number of programmable switches SW which exist between the terminals of the logic cells 1 can be reduced compared to the case shown in FIG. 47, and the signal delay can be minimized by this embodiment.

In each of the embodiments described above, it was described that the programmable logic circuit is made up of a plurality of logic cells. However, it is not essential to make all of the logic cells have the structure described above. In other words, if the functions to be realized by the programmable logic circuit is known beforehand, a predetermined number of the conventional combinational logic cells and/or sequential logic cells may be provided in addition to the logic cells having the structure described above. In this case, since the number of combinational logic cells and/or sequential logic cells which is likely to be used is known beforehand, the utilization efficiency of the logic cells will not become poor.

Figure 48:
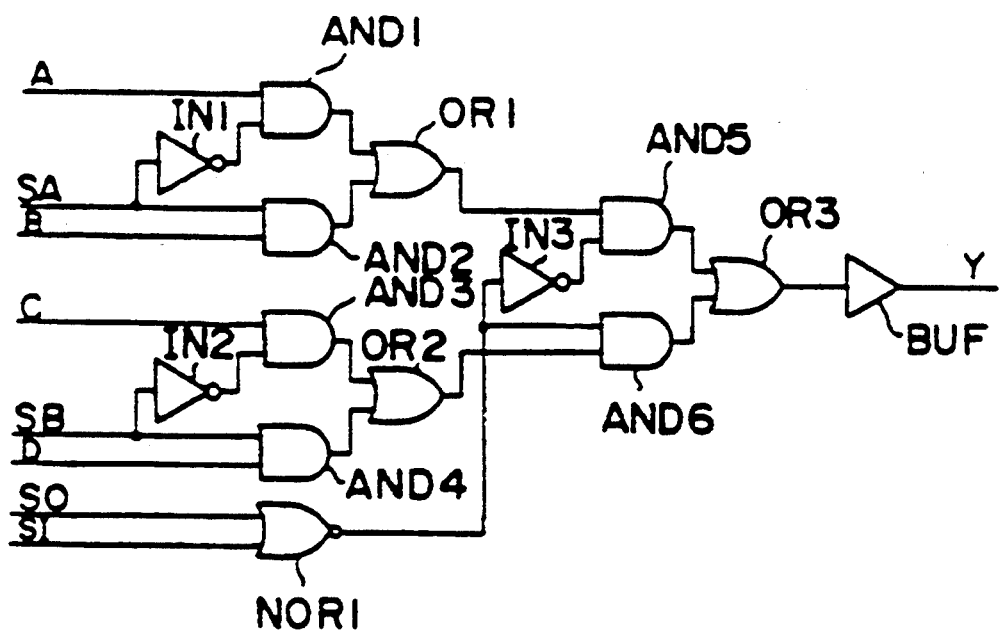
FIG. 48 is a circuit diagram showing the structure of a logic circuit included in a basic cell of a conventional FPGA.

Next, a description will be given of other problems associated with the conventional programmable logic circuit, by referring to FIG. 48. FIG. 48 shows the structure of a logic circuit included in a basic cell of the conventional FPGA. The basic cell substantially corresponds to the logic cell described above.

For example, a logic circuit (or logic module schematic) proposed in IEEE Journal of Solid-State Circuits, Vol.24, No.3, June 1989 may be applied to a basic cell which forms the FPGA which is programmable by the user.

The logic circuit shown in FIG. 48 includes six 2-input logic circuits (first through sixth AND circuits) AND1 through AND6, three inverter circuits (first through third inverters) IN1 through IN3, three 3-input OR circuits (first through third OR circuits) OR1 through OR3, one 2-input NOR circuit NOR1, and one buffer circuit BUF which are connected as shown.

By the functions of one unit of this logic circuit, it is possible to realize a 3-input logic circuit, a 4-input logic circuit, a 2-input exclusive-OR circuit, a delay (D) type latch circuit and the like, for example. In addition, by the functions of two units which combine two such logic circuits, it is possible to realize a D flip-flop.

A wiring region is provided between the logic circuits, and program points are provided at intersections of the wiring extending in the vertical and horizontal directions and reaching each circuit. The program points are made up of anti-fuses or fuse elements, so that an arbitrary logic gate circuit can be realized by the user. When a trial manufacture electronic circuit is made by use of the FPGA, the operations of this circuit is checked, and thereafter, the chip gate array is made over again to prepare for mass production.

According to the logic circuit shown in FIG. 48 which is applied to the conventional basic cell, the first through sixth AND circuits AND1 through AND6, the first through third inverters IN1 through IN3, the first through third OR circuits OR1 through OR3, the NOR circuit NOR1 and the buffer circuit BUF are provided. For this reason, there was a first problem in that the number of transistors forming the basic cell is large.

For example, if four transistors are used to form one 2-input logical product circuit, twenty-four transistors are required to form the first through sixth AND circuits AND1 through AND6. If two transistors are used to form one inverter circuit, six transistors are required to form the first through third inverters IN1 through IN3. Similarly, if four transistors are used to form one 2-input OR circuit or one 2-input NOR circuit, twelve transistors are required to form the first through third OR circuits OR1 through OR3, and four transistors are required to form the NOR circuit NOR1. Furthermore, if two transistors are used to form one buffer circuit, two transistors are required to form the buffer circuit BUF. As a result, a total of forty-eight transistors must be arranged within the basic cell.

Hence, if there is a demand to form a D flip-flop, it is necessary to arrange at least ninety-six transistors since two units, that is, two logic circuits are required to realize the D flip-flop.

In addition, a basic macro (logic circuit) which forms a minimum unit can only realize specific combinational logic circuits such as a 3-input logic circuit, a 4-input logic circuit, a 2-input exclusive-OR circuit and a D type latch. For this reason, there was a second problem in that the utilization efficiency of the logic circuit is poor when realizing a logic gate circuit having a large number of small circuits such as an inverter circuit and a 2-input NAND circuit.

Other types of basic cells have also been proposed. Among such proposed basic cells, there is proposal to use two kinds of minimum units, that is, two kinds of basic cells respectively having a transistor pair tile portion for realizing a combinational logic circuit and a RAM logic tile portion for realizing a flip-flop or the like. However, two kinds of basic macros are required when programming the programmable logic circuit, and the utilization efficiency of the basic macros becomes poor if the rate of use of the two kinds of basic macros provided within the chip greatly differ.

On the other hand, in order to reduce the programming time of the FPGA, it is desirable that the number of transistors forming the basic cell and the number of program points connecting the wirings to the basic cells are small as possible. Furthermore, because the program point after the programming has a contact resistance of approximately 50 to 500Ω, it is necessary to minimize the number of program points in order to realize high-speed operations of the transistors.

Therefore, a description will be given of further embodiments of the programmable logic circuit according to the present invention, in which the above described other problems of the conventional programmable logic circuit are overcome. More particularly, the embodiments described hereunder can minimize the number of transistors and the number of program points by the improved circuit structure of the basic cell. Hence, various kinds of basic logic circuits can be realized by use of a combination of the basic cells and programming the basic cells.

First, a general description will be given of the operating principle of each of ninth through twentieth embodiments of the programmable logic circuit according to the present invention, by referring to FIGS. 49 through 60.

Figure 49:
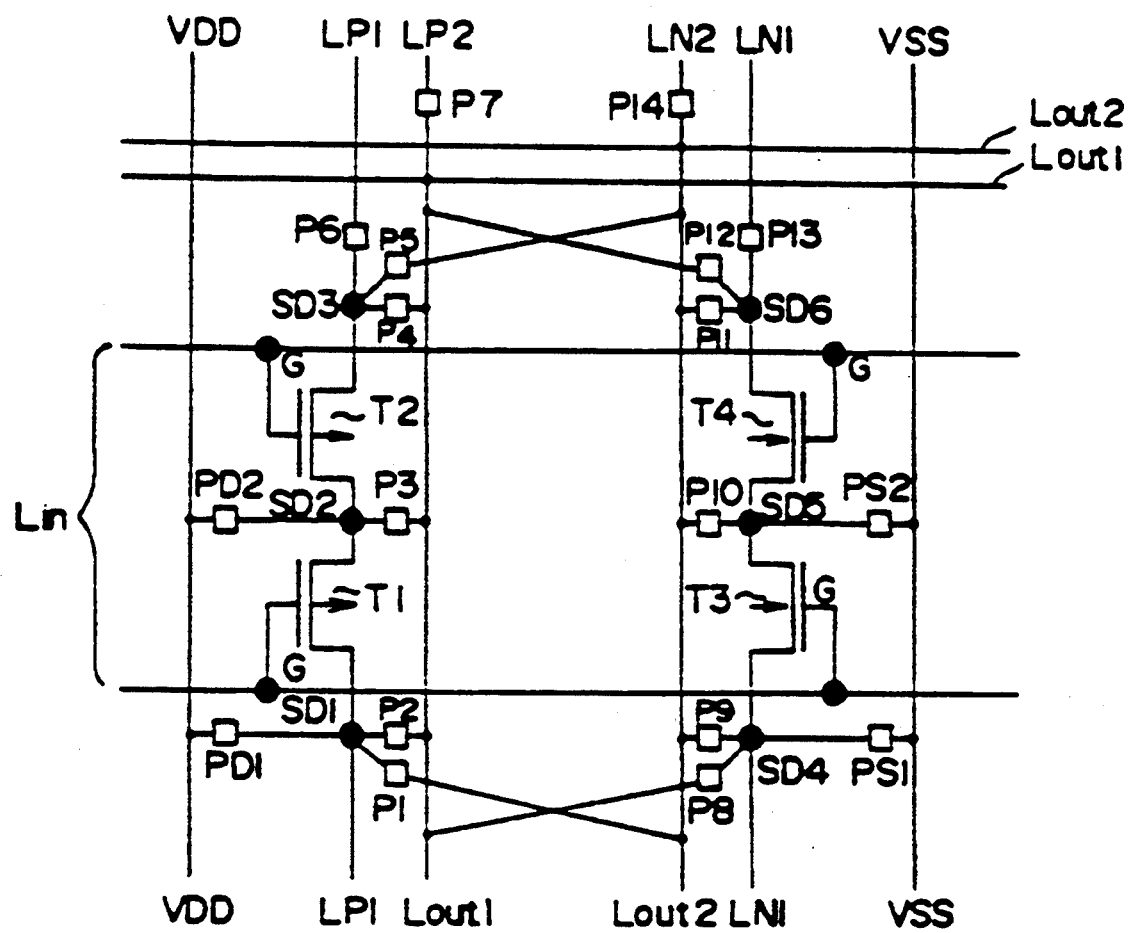
FIG. 49 is a diagram for explaining the operating principle of a ninth embodiment of the programmable logic circuit according to the present invention.

FIG. 49 is a diagram for explaining the operating principle of the ninth embodiment of the programmable logic circuit according to the present invention. As shown in FIG. 49, the programmable logic circuit includes first through fourth transistors T1 through T4 and a plurality of different kinds of programmable switches PD1, PD2, PS1, PS2 and P1 through P14 which couple the first through fourth transistors T1 through T4 and wirings. Each gate G of the first through fourth transistors T1 through T4 is connected to an input wiring Lin. Draw-out electrodes SD1 through SD6 of sources or drains of the first through fourth transistors T1 through T4 are coupled to selected ones of first and second power supply lines VDD and VSS, first and second output wirings Lout1 and Lout2, first and second high potential side protection wirings LP1 and LP2 or first and second low potential side protection wirings LN1 and LN2 via corresponding ones of the first and second high potential side programmable switches PD1 and PD2, first and second low potential side programmable switches PS1 and PS2, and the first through fourteenth programmable switches P1 through P14.

The source or drain draw-out electrode SD1 of the first transistor T1 is connected to the first power supply line VDD via the first high potential side programmable switch PD1, to the second output wiring Lout2 via the first programmable switch P1, to the first output wiring Lout1 via the second programmable switch P2, and to the first high potential side protection wiring LP1. The source or drain draw-out electrode SD2 of the first and second transistor T1 and T2 is coupled to the first power supply line VDD via the second high potential side programmable switch PD2, and to the first output wiring Lout1 via the third programmable switch P3. The source or drain draw-out electrode SD3 of the second transistor T2 is coupled to the first output wiring Lout1 via the fourth programmable switch P4, to the second output wiring Lout2 via the fifth programmable switch P5, and to the first high potential side protection wiring LP1 via the sixth programmable switch P6.

The source or drain draw-out electrode SD4 of the third transistor T3 is coupled to the second power supply line VSS via the first low potential side programmable switch PS1, to the first output wiring Lout1 via the eighth programmable switch PS, to the second output wiring Lout2 via the ninth programmable switch P9, and to the first low potential side protection line LN1. The source or drain draw-out electrode SD5 of the third and fourth transistor T3 and T4 is coupled to the second power supply line VSS via the second low potential side programmable switch PS2, and to the second output wiring Lout2 via the tenth programmable switch P10. The source or drain draw-out electrode SD6 of the fourth transistor T4 is coupled to the second output wiring Lout2 via the eleventh programmable switch P11, to the first output wiring Lout1 via the twelfth programmable switch P12, and to the first low potential side protection line LN1 via the thirteenth programmable switch P13.

The first output wiring Lout1 is coupled to the high potential side protection line LP2 via the seventh programmable switch P7. The second output wiring Lout2 is coupled to the second low potential side protection line LN2 via the fourteenth programmable switch P14.

According to this ninth embodiment, the basic cell which forms the minimum unit is made up of four transistors T1 through T4 and a total of eighteen programmable switches PD1, PD2, PS1, PS2 and P1 through P14. For example, a programming is made with respect to the fuse elements, anti-fuse elements or, p-type or n-type field effect transistors which form the first and second high potential side programmable switch PD1 and PD2, the first and second low potential side programmable switches PS1 and PS2, and the fourth and twelfth programmable switches P4 and P12. By this programming, the source or drain draw-out electrode SD1 of the first transistor T1 and the first power supply line VDD are coupled via the first high potential side programmable switch PD1. In addition, the source or drain draw-out electrode SD2 of the first and second transistors T1 and T2 and the first power supply line VDD are coupled via the second high potential side programmable switch PD2.

In addition, the source or drain draw-out electrode SD3 of the second transistor T2 and the first output wiring Lout1 are coupled via the fourth programmable switch P4. The source or drain draw-out electrode SD4 of the third transistor T3 and the second power supply line VSS are coupled via the first low potential side programmable switch PS1. The source or drain draw-out electrode SD5 of the third and fourth transistors T3 and T4 and the second power supply line VSS are coupled via the second high potential side programmable switch PS2. Furthermore, the source or drain draw-out electrode SD6 of the fourth transistor T4 and the first output wiring Lout1 are coupled via the twelfth programmable switch P12.

Accordingly, it is possible to form an inverter circuit by the second transistor T2 which is a p-type field effect transistor and the fourth transistor T4 which is an n-type field effect transistor. This means that, by appropriately programming the total of eighteen programmable switches PD1, PD2, PS1, PS2 and P1 through P14, it is possible to form by the four transistors T1 through T4 a basic logic cell such as an inverter circuit, a power type inverter circuit, a transmission gate circuit, a 2-input NAND circuit and a 2-input NOR circuit.

In addition, by appropriately programming, that is, by selectively turning ON the seventh and fourteenth programmable switches P7 and P14, it is possible to couple the first output wiring Lout1 and the second output wiring Lout2 to the basic cell which exists in the vertical direction.

Figure 50:
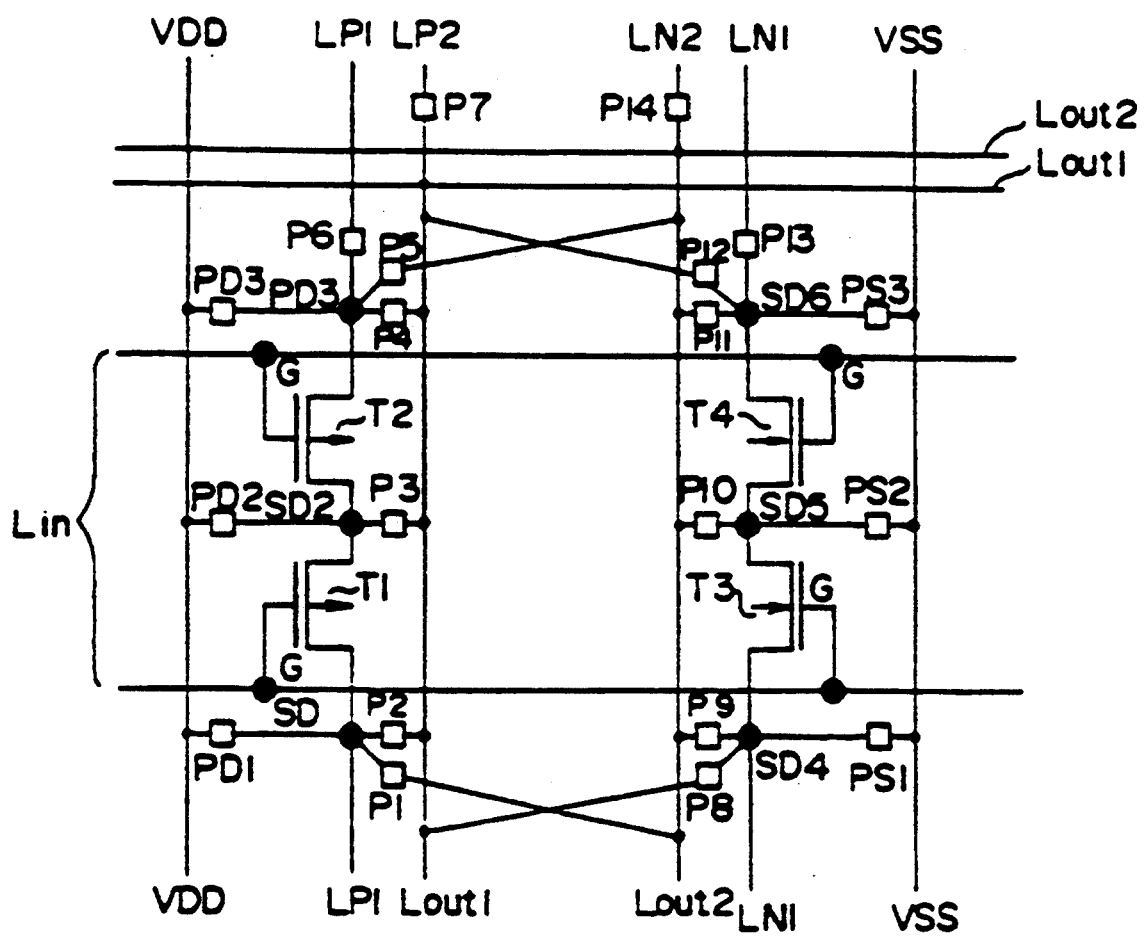
FIG. 50 is a diagram for explaining the operating principle of a tenth embodiment of the programmable logic circuit according to the present invention.

FIG. 50 is a diagram for explaining the operating principle of the tenth embodiment of the programmable logic circuit according to the present invention. In FIG. 50, those parts which are the same as those corresponding parts in FIG. 49 are designated by the same reference numerals, and a description thereof will be omitted.

As shown in FIG. 50, the source or drain draw-out electrode SD3 of the second transistor T2 is coupled to the first power supply line VDD via a third high potential side programmable switch PD3. In addition, the source or drain draw-out electrode SD6 of the fourth transistor T4 is coupled to the second power supply line VSS via a third low potential side programmable switch PS3.

According to this tenth embodiment, the basic cell which forms the minimum unit is made up of four transistors T1 through T4 and a total of twenty programmable switches PD1 through PD3, PS1 through PS3 and P1 through P14. For example, by appropriately programming the fuse elements, anti-fuse elements or, the p-type or n-type field effect transistors which form the first and third high potential side programmable switches PD1 and PD3, the first low potential side programmable switch PS1 and the third and twelfth programmable switches P3 and P12 within the basic cell, it is possible to form a 2-input NAND circuit by the basic cell.

Hence, although the number of programmable switches increases by two compared to the number of programmable switches in the ninth embodiment, it becomes possible to form the inverter circuit, the power type inverter circuit, the transmission gate circuit, the 2-input NAND circuit, the 2-input NOR circuit and the like.

Figure 51:
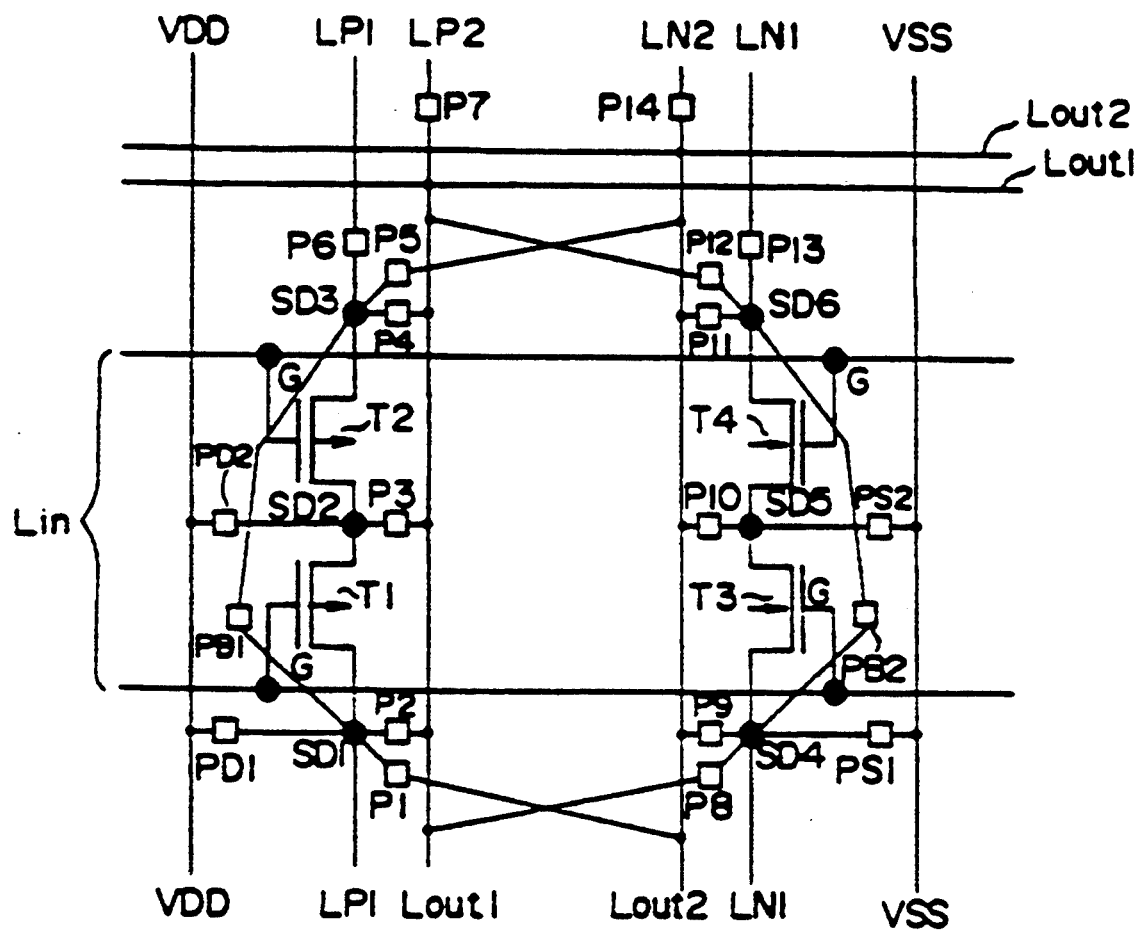
FIG. 51 is a diagram for explaining the operating principle of an eleventh embodiment of the programmable logic circuit according to the present invention.

FIG. 51 is a diagram for explaining the operating principle of the eleventh embodiment of the programmable logic circuit according to the present invention. In FIG. 51, those parts which are the same as those corresponding parts in FIG. 49 are designated by the same reference numerals, and a description thereof will be omitted.

As shown in FIG. 51, a first bypass programmable switch PB1 is coupled between the source or drain draw-out electrodes SD1 and SD3 of the first and second transistors T1 and T2. In addition, a second bypass programmable switch PB2 is coupled between the source or drain draw-out electrodes SD4 and SD6 of the third and fourth transistors T3 and T4.

According to this eleventh embodiment, the basic cell which forms the minimum unit is made up of four transistors T1 through T4 and a total of twenty programmable switches PD1, PD2, PS1, PS2, P1 through P14, PB1 and PB2. The source or drain draw-out electrodes SD1 and SD3 of the first and second transistors T1 and T2 can be connected directly by the first bypass programmable switch PB1, without via the first output wiring Lout1. Similarly, the source or drain draw-out electrodes SD4 and SD6 of the third and fourth transistors T3 and T4 can be connected directly by the second bypass programmable switch PB2, without via the second output wiring Lout2.

Hence, although the number of programmable switches increases by two compared to the number of programmable switches in the ninth embodiment, it is possible to efficiently use the first and second bypass programmable switches PB1 and PB2 when connecting two or three basic cells to form a 4-input AND-OR inverter circuit, a 6-input AND-OR inverter circuit or the like.

Figure 52:
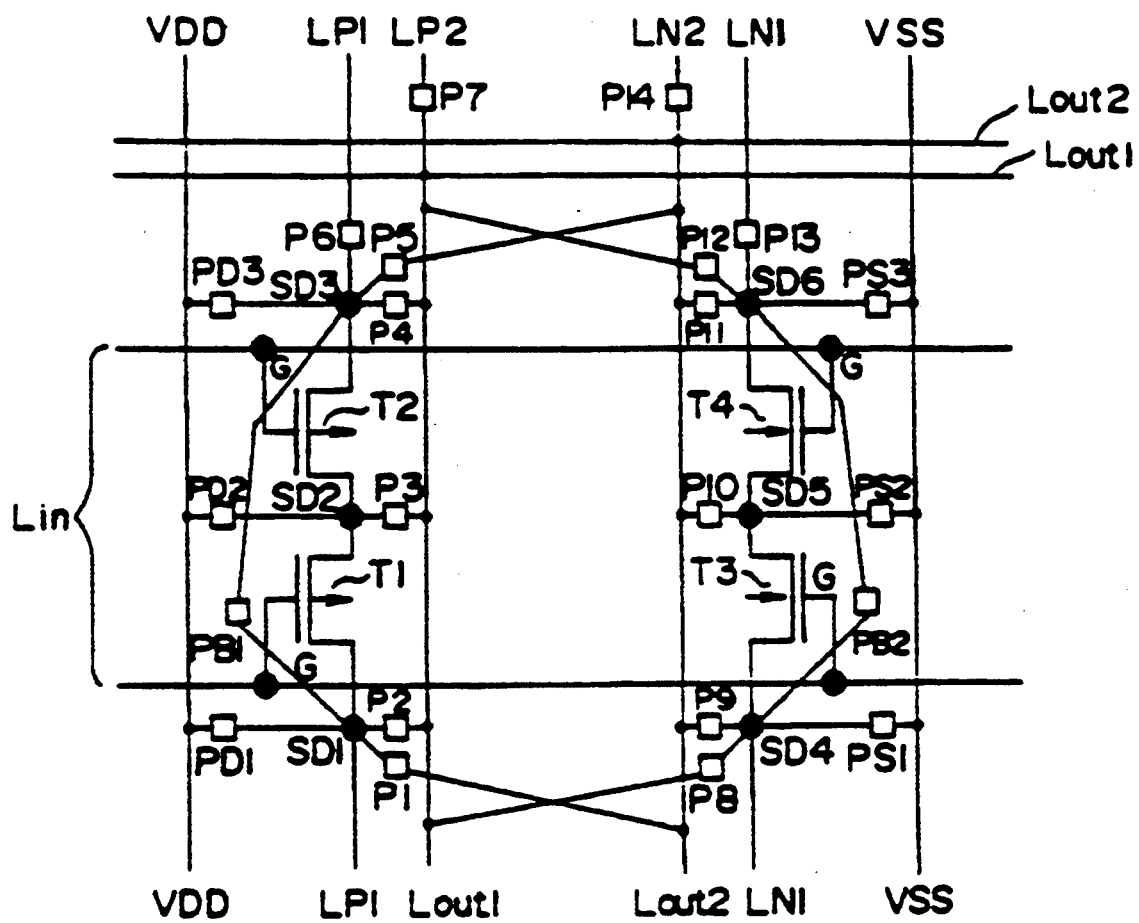
FIG. 52 is a diagram for explaining the operating principle of a twelfth embodiment of the programmable logic circuit according to the present invention.

FIG. 52 is a diagram for explaining the operating principle of the twelfth embodiment of the programmable logic circuit according to the present invention. In FIG. 52, those parts which are the same as those corresponding parts in FIG. 49 are designated by the same reference numerals, and a description thereof will be omitted.

As shown in FIG. 52, the source or drain draw-out electrode SD3 of the second transistor T2 is coupled to the first power supply line VDD via a third high potential side programmable switch PD3. The source or drain draw-out electrode SD6 of the fourth transistor T4 is coupled to the second power supply line VSS via a third low potential side programmable switch PS3. A first bypass programmable switch PB1 is coupled between the source or drain draw-out electrodes SD1 and SD3 of the first and second transistors T1 and T2. In addition, a second bypass programmable switch PB2 is coupled between the source or drain draw-out electrodes SD4 and SD6 of the third and fourth transistors T3 and T4.

According to this twelfth embodiment, the basic cell which forms the minimum unit is made up of four transistors T1 through T4 and a total of twenty-two programmable switches PD1 through PD3, PS1 through PS3, P1 through P14, PB1 and PB2. For example, by appropriately programming the fuse elements, anti-fuse elements or, the p-type or n-type field effect transistors which form the first and third high potential side programmable switches PD1 and PD3, the first low potential side programmable switch PS1 and the third and twelfth programmable switches P3 and P12 within the basic cell, it is possible to form a 2-input NAND circuit by the basic cell.

Hence, although the number of programmable switches increases by four compared to the number of programmable switches in the ninth embodiment, it becomes possible to form the inverter circuit, the power type inverter circuit, the transmission gate circuit, the 2-input NAND circuit, the 2-input NOR circuit and the like. In addition, it is possible to form a 3-input NAND circuit, a 3-input NOR circuit, a 4-input NAND circuit, a 4-input NOR circuit, a 4-input AND-OR inverter circuit or the like by connecting two basic cells. Furthermore, it is possible to form a 6-input AND-OR inverter circuit or the like by connecting three basic cells.

According to the ninth through twelfth embodiments, the first and second transistors T1 and T2 are p-type field effect transistors, and the third and fourth transistors T3 and T4 are n-type field effect transistors, for example. In addition, the programmable switches PD1 through PD3, PS1 through PS3, P1 through P14, PB1 and PB2 are fuse elements, anti-fuse elements, p-type or n-type field effect transistors or the like, for example.

Figure 53:
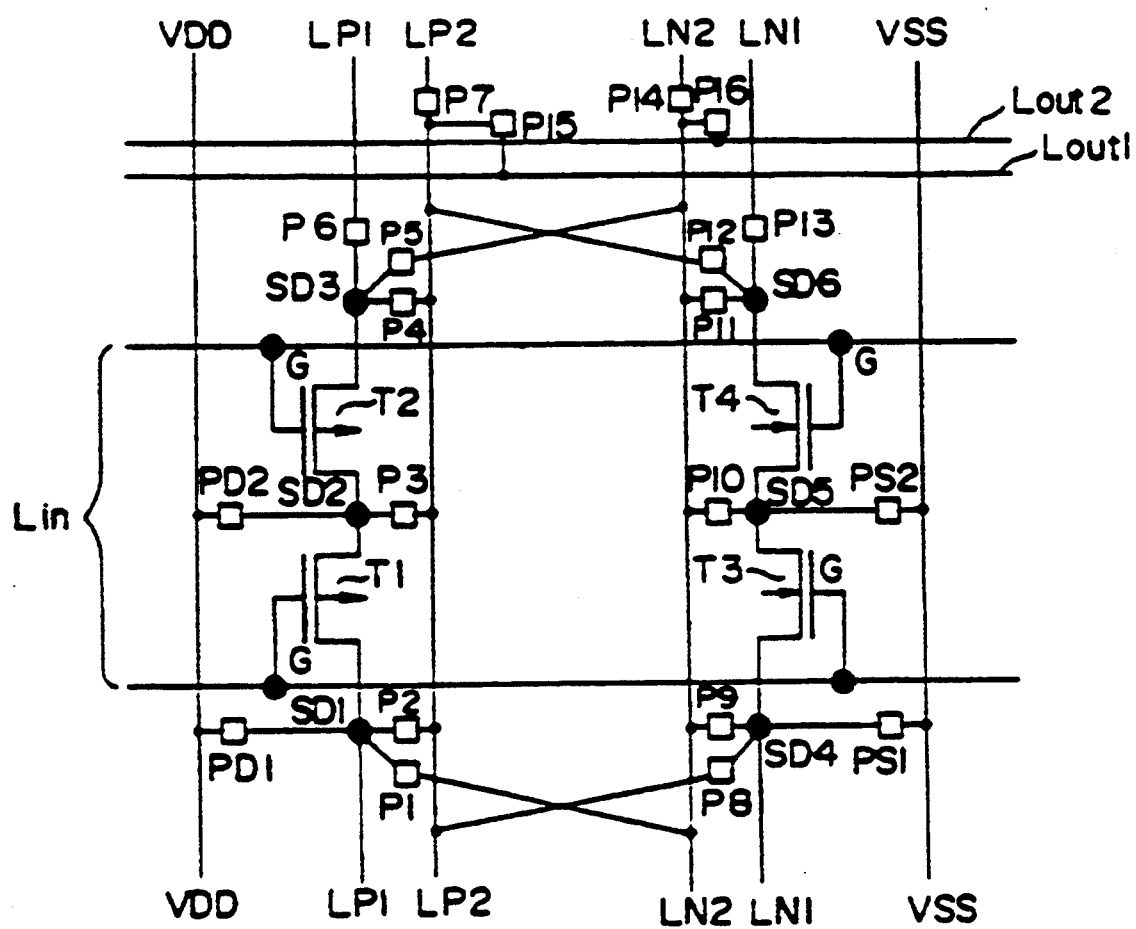
FIG. 53 is a diagram for explaining the operating principle of a thirteenth embodiment of the programmable logic circuit according to the present invention.

FIG. 53 is a diagram for explaining the operating principle of the thirteenth embodiment of the programmable logic circuit according to the present invention.

As shown in FIG. 53, the programmable logic circuit includes first through fourth transistors T1 through T4, and a plurality of various kinds of programmable switches PD1, PD2, PS1, PS2 and P1 through P16 which couple the first through fourth transistors T1 through T4 and wirings. Gates G of the first through fourth transistors T1 through T4 are connected to an input wiring Lin. Source or drain draw-out electrodes SD1 through SD6 of the first through fourth transistors T1 through T4 are coupled to selected ones of first and second power supply lines VDD and VSS, first and second output wirings Lout1 and Lout2, first and second high potential side protection wirings LP1 and LP2 or first and second low potential side protection wirings LN1 and LN2 via corresponding ones of the first and second high potential side programmable switches PD1 and PD2, first and second low potential side programmable switches PS1 and PS2, and the first through sixteenth programmable switches P1 through P16.

The source or drain draw-out electrode SD1 of the first transistor T1 is coupled to the first power supply line VDD via the first high potential side programmable switch PD1, to the second high potential side protection wiring LP2 via the first programmable switch P1, to the second high potential side protection wiring LP2 via the second programmable switch P2, and to the first high potential side protection wiring LP1. The source or drain draw-out electrode SD2 of the first and second transistors T1 and T2 is coupled to the first power supply line VDD via the second high potential side programmable switch PD2, and to the second high potential side protection wiring LP2 via the third programmable switch P3. The source or drain draw-out electrode SD3 of the second transistor T2 is coupled to the second high potential side protection wiring LP2 via the fourth programmable switch P4, to the second low potential side protection wiring LN2 via the fifth programmable switch P5, and to the first high potential side protection wiring LP1 via the sixth programmable switch P6. The source or drain draw-out electrode SD4 of the third transistor T3 is coupled to the second power supply line VSS via the first low potential side programmable switch PS1, to the second high potential side protection wiring LP2 via the eighth programmable switch P8, to the second low potential side protection wiring LN2 via the ninth programmable switch P9, and to the first low potential side protection wiring LN1.

The source or drain draw-out electrode SD5 of the third and fourth transistors T3 and T4 is coupled to the second power supply line VSS via the second low potential side programmable switch PS2, and to the second high potential side protection wiring LP2 via the tenth programmable switch P10. The source or drain draw-out electrode SD6 of the fourth transistor T4 is coupled to the second low potential side protection wiring LN2 via the eleventh programmable switch P11, to the second high potential side protection wiring LP2 via the twelfth programmable switch P12, and to the first low potential side protection wiring LN1 via the thirteenth programmable switch P13.

The second high potential side protection wiring LP2 is connected to the seventh programmable switch P7. The second low potential side protection wiring LN2 is connected to the fourteenth programmable switch P14. The second high potential side protection wiring LP2 is coupled to the first output wiring Lout1 via the fifteenth programmable switch P15. In addition, the second low potential side protection wiring LN2 is coupled to the second output wiring Lout2 via the sixteenth programmable switch P16.

According to this thirteenth embodiment, the basic cell which forms the minimum unit is made up of four transistors T1 through T4 and a total of twenty programmable switches PD1, PD2, PS1, PS2, and P1 through P18. By carrying out an appropriate programming to turn ON the fifteenth and sixteenth programmable switches P15 and P18, it is possible to connect the second high potential side protection wiring LP2 and the first output wiring Lout1 or, to connect the second low potential side protection wiring LN2 and the second output wiring Lout2. In addition, by carrying out an appropriate programming to turn OFF the fifteenth and sixteenth programmable switches and P18, it is possible to make the first and second output wirings Lout1 and Lout2 have a through-wiring function. The through-wiring function refers to a wiring which by-passes the basic cell in the horizontal direction, and is effectively used when there is a demand to communicate with a neighboring basic cell in the horizontal direction or to realize a minimum wiring distance.

Hence, although the number of programmable switches increases by two compared to the number of programmable switches in the ninth embodiment, it becomes possible to form the inverter circuit, the power type inverter circuit, the transmission gate circuit, the 2-input NAND circuit, the 2-input NOR circuit and the like utilizing the through-wiring function. In addition, it is possible to form a 3-input NAND circuit, a 3-input NOR circuit, a 4-input NAND circuit, a 4-input NOR circuit, a 4-input AND-OR inverter circuit or the like by connecting two basic cells. Furthermore, it is possible to form a 8-input AND-OR inverter circuit or the like by connecting three basic cells.

Figure 54:
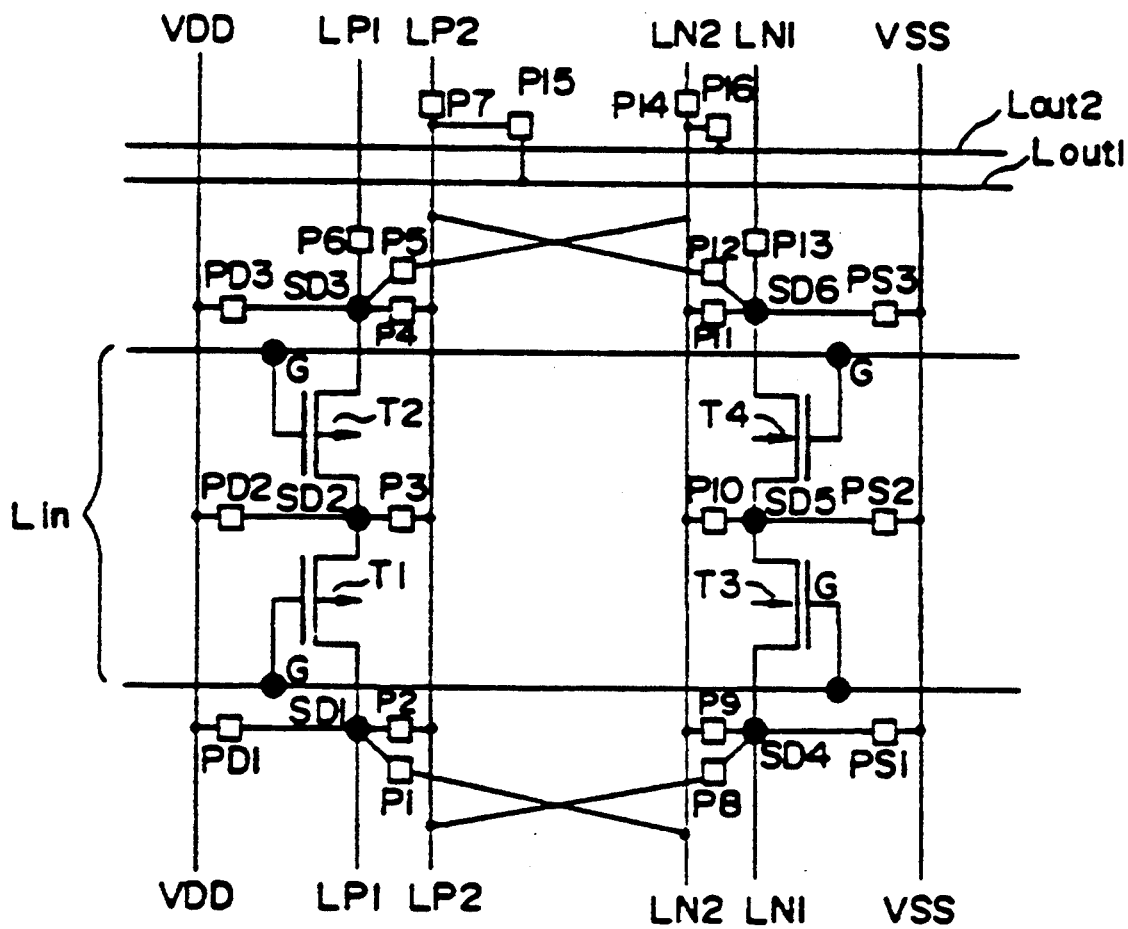
FIG. 54 is a diagram for explaining the operating principle of a fourteenth embodiment of the programmable logic circuit according to the present invention.

FIG. 54 is a diagram for explaining the operating principle of the fourteenth embodiment of the programmable logic circuit according to the present invention. In FIG. 54, those parts which are the same as those corresponding parts in FIG. 53 are designated by the same reference numerals, and a description thereof will be omitted.

As shown in FIG. 54, the source or drain draw-out electrode SD3 of the second transistor T2 is coupled to the first power supply line VDD via a third high potential side programmable switch PD3. In addition, the source or drain draw-out electrode SD6 of the fourth transistor T4 is coupled to the second power supply line VSS via a third low potential side programmable switch PS3.

According to this fourteenth embodiment, the basic cell which forms the minimum unit is made up of four transistors T1 through T4 and a total of twenty-two programmable switches PD1 through PD3, PS1 through PS3, and P1 through P16. Similarly to the thirteenth embodiment, the first and second output wirings Lout1 and Lout2 can be made to have the through-wiring function by appropriately programming the fifteenth and sixteenth programmable switches P15 and P16 to turn these programmable switches P15 and P16 OFF.

Hence, although the number of programmable switches increases by four compared to the number of programmable switches in the ninth embodiment, it becomes possible to form the inverter circuit, the power type inverter circuit, the transmission gate circuit, the 2-input NAND circuit, the 2-input NOR circuit and the like by utilizing the through-wiring function similarly to the thirteenth embodiment. In addition, it is possible to form a 3-input NAND circuit, a 3-input NOR circuit, a 4-input NAND circuit, a 4-input NOR circuit, a 4-input AND-OR inverter circuit or the like by connecting two basic cells. Furthermore, it is possible to form a 6-input AND-OR inverter circuit or the like by connecting three basic cells.

Figure 55:
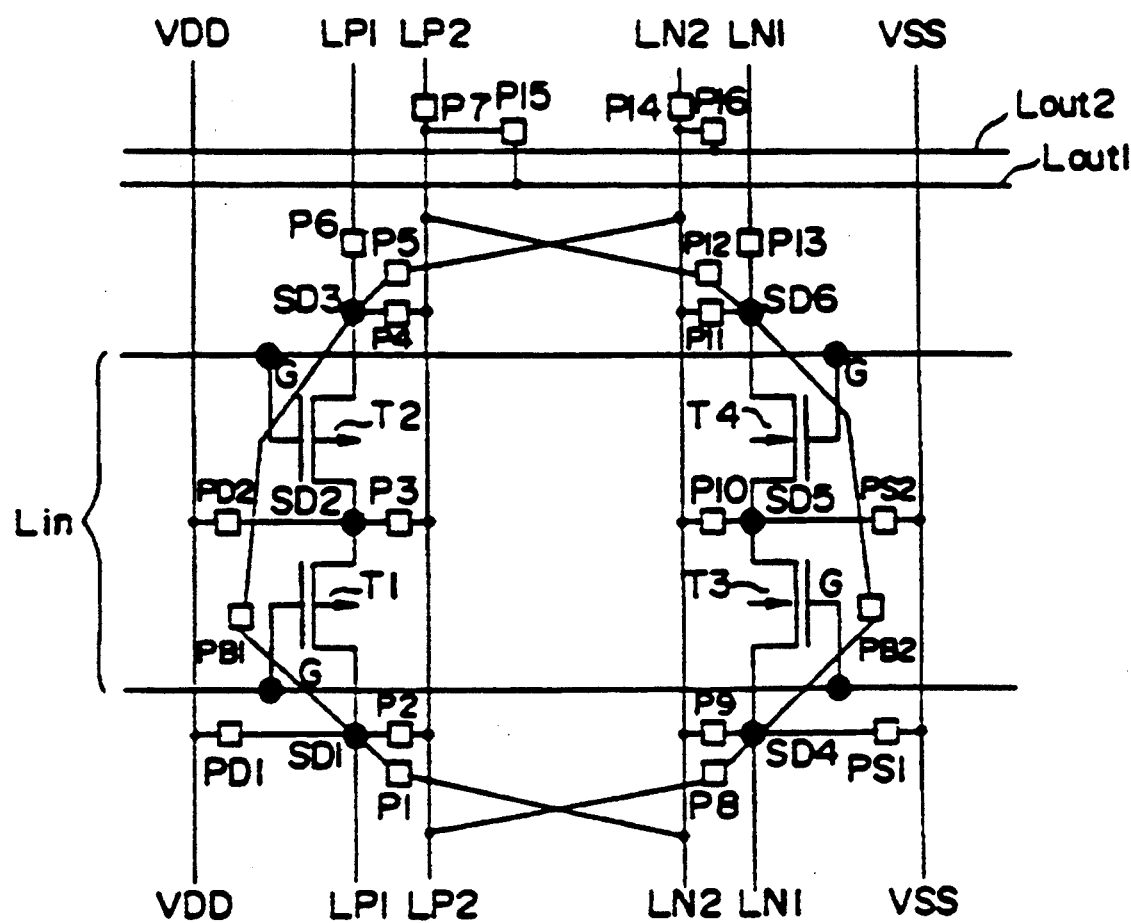
FIG. 55 is a diagram for explaining the operating principle of a fifteenth embodiment of the programmable logic circuit according to the present invention.

FIG. 55 is a diagram for explaining the operating principle of the fifteenth embodiment of the programmable logic circuit according to the present invention. In FIG. 55, those parts which are the same as those corresponding parts in FIG. 53 are designated by the same reference numerals, and a description thereof will be omitted.

As shown in FIG. 55, a first bypass programmable switch PB1 is coupled between the source or drain draw-out electrodes SD1 and SD3 of the first and second transistors T1 and T2. In addition, a second bypass programmable switch PB2 is coupled between the source or drain draw-out electrodes SD4 and SD6 of the third and fourth transistors T3 and T4.

According to this fifteenth embodiment, the basic cell which forms the minimum unit is made up of four transistors T1 through T4 and a total of twenty-two programmable switches PD1, PD2, PS1, PS2, P1 through P16, PB1 and PB2. Similarly to the eleventh embodiment described above, the source or drain draw-out electrodes SD1 and SD3 of the first and second transistors T1 and T2 can be connected directly by the first bypass programmable switch PB1, without via the second high potential side protection wiring LP2. Similarly, the source or drain draw-out electrodes SD4 and SD6 of the third and fourth transistors T3 and T4 can be connected directly by the second bypass programmable switch PB2, without via the second low potential side protection wiring LN2.

Hence, although the number of programmable switches increases by four compared to the number of programmable switches in the ninth embodiment, it becomes possible to form the inverter circuit, the power type inverter circuit, the transmission gate circuit, the 2-input NAND circuit, the 2-input NOR circuit and the like by utilizing the through-wiring function similarly to the thirteenth embodiment. In addition, it is possible to form a 3-input NAND circuit, a 3-input NOR circuit, a 4-input NAND circuit, a 4-input NOR circuit, a 4-input AND-OR inverter circuit or the like by connecting two basic cells. Furthermore, it is possible to form a 6-input AND-OR inverter circuit or the like by connecting three basic cells.

Figure 56:
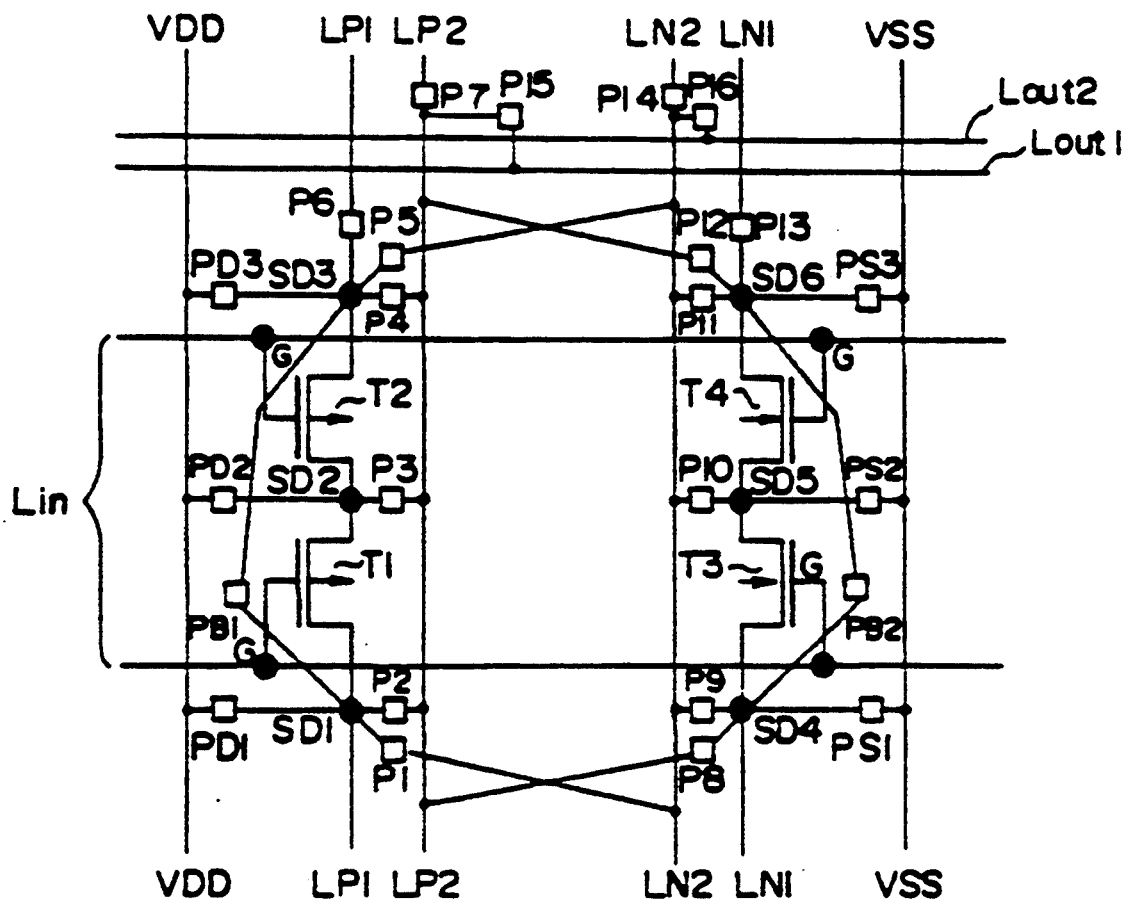
FIG. 56 is a diagram for explaining the operating principle of a sixteenth embodiment of the programmable logic circuit according to the present invention.

FIG. 56 is a diagram for explaining the operating principle of the sixteenth embodiment of the programmable logic circuit according to the present invention. In FIG. 56, those parts which are the same as those corresponding parts in FIG. 53 are designated by the same reference numerals, and a description thereof will be omitted.

As shown in FIG. 56, the source or drain draw-out electrode SD3 of the second transistor T2 is coupled to the first power supply line VDD via a third high potential side programmable switch PD3. The source or drain draw-out electrode SD6 of the fourth transistor T4 is coupled to the second power supply line VSS via a third low potential side programmable switch PS3. In addition, a first bypass programmable switch PB1 is coupled between the source of drain draw-out electrodes SD1 and SD3 of the first and second transistors T1 and T2. Similarly, a second bypass programmable switch PB2 is coupled between the source or drain draw-out electrodes SD4 and SD6 of the third and fourth transistors T3 and T4.

According to this sixteenth embodiment, the basic cell which forms the minimum unit is made up of four transistors T1 through T4 and a total of twenty-four programmable switches PD1 through PD3, PS1 through PS3, P1 through P16, PB1 and PB2. Similarly to the twelfth embodiment described above, by appropriately programming the fuse elements, anti-fuse elements or, the p-type or n-type field effect transistors which form the first and third high potential side programmable switches PD1 and PD3, the first low potential side programmable switch PS1 and the third and twelfth programmable switches P3 and P12 within the basic cell, for example, it is possible to form a 2-input NAND circuit by the basic cell.

Hence, although the number of programmable switches increases by four compared to the number of programmable switches in the ninth embodiment, it becomes possible to form the inverter circuit, the power type inverter circuit, the transmission gate circuit, the 2-input NAND circuit, the 2-input NOR circuit and the like by utilizing the through-wiring function similarly to the thirteenth embodiment. In addition, it is possible to form a 3-input NAND circuit, a 3-input NOR circuit, a 4-input NAND circuit, a 4-input NOR circuit, a 4-input AND-OR inverter circuit or the like by connecting two basic cells. Furthermore, it is possible to form a 6-input AND-OR inverter circuit or the like by connecting three basic cells.

According to the thirteenth through sixteenth embodiments, the first and second transistors T1 and T2 are p-type field effect transistors, and the third and fourth transistors T3 and T4 are n-type field effect transistors, for example. In addition, the programmable switches PD1 through PD3, PS1 through PS3, P1 through P14, PB1 and PB2 are fuse elements, anti-fuse elements, p-type or n-type field effect transistors or the like, for example.

Figure 57:
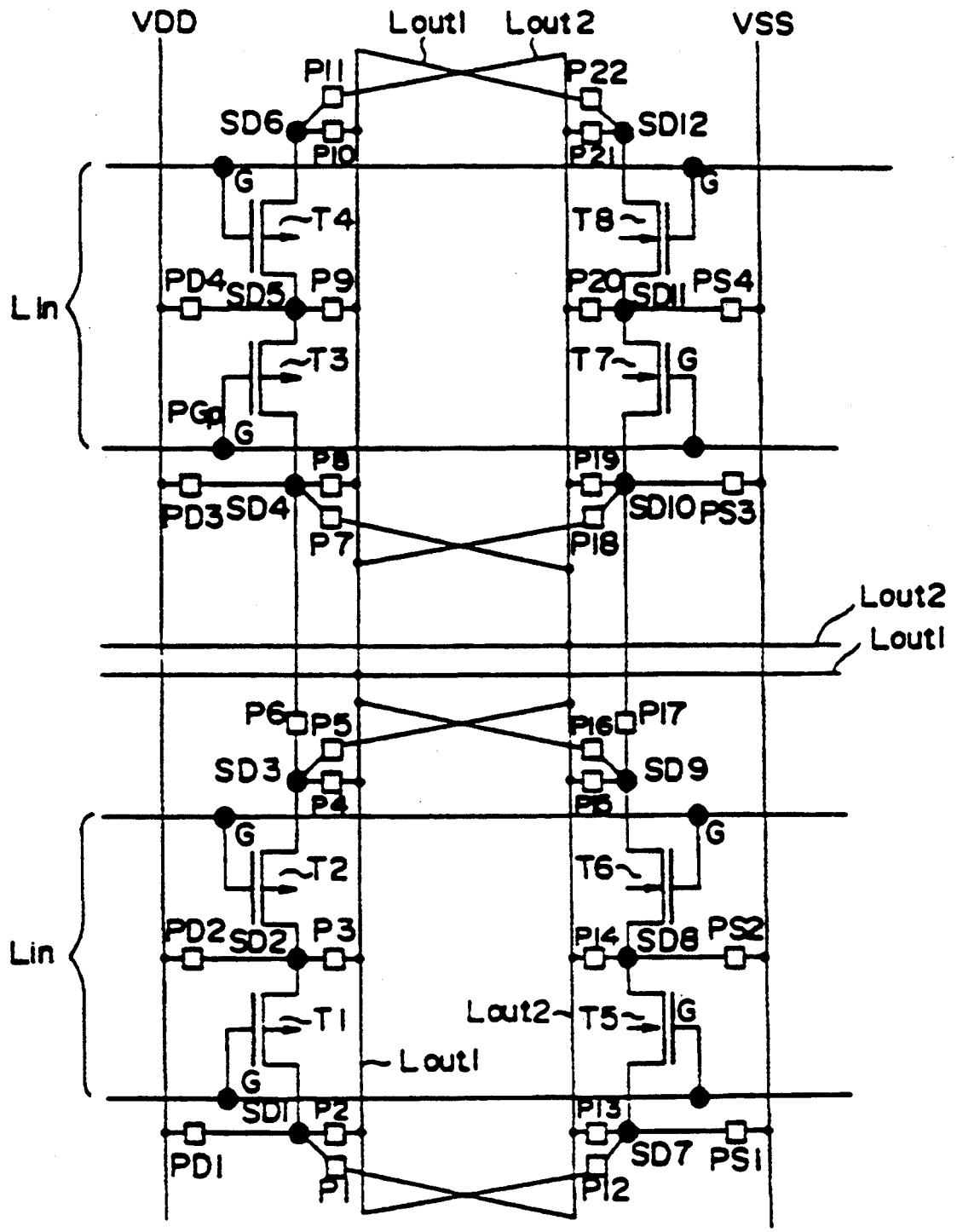
FIG. 57 is a diagram for explaining the operating principle of a seventeenth embodiment of the programmable logic circuit according to the present invention.

FIG. 57 is a diagram for explaining the operating principle of the seventeenth embodiment of the programmable logic circuit according to the present invention.

As shown in FIG. 57, the programmable logic circuit includes first through eighth transistors T1 through T8, and a plurality of various kinds of programmable switches PD1 through PD4, PS1 through PS4 and P1 through P22 which couple the first through eighth transistors T1 through T8 and wirings. Gates G of the first through eighth transistors T1 through T8 are connected to an input wiring Lin. Source or drain draw-out electrodes SD1 through SD12 of the first through eighth transistors T1 through T8 are coupled to selected ones of first and power supply lines VDD and VSS and first and second output wirings Lout1 and Lout2, via corresponding ones of the first through fourth high potential side programmable switches PD1 through PD4, first through fourth low potential side programmable switches PS1 through PS4, and the first through twenty-second programmable switches P1 through P22.

In this embodiment, the source or drain draw-out electrode SD1 of the first transistor T1 is coupled to the first power supply line VDD via the first high potential side programmable switch PD1, to the second output wiring Lout2 via the first programmable switch P1, and to the first output wiring Lout1 via the second programmable switch P2. The source or drain draw-out electrode SD2 of the first and second transistors T1 and T2 is coupled to the first power supply line VDD via the second high potential side programmable switch PD2, and to the first output wiring Lout1 via the third programmable switch P3.

The source or drain draw-out electrode SD3 of the second transistor T2 is coupled to the first output wiring Lout1 via the fourth programmable switch P4, to the second output wiring Lout2 via the fifth programmable switch P5, and to the source or drain draw-out electrode SD4 of the third transistor T3 via the sixth programmable switch P6. The source or drain draw-out electrode SD4 of the third transistor T3 is coupled to the first power supply line VDD via the third high potential side programmable switch PD3, to the second output wiring Lout2 via the seventh programmable switch P7, and to the first output wiring Lout1 via the eighth programmable switch P8.

The source or drain draw-out electrode SD5 of the third and fourth transistors T3 and T4 is coupled to the first power supply line VDD via the fourth high potential side programmable switch PD4, and to the first output wiring Lout1 via the ninth programmable switch P9. The source or drain draw-out electrode SD6 of the fourth transistor T4 is coupled to the first output wiring Lout1 via the tenth programmable switch P10, and to the second output wiring Lout2 via the eleventh programmable switch P11.

The source or drain draw-out electrode SD7 of the fifth transistor T5 is coupled to the second power supply line VSS via the first low potential side programmable switch PS1, to the first output wiring Lout1 via the twelfth programmable switch P12, and to the second output wiring Lout2 via the thirteenth programmable switch P13. The source or drain draw-out electrode SD8 of the fifth and sixth transistors T5 and T6 is coupled to the second power supply line VSS via the second low potential side programmable switch PS2, and to the second output wiring Lout2 via the fourteenth programmable switch P14.

The source or drain draw-out electrode SD9 of the sixth transistor T6 is coupled to the second output wiring Lout2 via the fifteenth programmable switch P15, to the first output wiring Lout1 via the sixteenth programmable switch P16, and to the source or drain draw-out electrode SD10 of the seventh transistor T7 via the seventeenth programmable switch p17. The source or drain draw-out electrode SD10 of the seventh transistor T7 is coupled to the second power supply line VSS via the third low potential side programmable switch PS3, to the first output wiring Lout1 via the eighteenth programmable switch P18, and to the second output wiring Lout2 via the nineteenth programmable switch P19.

The source or drain draw-out electrode SD11 of the seventh and eighth transistors T7 and T8 is coupled to the second power supply line VSS via the fourth low potential side programmable switch PS4, and to the second output wiring Lout2 via the twentieth programmable switch P20. The source or drain draw-out electrode SD12 of the eighth transistor T8 is coupled to the second output wiring Lout2 via the twenty-first programmable switch P21, and to the first output wiring Lout1 via the twenty-second programmable switch P22.

The ninth through sixteenth embodiments described above are suited for forming a logic gate circuit having a relatively small scale. On the other hand, the seventeenth through twentieth embodiments are suited for forming a logic gate circuit having a relatively large scale.

According to this seventeenth embodiment, the basic cell which forms the minimum unit is made up of eight transistors T1 through T8 and a total of thirty programmable switches PD1 through PD4, PS1 through PS4, and P1 through P22. The fuse elements, anti-fuse elements or, the p-type or n-type field effect transistors which form the first, second and fourth high potential side programmable switches PD1, PD2 and PD4, the first and second low potential side programmable switches PS1 and PS2, and the fourth, eighth, tenth, seventeenth and twenty-second programmable switches P4, P8, P10, P17 and P22 within the basic cell, for example, are appropriately programmed.

Hence, the source or drain draw-out electrode SD1 of the first transistor T1 and the first power supply line VDD are connected via the first high potential side programmable switch PD1, and the source or drain draw-out electrode SD2 of the first and second transistors T1 and T2 and the first power supply line VDD are connected via the second high potential side programmable switch PD2.

In addition, the source or drain draw-out electrode SD3 of the second transistor T2 is connected to the first output wiring Lout1 via the fourth programmable switch P4, and the source or drain draw-out electrode SD4 of the fourth transistor T4 is connected to the first output wiring Lout1 via the eighth programmable switch P8.

Moreover, the source or drain draw-out electrode SD5 of the third and fourth transistors T3 and T4 is connected to the first power supply line VDD via the fourth high potential side programmable switch PD4, and the source or drain draw-out electrode SD6 of the fourth transistor T4 is connected to the first output wiring Lout1 via the tenth programmable switch P10.

Furthermore, the source or drain draw-out electrode SD7 of the fifth transistor T5 is connected to the second power supply line VSS via the first low potential side programmable switch PS1, and the source or drain draw-out electrode SD8 of the fifth and sixth transistors T5 and T6 is connected to the second power supply line VSS via the second low potential side programmable switch PS2.

In addition, the source or drain draw-out electrode SD9 of the sixth transistor T6 is connected to the source or drain draw-out electrode SD10 of the seventh transistor T7 via the seventeenth programmable switch P17, and the source or drain draw-out electrode SD12 of the eighth transistor T8 is connected to the first output wiring Lout1 via the twenty-second programmable switch P22.

Therefore, it is possible to form a 3-input NAND circuit from the first through fourth transistors T1 through T4 which are p-type field effect transistors and the fifth through eighth transistors T5 through T8 which are n-type field effect transistors. Thus, by appropriately programming the total of thirty programmable switches PD1 through PD4, PS1 through PS4, and P1 through P22, it is possible to form a 3-input NAND circuit, a 3-input NOR circuit, a 4-input NAND circuit, a 4-input NOR circuit, a 3-input AND-OR inverter circuit, a 4-input AND-OR inverter circuit or the like from the eight transistors T1 through T8 of the basic cell.

Figure 58:
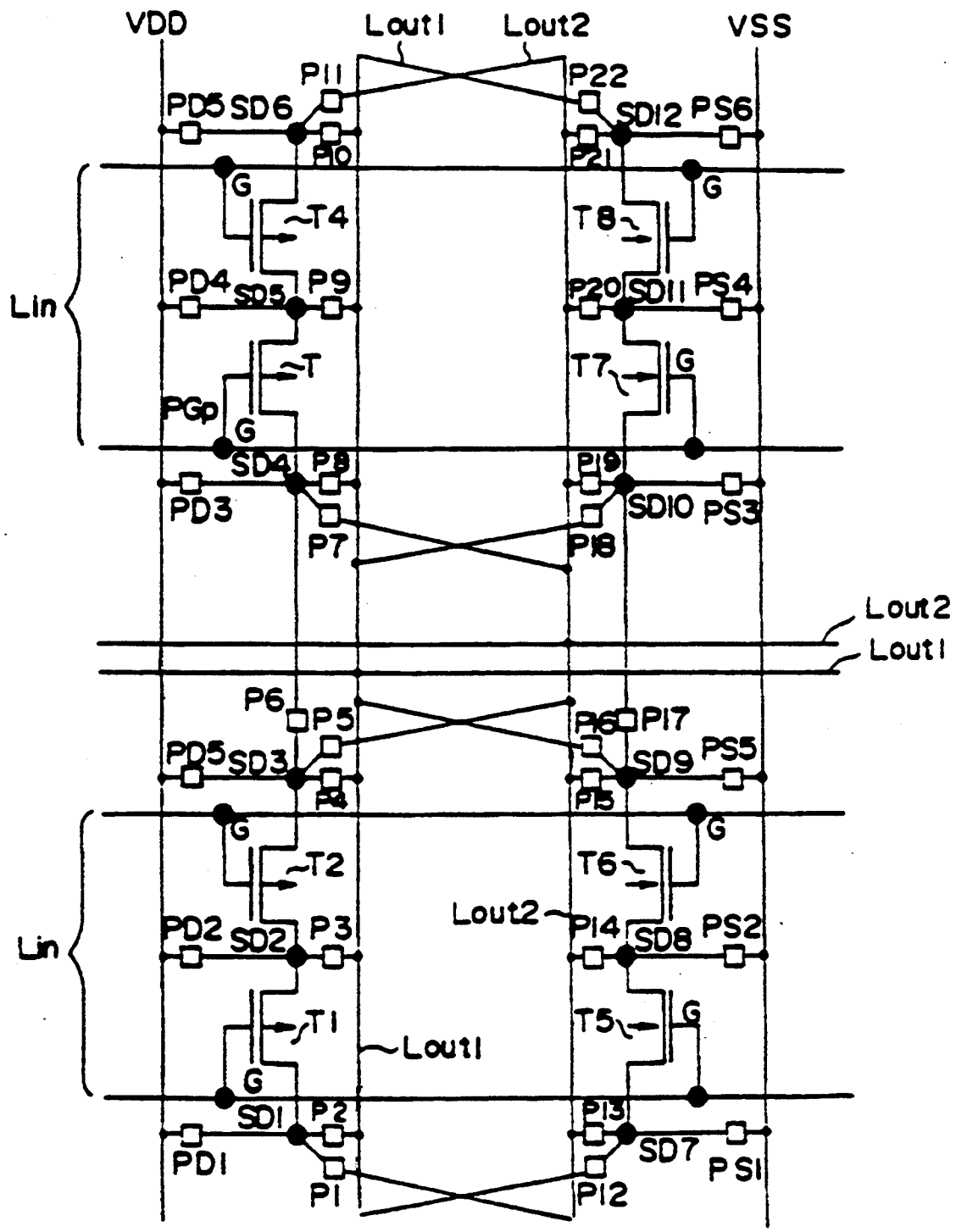
FIG. 58 is a diagram for explaining the operating principle of an eighteenth embodiment of the programmable logic circuit according to the present invention.

FIG. 58 is a diagram for explaining the operating principle of the eighteenth embodiment of the programmable logic circuit according to the present invention. In FIG. 58, those parts which are the same as those corresponding parts in FIG. 57 are designated by the same reference numerals, and a description thereof will be omitted.

As shown in FIG. 58, the source or drain draw-out electrode SD3 of the second transistor T2 is coupled to the first power supply line VDD via a fifth high potential side programmable switch PD5. The source or drain draw-out electrode SD6 of the fourth transistor T4 is coupled to the first power supply line VDD via a sixth high potential side programmable switch PD6. The source or drain draw-out electrode SD9 of the sixth transistor T6 is coupled to the second power supply line VSS via a fifth low potential side programmable switch PS5. In addition, the source or drain draw-out electrode SD12 of the eighth transistor T8 is coupled to the second power supply line VSS via a sixth low potential side programmable switch PS6.

According to this eighteenth embodiment, the basic cell which forms the minimum unit is made up of eight transistors T1 through T8 and a total of thirty-four programmable switches PD1 through PD6, PS1 through PS6, and P1 through P22. For example, by appropriately programming the fuse elements, anti-fuse elements or, the p-type or n-type field effect transistors which form the first, third, fifth and sixth high potential side programmable switches PD1, PD3, PD5 and PD6, the first low potential side programmable switch PS1, and the third, ninth, seventeenth and twenty-second programmable switches P3, P9, P17 and P22 within the basic cell, it is possible to form a 4-input NAND circuit by the basic cell.

Hence, although the number of programmable switches increases by four compared to the number of programmable switches in the seventeenth embodiment, it becomes possible to form the 3-input NAND circuit, the 3-input NOR circuit, the 4-input NAND circuit, the 4-input NOR circuit, the 3-input AND-OR inverter circuit or the like from the eight transistors T1 through T8 of the basic cell by appropriately programming the total of thirty-four programmable switches PD1 through PD6, PS1 through PS6, and P1 through P22.

Figure 59:
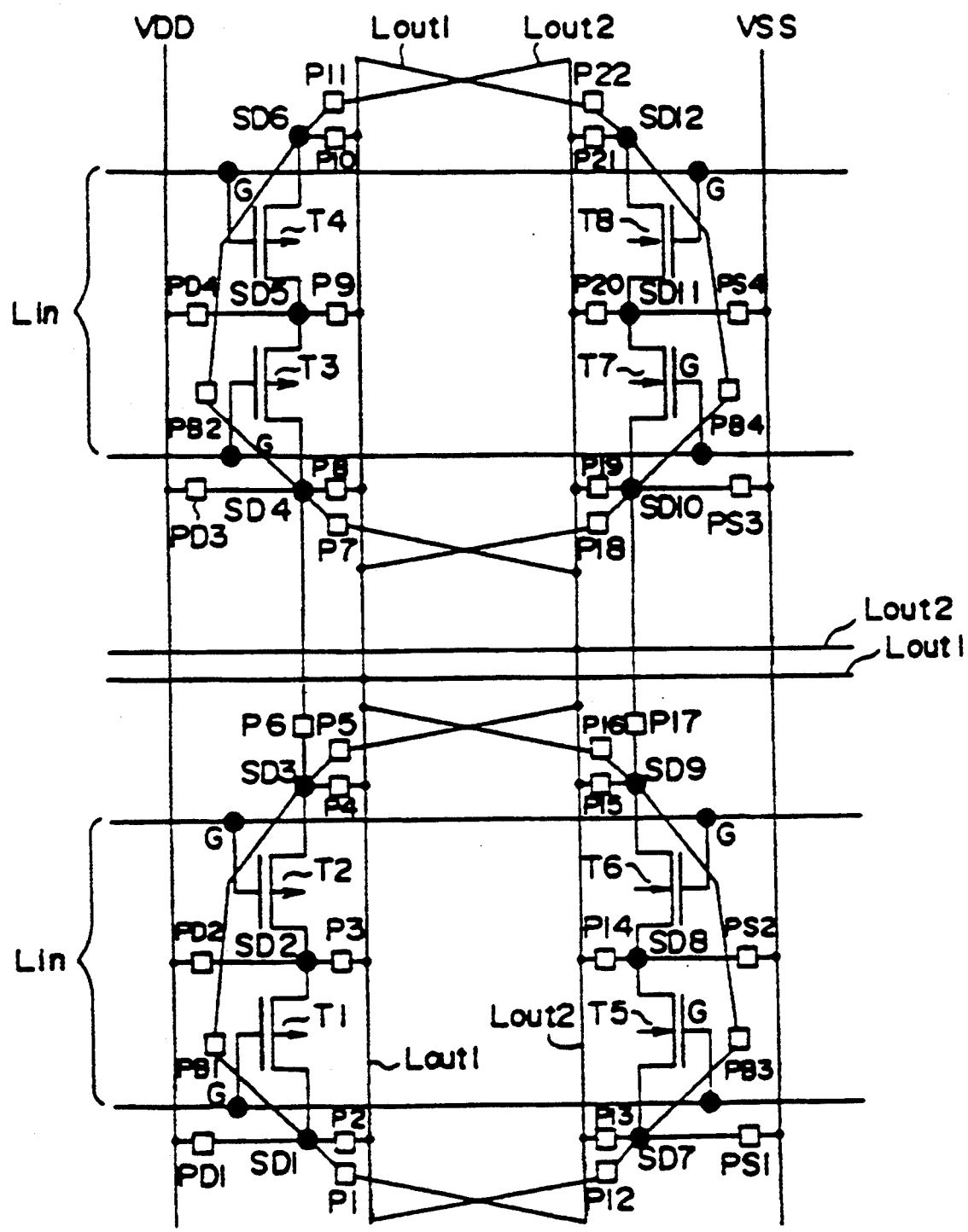
FIG. 59 is a diagram for explaining the operating principle of a nineteenth embodiment of the programmable logic circuit according to the present invention.

FIG. 59 is a diagram for explaining the operating principle of the nineteenth embodiment of the programmable logic circuit according to the present invention. In FIG. 59, those parts which are the same as those corresponding parts in FIG. 57 are designated by the same reference numerals, and a description thereof will be omitted.

As shown in FIG. 59, a first bypass programmable switch PB1 is coupled between the source or drain draw-out electrodes SD1 and SD3 of the first and second transistors T1 and T2, and a second bypass programmable switch PB2 is coupled between the source or drain draw-out electrodes SD4 and SD6 of the third and fourth transistors T3 and T4. In addition, a third bypass programmable switch PB3 is coupled between the source or drain draw-out electrodes SD7 and SD9 of the fifth and sixth transistors T5 and T6, and a fourth bypass programmable switch PB4 is coupled between the source or drain draw-out electrodes SD10 and SD12 of the seventh and eighth transistors T7 and T8.

According to this nineteenth embodiment, the basic cell which forms the minimum unit is made up of eight transistors T1 through T8 and a total of thirty-four programmable switches PD1 through PD4, PS1 through PS4, PB1 through PB4, and P1 through P22. The source or drain draw-out electrodes SD1 and SD3 of the first and second transistors T1 and T2 can be connected directly by the first bypass programmable switch PB1, without via the first output wiring Lout1. Similarly, the source or drain draw-out electrodes SD4 and SD6 of the third and fourth transistors T3 and T4 can be connected directly by the second bypass programmable switch PB2, without via the first output wiring Lout1.

The source or drain draw-out electrodes SD7 and SD9 of the fifth and sixth transistors T5 and T6 can be connected directly by the third bypass programmable switch PB3, without via the second output wiring Lout2. Similarly, the source or drain draw-out electrodes SD10 and SD12 of the seventh and eighth transistors T7 and T8 can be connected directly by the fourth bypass programmable switch PB4, without via the second output wiring Lout2.

Hence, although the number of programmable switches increases by four compared to the number of programmable switches in the seventeenth embodiment, it is possible to form the 3-input NAND circuit, the 3-input NOR circuit, the 4-input NAND circuit, the 4-input NOR circuit, the 3-input AND-OR inverter circuit, the 4-input AND-OR inverter circuit or the like from the eight transistors T1 through T8 of the basic cell, by appropriately programming the total of thirty-four programmable switches PD1 through PD4, PS1 through PS4, PB1 through PB4, and P1 through P22.

Figure 60:
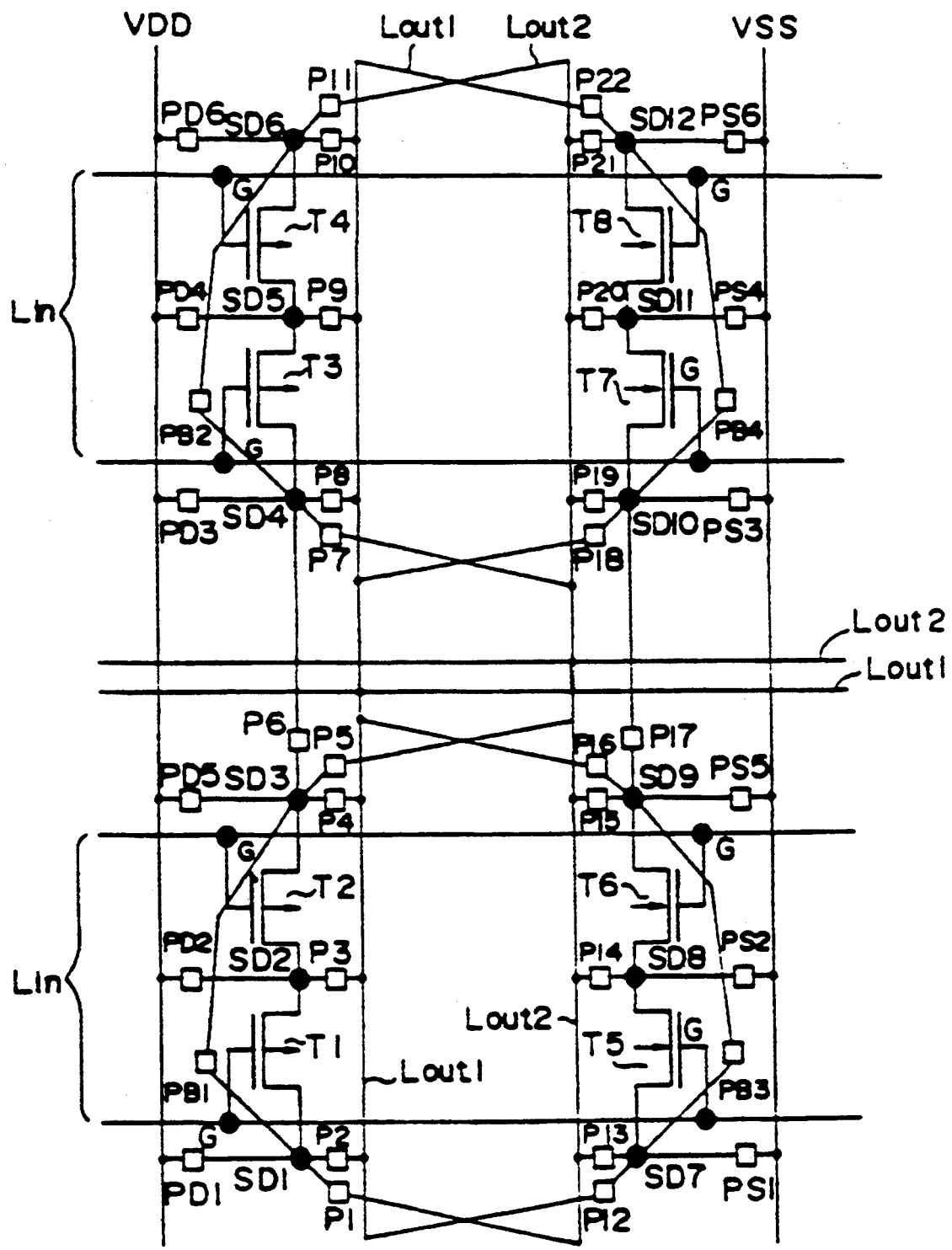
FIG. 60 is a diagram for explaining the operating principle of a twentieth embodiment of the programmable logic circuit according to the present invention.

FIG. 60 is a diagram for explaining the operating principle of the twentieth embodiment of the programmable logic circuit according to the present invention. In FIG. 60, those parts which are the same as those corresponding parts in FIG. 57 are designated by the same reference numerals, and a description thereof will be omitted.

As shown in FIG. 60, the source or drain draw-out electrode SD3 of the second transistor T2 is coupled to the first power supply line VDD via a fifth high potential side programmable switch PD5. The source or drain draw-out electrode SD6 of the fourth transistor T4 is coupled to the first power supply line VDD via a sixth high potential side programmable switch PD6. The source or drain draw-out electrode SD9 of the sixth transistor T6 is coupled to the second power supply line VSS via a fifth low potential side programmable switch PS5. In addition, the source or drain draw-out electrode SD12 of the eighth transistor T8 is coupled to the second power supply line VSS via a sixth low potential side programmable switch PS6.

Furthermore, a first bypass programmable switch PB1 is coupled between the source or drain draw-out electrodes SD1 and SD3 of the first and second transistors T1 and T2, and a second bypass programmable switch PB2 is coupled between the source or drain draw-out electrodes SD4 and SD6 of the third and fourth transistors T3 and T4. In addition, a third bypass programmable switch PB3 is coupled between the source or drain draw-out electrodes SD7 and SD9 of the fifth and sixth transistors T5 and T6, and a fourth bypass programmable switch PB4 is coupled between the source or drain draw-out electrodes SD10 and SD12 of the seventh and eighth transistors T7 and T8.

According to this twentieth embodiment, the basic cell which forms the minimum unit is made up of eight transistors T1 through T8 and a total of thirty-eight programmable switches PD1 through PD6, PS1 through PS6, PB1 through PB4, and P1 through P22. For example, by appropriately programming the fuse elements, anti-fuse elements or, the p-type or n-type field effect transistors which form the third high potential side programmable switch PD3, the second low potential side programmable switch PS2, the first, third, tenth, thirteenth and eighteenth programmable switches P1, P3, P10, P13 and P18, and the first and fourth bypass programmable switches PB1 and PB4 within the basic cell, it is possible to form a 4-input AND-OR inverter circuit by the basic cell.

Hence, although the number of programmable switches increases by eight compared to the number of programmable switches in the seventeenth embodiment, it is possible to form the 3-input NAND circuit, the 3-input NOR circuit, the 4-input NAND circuit, the 4-input NOR circuit, the 3-input AND-OR inverter circuit, the 4-input AND-OR inverter circuit or the like from the eight transistors T1 through T8 of the basic cell, by appropriately programming the total of thirty-eight programmable switches PD1 through PD6, PS1 through PS6, PB1 through PB4, and P1 through P22.

According to the seventeenth through twentieth embodiments, the first through fourth transistors T1 through T4 are p-type field effect transistors, and the fifth through eighth transistors T5 through T8 are n-type field effect transistors, for example. In addition, the programmable switches PD1 through PD6, PS1 through PS6, P1 through P22, and PB1 through PB4 are fuse elements, anti-fuse elements, p-type or n-type field effect transistors or the like, for example.

Next, according to the twenty-first embodiment of the programmable logic circuit of the present invention, two or more basic cells having the structures of any of the ninth through twelfth embodiments described above are connected, so as to form various kinds of logic circuits.

According to this twenty-first embodiment, it is possible to form a D flip-flop circuit from four transmission gate circuits and eight inverter circuits, for example, by appropriately combining the basic cells according to the ninth through twelfth embodiments. In addition, the total number of transistors in this case is forty-eight which includes the sixteen transistors forming the four transmission gate circuits and the thirty-two transistors forming the eight inverter circuits.

Therefore, it is possible to form the D flip-flop using approximately one-half the number of transistors required in the conventional case. Compared to the conventional case where two kinds of basic cells, namely, the transistor pair tile portion and the RAM logic tile portion, are provided as the minimum units, the D flip-flop can be formed more easily be combining the basic cells according to the ninth through twelfth embodiments. Hence, an improved utilization efficiency of the basic cells can be expected.

Next, according to the twenty-second embodiment of the programmable logic circuit of the present invention, two or more basic cells having the structures of any of the thirteenth through sixteenth embodiments described above are connected, so as to form various kinds of logic circuits.

According to this twenty-second embodiment, it is possible to form a 3-input NAND circuit, a 3-input NOR circuit, a 4-input NAND circuit, a 4-input NOR circuit, a 4-input AND-OR inverter circuit by combining the basic cells according to the thirteenth through sixteenth embodiments and utilizing the through-wiring function. In addition, it is possible to form a multiple-input AND-OR inverter circuit or the like by connecting a plurality of such basic cells. Furthermore, it is possible to form a D flip-flop by forming four transmission gate circuits and eight inverter circuits, similarly as in the case of the twenty-first embodiment.

Therefore, it is possible to realize a FPGA which can be freely programmed and has both high performance and large number of functions.

Next, according to the twenty-third embodiment of the programmable logic circuit of the present invention, two or more basic cells having the structures of any of the seventeenth through twentieth embodiments described above are connected, so as to form various kinds of logic circuits.

According to this twenty-third embodiment, it is possible to form a 3-input NAND circuit, a 3-input NOR circuit, a 4-input NAND circuit, a 4-input NOR circuit, a 4-input AND-OR inverter circuit by combining the basic cells according to the seventeenth through twentieth embodiments and utilizing the through-wiring function. In addition, it is possible to form a multiple-input AND-OR inverter circuit or the like by connecting a plurality of such basic cells.

Therefore, similarly to the twenty-second embodiment, it is possible to realize a FPGA which can be freely programmed and has both high performance and large number of functions.

Next, according to the twenty-fourth embodiment of the programmable logic circuit of the present invention, two or more basic cells having the structures of any of the ninth through twentieth embodiments described above are connected, so as to form various kinds of logic circuits.

According to this twenty-fourth embodiment, it is possible to form a relatively small-scale inverter circuit, power type inverter circuit, transmission gate circuit, 2-input NAND circuit, 2-input NOR circuit or the like by connecting the basic cells according to the ninth through sixteenth embodiments. In addition, it is possible to form a relatively large-scale 3-input NAND circuit, 3-input NOR circuit, 4-input NAND circuit, 4-input NOR circuit, 4-input AND-OR inverter circuit or the like by connecting the basic cells according to the ninth through twentieth embodiments. In other words, it is possible to form a multi-function composite logic circuit by combining the above described basic cells.

Therefore, similarly to the twenty-third embodiment, it is possible to realize a FPGA which can be freely programmed and has both high performance and large number of functions.

Next, a more detailed description will be given of each of the ninth through twentieth embodiments, by referring to FIGS. 61 through 125.

Figure 61:
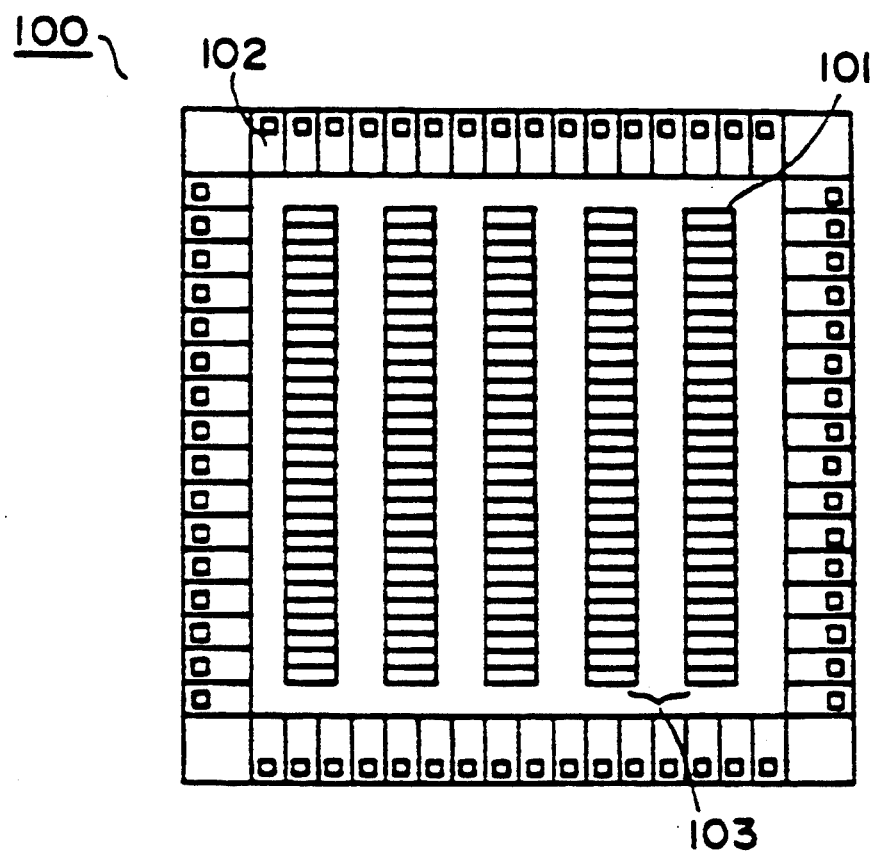
FIG. 61 is a plan view showing a FPGA chip of each embodiment.

(1) Ninth Embodiment:

FIG. 61 is a plan view of a FPGA chip according to each of the ninth through twentieth embodiments. FIG. 62 in parts (a) and (b) is a diagram for explaining the basic cell in each of the ninth through twentieth embodiments, and FIG. 63 in parts (a) and (b) is a diagram showing the structure of a first basic cell 1 in the ninth embodiment.

As shown in FIG. 61, a FPGA 100 includes a basic cell region 101, an input/output cell region (input/output circuit element region) 102, and a wiring region 103. The FPGA 100 can be provided to the user quickly, and is suited for use in developing a new LSI or making a prototype of an electronic device. The FPGA 100 is an ASIC which may be programmed arbitrarily by the user.

Figure 62A:
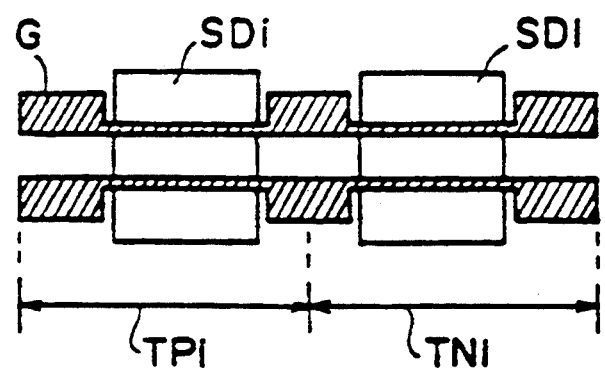
FIG. 62 in parts (a) and (b) is a diagram for explaining a basic cell in each embodiment.

In other words, the basic cell of the FPGA according to the ninth through sixteenth embodiments includes p-type field effect transistors TPi [i=1, 2, 11, 12] which are examples of the first and second transistors T1 and T2, and n-type field effect transistors TNi [i=1, 2, 11, 12] which are examples of the third and fourth transistors T3 and T4, as shown in FIG. 62(a). The basic cell is also provided with source or drain draw-out electrodes SDi [i=1~6], and gates G.

On the other hand, the basic cell of the FPGA according to the seventeenth through twentieth embodiments includes p-type field effect transistors TPi [i=1~4] which are examples of the first through fourth transistors T1 through T4, and n-type field effect transistors TNi [i=1~4] which are examples of the fifth through eighth transistors T5 through T8. The basic cell is also provided with source or drain draw-out electrodes SDi [i=1~12], and gates G.

Figure 62B:
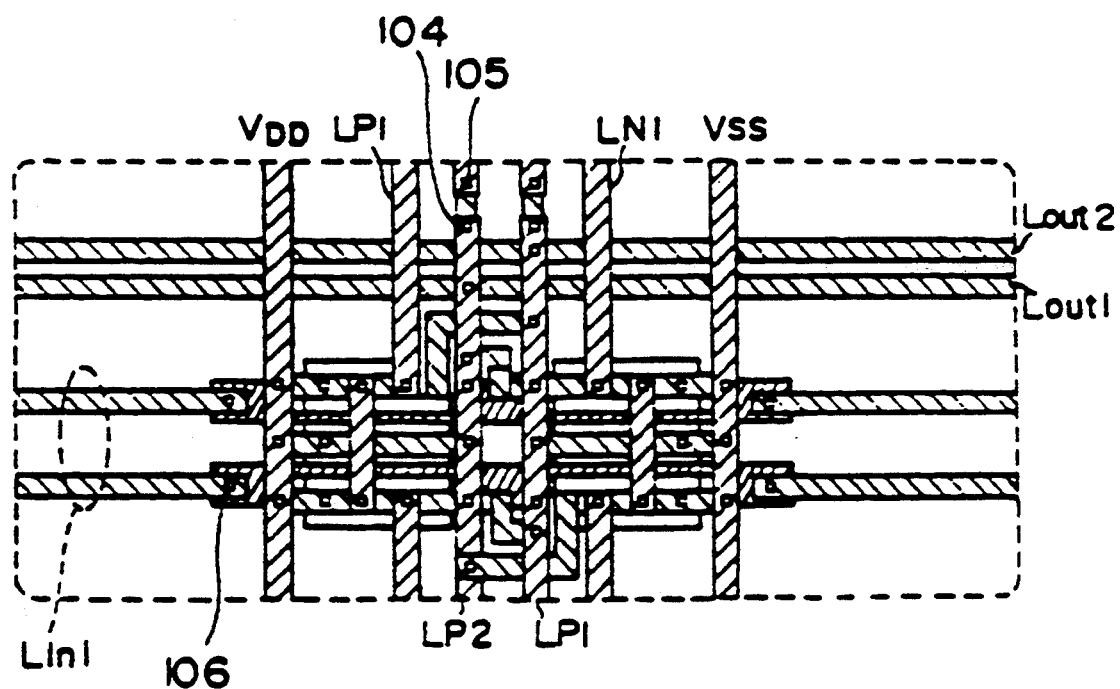

FIG. 62(b) shows a plan view of the wiring region of the first through fourth transistors T1 through T4. In FIG. 62(b), each gate G of the first through fourth transistors T1 through T4 is fixedly connected to the input wiring Lin via a contact hole (bulk-AL1) 108. In addition, the first and second output wirings Lout1 and Lout2 are fixedly connected to first and second p-type protection wirings or the like which are examples of the first and second high potential side protection wirings LP1 and LP2, via through holes (AL1-AL2) 105.

In addition, in the FPGA of each of the nineteenth through twentieth embodiments, each of the various program points are programmed via the through holes (AL1-AL2) 105 to the first and second power supply lines VDD and VSS (hereinafter simply referred to as a power supply line VDD and a ground line GND, respectively) and the first and second n-type protection wirings or the like which are examples of the first and second low potential side protection wirings LN1 and LN2. A more detailed description related to the programming will be given later in conjunction with FIGS. 63 through 125.

In FIG. 63, (a) shows a circuit diagram including transistors, wirings and various program points, and (b) shows a program symbol diagram related to the arrangement of the various program points.

Figure 63A:
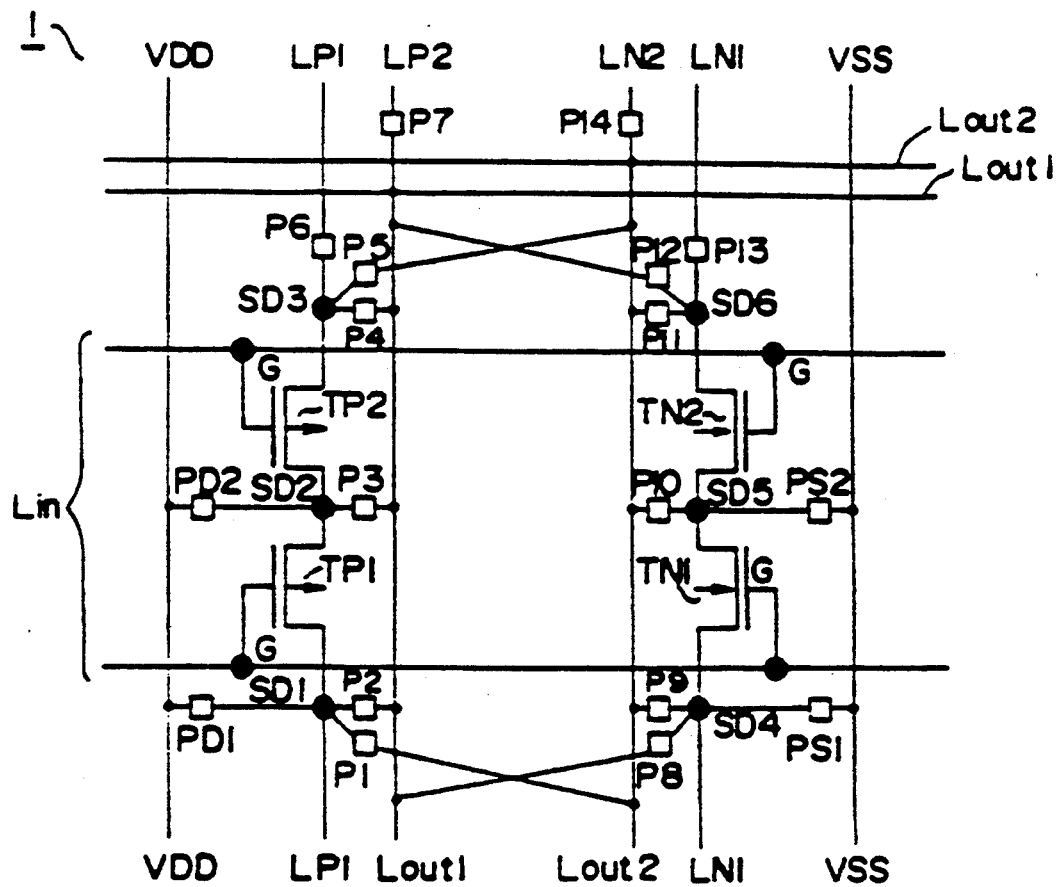
FIG. 63 in parts (a) and (b) is a diagram showing the structure of a basic cell of the ninth embodiment of the programmable logic circuit according to the present invention.

In FIG. 63(a), the first basic cell 1 includes first through fourth transistors TP1, TP2, TN1 and TN2, and eighteen programmable switches PD1, PD2, PS1, PS2, and P1 through P14.

For example, each gate G of the first through fourth transistors TP1, TP2, TN1 and TN2 is connected to the input wiring Lin. The source or drain draw-out electrodes SD1 through SD6 of the first through fourth transistors TP1, TP2, TN1 and TN2 are coupled to the selected ones of the power supply line VDD, the ground line GND, the first and second output wirings Lout1 and Lout2, the first and second p-type protection wirings LP1 and LP2, and the first and second n-type protection wirings LN1 and LN2, via first and second p-type power supply programmable switches which are examples of the first and second high potential side programmable switches PD1 and PD2, n-type ground programmable switches which are examples of the first and second low potential side programmable switches PS1 and PS2, and the first through fourteenth programmable switches P1 through P14.

Figure 63B:
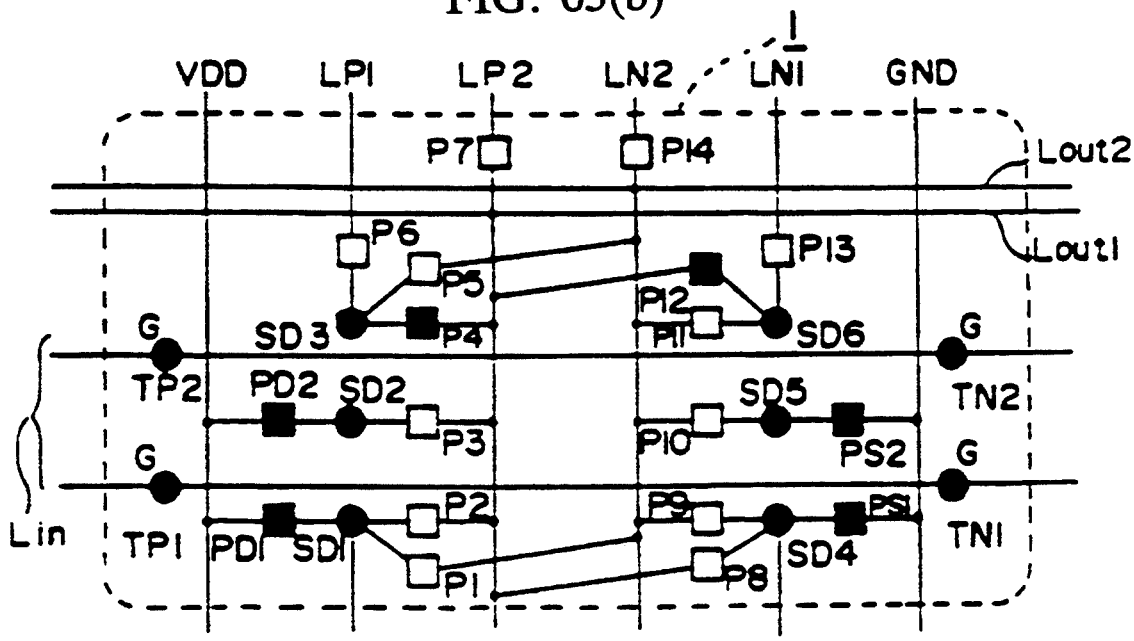

In other words, in the program symbol diagram shown in FIG. 63(b) in which the transistor symbols are omitted, the source or drain draw-out electrode SD1 of the first transistor TP1 is coupled to the power supply line VDD via the first p-type power supply programmable switch PD1, to the second output wiring Lout2 via the first programmable switch P1, to the first output wiring Lout1 via the second programmable switch P2, and to the first p-type protection wiring LP1.

In addition, the source or drain draw-out electrode SD2 of the first and second transistors TP1 and TP2 is coupled to the power supply line VDD via the second p-type power supply programmable switch PD2, and to the first output wiring Lout1 via the third programmable switch P3. The source or drain draw-out electrode S3 of the second transistor TP2 is coupled to the first output wiring Lout1 via the fourth programmable switch P4, to the second output wiring Lout2 via the fifth programmable switch P5, and to the first p-type protection wiring LP1 via the sixth programmable switch P6.

Furthermore, the source or drain draw-out electrode SD4 of the third transistor TN1 is coupled to the ground line GND via the first n-type ground programmable switch PS1, to the first output wiring Lout1 via the eighth programmable switch P8, to the second output wiring Lout2 via the ninth programmable switch P9, and to the first n-type protection wiring LN1. The source or drain draw-out electrode SD5 of the third and fourth transistors TN1 and TN2 is coupled to the ground line GND via the second n-type ground programmable switch PS2, and to the second output wiring Lout2 via the tenth programmable switch P10.

The source or drain draw-out electrode SD6 of the fourth transistor TN2 is coupled to the second output wiring Lout2 via the eleventh programmable switch P11, to the first output wiring Lout1 via the twelfth programmable switch P12, and to the first n-type protection wiring LN1 via the thirteenth programmable switch P13. The first output wiring Lout1 is coupled to the second p-type protection wiring LP2 via the seventh programmable switch P7, and the second output wiring Lout2 is coupled to the second n-type protection wiring LN2 via the fourteenth programmable switch P14.

Each of the various kinds of program points are made up of fuse elements, anti-fuse elements, or p-type or n-type field effect transistors. The program point becomes electrically insulative or electrically conductive depending on the programming. The programming includes melting the fuse element, activating the anti-fuse element, and turning ON/OFF the field effect transistor. In the program symbol diagram shown in FIG. 63(b), the anti-fuse element is used at each program point as indicated by an unfilled or white square symbol, and this anti-fuse element is indicated by a filled or black square symbol if selected. Hence, the non-selected anti-fuse remains indicated by the unfilled or white square symbol.

On the other hand, if the fuse element is used at each of the various program points, the unfilled or white square symbol in this case indicates a melted and disconnected fuse element. Hence, the non-selected fuse element is indicated by the filled or black square symbol.

If the p-type or n-type field effect transistor is used at each of the various program points, the unfilled or white square symbol in this case indicates a field effect transistor which is OFF. Thus, the filled or black square symbol indicates a field effect transistor which is ON.

Therefore, the first basic cell 1 of the ninth embodiment is provided with the first through fourth transistors TP1, TP2, TN1 and TN2, and the various kinds of programmable switches PD1, PD2, PS1, PS2, and P1 through P14 which connect these transistors and the wirings. For this reason, the first basic cell 1 which forms the minimum unit includes four transistors TP1, TP2, TN1 and TN2, and a total of eighteen programmable switches PD1, PD2, PS1, PS2, and P1 through P14. For example, the fuse elements, the anti-fuse elements, or the p-type or n-type field effect transistors which form the first and second p-type power supply programmable switches PD1 and PD2, the first and second n-type ground programmable switches PS1 and PS2, and the fourth and twelfth programmable switches P4 and P12 within the first basic cell 1 are programmed. As a result, the source or drain draw-out electrode' SD1 of the first transistor TP1 and the power supply line VDD are connected via the first p-type power supply programmable switch PD1. In addition, the source or drain draw-out electrode SD2 of the first and second transistors TP1 and TP2 and the power supply line VDD are connected via the second p-type power supply programmable switch PD2.

Furthermore, the source or drain draw-out electrode SD3 of the second transistor TP2 and the output wiring Lout1 are connected via the fourth programmable switch P4. The source or drain draw-out electrode SD4 of the third transistor TN1 and the ground line GND are connected via the first n-type ground programmable switch PS1. The source or drain draw-out electrode SD5 of the third and fourth transistors TN1 and TN2 and the ground line GND are connected via the second p-type ground programmable switch PS2. Moreover, the source or drain draw-out electrode SD6 of the fourth transistor TN4 and the first output wiring Lout1 are connected via the twelfth programmable switch P12.

Therefore, it is possible to form an inverter circuit from the second transistor TP2 which is a p-type field effect transistor and the fourth transistor TN2 which is an n-type field effect transistor. Hence, it may be seen that it is possible to form basic logic cells such as an inverter circuit, a power type inverter circuit, a transmission gate circuit, a 2-input NAND circuit and a 2-input NOR circuit from the four transistors TP1, TP2, TN1 and TN2 by appropriately programming the total of eighteen programmable switches PD1, PD2, PS1, PS2, and P1 through P14.

By appropriately programming the seventh and fourteenth programmable switches P7 and P14, it is possible to connect the first output wiring Lout1 or the second output wiring Lout2 to the first basic cell 1 in the vertical direction.

(2) Tenth Embodiment:

FIG. 64 in parts (a) and (b) is a diagram showing the structure of a second basic cell 2 in the tenth embodiment. This tenth embodiment differs from the ninth embodiment in that the second basic cell 2 is connected to a third p-type power supply programmable switch PD3 and a third n-type ground programmable switch PS3.

Figure 64A:
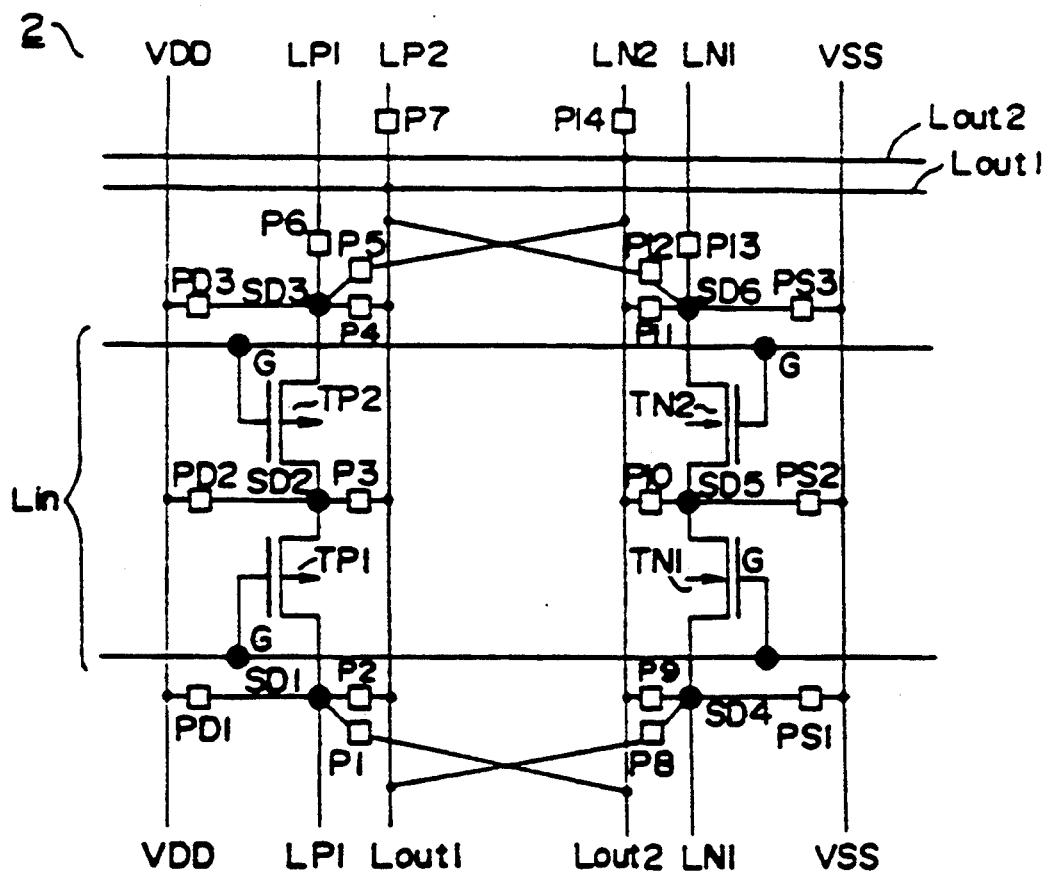
FIG. 64 in parts (a) and (b) is a diagram showing the structure of a basic cell of the tenth embodiment of the programmable logic circuit according to the present invention.

In other words, the second basic cell 2 shown in FIG. 64(a) includes first through fourth transistors TP1, TP2, TN1 and TN2, and twenty programmable switches PD1 through PD3, PS1 through PS3, and P1 through P14.

Figure 64B:
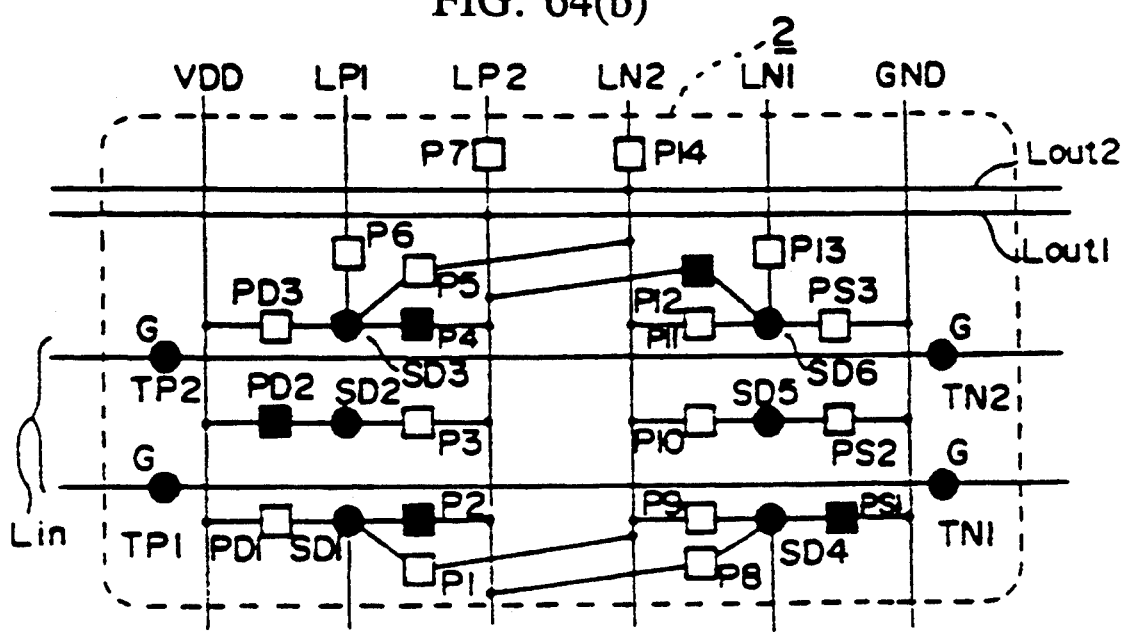

In addition, in the program symbol diagram shown in FIG. 64(b), the third p-type power supply programmable switch PD3 is coupled between the source or drain draw-out electrode SD3 of the second transistor TP2 and the power supply line VDD. The third n-type ground programmable switch PS3 is coupled between the source or drain draw-out electrode SD6 of the fourth transistor T4 and the ground line GND. Otherwise, the structure of the second basic cell 2 is the same as that of the first basic cell 1, and a description related to the same parts will be omitted.

According to this tenth embodiment, the second basic cell 2 which forms the minimum unit is made up of four transistors TP1, TP2, TN1 and TN2, and a total of twenty programmable switches PD1 through PD3, PS1 through PS3 and P1 through P14. For example, by appropriately programming the fuse elements, anti-fuse elements or, the p-type or n-type field effect transistors which form the first and third p-type power supply programmable switches PD1 and PD3, the first n-type ground programmable switch PS1, and the third and twelfth programmable switches P3 and P12 within the second basic cell 2, it is possible to form a 2-input NAND circuit by the second basic cell 2.

Hence, although the number of programmable switches increases by two compared to the number of programmable switches in the ninth embodiment, it becomes possible to form the inverter circuit, the power type inverter circuit, the transmission gate circuit, the 2-input NAND circuit, the 2-input NOR circuit and the like. In addition, it is possible to form 3-input and 4-input basic logic circuits by combining the second basic cells 2 and appropriately programming the third p-type power supply programmable switch PD3 and the third n-type ground programmable switch PS3.

(3) Eleventh Embodiment:

FIG. 65 in parts (a) and (b) is a diagram showing the structure of a third basic cell 3 in the eleventh embodiment. FIGS. 66 through 81 show structures of the basic logic cells formed by this third basic cell 3 when programmed. This eleventh embodiment differs from the ninth embodiment in that the third basic cell 3 is provided with first and second bypass programmable switches PB1 and PB2.

Figure 65A:
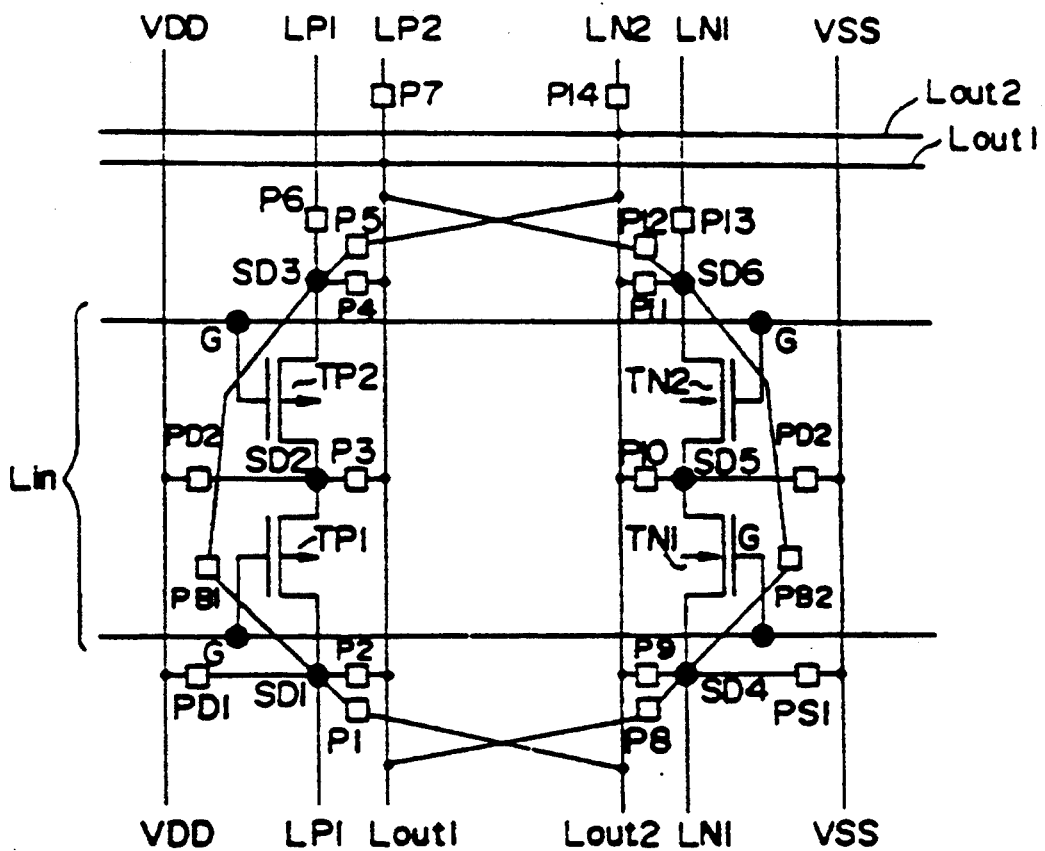
FIG. 65 in parts (a) and (b) is a diagram showing the structure of a basic cell of the eleventh embodiment of the programmable logic circuit according to the present invention.

In other words, the third basic cell 3 shown in FIG. 65(a) includes first through fourth transistors TP1, TP2, TN1 and TN2, and twenty programmable switches PD1, PD2, PS1, PS2, P1 through P14, PB1 and PB2.

Figure 65B:
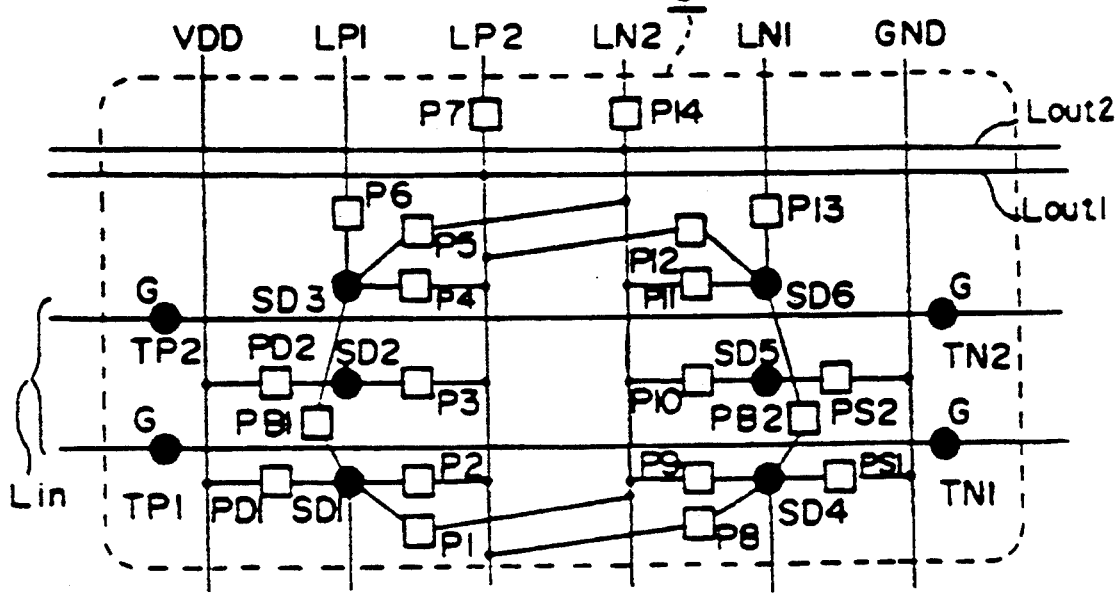

In addition, in the program symbol diagram shown in FIG. 65(b), the first bypass programmable switch PB1 is coupled between the source or drain draw-out electrodes SD1 and SD3 of the first and second transistors TP1 and TP2. The second bypass programmable switch PB2 is coupled between the source or drain draw-out electrodes SD4 and SD6 of the third and fourth transistors TN1 and TN2. Otherwise, the structure of the third basic cell 3 is the same as that of the first basic cell 1, and a description related to the same parts will be omitted.

Next, a description will be given of the programming of the third basic cell 3 of this eleventh embodiment.

Figure 66A:
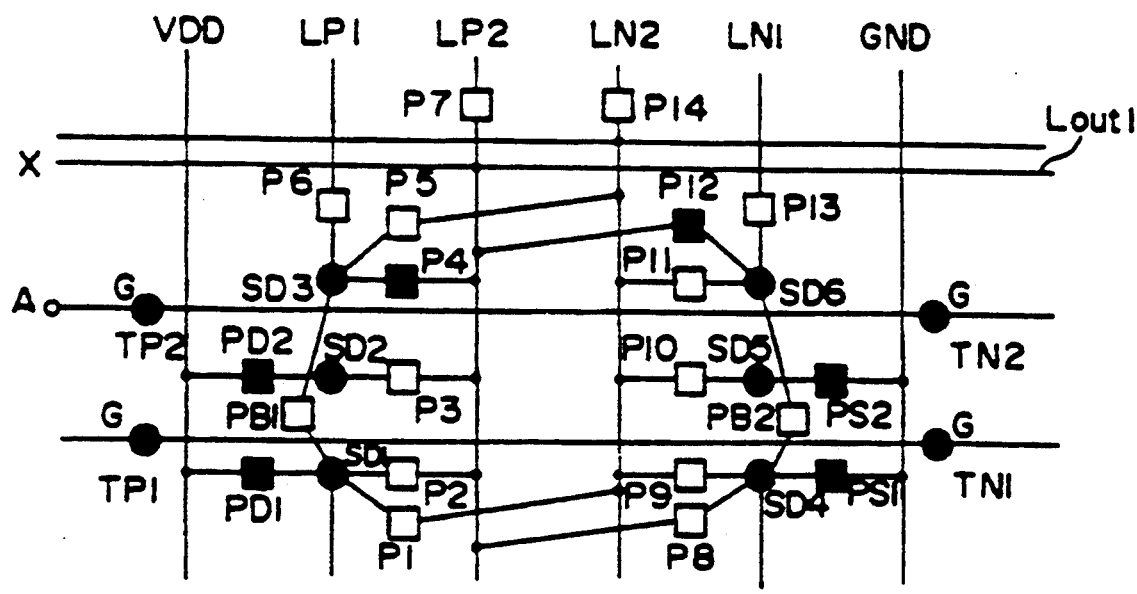
FIG. 66 in parts (a) and (b) is a diagram showing the structure of an inverter circuit which is obtained by programming the basic cell of the eleventh embodiment.

FIG. 66 in parts (a) and (b) shows the structure of an inverter circuit which is obtained by programming the third basic cell 3 of the eleventh embodiment. In FIG. 66(a), the inverter circuit is obtained by appropriately programming the fuse elements, anti-fuse elements or, the p-type or n-type field effect transistors which form the first and second p-type power supply programmable switches PD1 and PD2, the first n-type ground programmable switch PS1, and the fourth and twelfth programmable switches P4 and P12 within the third basic cell 3.

Figure 66B:
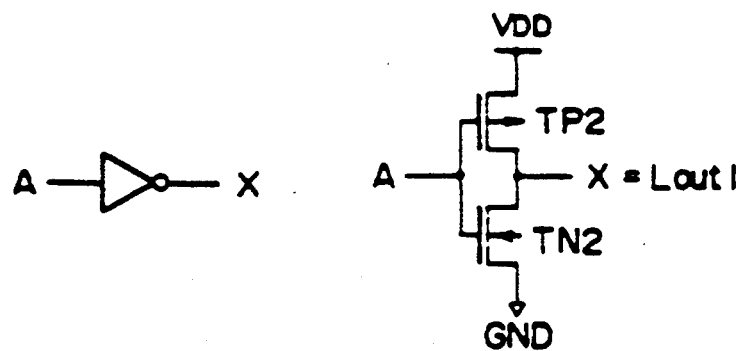

By this programming, it is possible to form the inverter circuit shown in FIG. 66(b) which has the transistors TP2 and TN1 connected between the power supply line VDD and the ground line GND. This inverter circuit inverts and amplifies an input signal A and outputs an output signal X via the first output wiring Lout1.

Figure 67A:
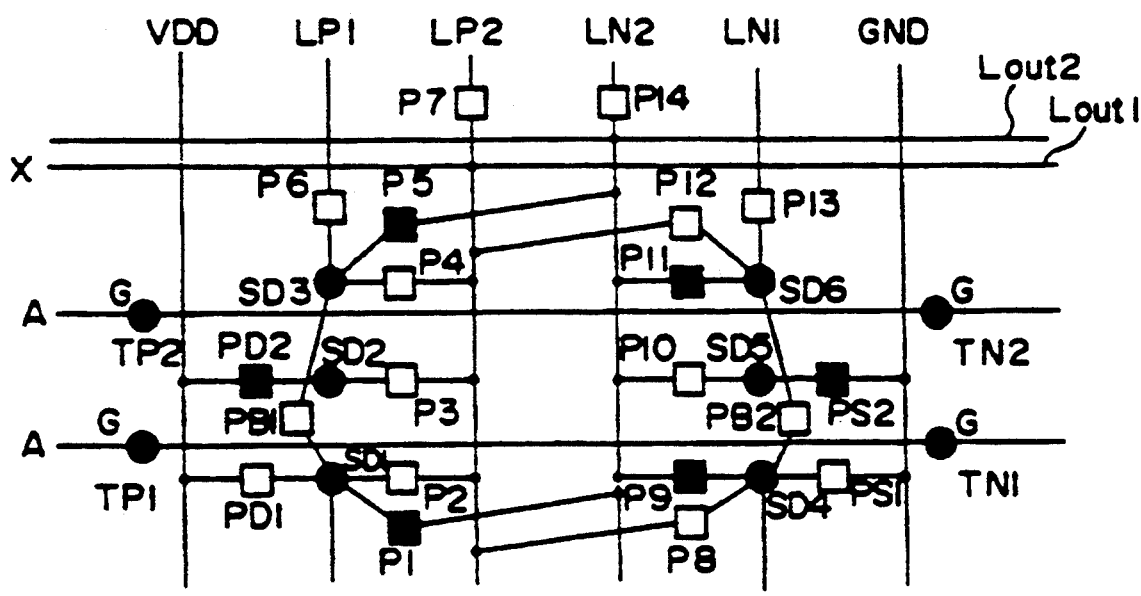
FIG. 67 in parts (a) and (b) is a diagram showing the structure of a power type inverter circuit which is obtained by programming the basic cell of the eleventh embodiment.

FIG. 67 in parts (a) and (b) shows the structure of a power type inverter circuit which is obtained by programming the third basic cell 3 of the eleventh embodiment. In FIG. 67(a), the power type inverter circuit is obtained by appropriately programming the fuse elements, anti-fuse elements or, the p-type or n-type field effect transistors which form the second p-type power supply programmable switch PD2, the second n-type ground programmable switch PS2, and the first, fifth, ninth and eleventh programmable switches P1, P5, P9 and P11 within the third basic cell 3.

Figure 67B:
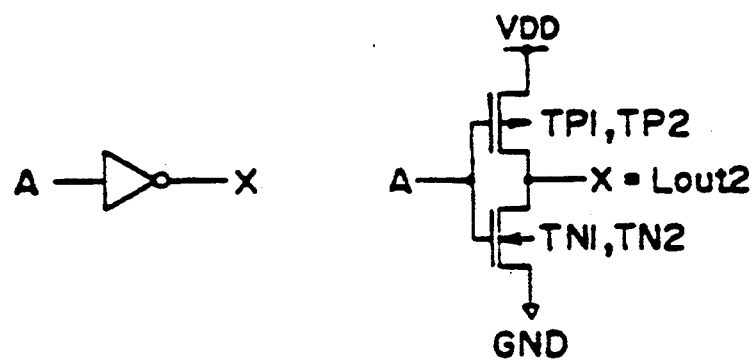

By this programming, it is possible to form the power type inverter circuit shown in FIG. 67(b) which has the transistors TP1, TN1, TP2 and TN2 connected between the power supply line VDD and the ground line GND. This power type inverter circuit inverts and amplifies an input signal A and outputs an output signal X via the second output wiring Lout2.

Figure 68A:
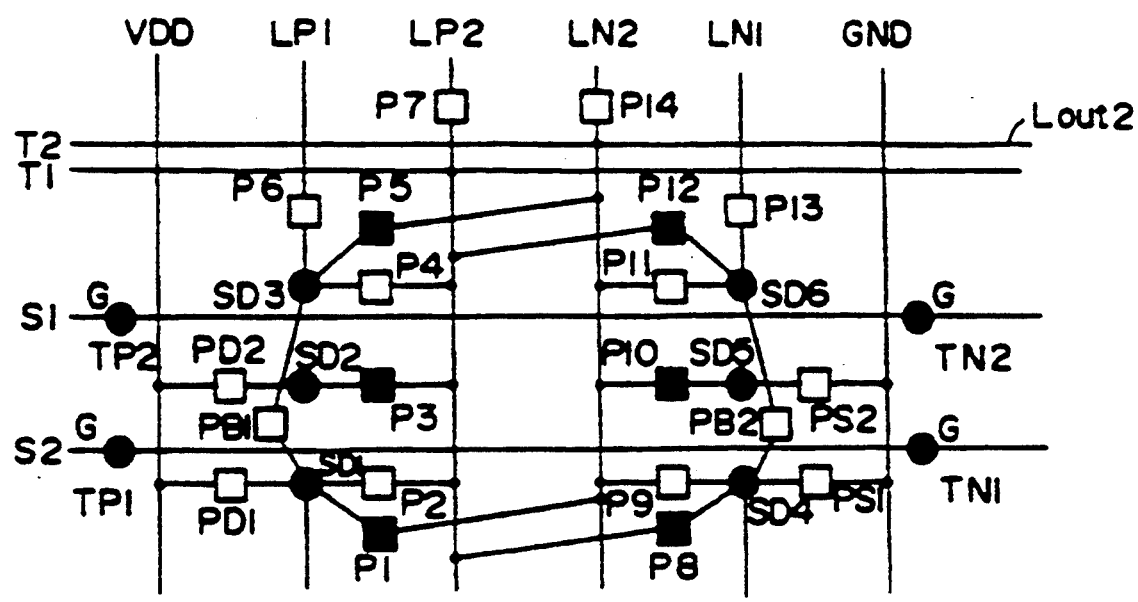
FIG. 68 in parts (a) and (b) is a diagram showing the structure of a transmission gate circuit which is obtained by programming the basic cell of the eleventh embodiment.

FIG. 68 in parts (a) and (b) shows the structure of a transmission gate circuit which is obtained by programming the third basic cell 3 of the eleventh embodiment. In FIG. 68(a), the transmission gate circuit is obtained by appropriately programming the fuse elements, anti-fuse elements or, the p-type or n-type field effect transistors which form the first, third, fifth, eighth, tenth and twelfth programmable switches P1, P3, P5, P8, P10 and P12 within the third basic cell 3.

Figure 68B:
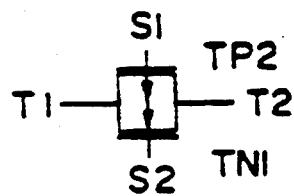

By this programming, it is possible to form the transmission gate circuit shown in FIG. 68(b) which has the first output wiring Lout1 extending to a connection terminal T1, the second output wiring Lout2 extending to a connection terminal T2, the gate G of the second transistor TP2 connected to a control terminal S1, and the gate G of the third transistor TN1 connected to a control terminal S2.

Figure 69A:
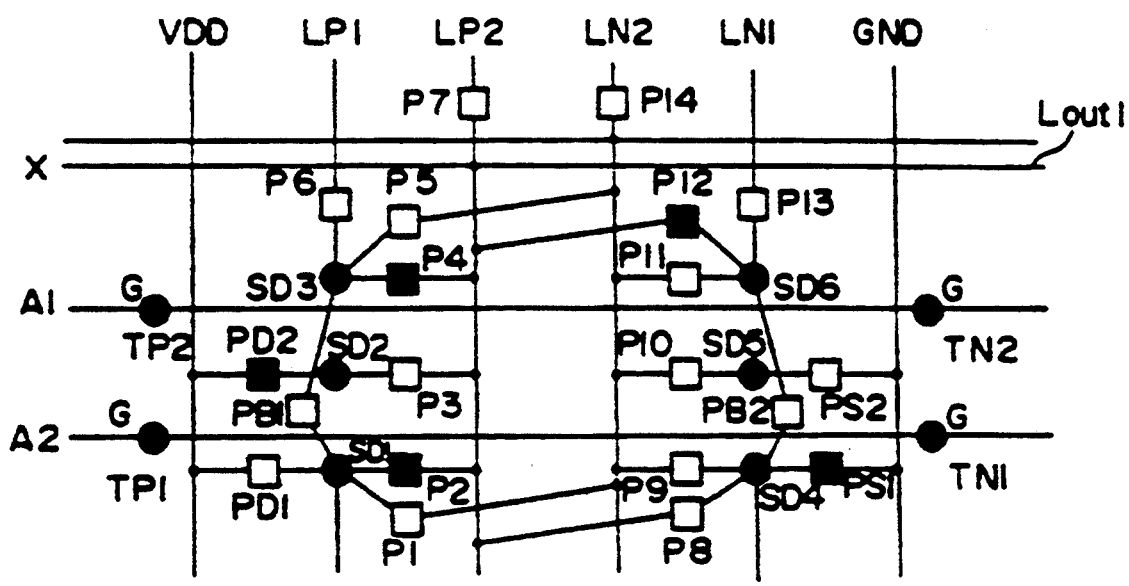
FIG. 69 in parts (a) and (b) is a diagram showing the structure of a 2-input NAND circuit which is obtained by programming the basic cell of the eleventh embodiment.

FIG. 69 in parts (a) and (b) shows the structure of a 2-input NAND circuit which is obtained by programming the third basic cell 3 of the eleventh embodiment. In FIG. 69(a), the 2-input NAND circuit is obtained by appropriately programming the fuse elements, anti-fuse elements or, the p-type or n-type field effect transistors which form the second p-type power supply programmable switch PD2, the first n-type ground programmable switch PS1, and the second, fourth and twelfth programmable switches P2, P4 and P12 within the third basic cell 3.

Figure 69B:
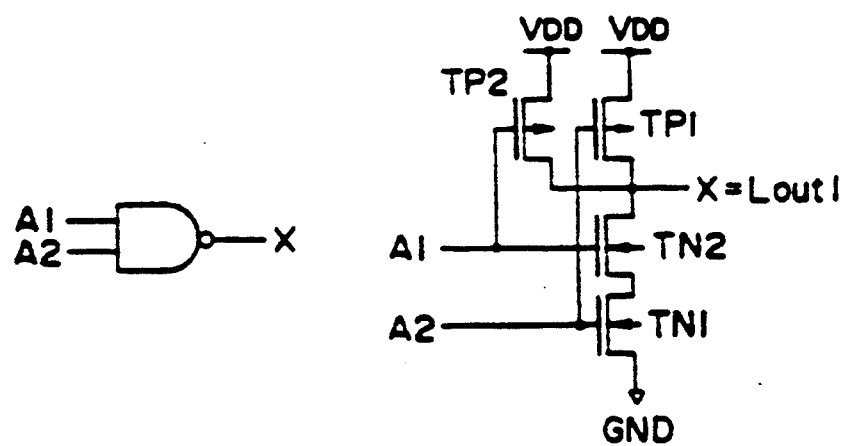

By this programming, it is possible to form the 2-input NAND circuit shown in FIG. 69(b) which has the first through fourth transistors TP1, TP2, TN1 and TN2. This 2-input NAND circuit amplifies the logic (that is, obtains a NAND) of input signals A1 and A2, and outputs an output signal X via the first output wiring Lout1.

Figure 70A:
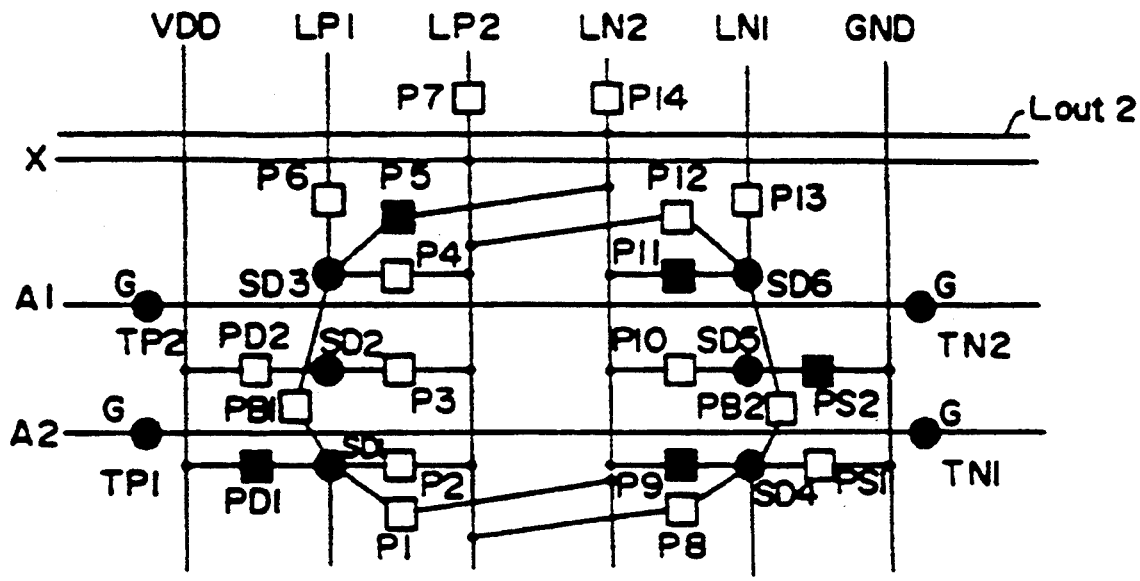
FIG. 70 in parts (a) and (b) is a diagram showing the structure of a 2-input NOR circuit which is obtained by programming the basic cell of the eleventh embodiment.

FIG. 70 in parts (a) and (b) shows the structure of a 2-input NOR circuit which is obtained by programming the third basic cell 3 of the eleventh embodiment. In FIG. 70(a), the 2-input NOR circuit is obtained by appropriately programming the fuse elements, anti-fuse elements or, the p-type or n-type field effect transistors which form the first p-type power supply programmable switch PD1, the second n-type ground programmable switch PS2, and the fifth, ninth and twelfth programmable switches P5, P9 and P12 within the third basic cell 3.

Figure 70B:
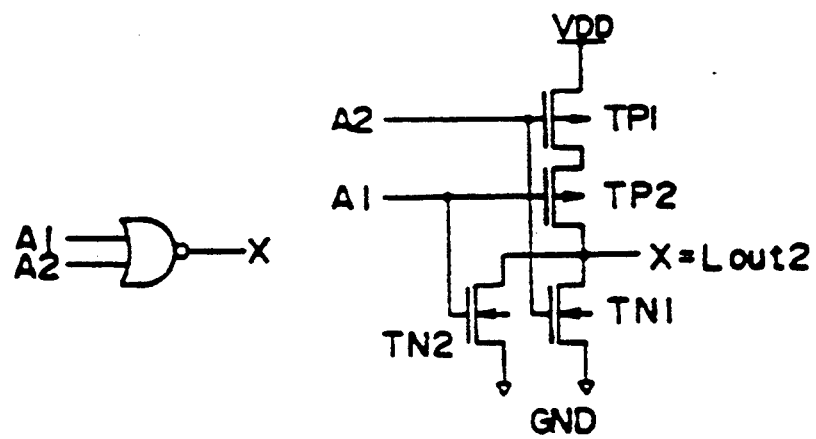

By this programming, it is possible to form the 2-input NOR circuit shown in FIG. 70(b) which has the first through fourth transistors TP1, TP2, TN1 and TN2. This 2-input NOR circuit amplifies the logic (that is, obtains a NOR) of input signals A1 and A2, and outputs an output signal X via the second output wiring Lout2.

Accordingly, the third basic cell 3 of the eleventh embodiment includes first through fourth transistors TP1, TP2, TN1 and TN2, and twenty programmable switches PD1, PD2, PS1, PS2, P1 through P14, PB1 and PB2 for connecting these transistors TP1, TP2, TN1 and TN2 and the wirings as shown in FIG. 65(a). In addition, the first bypass programmable switch PB1 is coupled between the source or drain draw-out electrodes SD1 and SD3 of the first and second transistors TP1 and TP2. The second bypass programmable switch PB2 is coupled between the source or drain draw-out electrodes SD4 and SD6 of the third and fourth transistors TN1 and TN2.

For this reason, the third basic cell 3 which forms the minimum unit is formed by the four transistors TP1, TP2, TN1 and TN2, and a total of twenty programmable switches PD1, PD2, PS1, PS2, P1 through P14, PB1 and PB2. By the provision of the first bypass programmable switch PB1, it is possible to directly connect the source or drain draw-out electrodes SD1 and SD3 of the first and second transistors TP1 and TP2, without via the first output wiring Lout1. Similarly, by the provision of the second bypass programmable switch PB2, it is possible to directly connect the source or drain draw-out electrodes SD4 and SD6 of the third and fourth transistors TN1 and TN2, without via the second output wiring Lout2.

Therefore, the number of programmable switches increases by two compared to the ninth embodiment. However, the first and second bypass programmable switches PB1 and PB2 can be used efficiently when connecting three third basic cells 3 to form a 4-input AND-OR inverter circuit, a 6-input AND-OR inverter circuit or the like.

In addition, the number of transistors and the number of program points of the third basic cell 3 are minimized compared to the large numbers required in the conventional case, and the third basic cell 3 can be programmed and combined appropriately to form twenty-one kinds of basic logic circuits.

Next, a description will be given of the programming of a plurality of third basic cells 3.

Figure 71A:
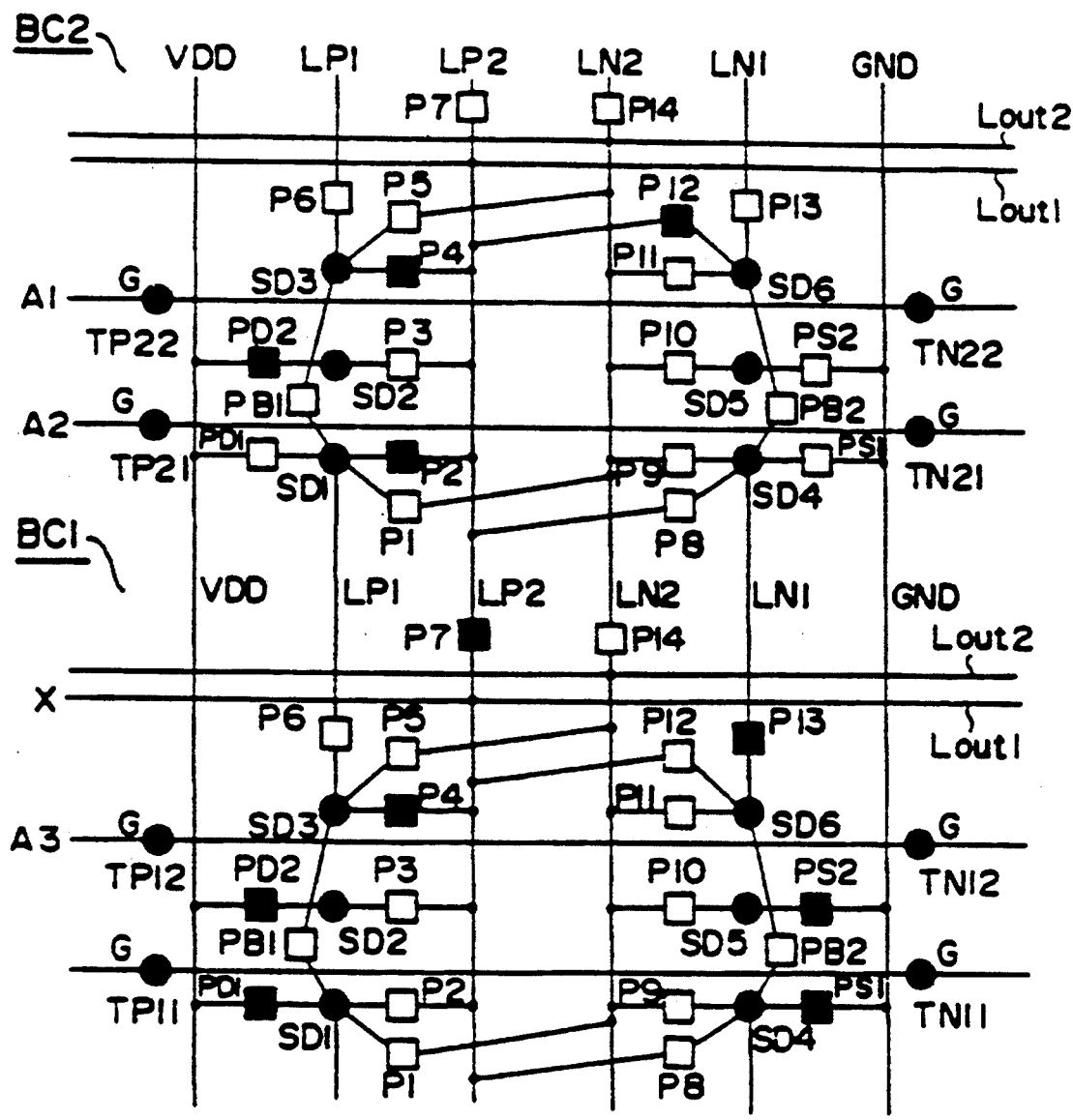
FIG. 71 in parts (a) and (b) is a diagram showing the structure of a 3-input NAND circuit which is obtained by programming the basic cell of the eleventh embodiment.

FIG. 71 in parts (a) and (b) shows the structure of a 3-input NAND circuit which is obtained by programming the third basic cells 3 of the eleventh embodiment. In FIG. 71(a), two third basic cells 3 are connected. The power supply line VDD, the ground line GND, the first and second p-type protection wirings LP1 and LP2, and the first and second n-type protection wirings LN1 and LN2 of one third basic cell 3 (BC1) are respectively connected to the corresponding power supply line VDD, ground line GND, first and second p-type protection wirings LP1 and LP2, and the first and second n-type protection wirings LN1 and LN2 of the other third basic cell 3 (BC2). In addition, between the two third basic cells BC1 and BC2, the first p-type protection wirings LP1 are connected via a program point P6, the second p-type protection wiring LP2 and the first output wiring Lout1 are connected via a program point P7, the first n-type protection wirings LN1 are connected via a program point P13, and the second n-type protection wiring LN2 and the second output wiring Lout2 are connected via a program point P14.

The fuse elements, anti-fuse elements or, the p-type or n-type field effect transistors which form the first and second p-type power supply programmable switches PD1 and PD2, the first and second n-type power supply programmable switches PS1 and PS2, and the fourth, seventh and thirteenth programmable switches P4, P7 and P13 of the third basic cell BC1 are programmed. In addition, the fuse elements, anti-fuse elements or, the p-type or n-type field effect transistors which form the second p-type power supply programmable switch PD2, and the second, fourth and twelfth programmable switches P2, P4 and P12 of the third basic cell BC2 are programmed.

Figure 71B:
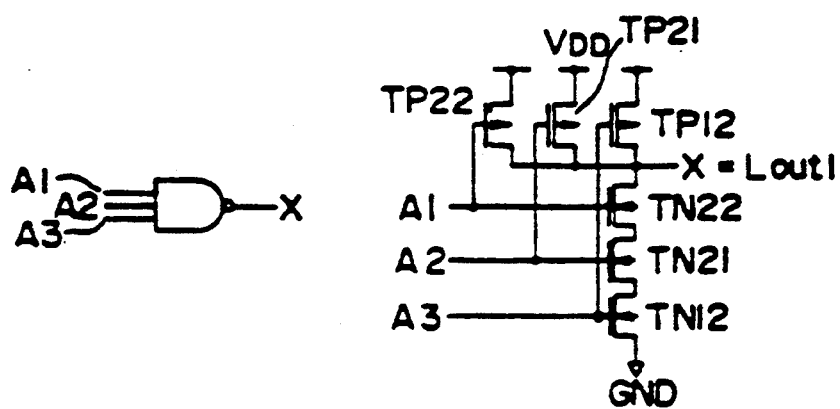

Accordingly, as shown in FIG. 71(b), it is possible to form a 3-input NAND circuit which includes the first through fourth transistors TP11, TP12, TN11 and TN12 of the third basic cell BC1, and the first through fourth transistors TP21, TP22, TN21 and TN22 of the third basic cell BC2. This 3-input NAND circuit amplifies the logic (obtains a NAND) of input signals A1, A2 and A3 and outputs an output signal X via the first output wiring Lout1.

Figure 72A:
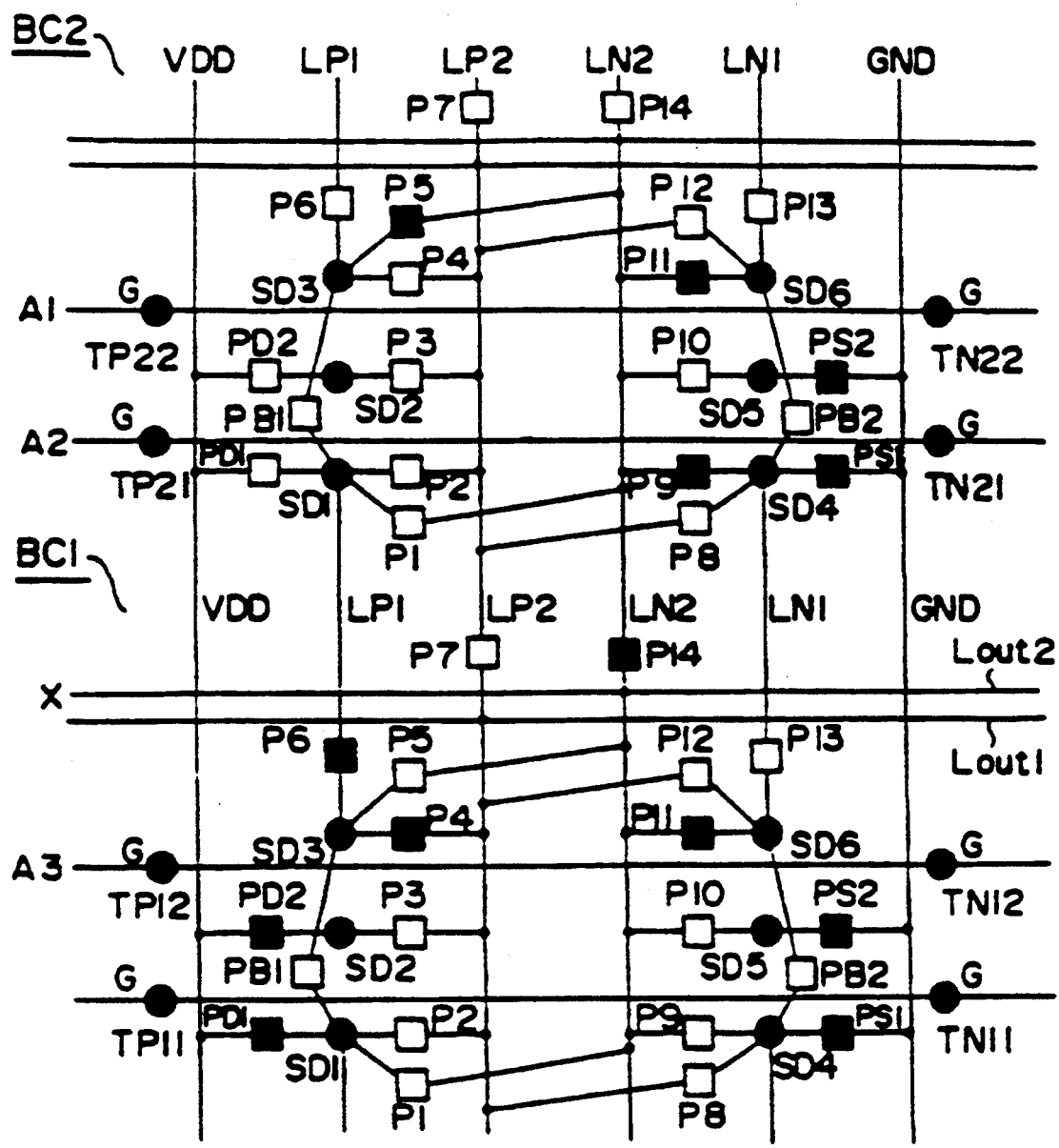
FIG. 72 in parts (a) and (b) is a diagram showing the structure of a 3-input NOR circuit which is obtained by programming the basic cell of the eleventh embodiment.

FIG. 72 in parts (a) and (b) shows the structure of a 3-input NOR circuit which is obtained by programming the third basic cells 3 of the eleventh embodiment. In FIG. 72(a), two third basic cells 3 are connected.

The fuse elements, anti-fuse elements or, the p-type or n-type field effect transistors which form the first and second p-type power supply programmable switches PD1 and PD2, the first and second n-type power supply programmable switches PS1 and PS2, and the fourth, sixth, eleventh and fourteenth programmable switches P4, P6, P11 and P14 of the third basic cell BC1 are programmed. In addition, the fuse elements, anti-fuse elements or, the p-type or n-type field effect transistors which form the first and second n-type power supply programmable switches PS1 and PS2, and the fifth, ninth and eleventh programmable switches P5, P9 and P11 of the third basic cell BC2 are programmed.

Figure 72B:
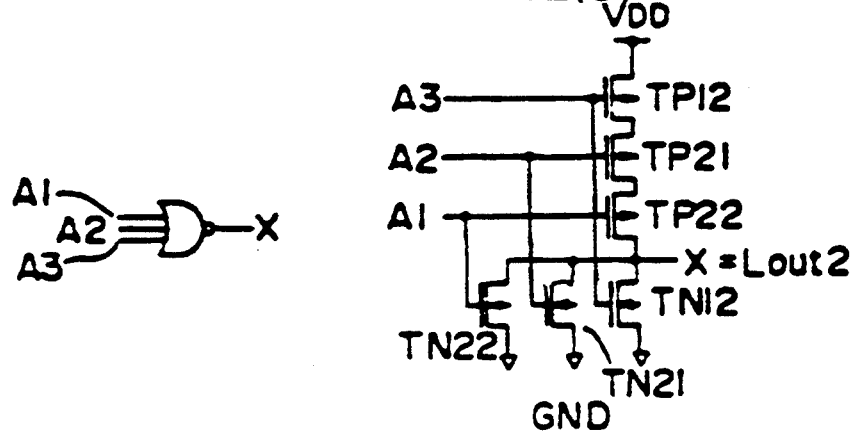

Accordingly, as shown in FIG. 72(b), it is possible to form a 3-input NOR circuit which includes the first through fourth transistors TP11, TP12, TN11 and TN12 of the third basic cell BC1, and the first through fourth transistors TP21, TP22, TN21 and TN22 of the third basic cell BC2. This 3-input NOR circuit amplifies the logic (obtains a NOR) of input signals A1, A2 and A3 and outputs an output signal X via the second output wiring Lout2.

Figure 73A:
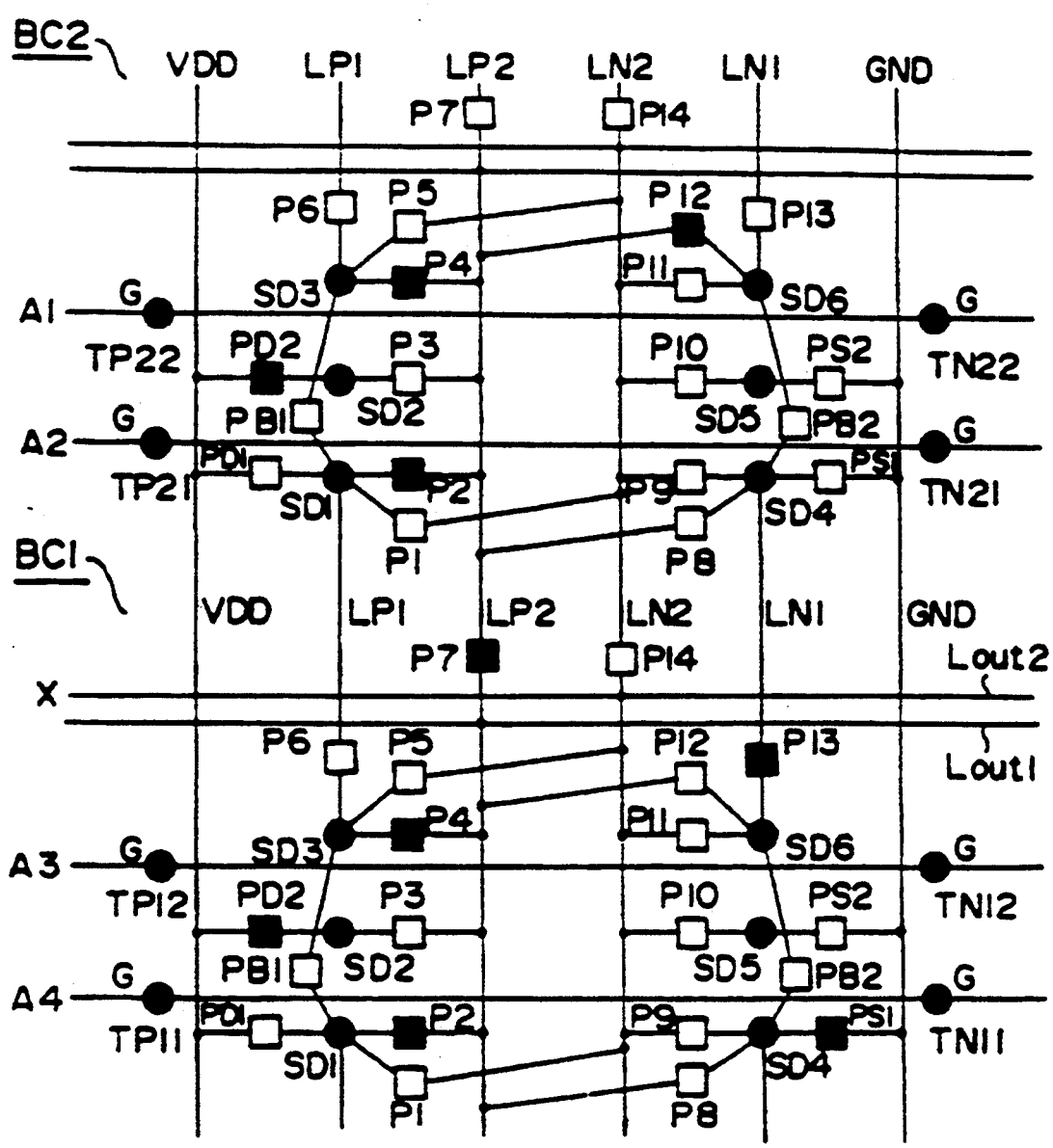
FIG. 73 in parts (a) and (b) is a diagram showing the structure of a 4-input NAND circuit which is obtained by programming the basic cell of the eleventh embodiment.

FIG. 73 in parts (a) and (b) shows the structure of a 4-input NAND circuit which is obtained by programming the third basic cells 3 of the eleventh embodiment. In FIG. 73(a), two third basic cells 3 are connected.

The fuse elements, anti-fuse elements or, the p-type or n-type field effect transistors which form the second p-type power supply programmable switch PD2, the first n-type power supply programmable switch PS1, and the second, fourth, seventh and thirteenth programmable switches P2, P4, P7 and P13 of the third basic cell BC1 are programmed. In addition, the fuse elements, anti-fuse elements or, the p-type or n-type field effect transistors which form the second p-type power supply programmable switch PD2, and the second, fourth and twelfth programmable switches P2, P4 and P12 of the third basic cell BC2 are programmed.

Figure 73B:
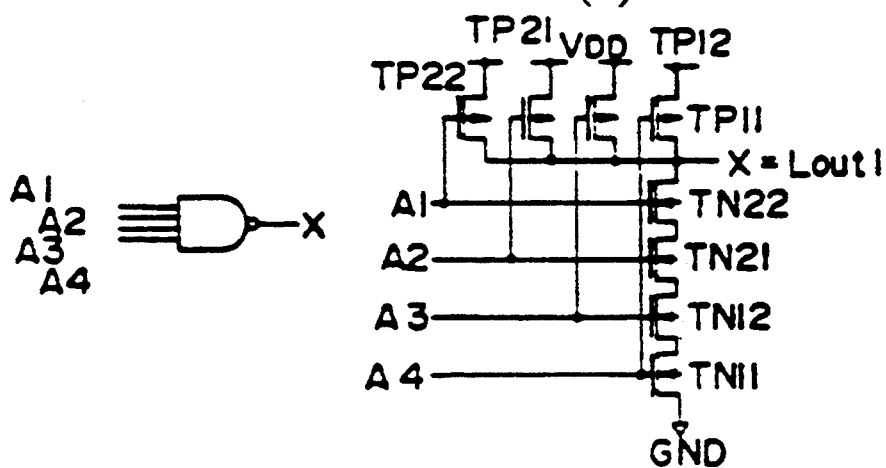

Accordingly, as shown in FIG. 73(b), it is possible to form a 4-input NAND circuit which includes the first through fourth transistors TP11, TP12, TN11 and TN12 of the third basic cell BC1, and the first through fourth transistors TP21, TP22, TN21 and TN22 of the third basic cell BC2. This 4-input NAND circuit amplifies the logic (obtains a NAND) of input signals A1, A2, A3 and A4 and outputs an output signal X via the first output wiring Lout1.

Figure 74A:
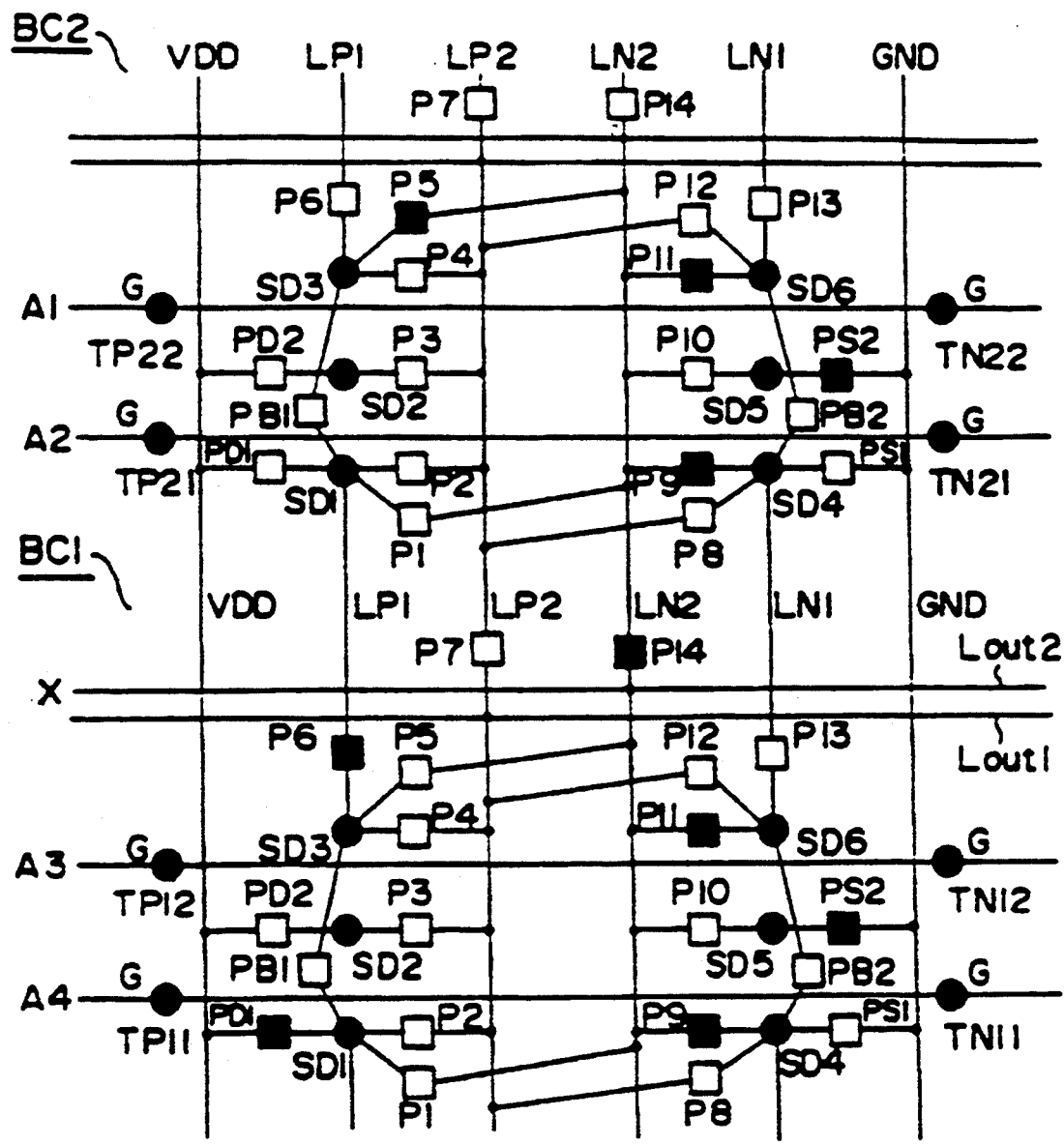
FIG. 74 in parts (a) and (b) is a diagram showing the structure of a 4-input NOR circuit which is obtained by programming the basic cell of the eleventh embodiment.

FIG. 74 in parts (a) and (b) shows the structure of a 4-input NOR circuit which is obtained by programming the third basic cells 3 of the eleventh embodiment. In FIG. 74(a), two third basic cells 3 are connected.

The fuse elements, anti-fuse elements or, the p-type or n-type field effect transistors which form the first p-type power supply programmable switch PD1, the second n-type power supply programmable switch PS2, and the sixth, ninth, eleventh and fourteenth programmable switches P6, P9, P11 and P14 of the third basic cell BC1 are programmed. In addition, the fuse elements, anti-fuse elements or, the p-type or n-type field effect transistors which form the second n-type power supply programmable switch PS2, and the fifth, ninth and eleventh programmable switches P5, P9 and P11 of the third basic cell BC2 are programmed.

Figure 74B:
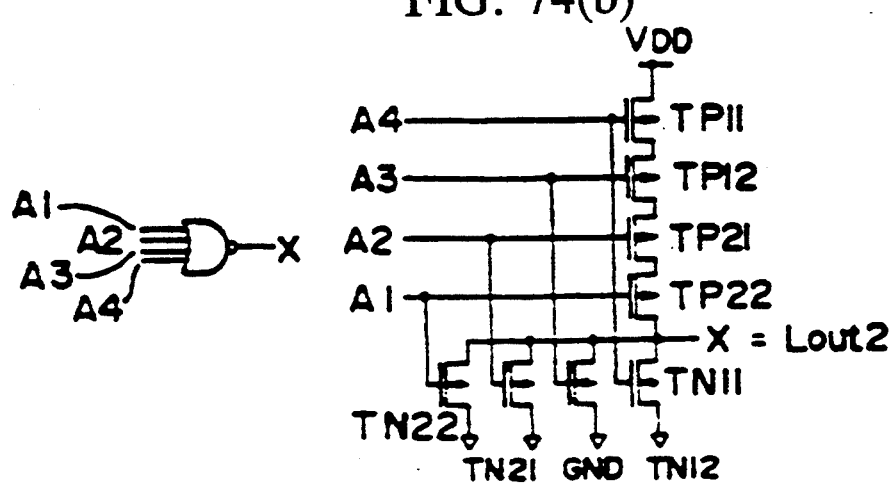

Accordingly, as shown in FIG. 74(b), it is possible to form a 4-input NOR circuit which includes the first through fourth transistors TP11, TP12, TN11 and TN12 of the third basic cell BC1, and the first through fourth transistors TP21, TP22, TN21 and TN22 of the third basic cell BC2. This 4-input NOR circuit amplifies the logic (obtains a NOR) of input signals A1, A2, A3 and A4 and outputs an output signal X via the second output wiring Lout2.

Figure 75A:
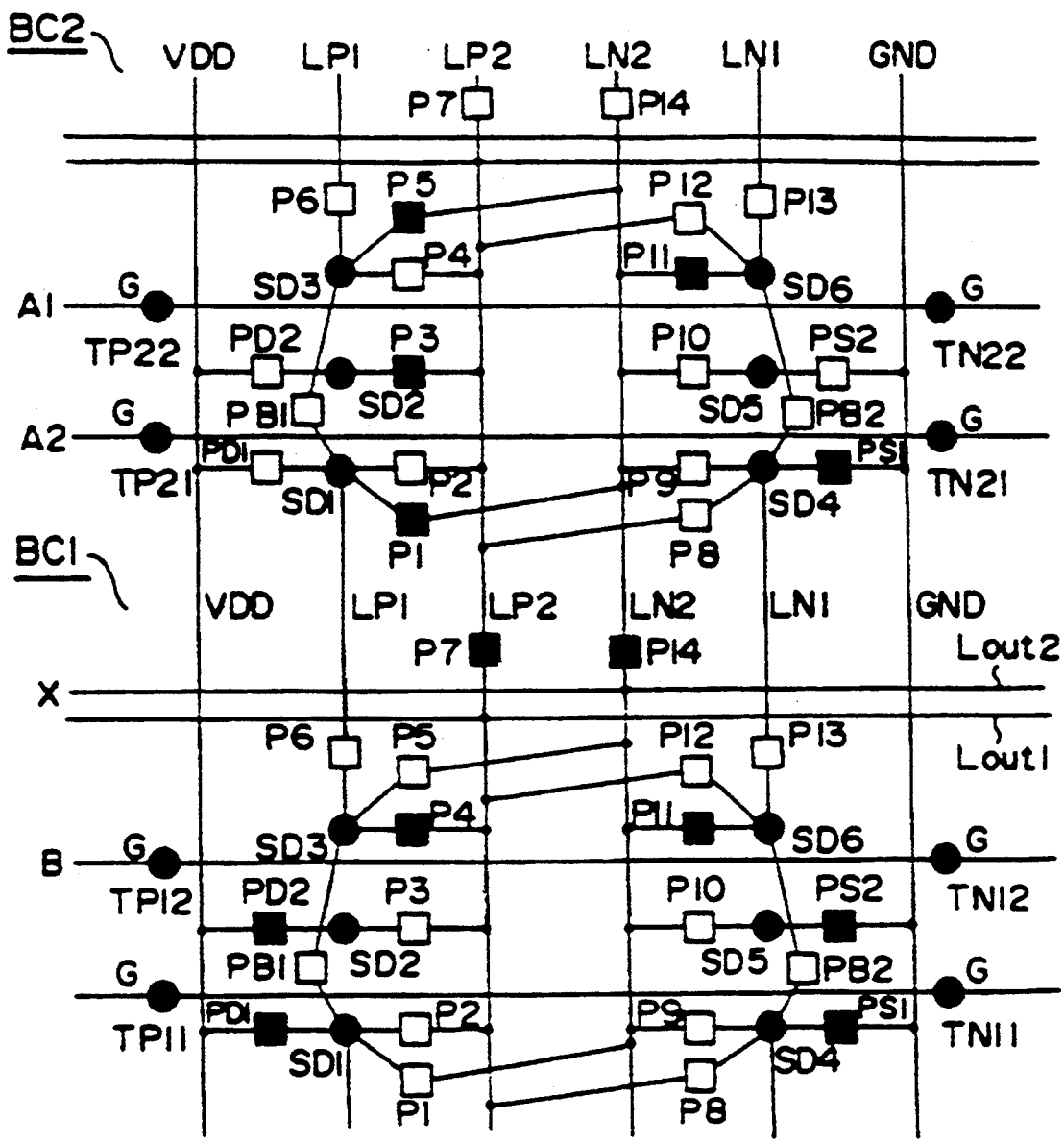
FIG. 75 in parts (a) and (b) is a diagram showing the structure of a 3-input AND-OR inverter circuit which is obtained by programming the basic cell of the eleventh embodiment.

FIG. 75 in parts (a) and (b) shows the structure of a 3-input AND-OR inverter circuit which is obtained by programming the third basic cells 3 of the eleventh embodiment. In FIG. 75(a), two third basic cells 3 are connected.

The fuse elements, anti-fuse elements or, the p-type or n-type field effect transistors which form the first and second p-type power supply programmable switches PD1 and PD2, the first and second n-type power supply programmable switches PS1 and PS2, and the fourth, seventh, eleventh and fourteenth programmable switches P4, P7, P11 and P14 of the third basic cell BC1 are programmed. In addition, the fuse elements, anti-fuse elements or, the p-type or n-type field effect transistors which form the first n-type power supply programmable switch PS1, and the first, third, fifth and eleventh programmable switches P1, P3, P5 and P11 of the third basic cell BC2 are programmed.

Figure 75B:
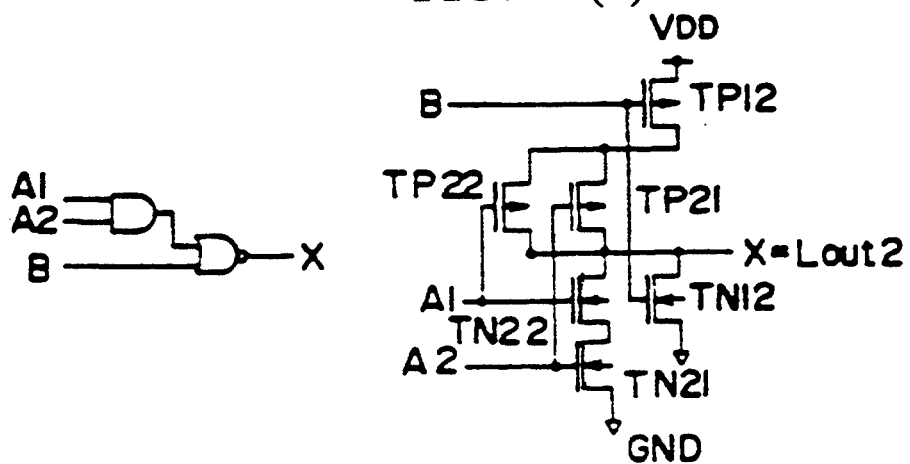

Accordingly, as shown in FIG. 75(b), it is possible to form a 3-input AND-OR inverter circuit which includes the first through fourth transistors TP11, TP12, TN11 and TN12 of the third basic cell BC1, and the first through fourth transistors TP21, TP22, TN21 and TN22 of the third basic cell BC2. This 3-input AND-OR inverter circuit amplifies the logic (obtains an AND) of input signals A1 and A2, amplifies the logic (obtains an OR inversion) of a resulting signal and an input signal B, and outputs an output signal X via the second output wiring Lout2.

Figures 76A, 76B:
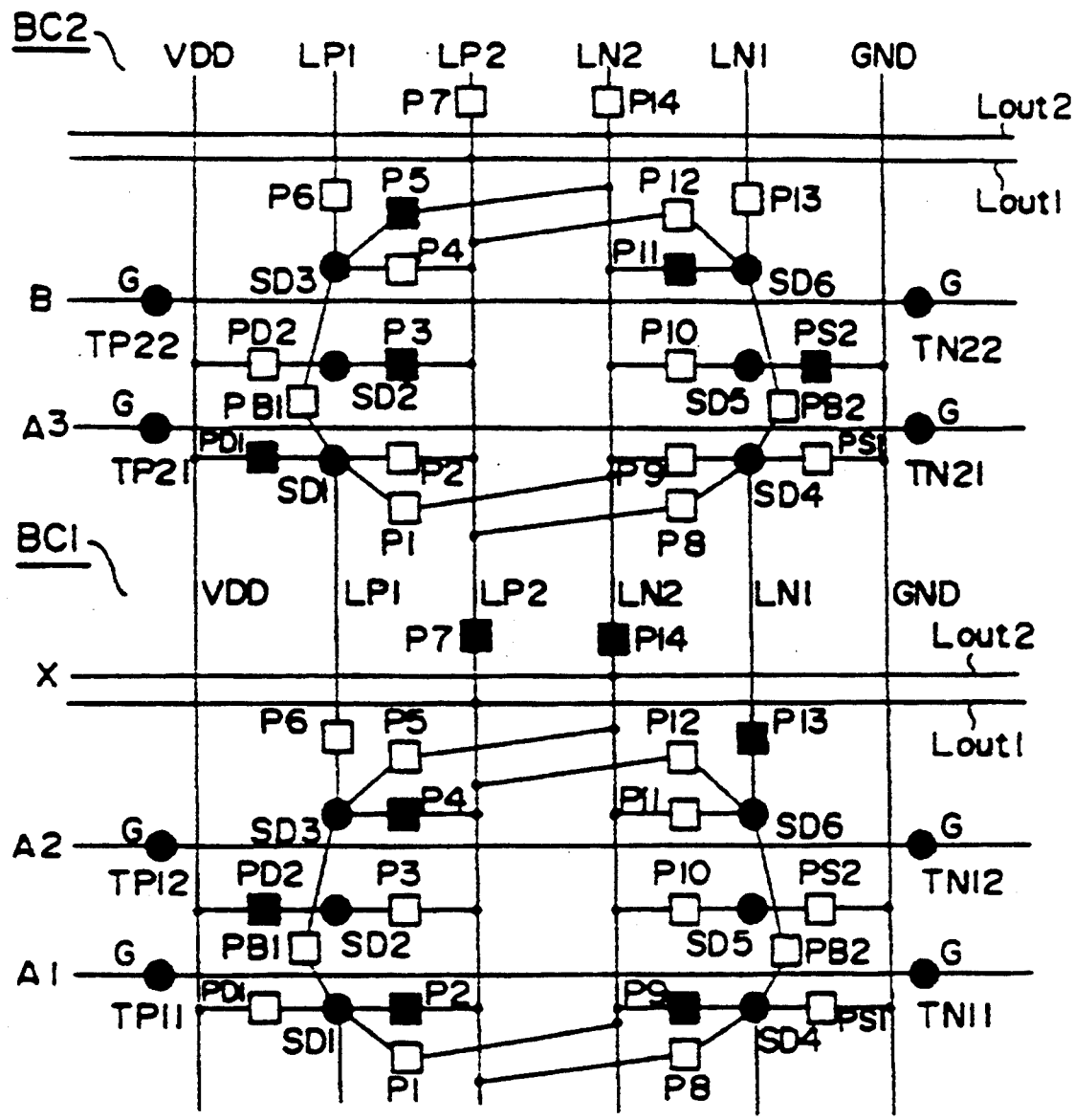
FIG. 76 in parts (a) and (b) is a diagram showing the structure of a 4-input AND-OR inverter circuit which is obtained by programming the basic cell of the eleventh embodiment.

FIG. 76 in parts (a) and (b) shows the structure of a 4-input AND-OR inverter circuit which is obtained by programming the third basic cells 3 of the eleventh embodiment. In FIG. 76(a), two third basic cells 3 are connected.

The fuse elements, anti-fuse elements or, the p-type or n-type field effect transistors which form the second p-type power supply programmable switch PD2, and the second, fourth, seventh, ninth, thirteenth and fourteenth programmable switches P2, P4, P7, P9, P13 and P14 of the third basic cell BC1 are programmed. In addition, the fuse elements, anti-fuse elements or, the p-type or n-type field effect transistors which form the first p-type power supply programmable switch PD1, the second n-type power supply programmable switch PS2, and the third, fifth and eleventh programmable switches P3, P5 and P11 of the third basic cell BC2 are programmed.

Accordingly, as shown in FIG. 76(b), it is possible to form a 4-input AND-OR inverter circuit which includes the first through fourth transistors TP11, TP12, TN11 and TN12 of the third basic cell BC1, and the first through fourth transistors TP21, TP22, TN21 and TN22 of the third basic cell BC2. This 4-input AND-OR inverter circuit amplifies the logic (obtains an AND) of input signals A1, A2 and A3, amplifies the logic (obtains an OR inversion) of a resulting signal and an input signal B, and outputs an output signal X via the second output wiring Lout2.

Figure 77A:
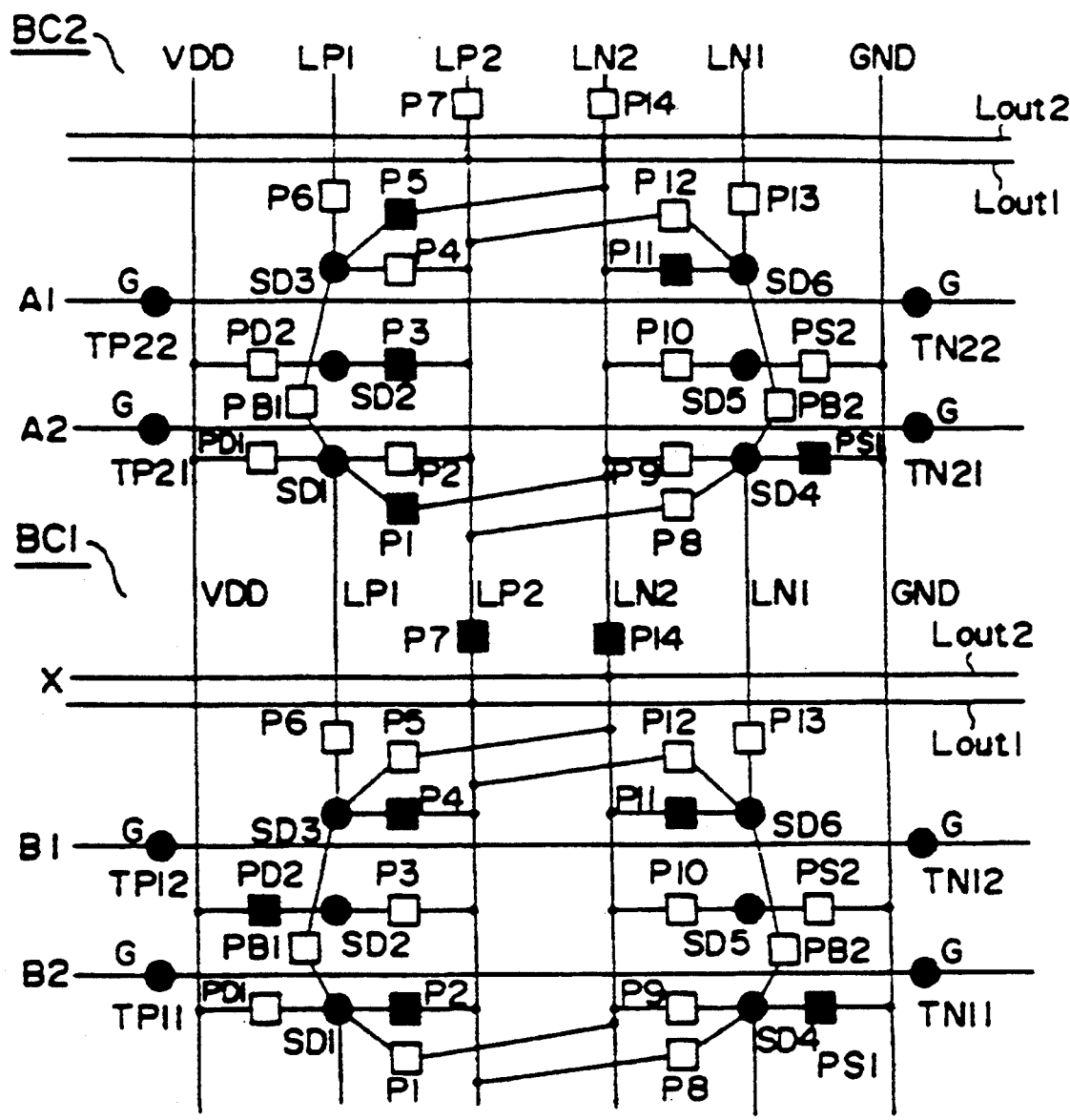
FIG. 77 in parts (a) and (b) is a diagram showing the structure of a 4-input AND-OR inverter circuit which is obtained by programming the basic cell of the eleventh embodiment.

FIG. 77 in parts (a) and (b) shows the structure of a 4-input AND-OR inverter circuit which is obtained by programming the third basic cells 3 of the eleventh embodiment. In FIG. 77(a), two third basic cells 3 are connected.

The fuse elements, anti-fuse elements or, the p-type or n-type field effect transistors which form the second p-type power supply programmable switch PD2, the first n-type power supply programmable switch PS1, and the second, fourth, seventh, ninth and fourteenth programmable switches P2, P4, P7, P9 and P14 of the third basic cell BC1 are programmed. In addition, the fuse elements, anti-fuse elements or, the p-type or n-type field effect transistors which form the first n-type power supply programmable switch PS1, and the first, third, fifth and eleventh programmable switches P1, P3, P5 and P11 of the third basic cell BC2 are programmed.

Figure 77B:
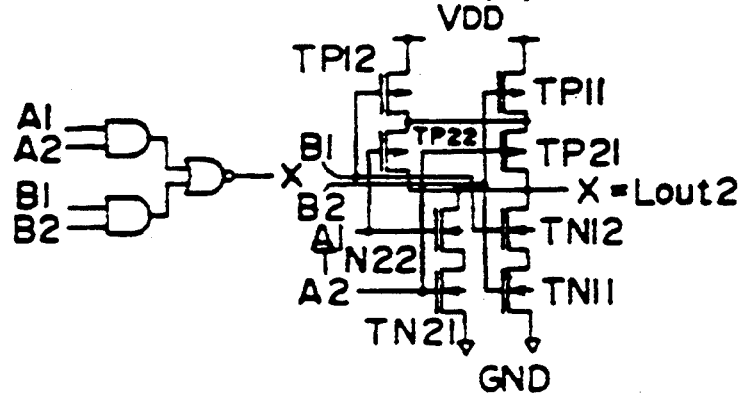

Accordingly, as shown in FIG. 77(b), it is possible to form a 4-input AND-OR inverter circuit which includes the first through fourth transistors TP11, TP12, TN11 and TN12 of the third basic cell BC1, and the first through fourth transistors TP21, TP22, TN21 and TN22 of the third basic cell BC2. This 4-input AND-OR inverter circuit amplifies the logic (obtains an AND) of input signals A1 and A2, amplifies the logic (obtains an AND) of input signals B1 and B2, amplifies the logic (obtains an OR inversion) of resulting two signals, and outputs an output signal X via the second output wiring Lout2.

Figure 78A:
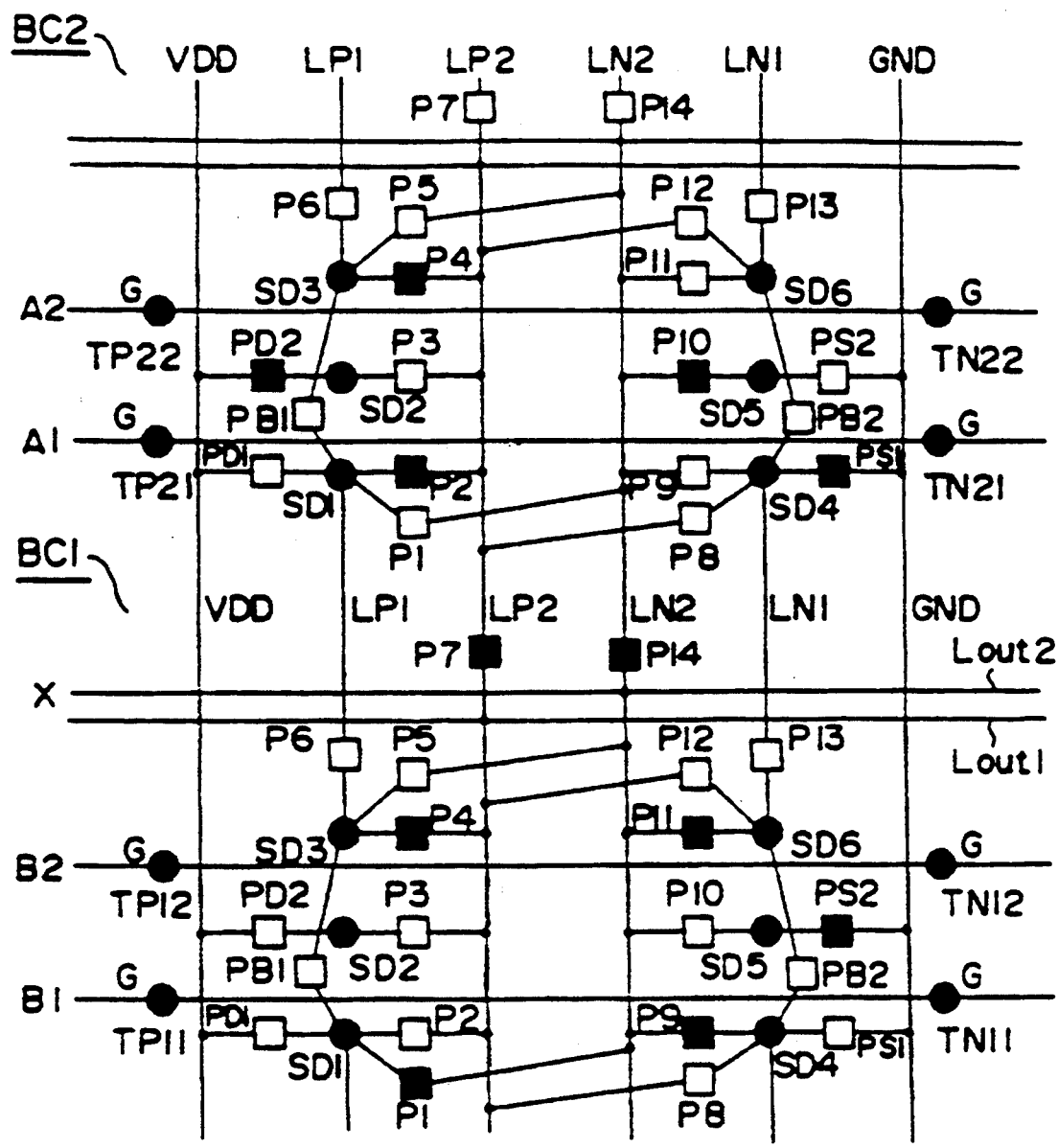
FIG. 78 in parts (a) and (b) is a diagram showing the structure of a 4-input AND-OR inverter circuit which is obtained by programming the basic cell of the eleventh embodiment.

FIG. 78 in parts (a) and (b) shows the structure of a 4-input AND-OR inverter circuit which is obtained by programming the third basic cells 3 of the eleventh embodiment. In FIG. 78(a), two third basic cells 3 are connected.

The fuse elements, anti-fuse elements or, the p-type or n-type field effect transistors which form the second n-type power supply programmable switch PS2, and the first, fourth, seventh, ninth, eleventh and fourteenth programmable switches P1, P4, P7, P9, P11 and P14 of the third basic cell BC1 are programmed. In addition, the fuse elements, anti-fuse elements or, the p-type or n-type field effect transistors which form the second p-type power supply programmable switch PD2, the first n-type power source programmable switch PS1, and the second, fourth and tenth programmable switches P2, P4 and P10 of the third basic cell BC2 are programmed.

Figure 78B:
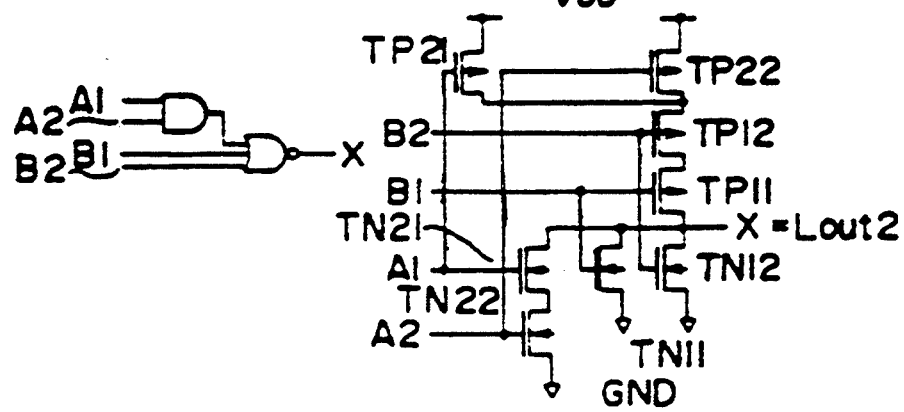

Accordingly, as shown in FIG. 78(b), it is possible to form a 4-input AND-OR inverter circuit which includes the first through fourth transistors TP11, TP12, TN11 and TN12 of the third basic cell BC1, and the first through fourth transistors TP21, TP22, TN21 and TN22 of the third basic cell BC2. This 4-input AND-OR inverter circuit first amplifies the logic (obtains an AND) of input signals A1 and A2, amplifies the logic (obtains an OR inversion) of a resulting signal and input signals B1 and B2, and outputs an output signal X via the second output wiring Lout2.

Figure 79:
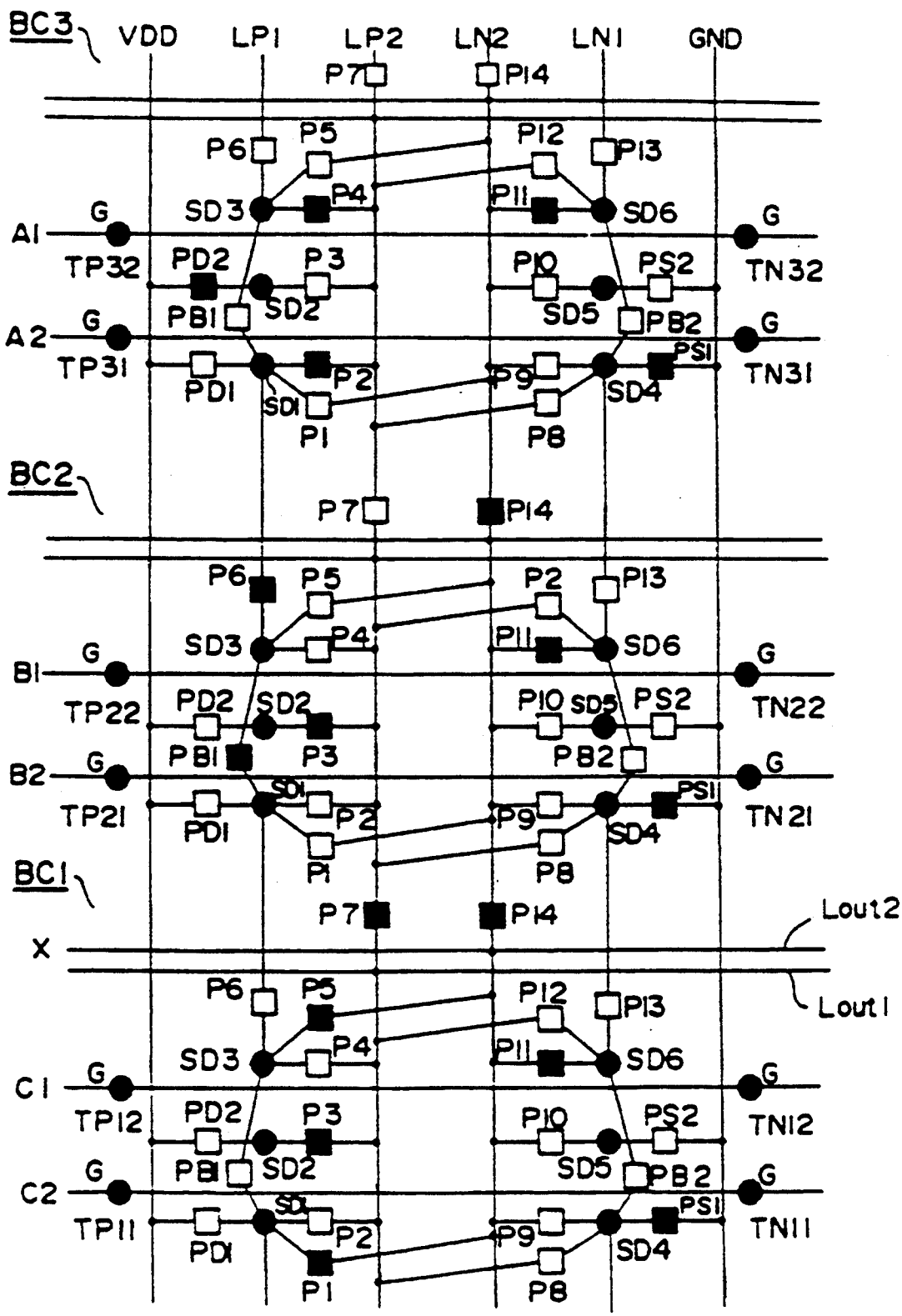
FIG. 79 is a diagram showing the structure of a 6-input AND-OR inverter circuit which is obtained by programming the basic cell of the eleventh embodiment.
Figure 80A:
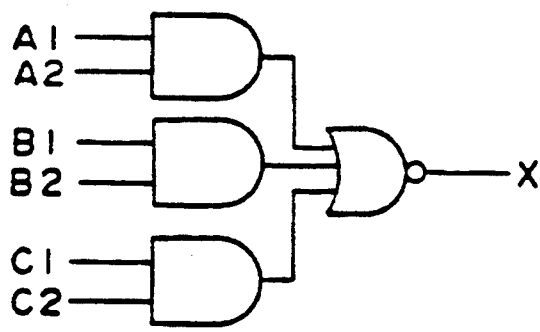
FIG. 80 in parts (a) and (b) is a diagram for explaining the 6-input AND-OR inverter circuit which is obtained by programming the basic cell of the eleventh embodiment.
Figure 80B:
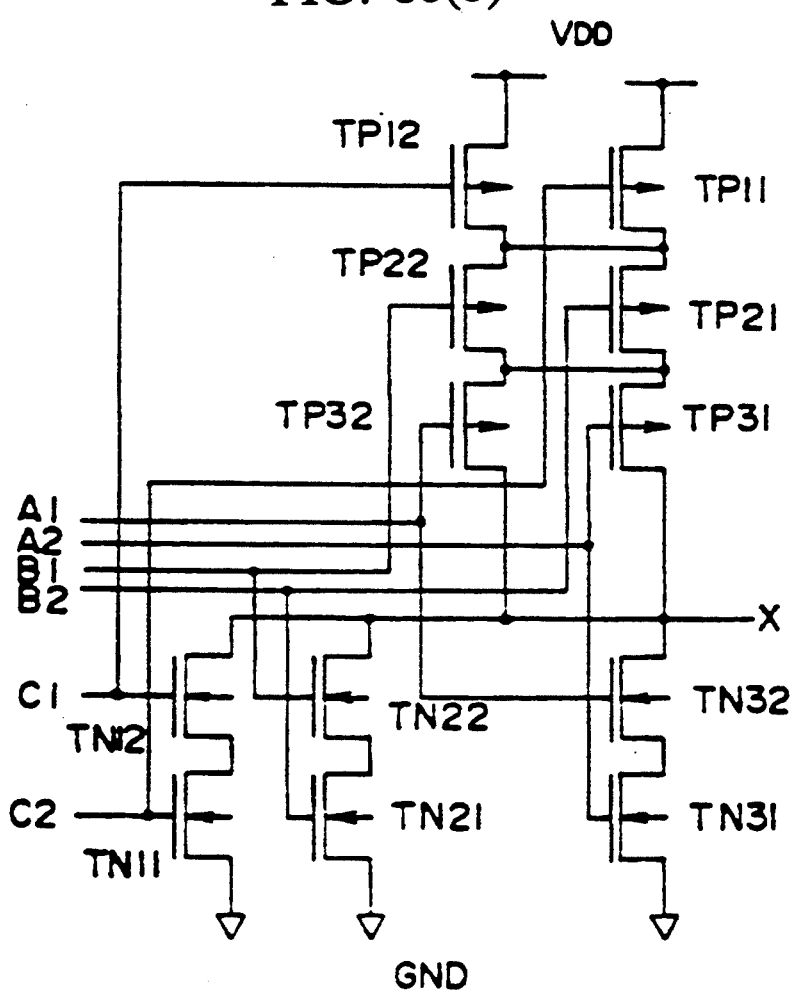

FIG. 79 and FIG. 80 in parts (a) and (b) show the structure of a 6-input AND-OR inverter circuit which is obtained by programming the third basic cells 3 of the eleventh embodiment. In FIG. 79, three third basic cells 3 are connected. The fuse elements, anti-fuse elements or, the p-type or n-type field effect transistors which form the first n-type power supply programmable switch PS1, and the first, third, fifth, seventh, eleventh and fourteenth programmable switches P1, P3, P5, P7, P11 and P14 of the third basic cell BC1 are programmed. In addition, the fuse elements, anti-fuse elements or, the p-type or n-type field effect transistors which form the first n-type power supply programmable switch PS1, the first bypass programmable switch PB1, and the third, sixth, eleventh and fourteenth programmable switches P3, P6, P11 and P14 of the third basic cell BC2 are programmed. Furthermore, the fuse elements, anti-fuse elements or, the p-type or n-type field effect transistors which form the second p-type power supply programmable switch PD2, the first n-type power supply programmable switch PS1, and the second, fourth and eleventh programmable switches P2, P4 and P11 of the third basic cell BC3 are programmed.

Accordingly, as shown in FIG. 80(a) and (b), it is possible to form a 6-input AND-OR inverter circuit which includes the first through fourth transistors TP11, TP12, TN11 and TN12 of the third basic cell BC1, the first through fourth transistors TP21, TP22, TN21 and TN22 of the third basic cell BC2, and the first through fourth transistors TP21, TP22, TN21 and TN22 of the third basic cell BC3. This 6-input AND-OR inverter circuit amplifies the logic (obtains an AND) of input signals A1 and A2, amplifies the logic (obtains an AND) of input signals B1 and B2, amplifies the logic (obtains an AND) of input signals C1 and C2, amplifies the logic (obtains an OR inversion) of resulting three signals, and outputs an output signal X via the second output wiring Lout2.

Figure 81A:
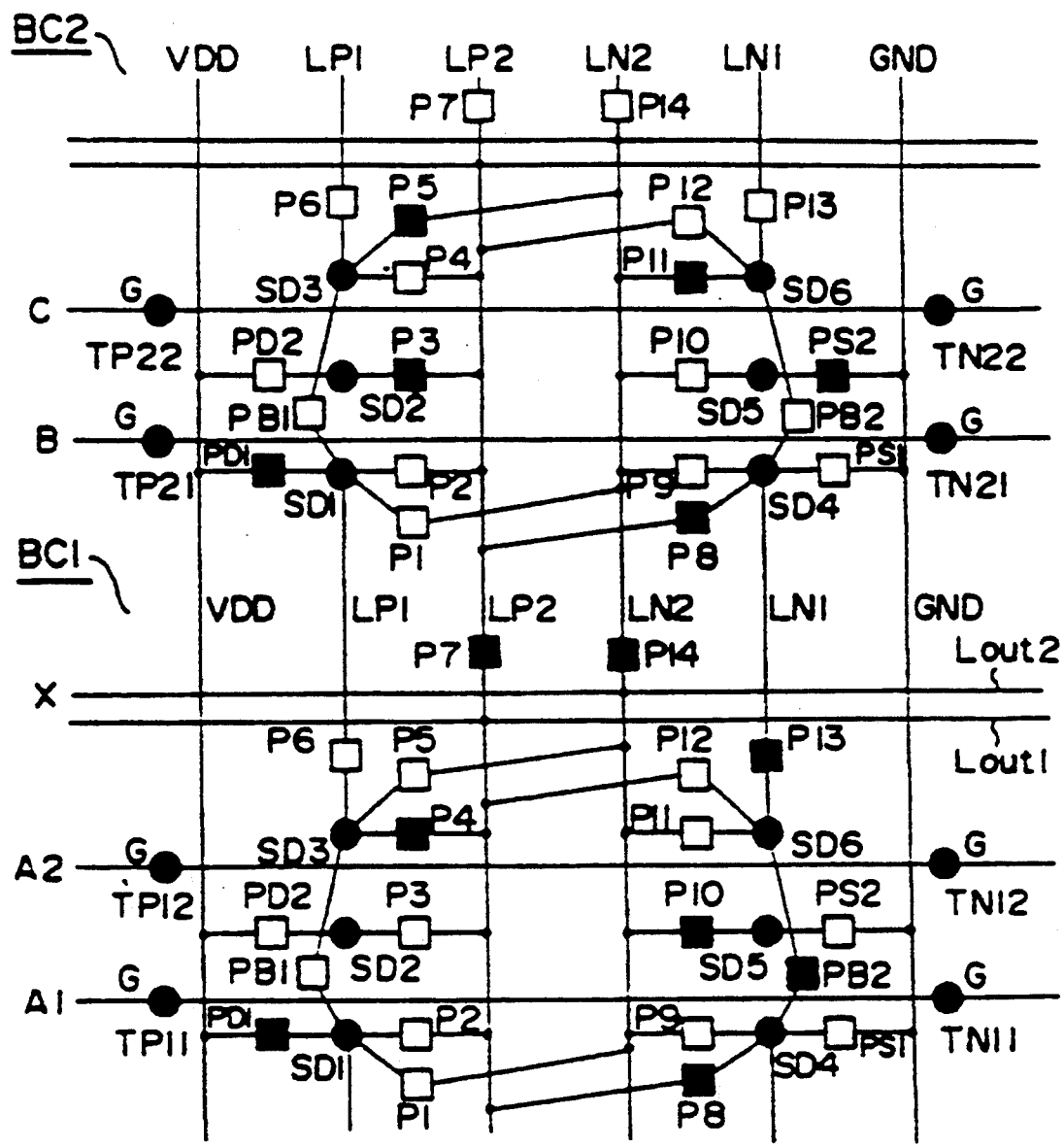
FIG. 81 in parts (a) and (b) is a diagram showing the structure of a 4-input AND-OR inverter circuit which is obtained by programming the basic cell of the eleventh embodiment.

FIG. 81 in parts (a) and (b) shows the structure of a 4-input AND-OR inverter circuit which is obtained by programming the third basic cells 3 of the eleventh embodiment. In FIG. 81(a), two third basic cells 3 are connected.

The fuse elements, anti-fuse elements or, the p-type or n-type field effect transistors which form the first p-type power supply programmable switch PD1, the second bypass programmable switch PB2, and the fourth, seventh, eighth, tenth, thirteenth and fourteenth programmable switches P4, P7, P8, P13 and P14 of the third basic cell BC1 are programmed. In addition, the fuse elements, anti-fuse elements or, the p-type or n-type field effect transistors which form the first p-type power supply programmable switch PD1, the second n-type power source programmable switch PS2, and the third, fifth, eighth and eleventh programmable switches P3, P5, P8 and P11 of the third basic cell BC2 are programmed.

Figure 81B:
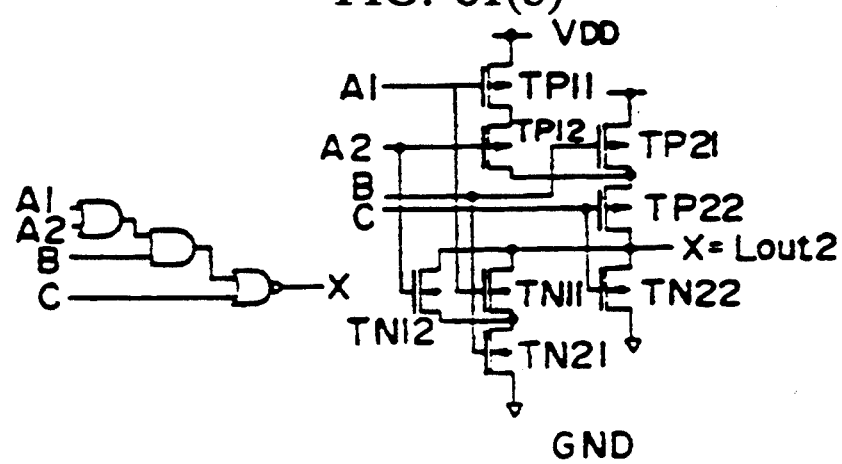

Accordingly, as shown in FIG. 81(b), it is possible to form a 4-input AND-OR inverter circuit which includes the first through fourth transistors TP11, TP12, TN11 and TN12 of the third basic cell BC1, and the first through fourth transistors TP21, TP22, TN21 and TN22 of the third basic cell BC2. This 4-input AND-OR inverter circuit first amplifies the logic (obtains an AND) of input signals A1 and A2, amplifies the logic (obtains an AND) of a resulting signal and an input signal B, amplifies the logic (obtains an OR inversion) of a resulting signal and an input signal C, and outputs an output signal X via the second output wiring Lout2.

(4) Twelfth Embodiment:

FIG. 82 in parts (a) and (b) is a diagram showing the structure of a fourth basic cell 4 in the twelfth embodiment. FIGS. 83 through 101 show structures of the basic logic cells formed by this fourth basic cell 4 when programmed. This twelfth embodiment differs from the ninth embodiment in that the fourth basic cell 4 is provided with a third p-type power supply programmable switch PD3, a third n-type power supply programmable switch rS3, and first and second bypass programmable switches PB1 and PB2.

Figure 82A:
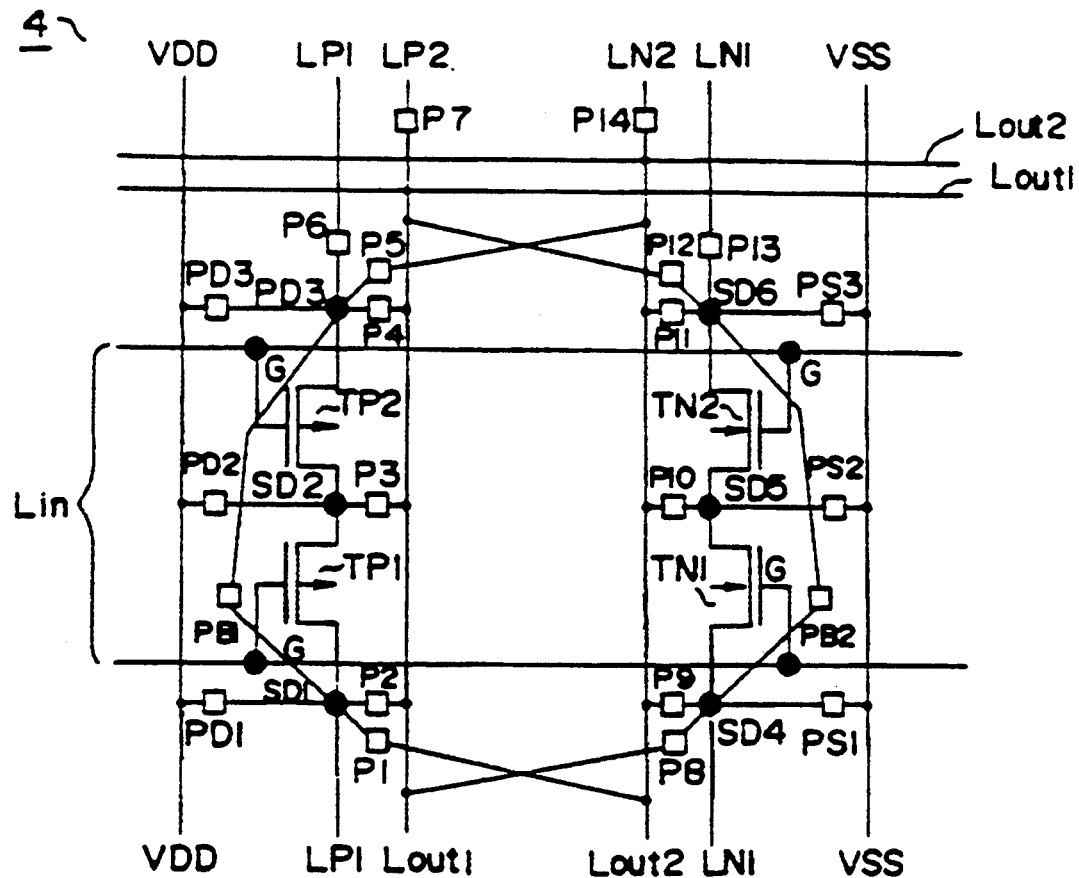
FIG. 82 in parts (a) and (b) is a diagram showing the structure of a basic cell of the twelfth embodiment of the programmable logic circuit according to the present invention.

In other words, the fourth basic cell 4 shown in FIG. 82(a) includes first through fourth transistors TP1, TP2, TN1 and TN2, and twenty-two programmable switches PD1 through PD3, PS1 through PS3, P1 through P14, PB1 and PB2.

Figure 82B:
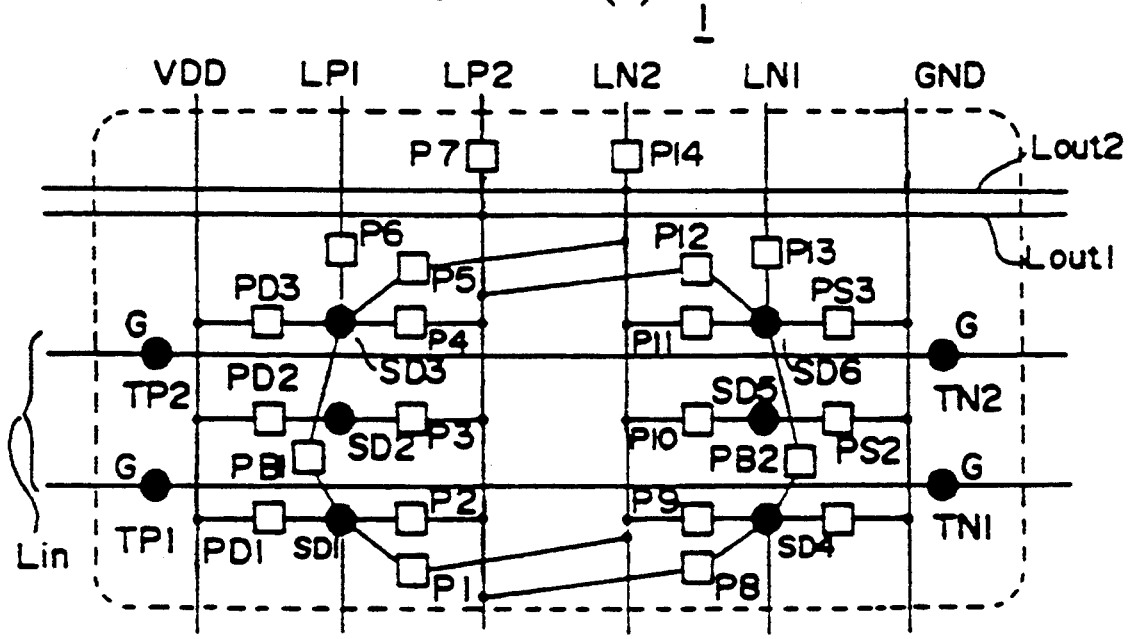

In addition, in the program symbol diagram shown in FIG. 82(b), the third p-type power supply programmable switch PD3 is coupled between the source or drain draw-out electrode SD3 of the second transistor TP2 and the power supply line VDD. The third n-type ground programmable switch PS3 is coupled between the source or drain draw-out electrode SD6 of the fourth transistor TN2 and the ground line GND.

Furthermore, the first bypass programmable switch PB1 is coupled between the source or drain draw-out electrodes SD1 and SD3 of the first and second transistors TP1 and TP2. The second bypass programmable switch PB2 is coupled between the source or drain draw-out electrodes SD4 and SD6 of the third and fourth transistors TN1 and TN2. Otherwise, the structure of the fourth basic cell 4 is the same as that of the first basic cell 1, and a description related to the same parts will be omitted.

Next, a description will be given of the programming of the fourth basic cell 4 of this twelfth embodiment.

Figure 83A:
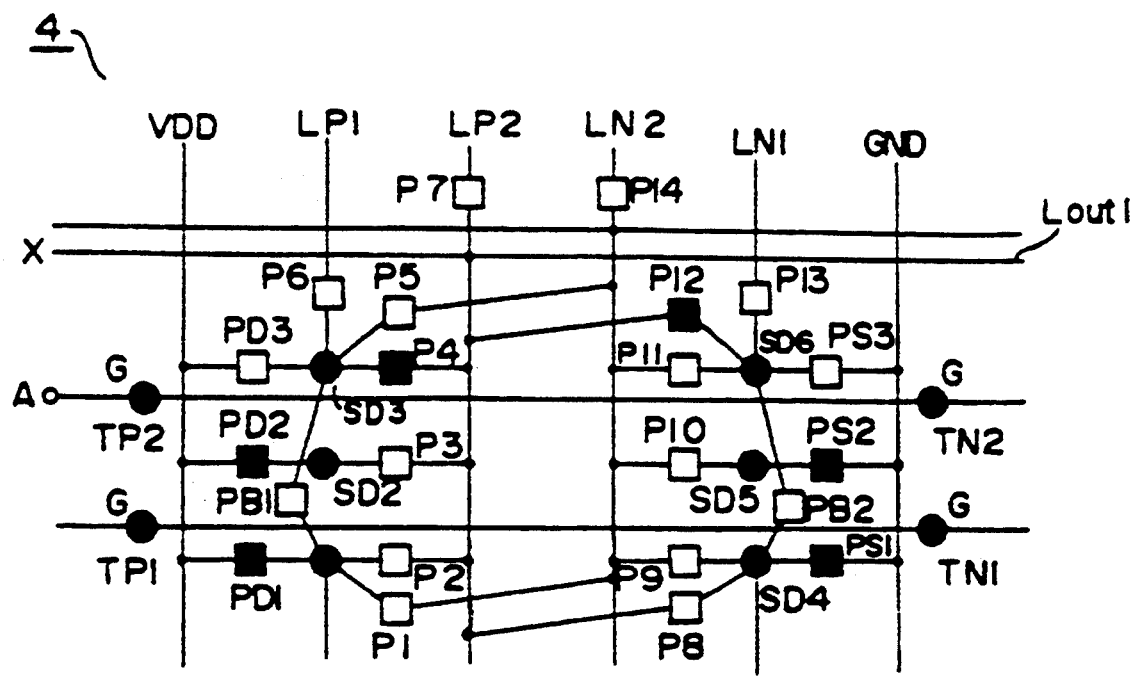
FIG. 83 in parts (a) and (b) is a diagram showing the structure of an inverter circuit which is obtained by programming the basic cell of the twelfth embodiment.

FIG. 83 in parts (a) and (b) shows the structure of an inverter circuit which is obtained by programming the fourth basic cell 4 of the twelfth embodiment. In FIG. 83(a), the inverter circuit is obtained by appropriately programming the fuse elements, anti-fuse elements or, the p-type or n-type field effect transistors which form the first and second p-type power supply programmable switches PD1 and PD2, the first n-type ground programmable switch PS1, and the fourth and twelfth programmable switches P4 and P12 within the fourth basic cell 4, similarly to the corresponding programming made in the eleventh embodiment.

Figure 83B:
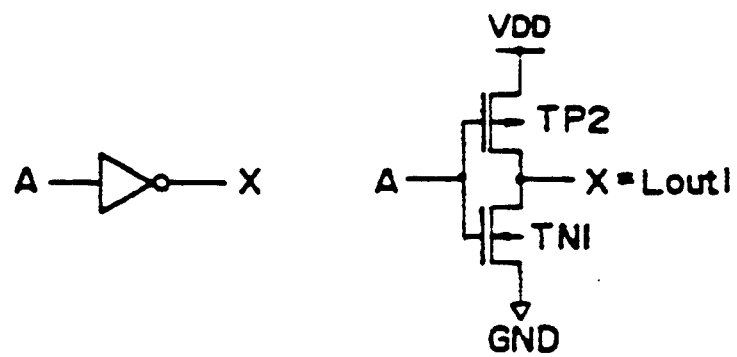

By this programming, it is possible to form the inverter circuit shown in FIG. 83(b) which has the transistors TP2 and TN1 connected between the power supply line VDD and the ground line GND. This inverter circuit inverts and amplifies an input signal A and outputs an output signal X via the first output wiring Lout1.

Figure 84A:
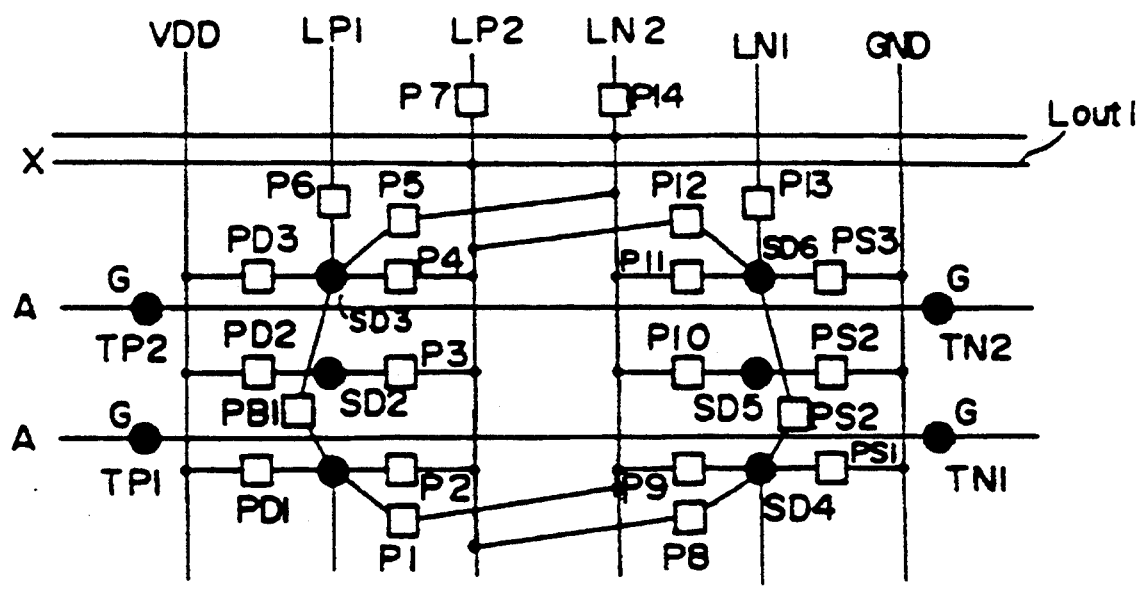
FIG. 84 in parts (a) and (b) is a diagram showing the structure of a power type inverter circuit which is obtained by programming the basic cell of the twelfth embodiment.

FIG. 84 in parts (a) and (b) shows the structure of a power type inverter circuit which is obtained by programming the fourth basic cell 4 of the eleventh embodiment. In FIG. 84(a), the power type inverter circuit is obtained by appropriately programming the fuse elements, anti-fuse elements or, the p-type or n-type field effect transistors which form the second p-type power supply programmable switch PD2, the second n-type ground programmable switch PS2, and the first, fifth, ninth and eleventh programmable switches P1, P5, P9 and P11 within the fourth basic cell 4, similarly to the corresponding programming made in the eleventh embodiment.

Figure 84B:
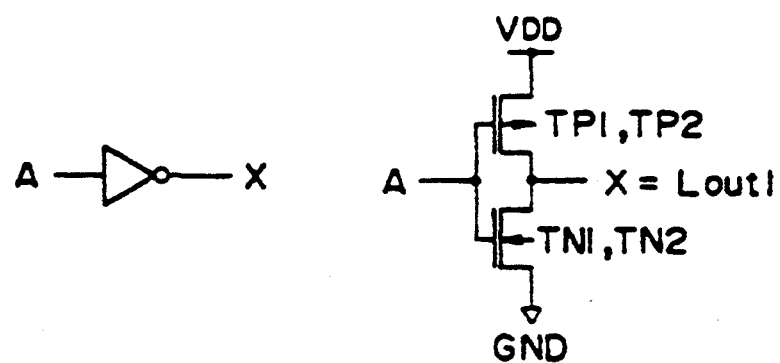

By this programming, it is possible to form the power type inverter circuit shown in FIG. 84(b) which has the transistors TP1, TN1, TP2 and TN2 connected between the power supply line VDD and the ground line GND. This power type inverter circuit inverts and amplifies an input signal A and outputs an output signal X via the second output wiring Lout2.

Figure 85A:
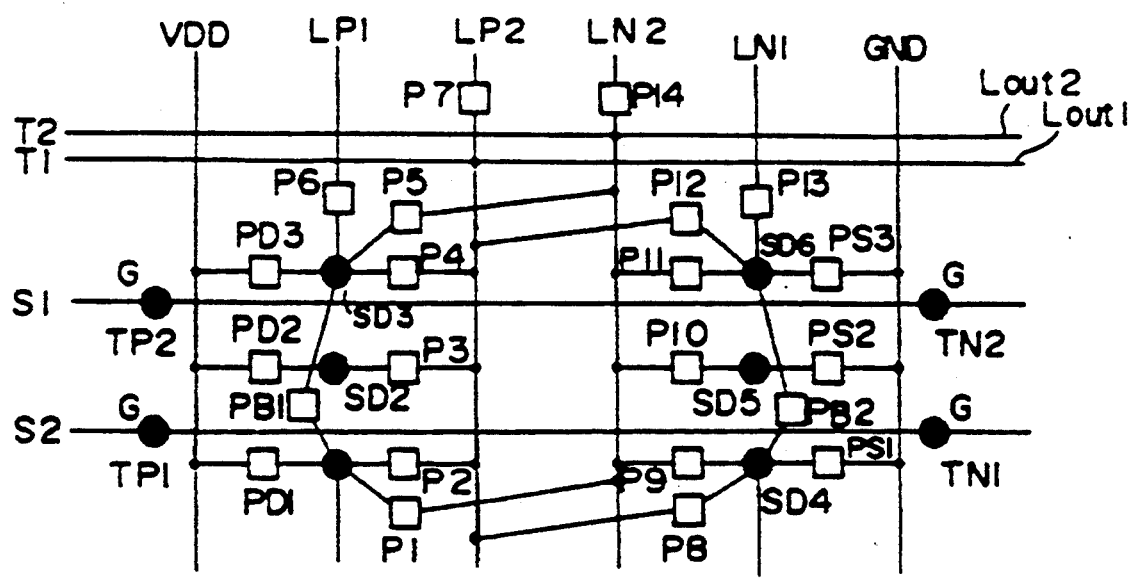
FIG. 85 in parts (a) and (b) is a diagram showing the structure of a transmission gate circuit which is obtained by programming the basic cell of the twelfth embodiment.

FIG. 85 in parts (a) and (b) shows the structure of a transmission gate circuit which is obtained by programming the fourth basic cell 4 of the twelfth embodiment. In FIG. 86(a), the transmission gate circuit is obtained by appropriately programming the fuse elements, anti-fuse elements or, the p-type or n-type field effect transistors which form the first, third, fifth, eighth, tenth and twelfth programmable switches P1, P3, PS, PS, P10 and P12 within the fourth basic cell 4, similarly to the corresponding programming made in the eleventh embodiment.

Figure 85B:
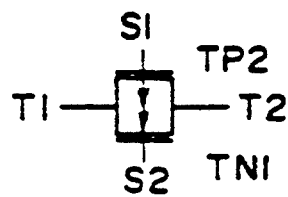
Figure 86A:
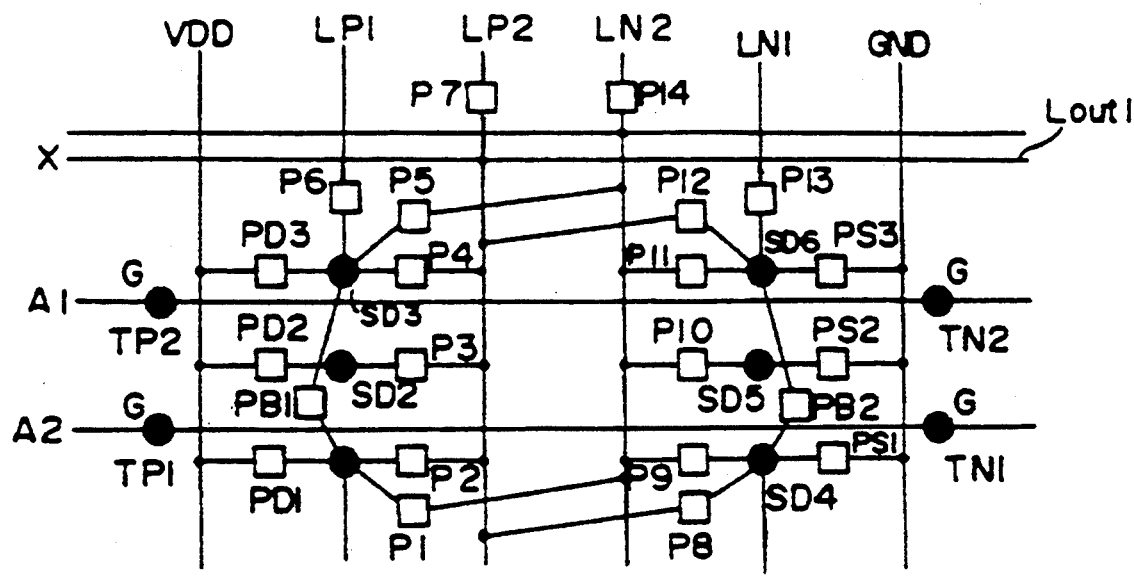
FIG. 86 in parts (a) and (b) is a diagram showing the structure of a 2-input NAND circuit which is obtained by programming the basic cell of the twelfth embodiment.

By this programming, it is possible to form the transmission gate circuit shown in FIG. 85(b) which has the first output wiring Lout1 extending to a connection terminal T1, the second output wiring Lout2 extending to a connection terminal T2, the gate G of the second transistor TP2 connected to a control terminal S1, and the gate G of the third transistor TN1 connected to a control terminal S2.

FIG. 86 in parts (a) and (b) shows the structure of a 2-input NAND circuit which is obtained by programming the fourth basic cell 4 of the twelfth embodiment. In FIG. 86(a), the 2-input NAND circuit is obtained by appropriately programming the fuse elements, anti-fuse elements or, the p-type or n-type field effect transistors which form the first and third p-type power supply programmable switches PD1 and PD3, the first n-type ground programmable switch PS1, and the third and twelfth programmable switches P3 and P12 within the fourth basic cell 4.

Figure 86B:
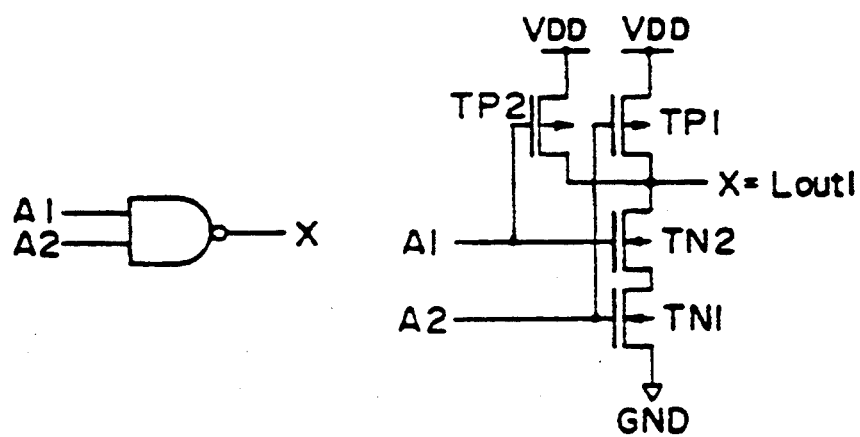

By this programming, it is possible to form the 2-input NAND circuit shown in FIG. 86(b) which has the first through fourth transistors TP1, TP2, TN1 and TN2. This 2-input NAND circuit amplifies the logic (that is, obtains a NAND) of input signals A1 and A2, and outputs an output signal X via the first output wiring Lout1.

Figure 87A:
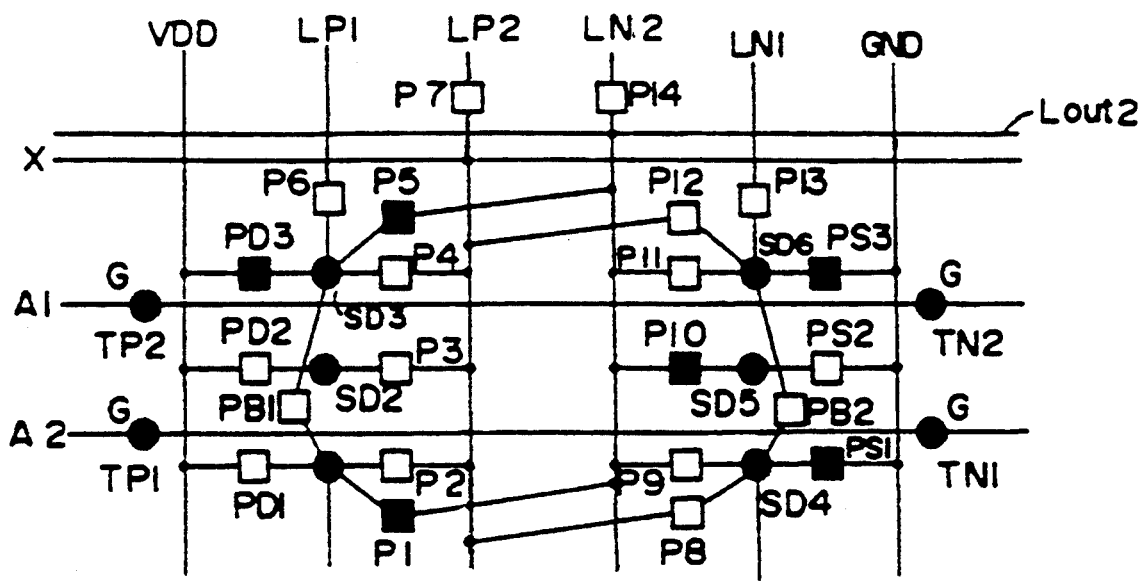
FIG. 87 in parts (a) and (b) is a diagram showing the structure of a 2-input NOR circuit which is obtained by programming the basic cell of the twelfth embodiment.

FIG. 87 in parts (a) and (b) shows the structure of a 2-input NOR circuit which is obtained by programming the fourth basic cell 4 of the twelfth embodiment. In FIG. 87(a), the 2-input NOR circuit is obtained by appropriately programming the fuse elements, anti-fuse elements or, the p-type or n-type field effect transistors which form the third p-type power supply programmable switch PD3, the first and third n-type ground programmable switches PS1 and PS3, and the first, fifth and tenth programmable switches P1, P5 and P10 within the fourth basic cell 4.

Figure 87B:
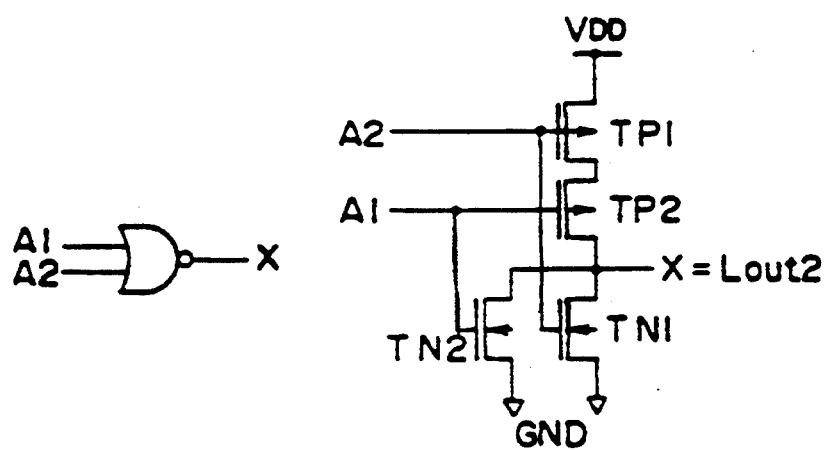

By this programming, it is possible to form the 2-input NOR circuit shown in FIG. 87(b) which has the first through fourth transistors TP1, TP2, TN1 and TN2. This 2-input NOR circuit amplifies the logic (that is, obtains a NOR) of input signals A1 and A2, and outputs an output signal X via the second output wiring Lout2.

Accordingly, the fourth basic cell 4 of the twelfth embodiment includes first through fourth transistors TP1, TP2, TN1 and TN2, and twenty-two programmable switches PD1 through PD3, PS1 through PS3, P1 through P14, PB1 and PB2 for connecting these transistors TP1, TP2, TN1 and TN2 and the wirings as shown in FIG. 82(a). The third p-type power supply programmable switch PD3 is coupled between the source or drain draw-out electrode SD3 of the second transistor TP2 and the power supply line VDD. The third n-type ground programmable switch PS3 is coupled between the source or drain draw-out electrode SD6 of the fourth transistor TN2 and the ground line GND. In addition, the first bypass programmable switch PB1 is coupled between the source or drain draw-out electrodes SD1 and SD3 of the first and second transistors TP1 and TP2. The second bypass programmable switch PB2 is coupled between the source or drain draw-out electrodes SD4 and SD6 of the third and fourth transistors TN1 and TN2.

For this reason, the fourth basic cell 4 which forms the minimum unit is formed by the four transistors TP1, TP2, TN1 and TN2, and a total of twenty programmable switches PD1 through PD3, PS1 through PS3, P1 through P14, PB1 and PB2. Therefore, the number of programmable switches increases by four compared to the ninth embodiment. However, the fourth basic cell 4 can be used efficiently to form the inverter circuit, the power type inverter circuit, the transmission gate circuit, the 2-input NAND circuit, the 2-input NOR circuit or the like.

Next, a description will be given of the programming of a plurality of fourth basic cell 4.

Figure 88A:
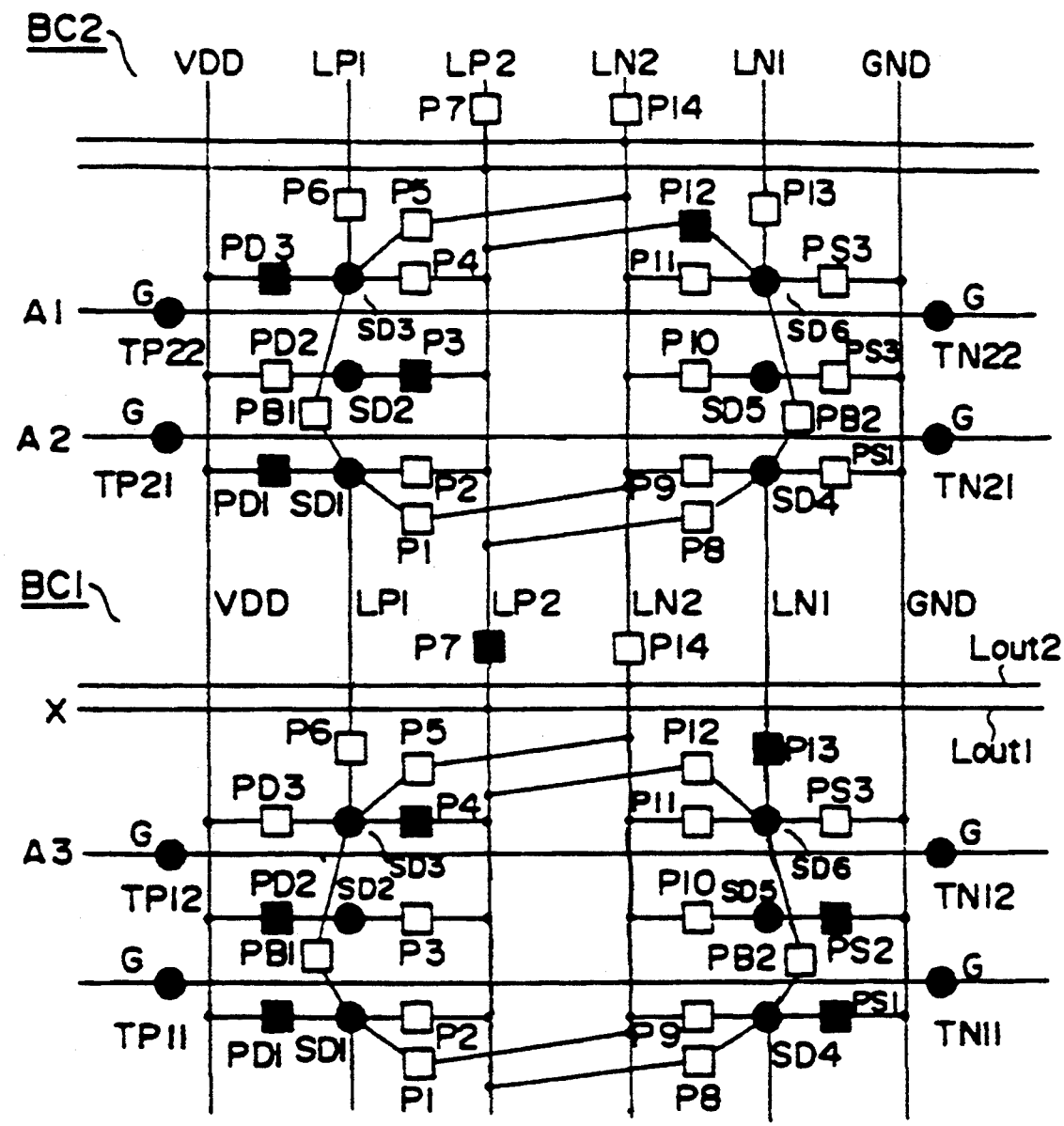
FIG. 88 in parts (a) and (b) is a diagram showing the structure of a 3-input NAND circuit which is obtained by programming the basic cell of the twelfth embodiment.

FIG. 88 in parts (a) and (b) shows the structure of a 3-input NAND circuit which is obtained by programming the fourth basic cells 4 of the twelfth embodiment. In FIG. 88(a), two fourth basic cells 4 are connected. The power supply line VDD, the ground line GND, the first and second p-type protection wirings LP1 and LP2, and the first and second n-type protection wirings LN1 and LN2 of one fourth basic cell 4 (BC1) are respectively connected to the corresponding power supply line VDD, ground line GND, first and second p-type protection wirings LP1 and LP2, and the first and second n-type protection wirings LN1 and LN2 of the other fourth basic cell 4 (BC2). In addition, between the two fourth basic cells BC1 and BC2, the first p-type protection wirings LP1 are connected via a program point P6, the second p-type protection wiring LP2 and the first output wiring Lout1 are connected via a program point P7, the first n-type protection wirings LN1 are connected via a program point P13, and the second n-type protection wiring LN2 and the second output wiring Lout2 are connected via a program point P14.

The fuse elements, anti-fuse elements or, the p-type or n-type field effect transistors which form the first and second p-type power supply programmable switches PD1 and PD2, the first and second n-type power supply programmable switches PS1 and PS2, and the fourth, seventh and thirteenth programmable switches P4, P7 and P13 of the fourth basic cell BC1 are programmed. In addition, the fuse elements, anti-fuse elements or, the p-type or n-type field effect transistors which form the first and third p-type power supply programmable switches PD1 and PD3, and the third and twelfth programmable switches P3 and P12 of the fourth basic cell BC2 are programmed.

Figure 88B:
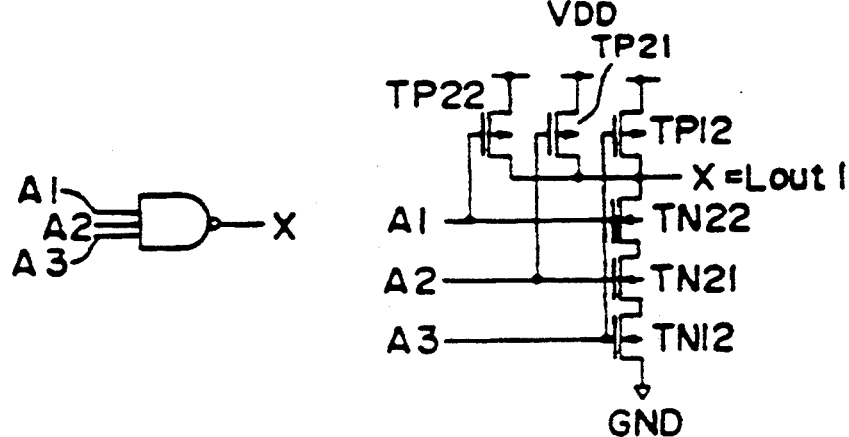

Accordingly, as shown in FIG. 88(b), it is possible to form a 3-input NAND circuit which includes the first through fourth transistors TP11, TP12, TN11 and TN12 of the fourth basic cell BC1, and the first through fourth transistors TP21, TP22, TN21 and TN22 of the fourth basic cell BC2. This 3-input NAND circuit amplifies the logic (obtains a NAND) of input signals A1, A2 and A3 and outputs an output signal X via the first output wiring Lout1.

Figure 89A:
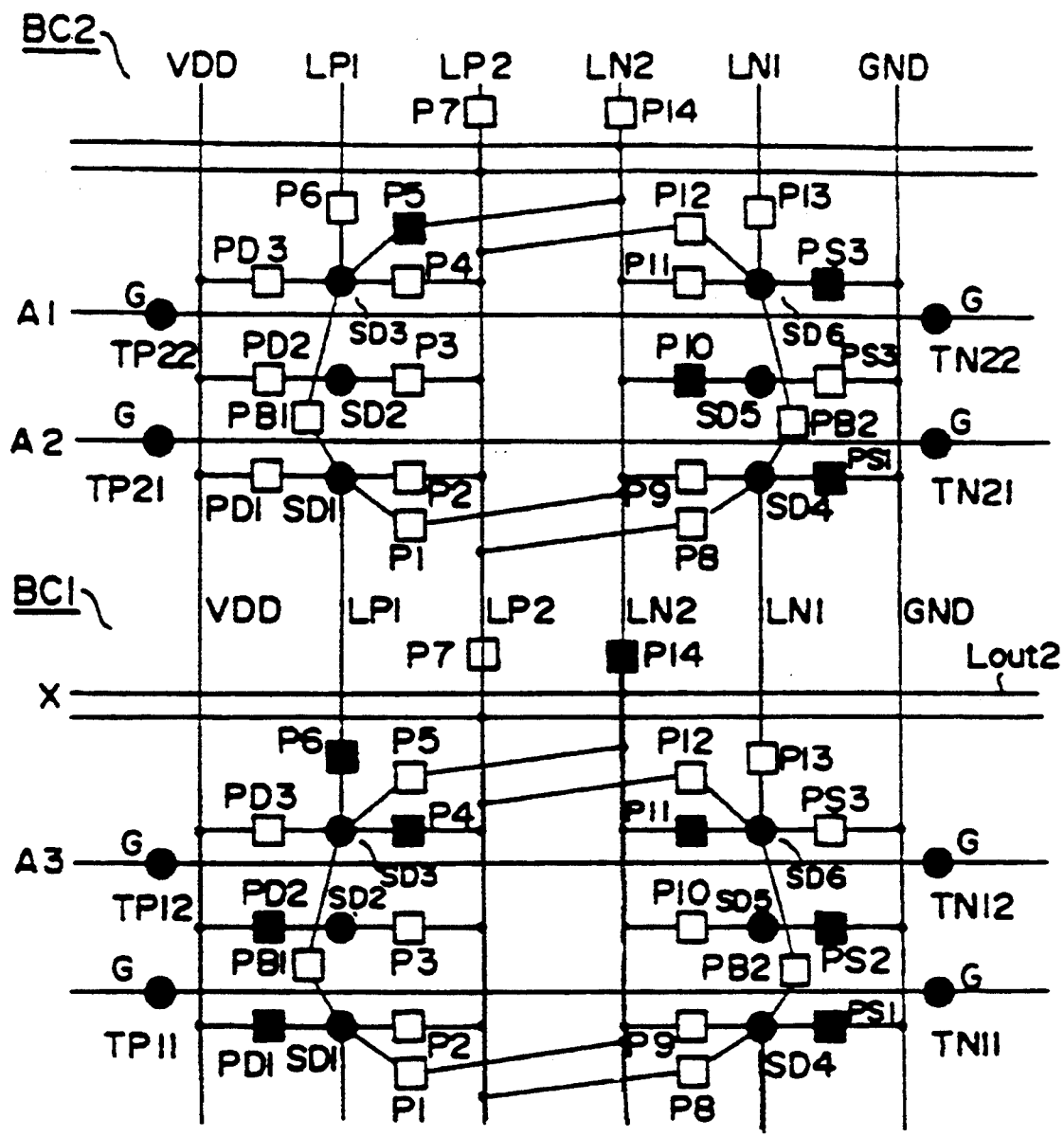
FIG. 89 in parts (a) and (b) is a diagram showing the structure of a 3-input NOR circuit which is obtained by programming the basic cell of the twelfth embodiment.

FIG. 89 in parts (a) and (b) shows the structure of a 3-input NOR circuit which is obtained by programming the fourth basic cells 4 of the twelfth embodiment. In FIG. 89(a), two fourth basic cells 4 are connected.

The fuse elements, anti-fuse elements or, the p-type or n-type field effect transistors which form the first and second p-type power supply programmable switches PD1 and PD2, the first and second n-type power supply programmable switches PS1 and PS2, and the fourth, sixth, eleventh and fourteenth programmable switches P4, P6, P11 and P14 of the fourth basic cell BC1 are programmed. In addition, the fuse elements, anti-fuse elements or, the p-type or n-type field effect transistors which form the first and third n-type power supply programmable switches PS1 and PS3, and the fifth and tenth programmable switches P5 and P10 of the fourth basic cell BC2 are programmed.

Figure 89B:
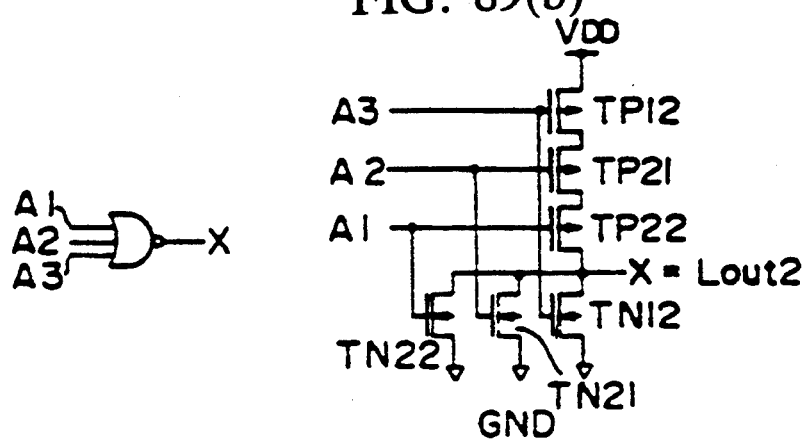

Accordingly, as shown in FIG. 89(b), it is possible to form a 3-input NOR circuit which includes the first through fourth transistors TP11, TP12, TN11 and TN12 of the fourth basic cell BC1, and the first through fourth transistors TP21, TP22, TN21 and TN22 of the fourth basic cell BC2. This 3-input NOR circuit amplifies the logic (obtains a NOR) of input signals A1, A2 and A3 and outputs an output signal X via the second output wiring Lout2.

Figure 90A:
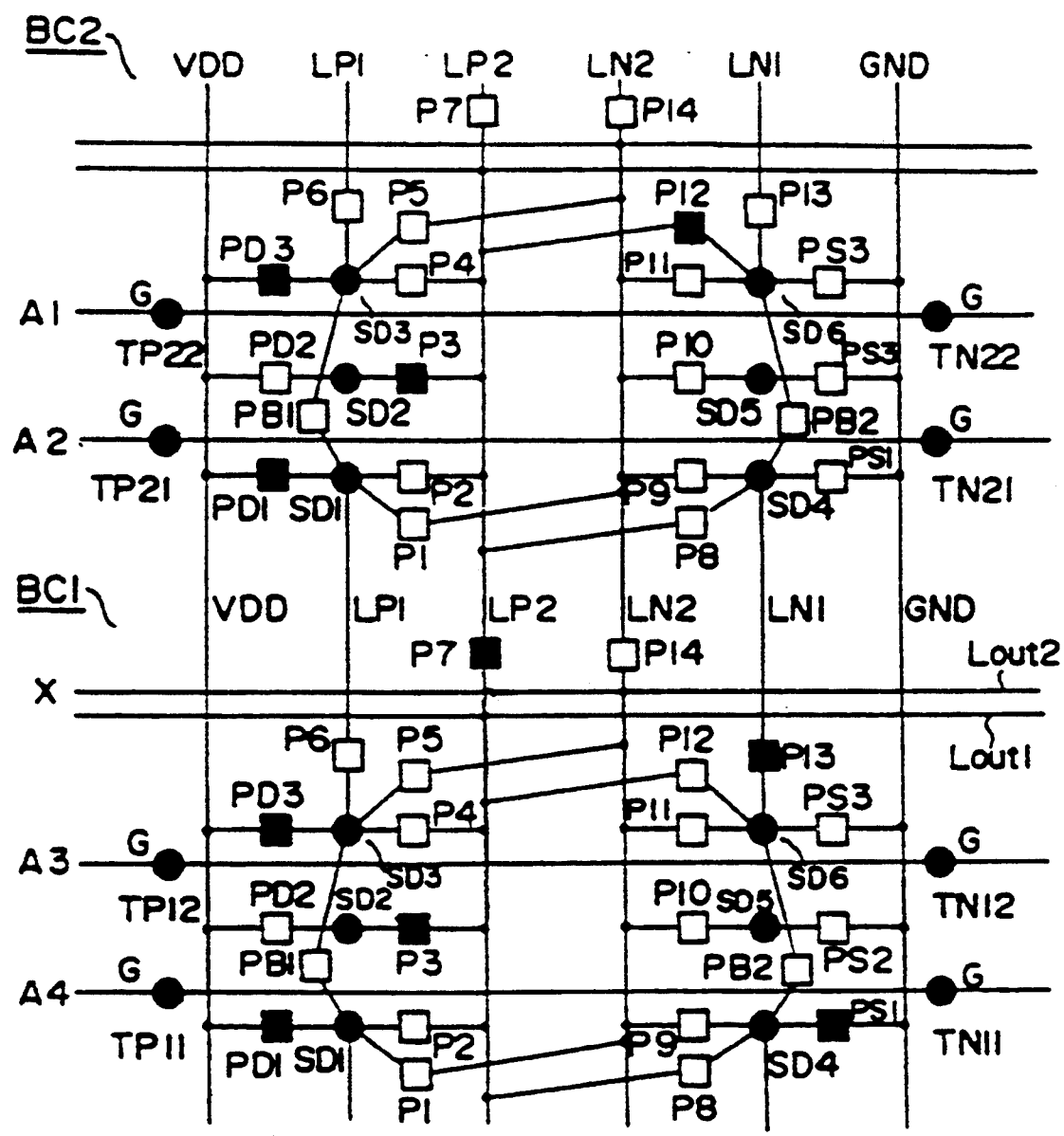
FIG. 90 in parts (a) and (b) is a diagram showing the structure of a 4-input NAND circuit which is obtained by programming the basic cell of the twelfth embodiment.

FIG. 90 in parts (a) and (b) shows the structure of a 4-input NAND circuit which is obtained by programming the fourth basic cells 4 of the twelfth embodiment. In FIG. 90(a), two fourth basic cells 4 are connected.

The fuse elements, anti-fuse elements or, the p-type or n-type field effect transistors which form the first and third p-type power supply programmable switches PD1 and PD3, the first n-type power supply programmable switch PS1, and the third, seventh and thirteenth programmable switches P3, P7 and P13 of the fourth basic cell BC1 are programmed. In addition, the fuse elements, anti-fuse elements or, the p-type or n-type field effect transistors which form the first and third p-type power supply programmable switches PD1 and PD3, and the third and twelfth programmable switches P3 and P12 of the fourth basic cell BC2 are programmed.

Figure 90B:
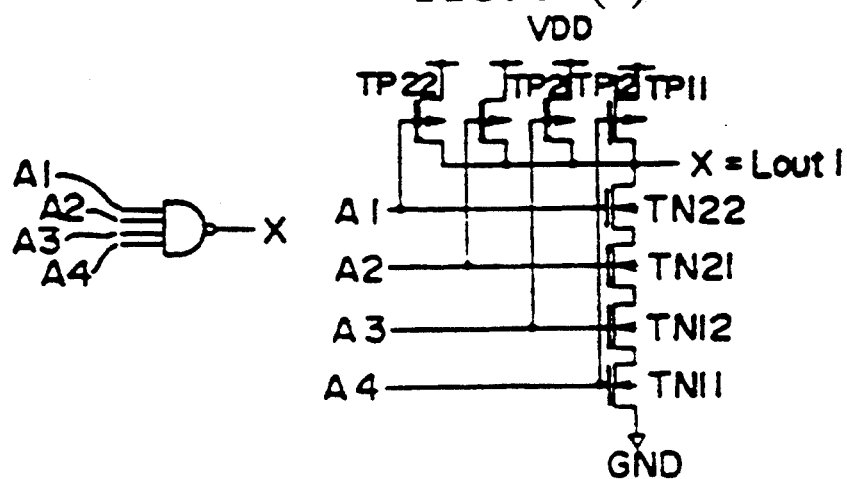

Accordingly, as shown in FIG. 90(b), it is possible to form a 4-input NAND circuit which includes the first through fourth transistors TP11, TP12, TN11 and TN12 of the fourth basic cell BC1, and the first through fourth transistors TP21, TP22, TN21 and TN22 of the fourth basic cell BC2. This 4-input NAND circuit amplifies the logic (obtains a NAND) of input signals A1, A2, A3 and A4 and outputs an output signal X via the first output wiring Lout1.

Figure 91A:
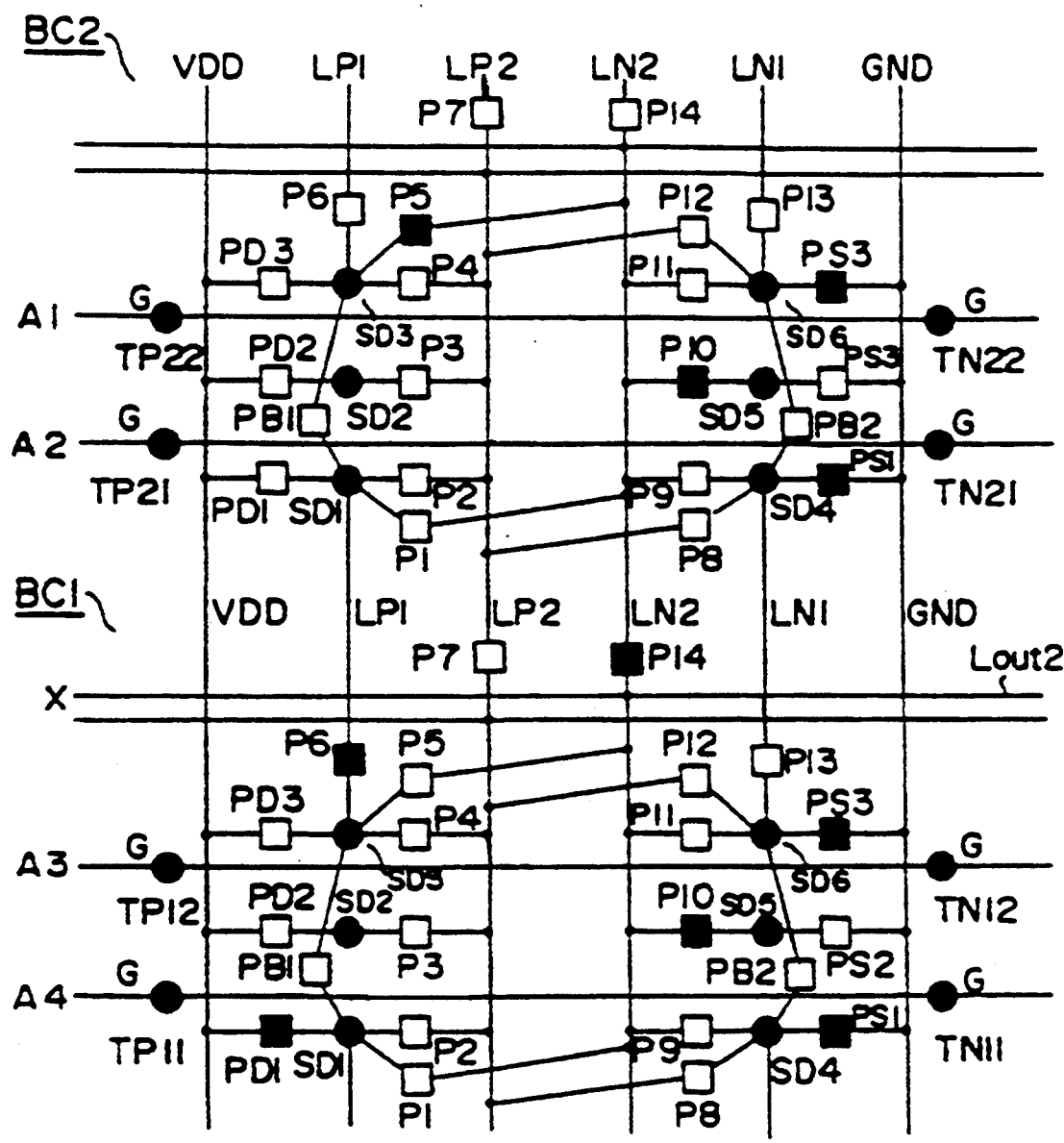
FIG. 91 in parts (a) and (b) is a diagram showing the structure of a 4-input NOR circuit which is obtained by programming the basic cell of the twelfth embodiment.

FIG. 91 in parts (a) and (b) shows the structure of a 4-input NOR circuit which is obtained by programming the fourth basic cells 4 of the twelfth embodiment. In FIG. 91(a), two fourth basic cells 4 are connected.

The fuse elements, anti-fuse elements or, the p-type or n-type field effect transistors which form the first p-type power supply programmable switch PD1, the first and third n-type power supply programmable switches PS1 and PS3, and the sixth, tenth and fourteenth programmable switches P6, P10 and P14 of the fourth basic cell BC1 are programmed. In addition, the fuse elements, anti-fuse elements or, the p-type or n-type field effect transistors which form the first and third n-type power supply programmable switches PS1 and PS3, and the fifth and tenth programmable switches P5 and P10 of the fourth basic cell BC2 are programmed.

Figure 91B:
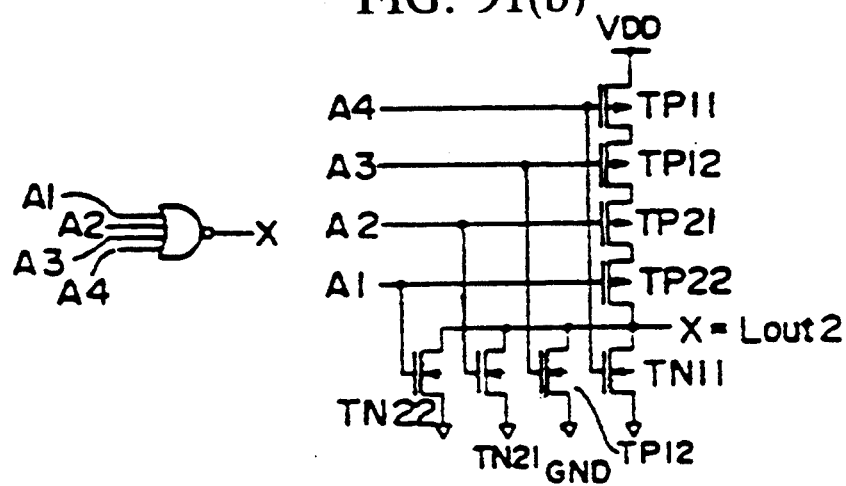

Accordingly, as shown in FIG. 91(b), it is possible to form a 4-input NOR circuit which includes the first through fourth transistors TP11, TP12, TN11 and TN12 of the fourth basic cell BC1, and the first through fourth transistors TP21, TP22, TN21 and TN22 of the fourth basic cell BC2. This 4-input NOR circuit amplifies the logic (obtains a NOR) of input signals A1, A2, A3 and A4 and outputs an output signal X via the second output wiring Lout2.

Figure 92A:
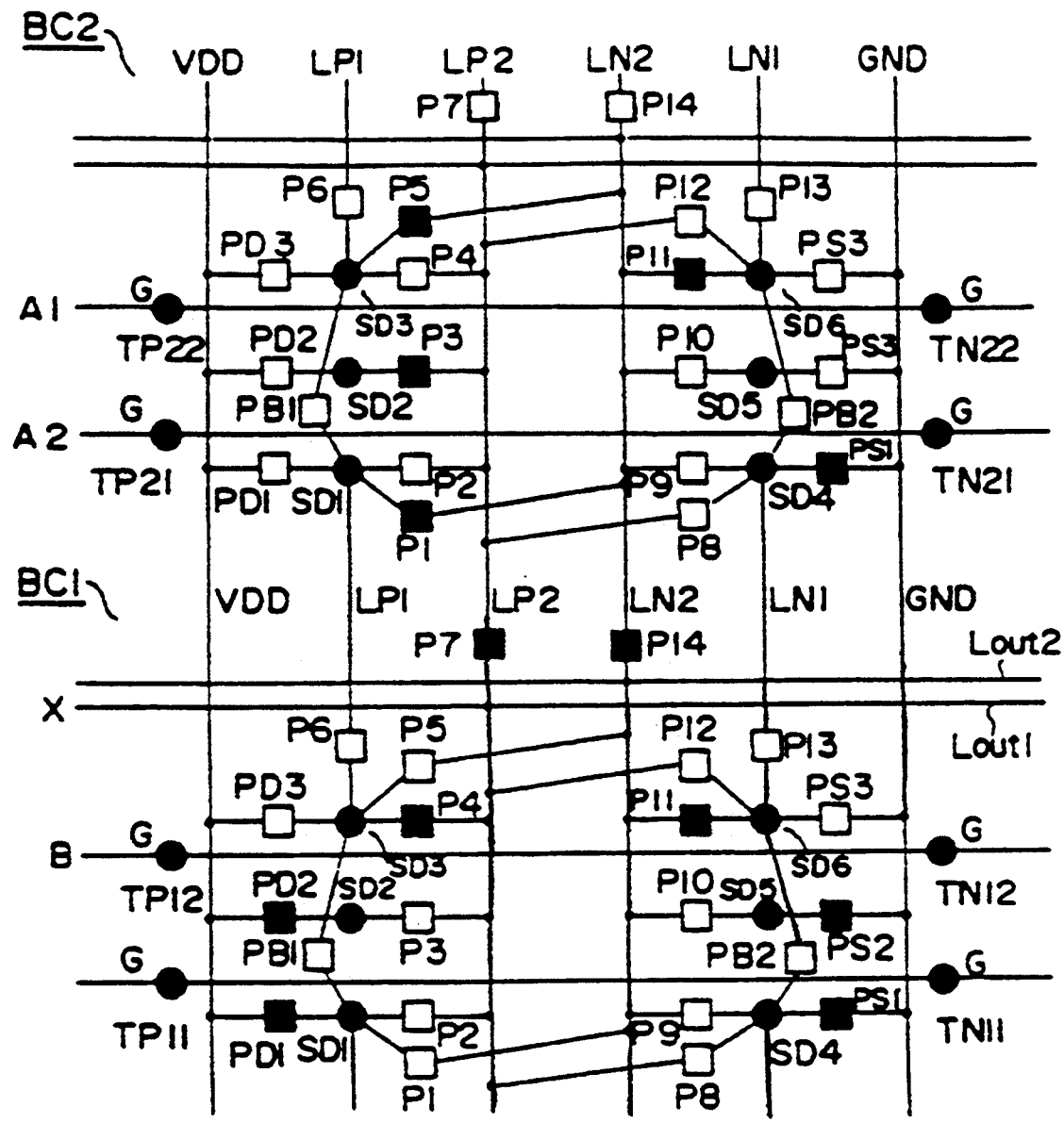
FIG. 92 in parts (a) and (b) is a diagram showing the structure of a 3-input AND-OR inverter circuit which is obtained by programming the basic cell of the twelfth embodiment.

FIG. 92 in parts (a) and (b) shows the structure of a 3-input AND-OR inverter circuit which is obtained by programming the fourth basic cells 4 of the twelfth embodiment. In FIG. 92(a), two fourth basic cells 4 are connected.

The fuse elements, anti-fuse elements or, the p-type or n-type field effect transistors which form the first and second p-type power supply programmable switches PD1 and PD2, the first and second n-type power supply programmable switches PS1 and PS2, and the fourth, seventh, eleventh and fourteenth programmable switches P4, P7, P11 and P14 of the fourth basic cell BC1 are programmed. In addition, the fuse elements, anti-fuse elements or, the p-type or n-type field effect transistors which form the first n-type power supply programmable switch PS1, and the first, third, fifth and eleventh programmable switches P1, P3, P5 and P11 of the fourth basic cell BC2 are programmed.

Figure 92B:
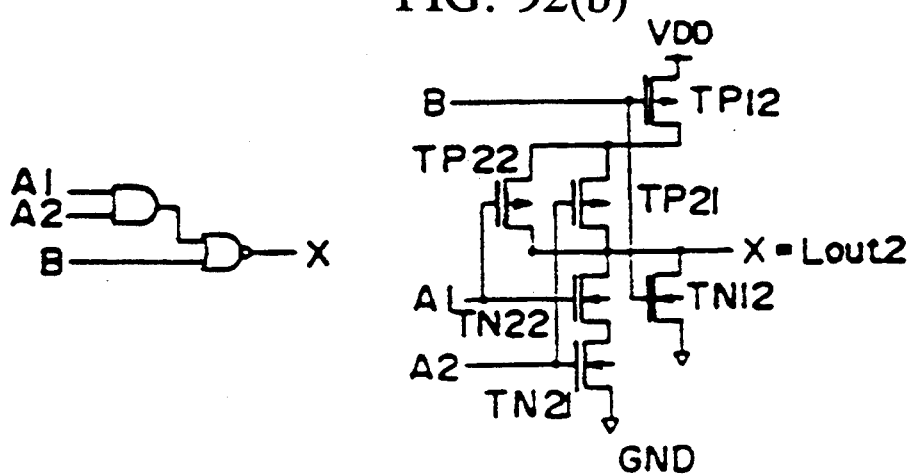

Accordingly, as shown in FIG. 92(b), it is possible to form a 3-input AND-OR inverter circuit which includes the first through fourth transistors TP11, TP12, TN11 and TN12 of the fourth basic cell BC1, and the first through fourth transistors TP21, TP22, TN21 and TN22 of the fourth basic cell BC2. This 3-input AND-OR inverter circuit amplifies the logic (obtains an AND) of input signals A1 and A2, amplifies the logic (obtains an OR inversion) of a resulting signal and an input signal B, and outputs an output signal X via the second output wiring Lout2.

Figure 93A:
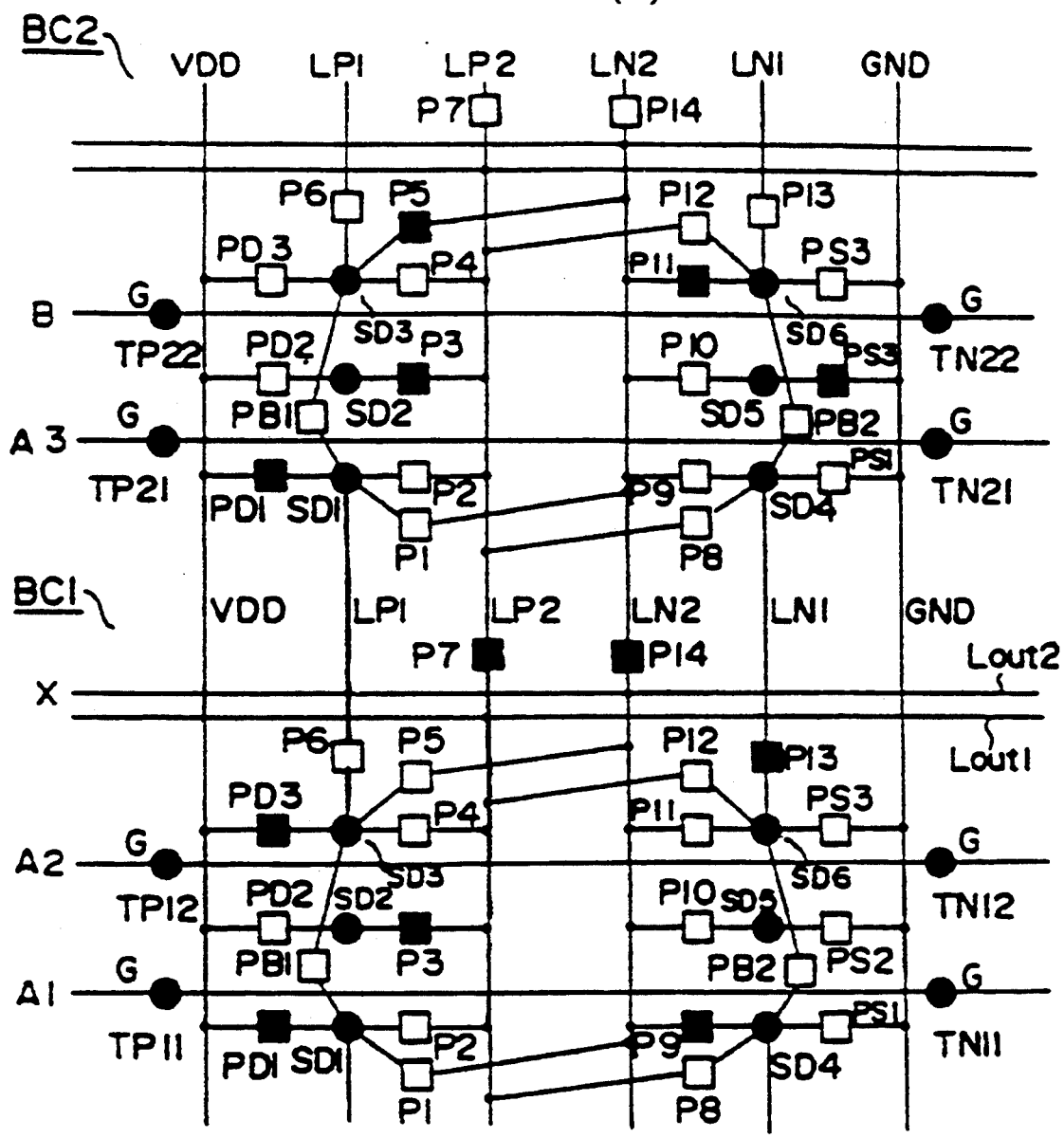
FIG. 93 in parts (a) and (b) is a diagram showing the structure of a 4-input AND-OR inverter circuit which is obtained by programming the basic cell of the twelfth embodiment.

FIG. 93 in parts (a) and (b) shows the structure of a 4-input AND-OR inverter circuit which is obtained by programming the fourth basic cells 4 of the twelfth embodiment. In FIG. 93(a), two fourth basic cells 4 are connected.

The fuse elements, anti-fuse elements or, the p-type or n-type field effect transistors which form the first and third p-type power supply programmable switches PD1 and PD3, and the third, seventh, ninth, thirteenth and fourteenth programmable switches P2, P4, P7, P9, P13 and P14 of the fourth basic cell BC1 are programmed. In addition, the fuse elements, anti-fuse elements or, the p-type or n-type field effect transistors which form the first p-type power supply programmable switch PD1, the second n-type power supply programmable switch PS2, and the third, fifth and eleventh programmable switches P3, P5 and P11 of the fourth basic cell BC2 are programmed.

Figure 93B:
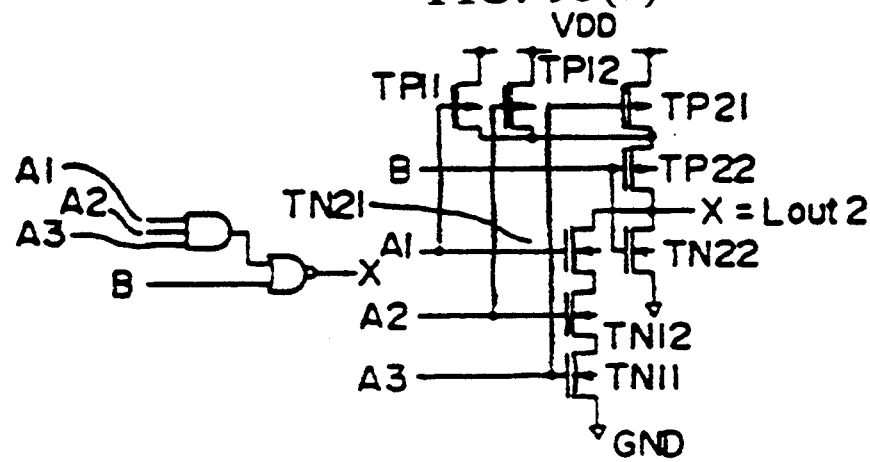

Accordingly, as shown in FIG. 93(b), it is possible to form a 4-input AND-OR inverter circuit which includes the first through fourth transistors TP11, TP12, TN11 and TN12 of the fourth basic cell BC1, and the first through fourth transistors TP21, TP22, TN21 and TN22 of the fourth basic cell BC2. This 410 input AND-OR inverter circuit amplifies the logic (obtains an AND) of input signals A1, A2 and A3, amplifies the logic (obtains an OR inversion) of a resulting signal and an input signal B, and outputs an output signal X via the second output wiring Lout2.

Figure 94A:
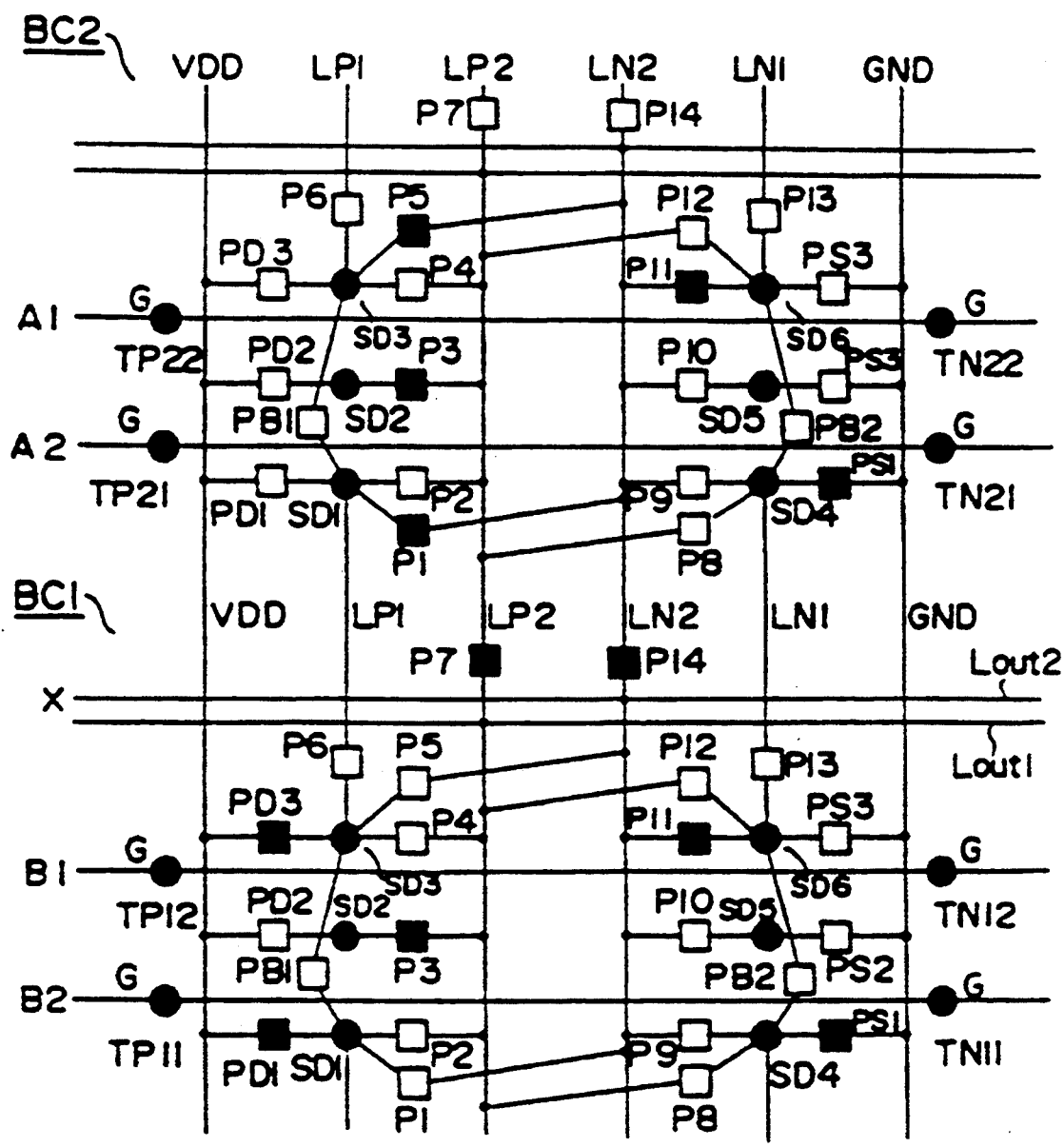
FIG. 94 in parts (a) and (b) is a diagram showing the structure of a 4-input AND-OR inverter circuit which is obtained by programming the basic cell of the twelfth embodiment.

FIG. 94 in parts (a) and (b) shows the structure of a 4-input AND-OR inverter circuit which is obtained by programming the fourth basic cells 4 of the twelfth embodiment. In FIG. 94(a), two fourth basic cells 4 are connected.

The fuse elements, anti-fuse elements or, the p-type or n-type field effect transistors which form the first and third p-type power supply programmable switches PD1 and PD3, the first n-type power supply programmable switch PS1, and the third, seventh, eleventh and fourteenth programmable switches P3, P7, P11 and P14 of the fourth basic cell BC1 are programmed. In addition, the fuse elements, anti-fuse elements or, the p-type or n-type field effect transistors which form the first n-type power supply programmable switch PS1, and the first, third, fifth and eleventh programmable switches P1, P3, P5 and P11 of the fourth basic cell BC2 are programmed.

Figure 94B:
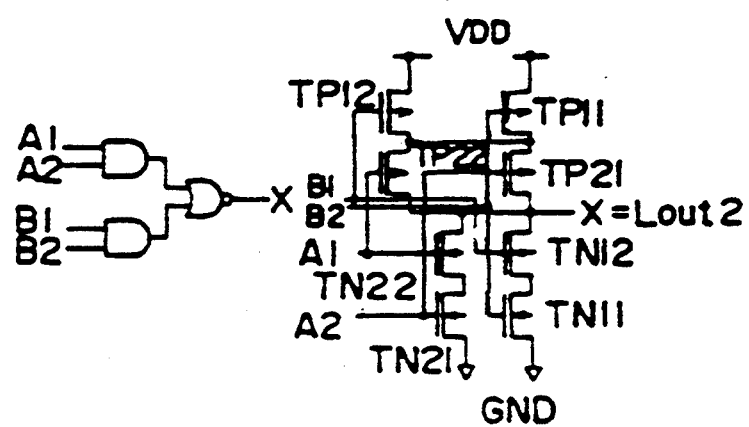

Accordingly, as shown in FIG. 94(b), it is possible to form a 4-input AND-OR inverter circuit which includes the first through fourth transistors TP11, TP12, TN11 and TN12 of the fourth basic cell BC1, and the first through fourth transistors TP21, TP22, TN21 and TN22 of the fourth basic cell BC2. This 4-input AND-OR inverter circuit amplifies the logic (obtains an AND) of input signals A1 and A2, amplifies the logic (obtains an AND) of input signals B1 and B2, amplifies the logic (obtains an OR inversion) of resulting two signals, and outputs an output signal X via the second output wiring Lout2.

Figure 95A:
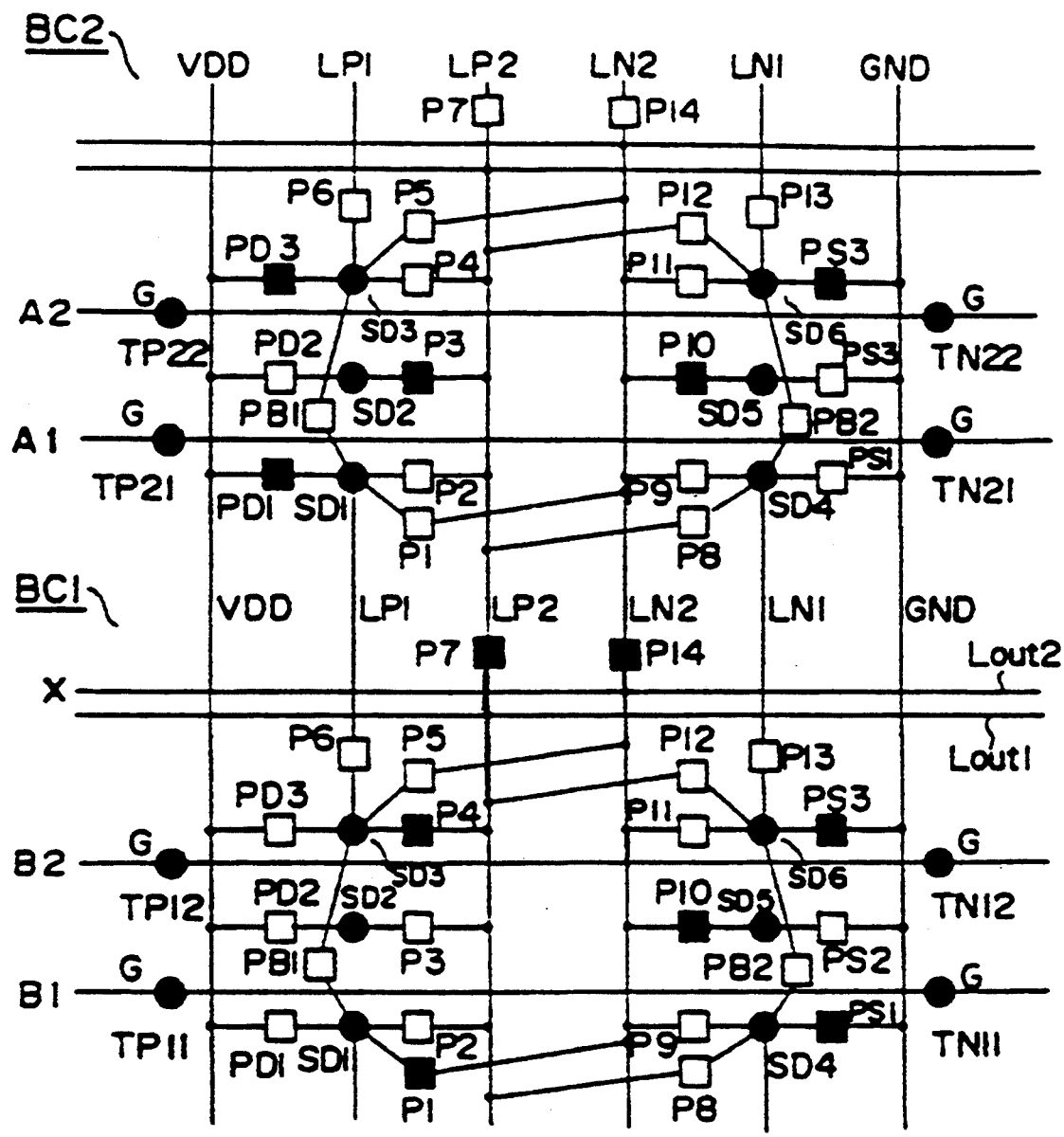
FIG. 95 in parts (a) and (b) is a diagram showing the structure of a 4-input AND-OR inverter circuit which is obtained by programming the basic cell of the twelfth embodiment.

FIG. 95 in parts (a) and (b) shows the structure of a 4-input AND-OR inverter circuit which is obtained by programming the fourth basic cells 4 of the twelfth embodiment. In FIG. 95(a), two fourth basic cells 4 are connected.

The fuse elements, anti-fuse elements or, the p-type or n-type field effect transistors which form the first and third n-type power supply programmable switches PS1 and PS3, and the first, fourth, seventh, tenth and fourteenth programmable switches P1, P4, P7, P10 and P14 of the fourth basic cell BC1 are programmed. In addition, the fuse elements, anti-fuse elements or, the p-type or n-type field effect transistors which form the first and third p-type power supply programmable switches PD1 and PD3, the third n-type power source programmable switch PS3, and the third and tenth programmable switches P3 and P10 of the fourth basic cell BC2 are programmed.

Figure 95B:
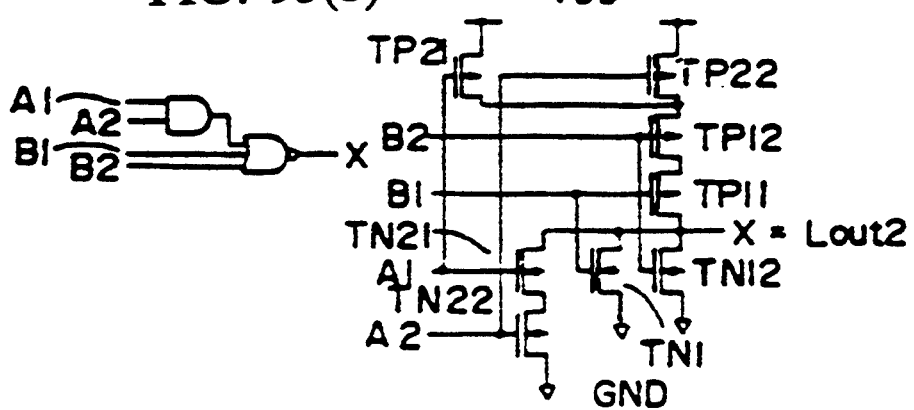

Accordingly, as shown in FIG. 95(b), it is possible to form a 4-input AND-OR inverter circuit which includes the first through fourth transistors TP11, TP12, TN11 and TN12 of the fourth basic cell BC1, and the first through fourth transistors TP21, TP22, TN21 and TN22 of the fourth basic cell BC2. This 4-input AND-OR inverter circuit first amplifies the logic (obtains an AND) of input signals A1 and A2, amplifies the logic (obtains an OR inversion) of a resulting signal and input signals B1 and B2, and outputs an output signal X via the second output wiring Lout2.

Figure 96:
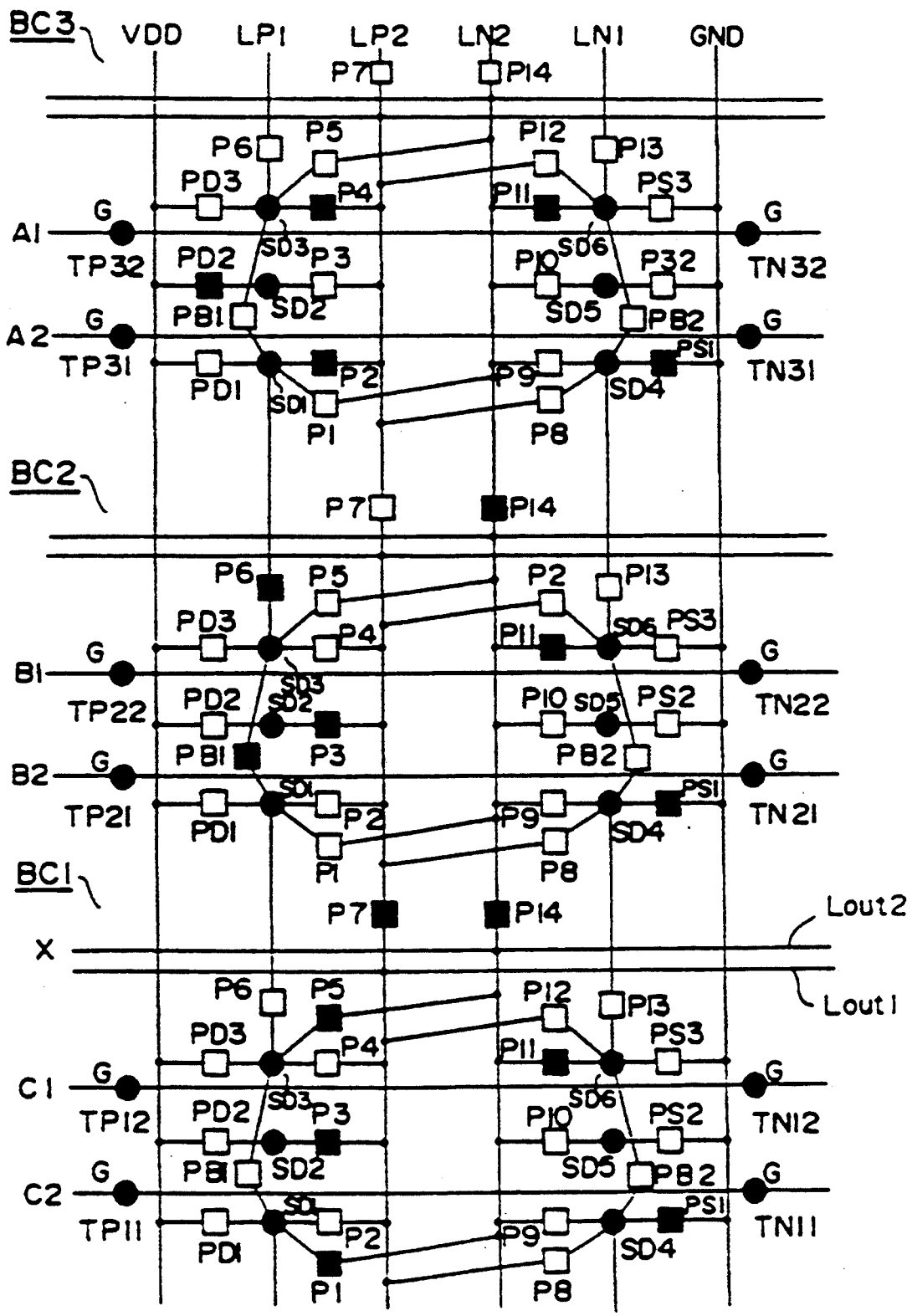
FIG. 96 is a diagram showing the structure of a 6-input AND-OR inverter circuit which is obtained by programming the basic cell of the twelfth embodiment.
Figure 97A:
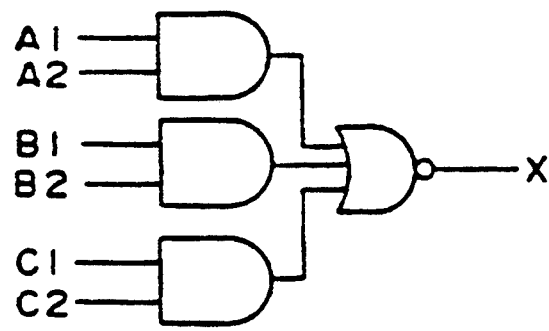
FIG. 97 in parts (a) and (b) is a diagram for explaining the 6-input AND-OR inverter circuit which is obtained by programming the basic cell of the twelfth embodiment.
Figure 97B:
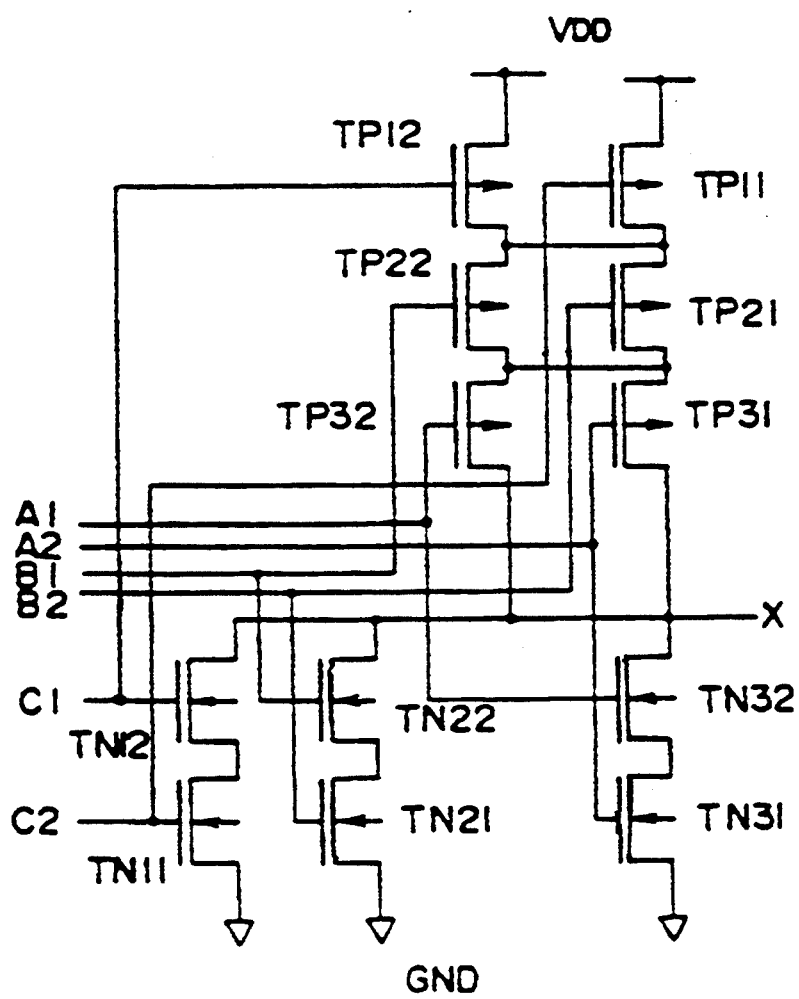

FIG. 96 and FIG. 97 in parts (a) and (b) show the structure of a 6-input AND-OR inverter circuit which is obtained by programming the fourth basic cells 4 of the twelfth embodiment. In FIG. 96, three fourth basic cells 4 are connected.

The fuse elements, anti-fuse elements or, the p-type or n-type field effect transistors which form the first n-type power supply programmable switch PS1, and the first, third, fifth, seventh, eleventh and fourteenth programmable switches P1, P3, P5, P7, P11 and P14 of the fourth basic cell BC1 are programmed. In addition, the fuse elements, anti-fuse elements or, the p-type or n-type field effect transistors which form the first n-type power supply programmable switch PS1, the first bypass programmable switch PB1, and the third, sixth, eleventh and fourteenth programmable switches P3, P6, P11 and P14 of the fourth basic cell BC2 are programmed. Furthermore, the fuse elements, anti-fuse elements or, the p-type or n-type field effect transistors which form the second p-type power supply programmable switch PD2, the first n-type power supply programmable switch PS1, and the second, fourth and eleventh programmable switches P2, P4 and P11 of the fourth basic cell BC3 are programmed.

Accordingly, as shown in FIG. 97(a) and (b), it is possible to form a 6-input AND-OR inverter circuit which includes the first through fourth transistors TP11, TP12, TN11 and TN12 of the fourth basic cell BC1, the first through fourth transistors TP21, TP22, TN21 and TN22 of the fourth basic cell BC2, and the first through fourth transistors TP21, TP22, TN21 and TN22 of the fourth basic cell BC3. This 6-input AND-OR inverter circuit amplifies the logic (obtains an AND) of input signals A1 and A2, amplifies the logic (obtains an AND) of input signals B1 and B2, amplifies the logic (obtains an AND) of input signals C1 and C2, amplifies the logic (obtains an OR inversion) of resulting three signals, and outputs an output signal X via the second output wiring Lout2.

Figure 98A:
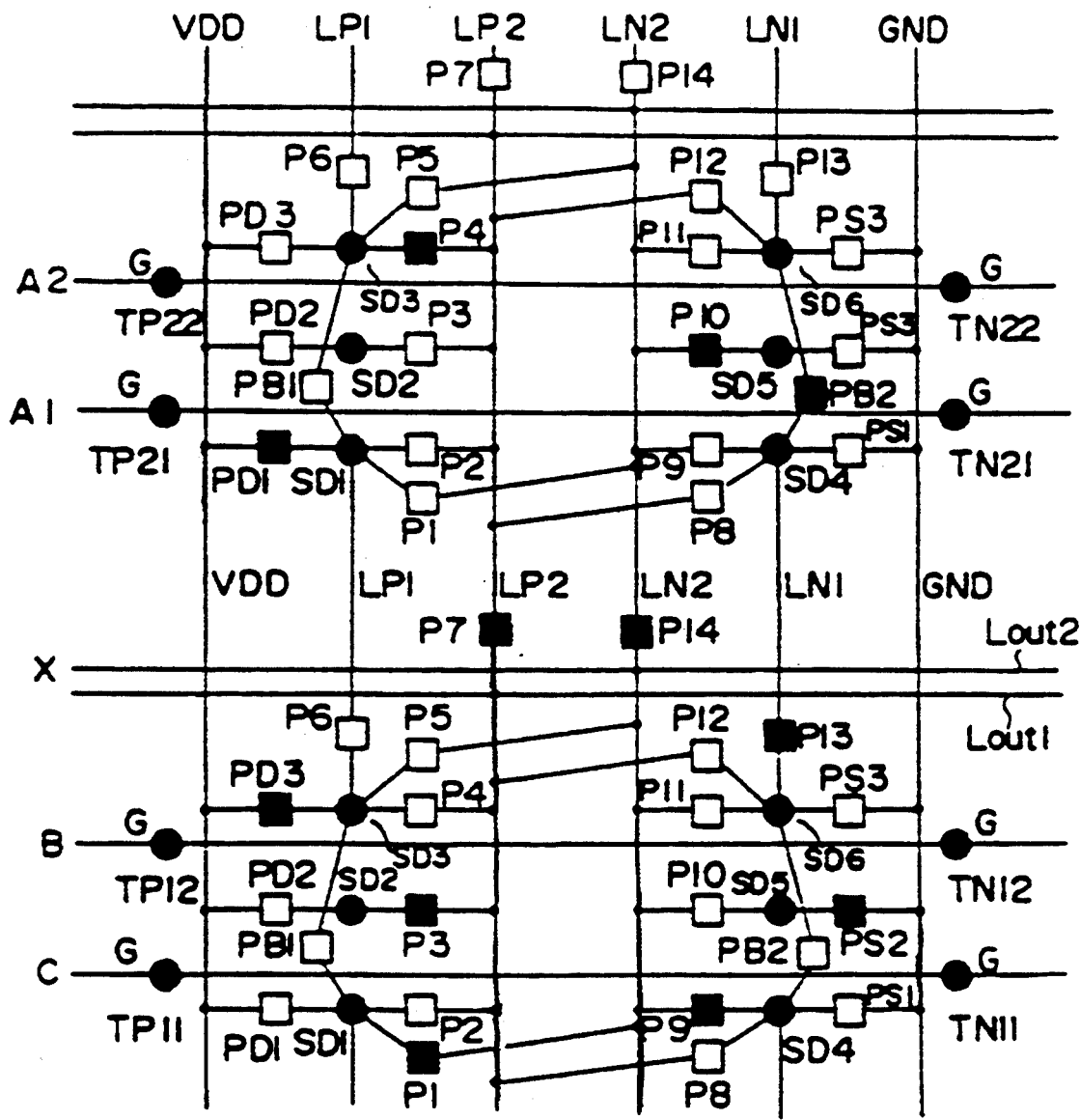
FIG. 98 in parts (a) and (b) is a diagram showing the structure of a 4-input AND-OR inverter circuit which is obtained by programming the basic cell of the twelfth embodiment.

FIG. 98 in parts (a) and (b) shows the structure of a 4-input AND-OR inverter circuit which is obtained by programming the fourth basic cells 4 of the twelfth embodiment. In FIG. 98(a), two fourth basic cells 4 are connected.

The fuse elements, anti-fuse elements or, the p-type or n-type field effect transistors which form the third p-type power supply programmable switch PD3, the second n-type power supply programmable switch PS2, and the first, third, seventh, ninth, thirteenth and fourteenth programmable switches P1, P3, P7, P9, P13 and P14 of the fourth basic cell BC1 are programmed. In addition, the fuse elements, anti-fuse elements or, the p-type or n-type field effect transistors which form the first p-type power supply programmable switch PD1, the second bypass programmable switch PB2, and the fourth and tenth programmable switches P4 and P10 of the fourth basic cell BC2 are programmed.

Figure 98B:
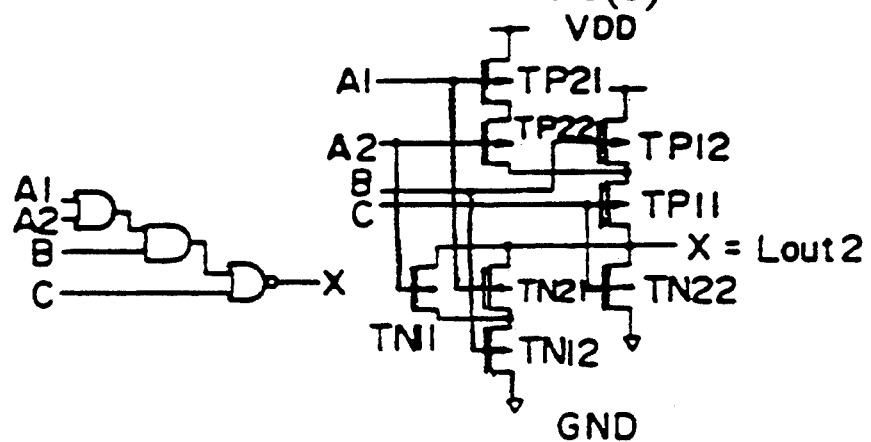

Accordingly, as shown in FIG. 98(b), it is possible to form a 4-input AND-OR inverter circuit which includes the first through fourth transistors TP11, TP12, TN11 and TN12 of the fourth basic cell BC1, and the first through fourth transistors TP21, TP22, TN21 and TN22 of the fourth basic cell BC2. This 4-input AND-OR inverter circuit first amplifies the logic (obtains an AND) of input signals A1 and A2, amplifies the logic (obtains an AND) of a resulting signal and an input signal B, amplifies the logic (obtains an OR inversion) of a resulting signal and an input signal C, and outputs an output signal X via the second output wiring Lout2.

Figure 99A:
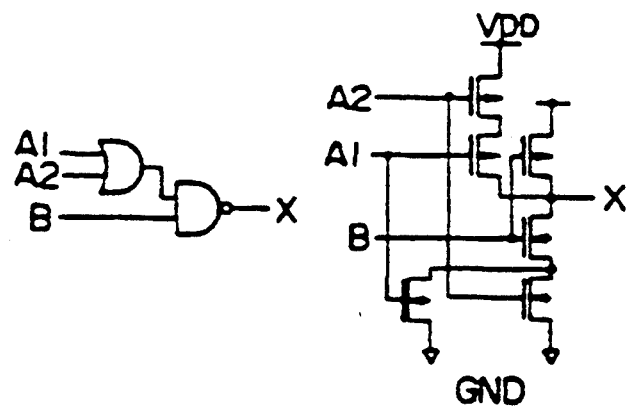
FIG. 99 in parts (a), (b) and (c) is a diagram showing the structure of a logic circuit which can be programmed by the basic cell of the twelfth embodiment.

FIG. 99(a), (b) and (c) shows the structure of logic circuits which can be programmed by the fourth basic cell 4 of the twelfth embodiment.

FIG. 99(a) shows a 3-input OR-AND inverter circuit which is a symmetrical type to the 3-input AND-OR inverter circuit.

Figure 99B:
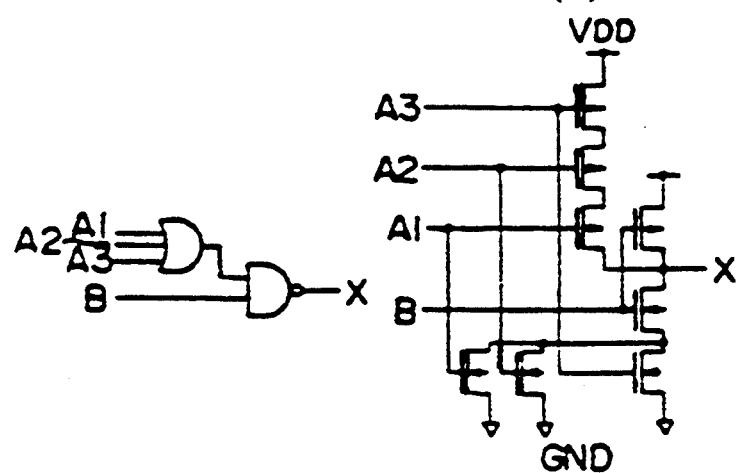

FIG. 99(b) shows a 4-input OR-AND inverter circuit which is a symmetrical type to the 4-input AND-OR inverter circuit.

Figure 99C:
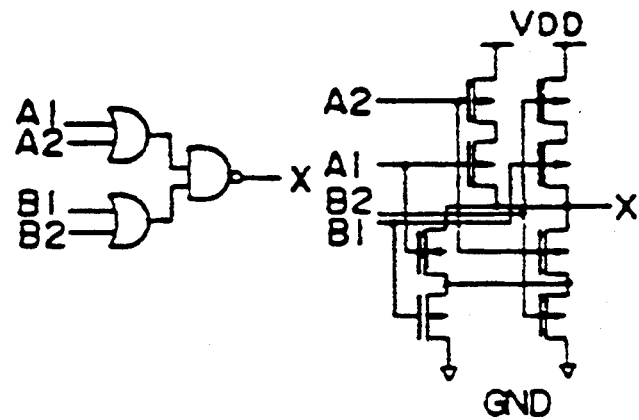

FIG. 99(c) shows a 4-input OR-AND inverter circuit which is a symmetrical type to the 4-input AND-OR inverter circuit.

Each logic circuit shown in FIG. 99(a), (b) and (c) can be formed by making connections symmetrical to that of the corresponding AND-OR inverter circuit by programming the fourth basic cell 4.

Figure 100A:
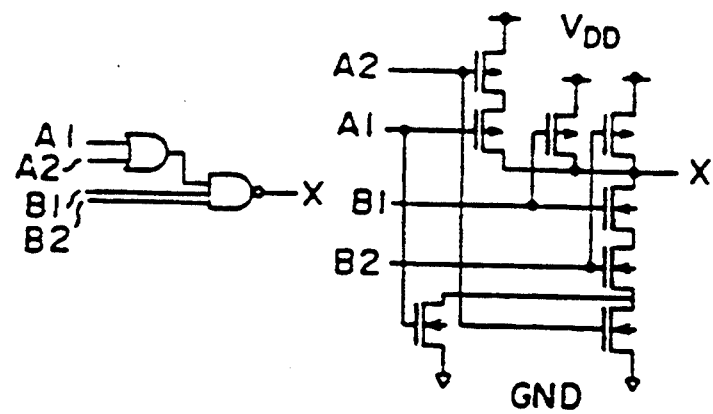
FIG. 100 in parts (a), (b) and (c) is a diagram showing the structure of a logic circuit which can be programmed by the basic cell of the twelfth embodiment.

FIG. 100(a), (b) and (c) shows the structure of other logic circuits which can be programmed by the fourth basic cell 4 of the twelfth embodiment.

FIG. 100(a) shows a 4-input OR-AND inverter circuit which is a symmetrical type to the 4-input AND-OR inverter circuit.

Figure 100B:
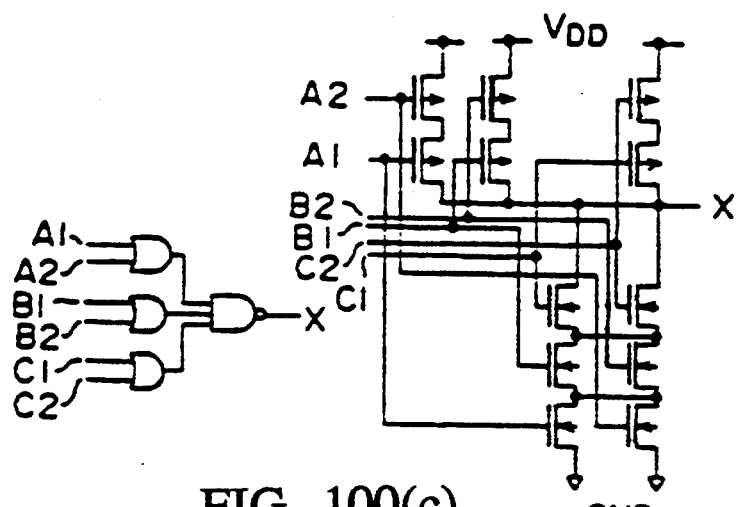

FIG. 100(b) shows a 6-input OR-AND inverter circuit which is a symmetrical type to the 6-input AND-OR inverter circuit.

Figure 100C:
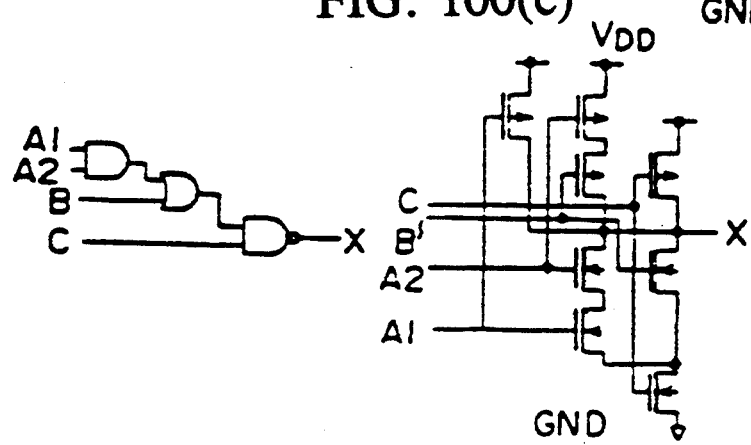

FIG. 100(c) shows a 4-input OR-AND inverter circuit which is a symmetrical type to the 4-input AND-OR inverter circuit.

Each logic circuit shown in FIG. 100(a), (b) and (c) can be formed by making connections symmetrical to that of the corresponding AND-OR inverter circuit by programming the fourth basic cell 4.

Therefore, by appropriately programming two fourth basic cells 4, it is possible form any of 21 kinds of basic logic cells.

Figure 101A:
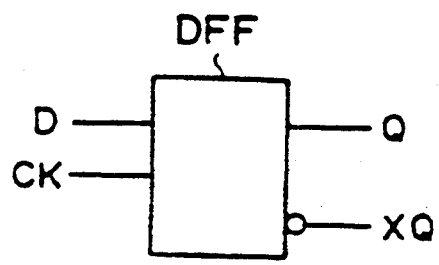
FIG. 101 in parts (a) and (b) is a diagram for explaining a D flip-flop which combines the basic cells of the twelfth embodiment.
Figure 101B:
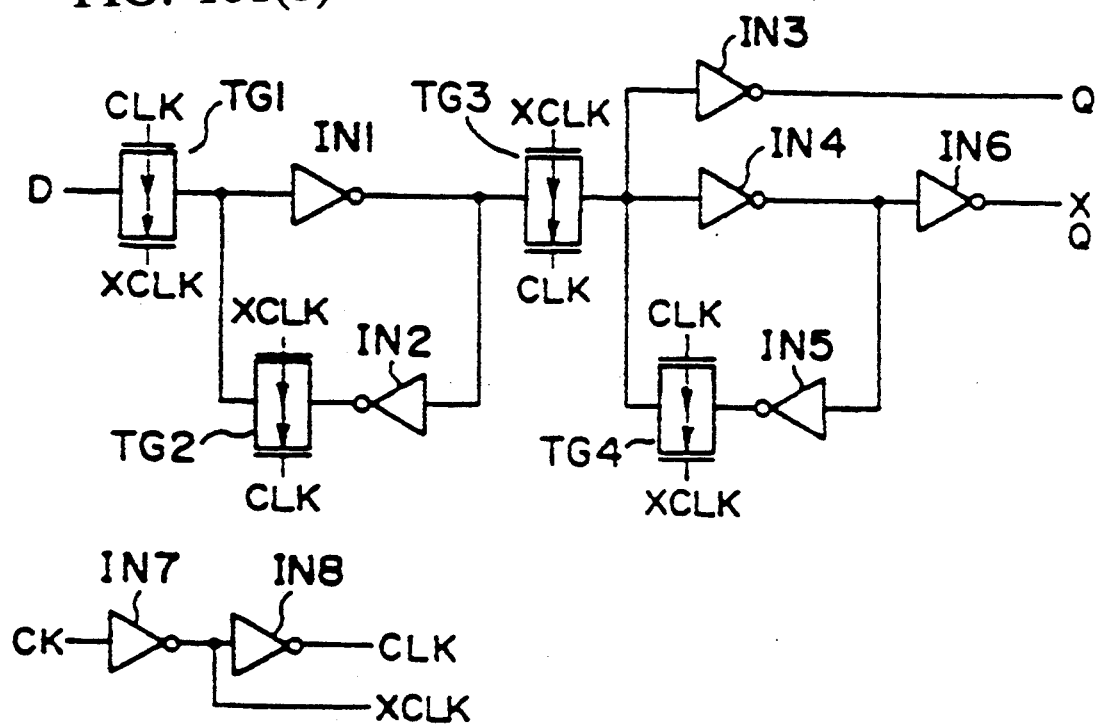

FIG. 101(a) and (b) is a diagram for explaining a D flip-flop which is formed by the fourth basic cells 4. In FIG. 101(a), the a D flip-flop circuit DFF is formed by appropriately connecting twelve fourth basic cells 4, but may be similarly formed by connecting twelve basic cells according to any of the ninth through sixteenth embodiments.

For example, the D flip-flop DFF is formed by connecting eight inverter circuits IN1 through IN8 which are formed by the fourth basic cells 4, and four transmission gate circuits TG1 through TG4 which are formed by the fourth basic cells 4. In this case, the total number of transistors forming the D flip-flop circuit DFF is forty-eight which includes the sixteen transistors forming the four transmission gates TG1 through TG4 and the thirty-two transistors forming the eight inverter circuits IN1 through IN8.

Accordingly, it is possible to form the D flip-flop using a number of transistors only corresponding to approximately one-half the number of transistors required in the conventional case. In addition, compared to the conventional case where the transistor pair tile portion and the RAM logic tile portion, that is, the two kinds of basic cells, are used as the minimum units, it is possible to more easily form the D flip-flop circuit from the basic cells according to the ninth through sixteenth embodiments with an improved utilization efficiency of the basic cells.

Figure 102A:
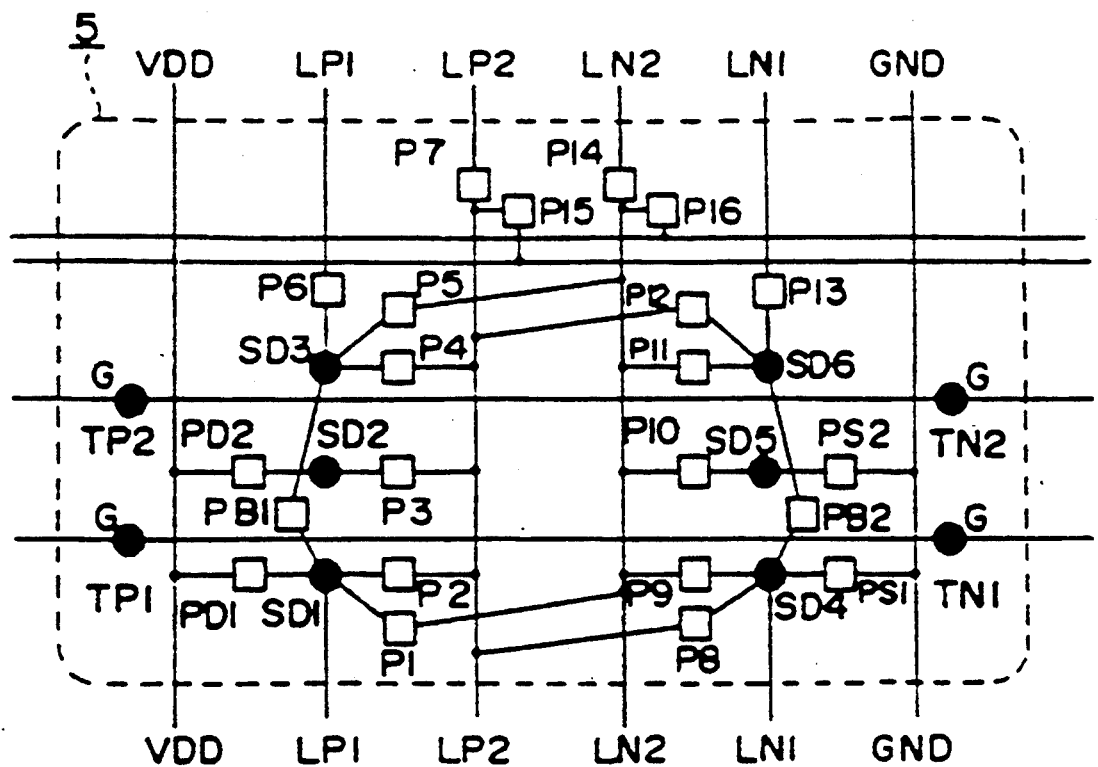
FIG. 102 in parts (*a*) and (*b*) is a diagram showing the structure of a basic cell of the thirteenth and fourteenth embodiments of the programmable logic circuit according to the present invention.

(5) Thirteenth Embodiment:

FIG. 102(a) is a diagram showing the structure of a fifth basic cell 5 of the thirteenth embodiment. The fifth basic cell 5 differs from the first through fourth basic cells 1 through 4, in that fifteenth and sixteenth programmable switches P15 and P16 are additionally provided. In addition, the first through fifth programmable switches P1 through P5 and the eighth through twelfth programmable switches P8 through P12 which are connected to corresponding ones of the source or drain draw-out electrodes SD1 through SD6 of the transistors TP1, TP2, TN1 and TN2 are not directly connected to the first and second output wirings Lout1 and Lout2.

In other words, in the program symbol diagram of FIG. 102(a), the fifth basic cell 5 includes the first through fourth transistors TP1, TP2, TN1 and TN2, and twenty programmable switches P11, PD2, PS1, PS2, and P1 through P16.

In addition, the gates G of the first through fourth transistors TP1, TP2, TN1 and TN2 are connected to the input wiring Lin, and the source or drain draw-out electrodes SD1 through SD6 of the transistors TP1, TP2, TN1 and TN2 are coupled to the corresponding ones of the power supply line VDD, the ground line GND, the first and second output wirings Lout1 and Lout2, the first and second p-type protection wirings LP1 and LP2, and the first and second n-type protection wirings LN1 and LN2 via corresponding ones of first and second p-type power supply programmable switches PD1 and PD2, the first and second n-type ground programmable switches PS1 and PS2, and first through sixteenth programmable switches P1 through P16.

That is, the source or drain draw-out electrode SD1 of the first transistor TP1 is coupled to the power supply line VDD via the first p-type power supply programmable switch PD1, to the second n-type protection wiring LN2 via the first programmable switch P1, to the second p-type protection wiring LP2 via the second programmable switch P2.

Moreover, the source or drain draw-out electrode SD2 of the first and second transistors TP1 and TP2 is coupled to the power supply line VDD via the second p-type power supply programmable switch PD2, and to the second p-type protection wiring LP2 via the third programmable switch P3. The source or drain draw-out electrode SD3 of the second transistor TP2 is coupled to the second p-type protection wiring LP2 via the fourth programmable switch P4, to the second n-type protection wiring LN2 via the fifth programmable switch P5, and to the first p-type protection wiring LP1 via the sixth programmable switch P6.

Furthermore, the source or drain draw-out electrode SD4 of the third transistor TN1 is coupled to the ground line GND via the first n-type ground programmable switch PS1, to the second p-type protection wiring LP2 via the eighth programmable switch P8, to the second n-type protection wiring LN2 via the ninth programmable switch P9, and to the first n-type protection wiring LN1. The source or drain draw-out electrode SD5 of the third and fourth transistors TN1 and TN2 is coupled to the ground line GND via the second n-type ground programmable switch PS2, and to the second p-type protection wiring LP2 via the tenth programmable switch P10.

The source or drain draw-out electrode SD6 of the fourth transistor TN2 is coupled to the second n-type protection wiring LN2 via the eleventh programmable switch P11, to the second p-type protection wiring LP2 via the twelfth programmable switch P12, and to the first n-type protection wiring LN1 via the thirteenth programmable switch P13.

In addition, the second p-type protection wiring LP2 is connected to the seventh programmable switch P7, and the second n-type protection wiring LN2 is connected to the fourteenth programmable switch P14. The second p-type protection wiring LP2 is coupled to the first output wiring Lout1 via the fifteenth programmable switch P15, and the second n-type protection wiring LN2 is coupled to the second output wiring Lout2 via the sixteenth programmable switch P16. Otherwise, the structure of the fifth basic cell 5 is the same as that of the first basic cell 1, and a description related to the same parts will be omitted.

According to the fifth basic cell 5, there are provided the first through fourth transistors TP1, TP2, TN1 and TN2, and twenty programmable switches PD1, PD2, PS1, PS1, and P1 through P16 for connecting these transistors TP1, TP2, TN1 and TN2 and the wirings, as shown in FIG. 102(a). In addition, the second p-type protection wiring LP2 is coupled to the first output wiring Lout1 via the fifteenth programmable switch P15, and the second n-type protection wiring LN2 is coupled to the second output wiring Lout2 via the sixteenth programmable switch P16.

For this reason, the fifth basic cell 5 which forms the minimum unit includes the first through fourth transistors TP1, TP2, TN1 and TN2 and a total of twenty programmable switches PD1, PD2, PS1, PS2, and P1 through P16. By appropriately programming the fifteenth and sixteenth programmable switches P15 and P16 to selectively make these programmable switches P15 and P16 become conductive, it is possible to connect the second p-type protection wiring LP2 and the first output wiring Lout1 or to connect the second n-type protection wiring LN2 and the second output wiring Lout2. In addition, by appropriately programming the fifteenth and sixteenth programmable switches P15 and P16 to selectively make these programmable switches P15 and P16 become non-conductive, it is possible to make the first and second output wirings Lout1 and Lout2 have the through-wiring function.

The through-wiring function refers to a wiring which bypasses the fifth basic cell 5 in the horizontal direction, and is effectively used when there is a demand to communicate with a neighboring fifth basic cell 5 in the horizontal direction or to realize a minimum wiring distance.

Hence, although the number of programmable switches increases by two compared to the number of programmable switches in the ninth embodiment, it becomes possible to form the inverter circuit, the power type inverter circuit, the transmission gate circuit, the 2-input NAND circuit, the 2-input NOR circuit and the like utilizing the through-wiring function. In addition, it is possible to form a 3-input NAND circuit, a 3-input NOR circuit, a 4-input NAND circuit, 4-input NOR circuit, a 4-input AND-OR inverter circuit or the like by connecting two fifth basic cells 5. Furthermore, it is possible to form a 6-input AND-OR inverter circuit or the like by connecting three fifth basic cells 5.

Figure 102B:
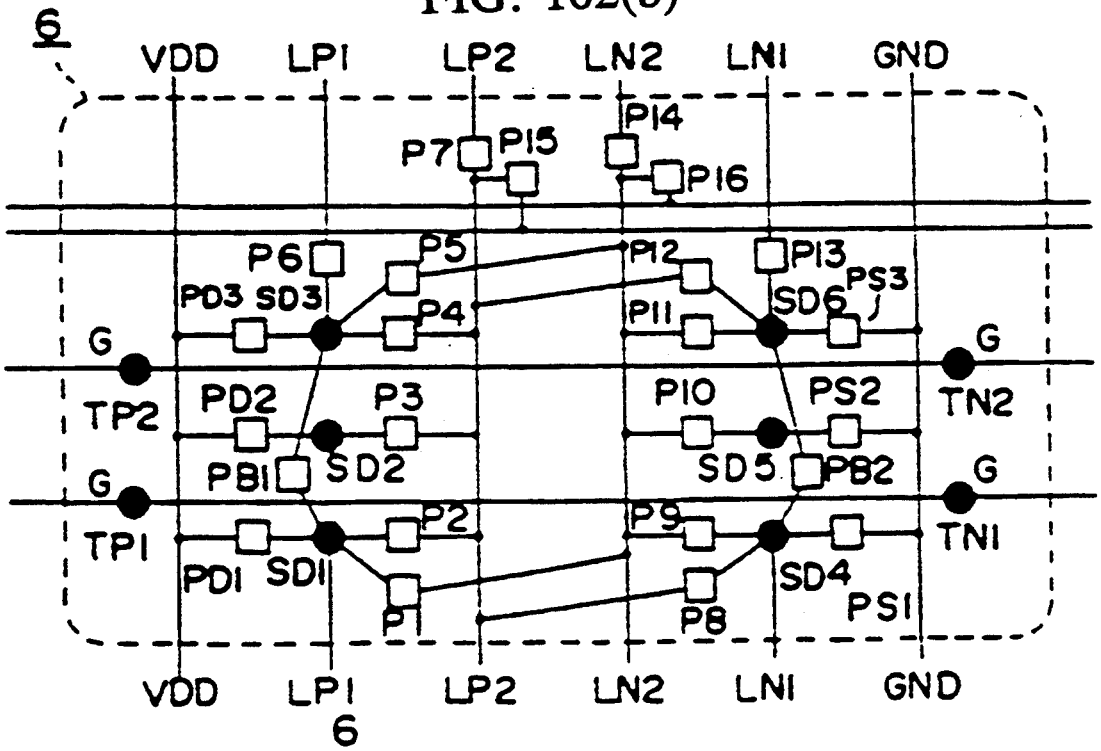

(6) Fourteenth Embodiment:

FIG. 102(b) is a diagram showing the structure of a sixth basic cell 6 of the fourteenth embodiment. The sixth basic cell 6 makes a connection to the ground line GND using a third p-type power supply programmable switch PD3 or a third n-type ground programmable switch PS3.

In other words, in the program symbol diagram of FIG. 102(b), the sixth basic cell 6 includes the first through fourth transistors TP1, TP2, TN1 and TN2, and twenty-two programmable switches PD1 through PD3, PS1 through PS3, and P1 through P16.

The third p-type power supply programmable switch PD3 is coupled between the source or drain draw-out electrode SD3 of the second transistor TP2 and the power supply line VDD, and the third n-type ground programmable switch PS3 is coupled between the source or drain draw-out electrode SD6 of the fourth transistor TN2 and the ground line GND. Otherwise, the structure of the sixth basic cell 6 is the same as that of the fifth basic cell 5, and a description thereof will be omitted.

According to the sixth basic cell 6, there are provided the first through fourth transistors TP1, TP2, TN1 and TN2, and twenty-two programmable switches PD1 through PD3, PS1 through PS3, and P1 through P16 for connecting these transistors TP1, TP2, TN1 and TN2 and the wirings, as shown in FIG. 102(b). In addition, the source or drain draw-out electrode SD3 of the second transistor TP2 is coupled to the power supply line VDD via the third p-type power supply programmable switch PD3, and the source or drain draw-out electrode SD6 of the fourth transistor TN2 is coupled to the ground line GND via the third n-type ground programmable switch PS3.

For this reason, the sixth basic cell 6 which forms the minimum unit includes the first through fourth transistors TP1, TP2, TN1 and TN2 and a total of twenty-two programmable switches PD1 through PD3, PS1 through PS3, and P1 through P16. By appropriately programming the fifteenth and sixteenth programmable switches P15 and P16 similarly to the fifth basic cell 5, it is possible to make the first and second output wirings Lout1 and Lout2 have the through-wiring function.

Hence, although the number of programmable switches increases by four compared to the number of programmable switches in the ninth embodiment, it becomes possible to form the inverter circuit, the power type inverter circuit, the transmission gate circuit, the 2-input NAND circuit, the 2-input NOR circuit and the like utilizing the through-wiring function. In addition, it is possible to form a 3-input NAND circuit, a 3-input NOR circuit, a 4-input NAND circuit, a 4-input NOR circuit, a 4-input AND-OR inverter circuit or the like by connecting two sixth basic cells 8. Furthermore, it is possible to form a 8-input AND-OR inverter circuit or the like by connecting three sixth basic cells 6.

(7) Fifteenth Embodiment:

FIG. 103 (a) shows the structure of a seventh basic cell 7 according to the fifteenth embodiment. This seventh basic cell 7 differs from the fifth basic cell 5 in that the seventh basic cell 7 is provided with first and second bypass programmable switches PB1 and PB2.

Figure 103A:
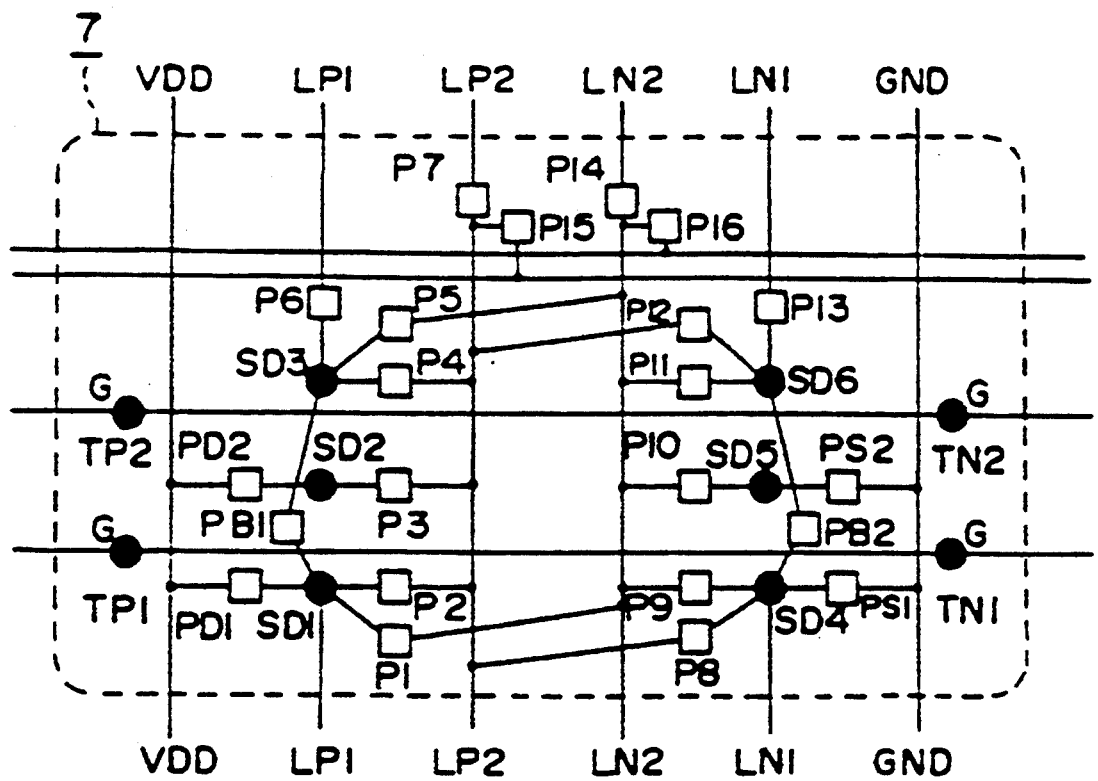
FIG. 103 in parts (*a*) and (*b*) is a diagram showing the structure of a basic cell of the fifteenth and sixteenth embodiments of the programmable logic circuit according to the present invention.

In other words, in the program symbol diagram of FIG. 103(a), the seventh basic cell 7 includes first through fourth transistors TP1, TP2, TN1 and TN2, and twenty-two programmable switches PD1, PD2, PS1, PS2, P1 through P16, PB1 and PB2.

In addition, the first bypass programmable switch PB1 is coupled between the source or drain draw-out electrodes SD1 and SD3 of the first and second transistors TP1 and TP2. The second bypass programmable switch PB2 is coupled between the source or drain draw-out electrodes SD4 and SD6 of the third and fourth transistors TN1 and TN2. Otherwise, the structure of the seventh basic cell 7 is the same as that of the fifth basic cell 5, and a description thereof will be omitted.

According to the seventh basic cell 7, there are provided the first through fourth transistors TP1, TP2, TN1 and TN2, and twenty-two programmable switches PD1, PD2, PS1, PS2, P1 through P16, PB1 and PB2 for connecting these transistors TP1, TP2, TN1 and TN2 and the wirings, as shown in FIG. 103(a). In addition, the first bypass programmable switch PB1 is coupled between the source or drain draw-out electrodes SD1 and SD3 of the first and second transistors TP1 and TP2, and the second bypass programmable switch PB2 is coupled between the source or drain draw-out electrodes SD4 and SD6 of the third and fourth transistors TN1 and TN2.

For this reason, the seventh basic cell 7 which forms the minimum unit includes the first through fourth transistors TP1, TP2, TN1 and TN2 and a total of twenty-two programmable switches PD1, PD2, PS1, PS2, P1 through P16, PB1 and PB2. Similarly to the eleventh embodiment, the first bypass programmable switch PB1 can directly connect the source or drain draw-out electrodes SD1 and SD3 of the first and second transistors TP1 and TP2, without via the second p-type protection wiring LP2. In addition, the second bypass programmable switch PB2 can directly connect the source or drain draw-out electrodes SD4 and SD6 of the third and fourth transistors TN1 and TN2, without via the second n-type protection wiring LN2.

Hence, although the number of programmable switches increases by four compared to the number of programmable switches in the ninth embodiment, it becomes possible to form the inverter circuit, the power type inverter circuit, the transmission gate circuit, the 2-input NAND circuit, the 2-input NOR circuit and the like utilizing the through-wiring function, similarly to the thirteenth embodiment. In addition, it is possible to form a 3-input NAND circuit, a 3-input NOR circuit, a 4-input NAND circuit, a 4-input NOR circuit, a 4-input AND-OR inverter circuit or the like by connecting two seventh basic cells 7. Furthermore, it is possible to form a 6-input AND-OR inverter circuit or the like by connecting three seventh basic cells 7.

Figure 103B:
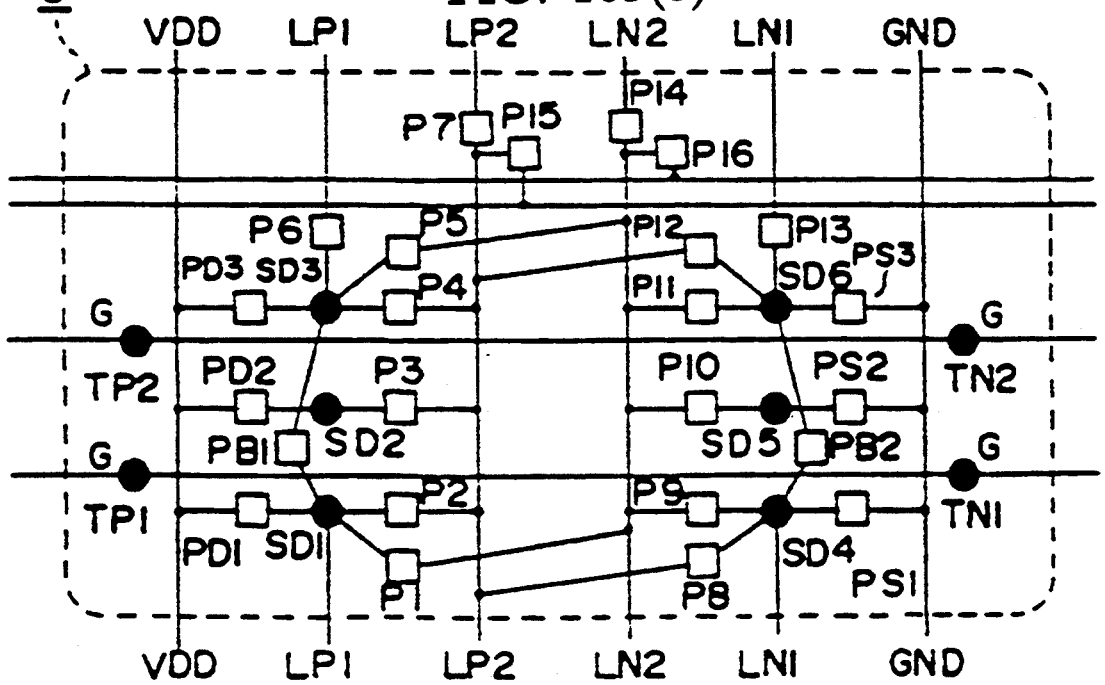

(8) Sixteenth Embodiment:

FIG. 103(b) shows the structure of an eighth basic cell 8 according to the sixteenth embodiment. This eighth basic cell 8 differs from the first basic cell 1 in that the eighth basic cell 8 is provided with a third p-type power supply programmable switch PD3, a third n-type ground programmable switch, and first and second bypass programmable switches PB1 and PB2.

In other words, in the program symbol diagram of FIG. 103(b), the eighth basic cell 8 includes first through fourth transistors TP1, TP2, TN1 and TN2, and twenty-four programmable switches PD1 through PD3, PS1 through PS3, P1 through P18, PB1 and PB2.

In addition, the first bypass programmable switch PB1 is coupled between the source or drain draw-out electrodes SD1 and SD3 of the first and second transistors TP1 and TP2. The second bypass programmable switch PB2 is coupled between the source or drain draw-out electrodes SD4 and SD6 of the third and fourth transistors TN1 and TN2. Otherwise, the structure of the seventh basic cell 7 is the same as that of the fifth basic cell 5, and a description thereof will be omitted.

According to the eighth basic cell 8, there are provided the first through fourth transistors TP1, TP2, TN1 and TN2, and twenty-four programmable switches PD1 through PD3, PS1 through PS3, P1 through P16, PB1 and PB2 for connecting these transistors TP1, TP2, TN1 and TN2 and the wirings, as shown in FIG. 103(b). In addition, the third p-type power supply programmable switch PD3 is coupled between the source or drain draw-out electrode SD3 of the second transistor TP2 and the power supply line VDD, and the third n-type ground programmable switch PS3 is coupled between the source or drain draw-out electrode SD6 of the fourth transistor TN2 and the ground line GND. Moreover, the first bypass programmable switch PB1 is coupled between the source or drain draw-out electrodes SD1 and SD3 of the first and second transistors TP1 and TP2, and the second bypass programmable switch PB2 is coupled between the source or drain draw-out electrodes SD4 and SD6 of the third and fourth transistors TN1 and TN2.

For this reason, the eighth basic cell 8 which forms the minimum unit includes the first through fourth transistors TP1, TP2, TN1 and TN2 and a total of twenty-four programmable switches PD1 through PD3, through PS3, P1 through P16, PB1 and PB2. Similarly to the twelfth embodiment, the 2-input NAND circuit can be formed by appropriately programming the fuse elements, anti-fuse elements or, the p-type or n-type field effect transistors which form the first and third p-type power supply programmable switches PD1 and PD3, the first n-type ground programmable switch PS1, and the third and twelfth programmable switches P3 and P12 within the eighth basic cell 8.

Hence, although the number of programmable switches increases by six compared to the number of programmable switches in the ninth embodiment, it becomes possible to form the inverter circuit, the power type inverter circuit, the transmission gate circuit, the 2-input NAND circuit, the 2-input NOR circuit and the like utilizing the through-wiring function, similarly to the thirteenth embodiment. In addition, it is possible to form a 3-input NAND circuit, a 3-input NOR circuit, a 4-input NAND circuit, a 4-input NOR circuit, a 4-input AND-OR inverter circuit or the like by connecting two eighth basic cells 8. Furthermore, it is possible to form a 6-input AND-OR inverter circuit or the like by connecting three eighth basic cells 8.

The first through eighth basic cells 1 through 8 are suited for forming a logic gate circuit having a relatively small scale. On the other hand, ninth through twelfth basic cells which will be described hereinafter are suited for forming a logic gate circuit having a relatively large scale.

Figure 104:
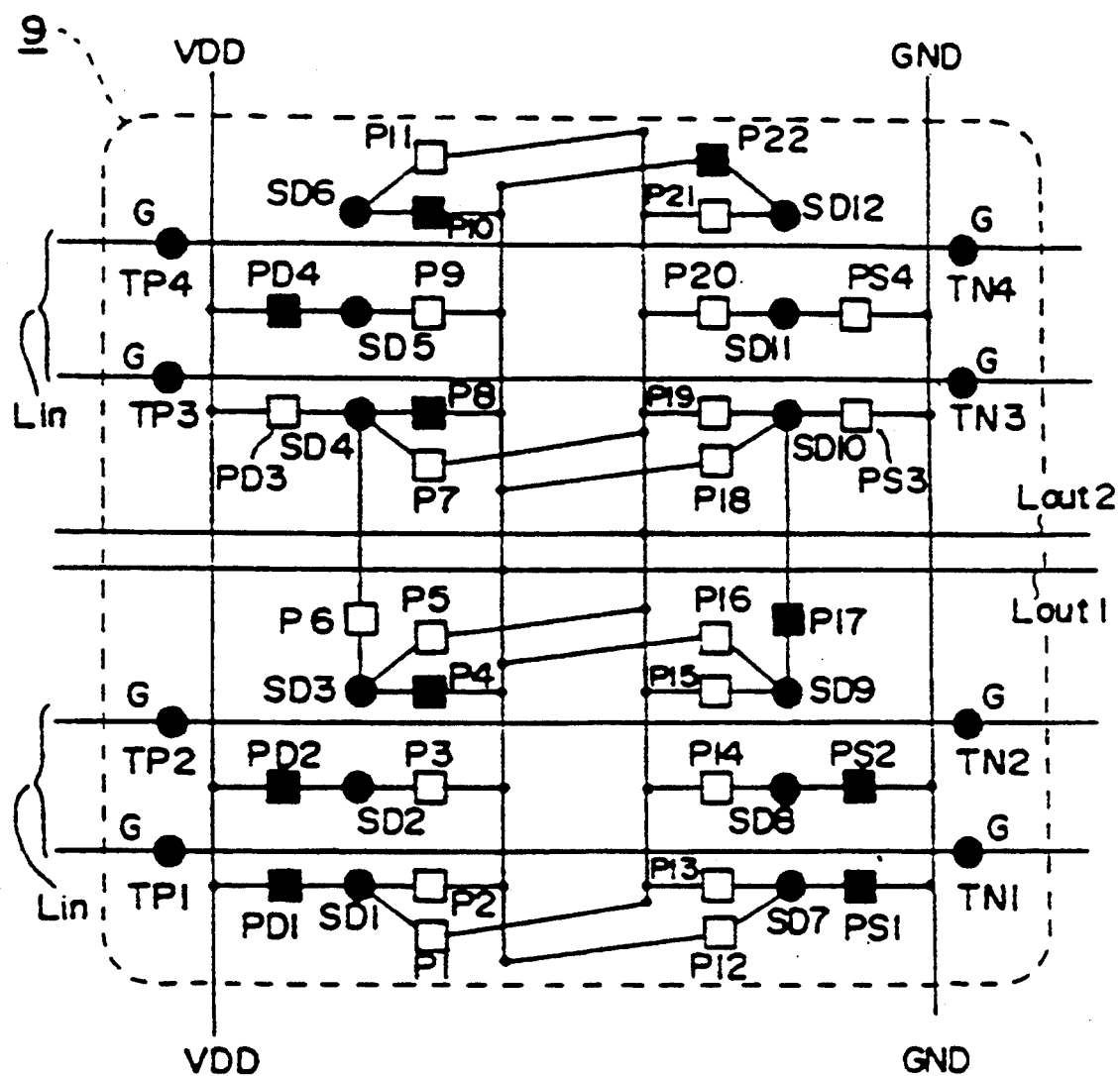
FIG. 104 is a diagram showing the structure of a basic cell of the seventeenth embodiment of the programmable logic circuit according to the present invention.

(9) Seventeenth Embodiment:

FIG. 104 shows the structure of a ninth basic cell 9 according to the seventeenth embodiment. This ninth basic cell 9 differs from the first through eighth basic cells 1 through 8 in that the ninth basic cell 9 is provided with eight transistors TP1 through TP4 and TN1 through TN4.

In other words, in the program symbol diagram of FIG. 104, the ninth basic cell 9 includes first through eighth transistors TP1 through TP4, and TN1 through TN4, and thirty programmable switches PD1 through PD4, PS1 through PS4, and P1 through P22.

For example, each gate G of the first through eighth transistors TP1 through TP4 and TN1 through TN4 is connected to the input wiring Lin. The source or drain draw-out electrodes SD1 through SD12 of the first through eighth transistors TP1 through TP4 and TN1 through TN4 are coupled to corresponding ones of the power supply line VDD, the ground line GND and the first and second output wirings Lout1 and Lout2, via corresponding ones of first through fourth p-type power supply programmable switches PD1 through PD4, first through fourth n-type ground programmable switches PS1 through PS4, and first through twenty-second programmable switches P1 through P22.

In other words, the source or drain draw-out electrode SD1 of the first transistor TP1 is coupled to the power supply line VDD via the first p-type programmable switch PD1, to the second output wiring Lout2 via the first programmable switch P1, and to the first output wiring Lout1 via the second programmable switch P2.

In addition, the source or drain draw-out electrode SD2 of the first and second transistors TP1 and TP2 is coupled to the power supply line VDD via the second p-type power supply programmable switch PD2, and to the first output wiring Lout1 via the third programmable switch P3. The source or drain draw-out electrode SD3 of the second transistor TP2 is coupled to the first output wiring Lout1 via the fourth programmable switch P4, to the second output wiring Lout 2 via the fifth programmable switch P5, and to the source or drain draw-out electrode SD4 of the third transistor TP3 via the sixth programmable switch P6.

Furthermore, the source or drain draw-out electrode SD4 of the third transistor TP3 is coupled to the power supply line VDD via the third p-type power supply programmable switch PD3, to the second output wiring Lout2 via the seventh programmable switch P7, and to the first output wiring Lout1 via the eighth programmable switch P8. The source or drain draw-out electrode SD5 of the third and fourth transistors TP3 and TP4 is coupled to the power supply line VDD via the fourth p-type power supply programmable switch PD4, and to the first output wiring Lout1 via the ninth programmable switch P9.

Moreover, the source or drain draw-out electrode SD6 of the fourth transistor TP4 is coupled to the first output wiring Lout1 via the tenth programmable switch P10, and to the second output wiring Lout2 via the eleventh programmable switch P11.

The source or drain draw-out electrode SD7 of the fifth transistor TN1 is coupled to the ground line GND via the first n-type ground programmable switch PS1, to the first output wiring Lout1 via the twelfth programmable switch P12, and to the second output wiring Lout2 via the thirteenth programmable switch P13. The source or drain draw-out electrode SD8 of the fifth and sixth transistors TN1 and TN2 is coupled to the ground line GND via the second n-type ground programmable switch PS2, and to the second output wiring Lout2 via the fourteenth programmable switch P14.

The source or drain draw-out electrode SD9 of the sixth transistor TN2 is coupled to the second output wiring Lout2 via the fifteenth programmable switch P15, to the first output wiring Lout1 via the sixteenth programmable switch P16, and to the source or drain draw-out electrode SD10 of the seventh transistor TP3 via the seventeenth programmable switch P17. The source or drain draw-out electrode SD10 of the seventh transistor TN3 is coupled to the ground line GND via the third n-type ground programmable switch PS3, to the first output wiring Lout1 via the eighteenth programmable switch P18, and to the second output wiring Lout2 via the nineteenth programmable switch P19.

Furthermore, the source or drain draw-out electrode SD11 of the seventh and eighth transistors TN3 and TN4 is coupled to the ground line GND via the fourth n-type ground programmable switch PS4, and to the second output wiring Lout2 via the twentieth programmable switch P20. The source or drain draw-out electrode SD12 of the eighth transistor TN4 is coupled to the second output wiring Lout2 via the twenty-first programmable switch P21, and to the first output wiring Lout1 via the twenty-second programmable switch P22. Otherwise, the structure of the ninth basic cell 9 is the same as that of the first basic cell 1, and a description thereof will be omitted.

According to the ninth basic cell 9, there are provided the first through eighth transistors TP1 through TP4 and TN1 through TN4, and the programmable switches PD1 through PD4, PS1 through PS4, and P1 through P22 for connecting these transistors TP1 through TP4 and TN1 through TN4 and the wirings, as shown in FIG. 104.

For this reason, the ninth basic cell 9 which forms the minimum unit includes eight transistors TP1 through TP4 and TN1 through TN4, and a total of thirty programmable switches PD1 through PD4, PS1 through PS4, and P1 through P22. For example, in the ninth basic cell 9, the fuse elements, anti-fuse elements, or p-type or n-type field effect transistors forming the first, second and fourth p-type power supply programmable switches PD1, PD2 and PD4, the first and second n-type ground programmable switches PS1 and PS2, and the fourth, eighth, tenth, seventeenth and twenty-second programmable switches P4, P8, P10, P17 and P22 are programmed.

Accordingly, the source or drain draw-out electrode SD1 of the first transistor TP1 and the power supply line VDD are coupled via the first p-type power supply programmable switch PD1, and the source or drain draw-out electrode SD2 of the first and second transistors TP1 and TP2 and the power supply line VDD are coupled via the second p-type power supply programmable switch PD2.

In addition, the source or drain draw-out electrode SD3 of the second transistor TP2 and the first output wiring Lout1 are coupled via the fourth programmable switch P4, and the source or drain draw-out electrode SD4 of the fourth transistor TP4 and the first output wiring Lout1 are coupled via the eighth programmable switch P8. The source or drain draw-out electrode SD5 of the third and fourth transistors TP3 and TP4 and the power supply line VDD are coupled via the fourth p-type power supply programmable switch PD4, and the source or drain draw-out electrode SD6 of the fourth transistor TP4 and the first output wiring Lout1 are coupled via the tenth programmable switch P10.

Further, the source or drain draw-out electrode SD7 of the fifth transistor TN1 and the ground line GND are coupled via the first n-type ground programmable switch PS1, and the source or drain draw-out electrode SD8 of the fifth and sixth transistors TN1 and TN2 and the ground line GND are coupled via the second p-type power supply programmable switch PS2.

Moreover, the source or drain draw-out electrode SD9 of the sixth transistor TN2 and the source or drain draw-out electrode SD10 of the seventh transistor TN3 are coupled via the seventeenth programmable switch P17. The source or drain draw-out electrode SD12 of the eighth transistor TN4 and the first output wiring Lout1 are coupled via the twenty-second programmable switch P22.

Figure 105:
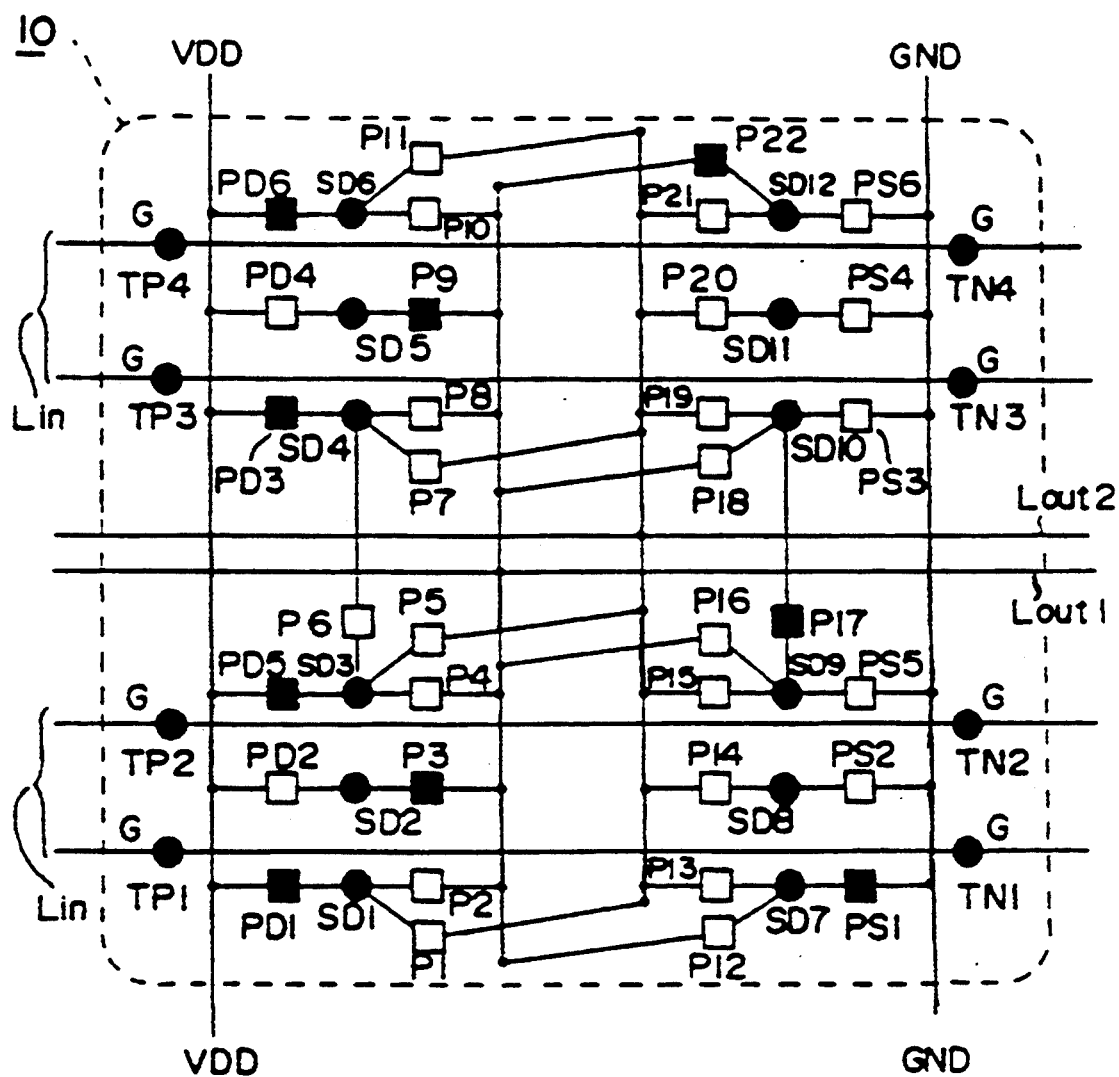
FIG. 105 is a diagram showing the structure of a basic cell of the eighteenth embodiment of the programmable logic circuit according to the present invention.

(10) Eighteenth Embodiment:

FIG. 105 shows the structure of a tenth basic cell 10 according to the eighteenth embodiment. This tenth basic cell 10 differs from the ninth basic cell 9 in that the tenth basic cell 10 is provided with fifth and sixth p-type power supply programmable switches PD5 and PD6 and fifth and sixth n-type ground programmable switches PS5 and PS6.

In other words, in the program symbol diagram of FIG. 105, the tenth basic cell 10 includes first through eighth transistors TP1 through TP4, and TN1 through TN4, and thirty-four programmable switches PD1 through PD6, PS1 through PS6, and P1 through P22.

For example, the fifth p-type power supply programmable switch PD5 is coupled between the source or drain draw-out electrode SD3 of the second transistor TP2 and the power supply line VDD, and the sixth p-type power supply programmable switch PD6 is coupled between the source or drain draw-out electrode SD6 of the fourth transistor TP4 and the power supply line VDD. In addition, the fifth n-type ground programmable switch PS5 is coupled between the source or drain draw-out electrode SD9 of the sixth transistor TN2 and the ground line GND, and the sixth n-type ground programmable switch PS6 is coupled between the source or drain draw-out electrode SD12 of the eighth transistor TN4 and the ground line GND. Otherwise, the structure of the tenth basic cell 10 is the same as that of the ninth basic cell 9, and a description thereof will be omitted.

According to the tenth basic cell 10, there are provided the first through eighth transistors TP1 through TP4 and TN1 through TN4, and the programmable switches PD1 through PD6, PS1 through PS6, and P1 through P22 for connecting these transistors TP1 through TP4 and TN1 through TN4 and the wirings, as shown in FIG. 105. The fifth p-type power supply programmable switch PD5 is coupled between the source or drain draw-out electrode SD3 of the second transistor TP2 and the power supply line VDD, and the sixth p-type power supply programmable switch PD6 is coupled between the source or drain draw-out electrode SD6 of the fourth transistor TP4 and the power supply line VDD. In addition, the fifth n-type ground programmable switch PS5 is coupled between the source or drain draw-out electrode SD9 of the sixth transistor TN2 and the ground line GND, and the sixth n-type ground programmable switch PS6 is coupled between the source or drain draw-out electrode SD12 of the eighth transistor TN4 and the ground line GND.

For this reason, the tenth basic cell 10 which forms the minimum unit is made up of eight transistors TP1 through TP4 and TN1 through TN4, and a total of thirty-four programmable switches PD1 through PD6, PS1 through PS6, and P1 through P22. For example, the fuse elements, anti-fuse elements, or p-type or n-type field effect transistors forming the first, third, fifth and sixth p-type power supply programmable switches PD1, PD3, PD5 and PD6, the first n-type ground programmable switch PS1, and the third, ninth, seventeenth and twenty-second programmable switches P3, P9, P17 and P22 within the tenth basic cell 10 are programmed when forming a 4-input NAND circuit.

Accordingly, although the number of programmable switches required in the tenth basic cell 10 increases by four compared to the ninth basic cell 9, it is possible to form a basic logic cell such as a 3-input NAND circuit, a 3-input NOR circuit, a 4-input NAND circuit, a 4-input NOR circuit, a 3-input AND-OR inverter circuit, a 4-input AND-OR inverter circuit or the like by appropriately programming the total of thirty-four programmable switches PD1 through PD6, PS1 through PS6, and P1 through P22.

Figure 106:
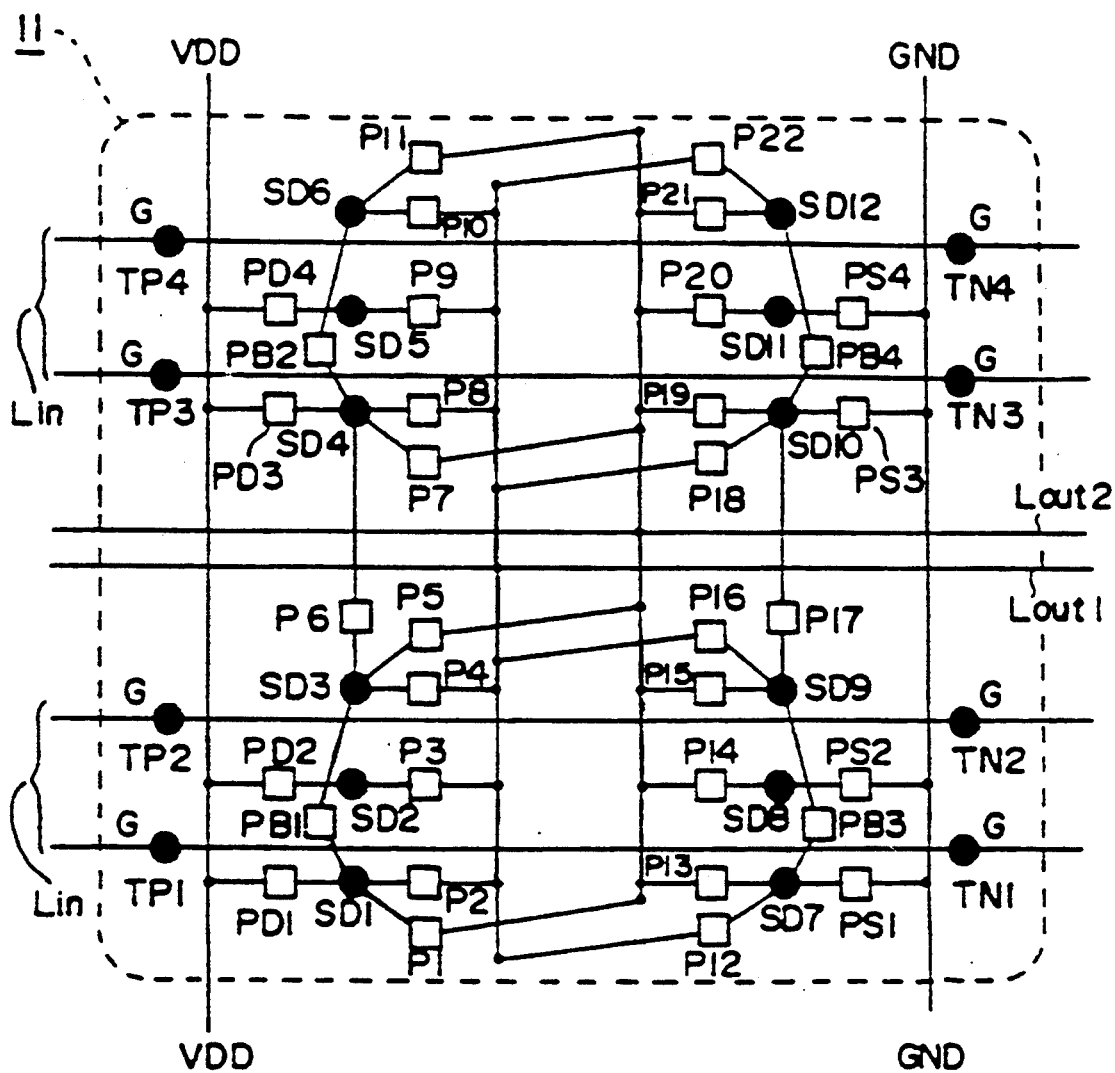
FIG. 106 is a diagram showing the structure of a basic cell of the nineteenth embodiment of the programmable logic circuit according to the present invention.

(11) Nineteenth Embodiment:

FIG. 106 shows the structure of an eleventh basic cell 11 according to the nineteenth embodiment. This eleventh basic cell 11 differs from the ninth basic cell 9 in that the eleventh basic cell 11 is provided with first through fourth bypass programmable switches PB1 through PB4.

In other words, in the program symbol diagram of FIG. 106, the eleventh basic cell 11 includes first through eighth transistors TP1 through TP4, and TN1 through TN4, and thirty-four programmable switches PD1 through PD4, PS1 through PS4, PB1 through PB4, and P1 through P22.

For example, the first bypass programmable switch PB1 is coupled between the source or drain draw-out electrodes SD1 and SD3 of the first and second transistors TP1 and TP2. The second bypass programmable switch PB2 is coupled between the source or drain draw-out electrodes SD4 and SD6 of the third and fourth transistors TP3 and TP4.

In addition, the third bypass programmable switch PB3 is coupled between the source or drain draw-out electrodes SD7 and SD9 of the fifth and sixth transistors TN1 and TN2, and the fourth bypass programmable switch PB4 is coupled between the source or drain draw-out electrodes SD10 and SD12 of the seventh and eighth transistors TN3 and TN4. Otherwise the structure of the eleventh basic cell 11 is the same as that of the ninth basic cell 9, and a description thereof will be omitted.

According to this eleventh basic cell 11, there are provided the first through eighth transistors TP1 through TP4 and TN1 through TN4, and the programmable switches PD1 through PD4, PS1 through PS4, PB1 through PB4, and Pi through P22 for connecting these transistors TP1 through TP4 and TN1 through TN4 and the wirings, as shown in FIG. 106. The first and second bypass programmable switches PB1 and PB2 are respectively coupled between the source or drain draw-out electrodes SD1 and SD3 of the first and second transistors TP1 and TP2 and between the source or drain draw-out electrodes SD4 and SD6 of the third and fourth transistors TP3 and TP4. In addition, the third and fourth bypass programmable switches PB3 and PB4 are respectively coupled between the source or drain draw-out electrodes SD7 and SD9 of the fifth and sixth transistors TN1 and TN2 and between the source or drain draw-out electrodes SD10 and SD12 of the seventh and eighth transistors TN3 and TN4.

Hence, the eleventh basic cell 11 which forms the minimum unit is made up of eight transistors TP1 through TP4 and TN1 through TN4, and a total of thirty-four programmable switches PD1 through PD4, PS1 through PS4, PB1 through PB4, and P1 through P22. In addition, by use of the first and second bypass programmable switches PB1 and PB2, it is possible to directly connect the source or drain draw-out electrodes SD1 and SD3 of the first and second transistors TP1 and TP2 and the source or drain draw-out electrodes SD4 and SD6 of the third and fourth transistors TP3 and TP4, without via the first output wiring Lout1.

Similarly, by use of the third and fourth bypass programmable switches PB3 and PB4, it is possible to directly connect the source or drain draw-out electrodes SD7 and SD9 of the fifth and sixth transistors TN1 and TN2 and the source or drain draw-out electrodes SD10 and SD12 of the seventh and eighth transistors TN3 and TN4, without via the second output wiring Lout2.

Accordingly, the eleventh basic cell 11 requires four more programmable switches compared to the number of programmable switches required in the ninth basic cell 9, however, it is possible to form a basic logic cell such as a 2-input NAND circuit, a 3-input NOR circuit, a 4-input NAND circuit, a 4-input NOR circuit, a 3-input AND-OR inverter circuit, a 4-input AND-OR inverter circuit or the like from the eight transistors TP1 through TP4 and TN1 through TN4 by appropriately programming the total of thirty-four programmable switches PD1 through PD4, PS1 through PS4, PB1 through PB4, and P1 through P22, as will be described hereinafter in conjunction with FIGS. 107 through 115.

Next, a description will be given of the programming of the eleventh basic cell 11 of the nineteenth embodiment.

Figure 107A:
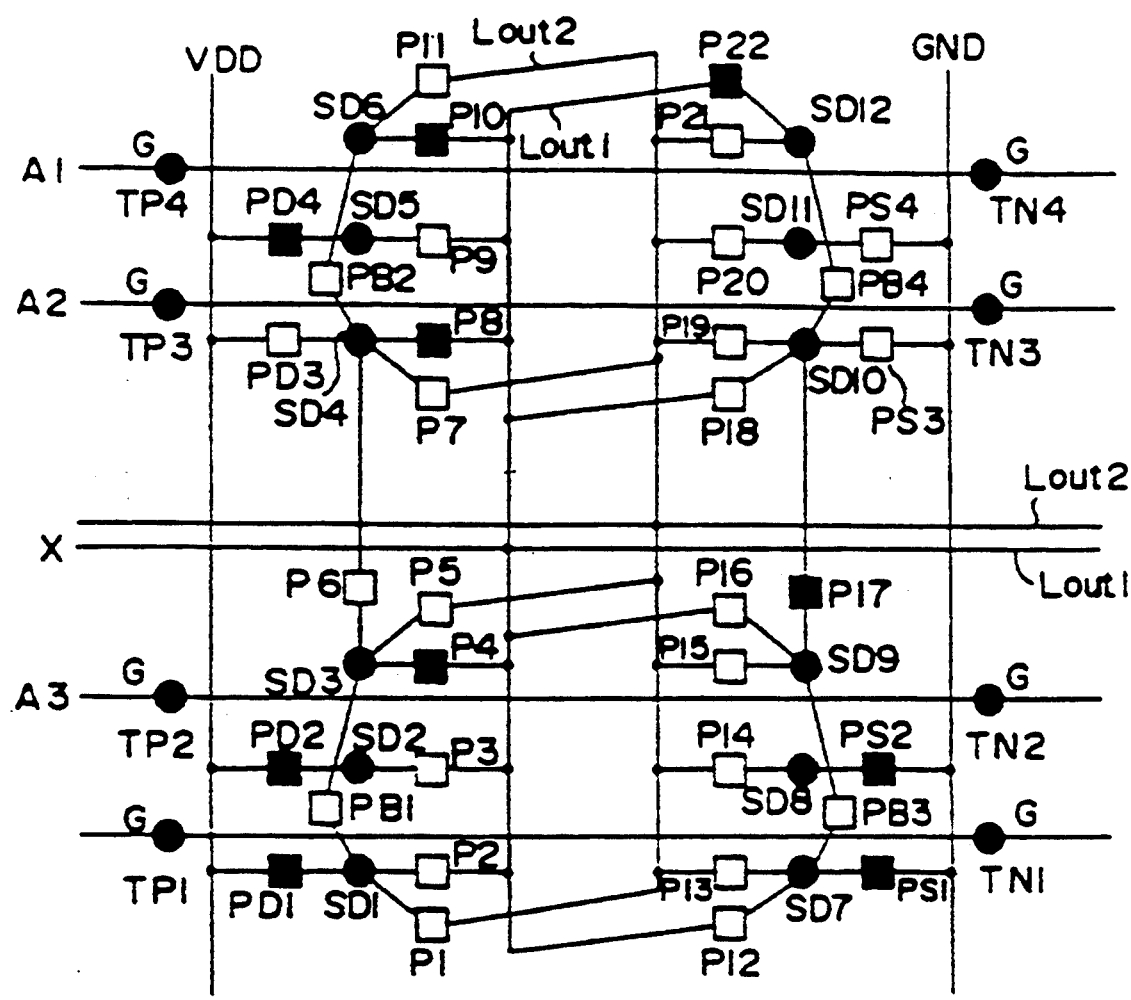
FIG. 107 in parts (*a*) and (*b*) is a diagram showing the structure of a 3-input NAND circuit which is obtained by programming the basic cell of the nineteenth embodiment.

FIG. 107 in parts (a) and (b) shows the structure of a 3-input NAND circuit which is obtained by programming the eleventh basic cell 11 of the nineteenth embodiment. In FIG. 107(a), the fuse elements, anti-fuse elements or, the p-type or n-type field effect transistors which form the first, second and fourth p-type power supply programmable switches PD1, PD2 and PD4, the first and second n-type power supply programmable switches PS1 and PS2, and the fourth, eighth, tenth, seventeenth and twenty-second programmable switches P4, PS, P10, P17 and P22 of the eleventh basic cell 11 are programmed.

Figure 107B:
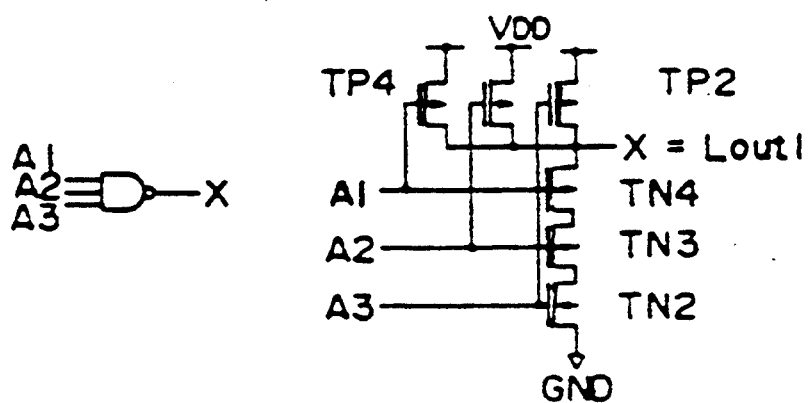

Accordingly, as shown in FIG. 107(b), it is possible to form a 3-input NAND circuit which includes the first through fourth transistors TP1 through TP4, and the fifth through eighth transistors TN1 through TN4 of the eleventh basic cell 11. This 3-input NAND circuit amplifies the logic (obtains a NAND) of input signals A1, A2 and A3 and outputs an output signal X via the first output wiring Lout1.

Figure 108A:
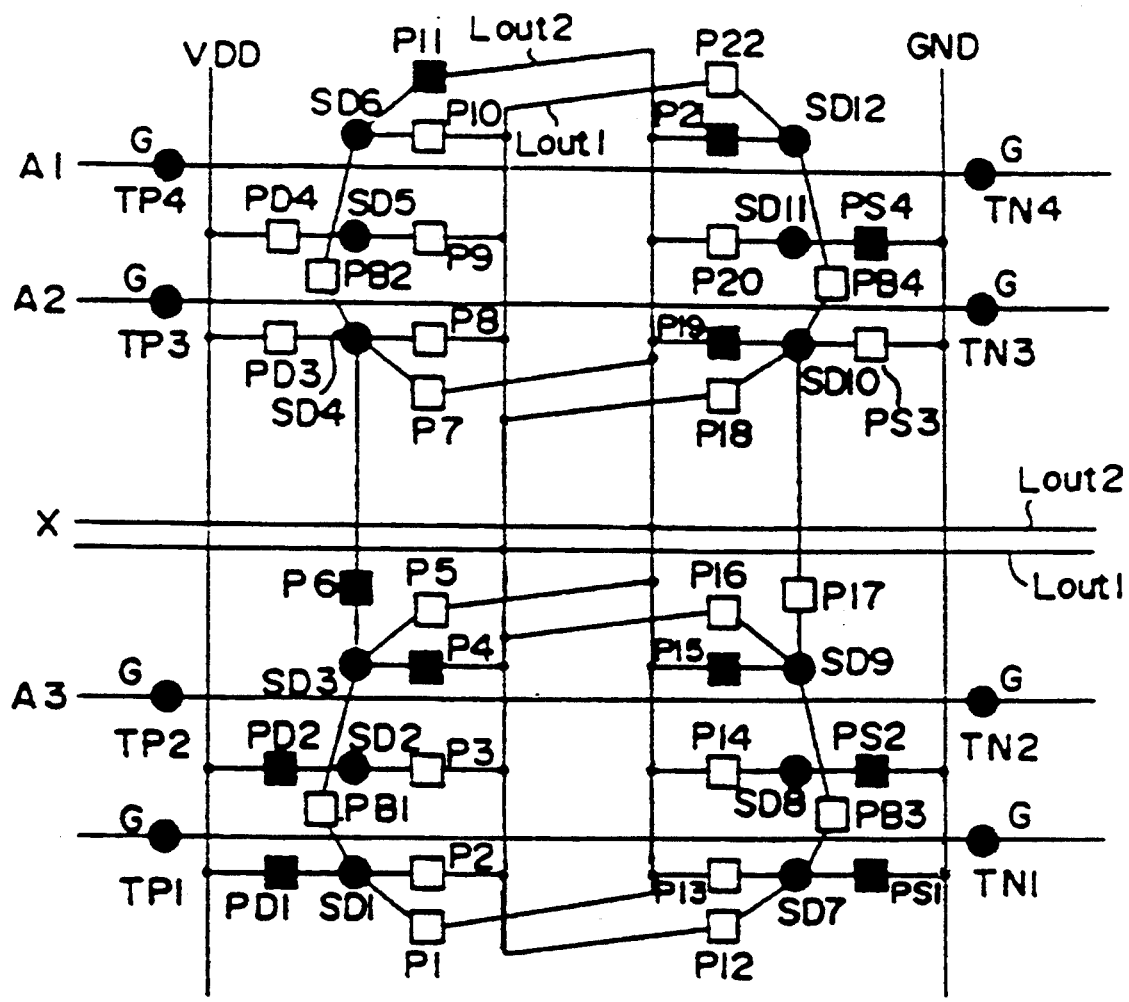
FIG. 108 in parts (*a*) and (*b*) is a diagram showing the structure of a 3-input NOR circuit which is obtained by programming the basic cell of the nineteenth embodiment.

FIG. 108 in parts (a) and (b) shows the structure of a 3-input NOR circuit which is obtained by programming the eleventh basic cell 11 of the nineteenth embodiment. In FIG. 108(a), the fuse elements, anti-fuse elements or, the p-type or n-type field effect transistors which form the first and second p-type power supply programmable switches PD1 and PD2, the first, second and fourth n-type power supply programmable switches PS1, PS2 and PS4, and the fourth, sixth, eleventh, fifteenth, nineteenth and twenty-first programmable switches P4, P6, P11, P15, P19 and P21 of the eleventh basic cell 11 are programmed.

Figure 108B:
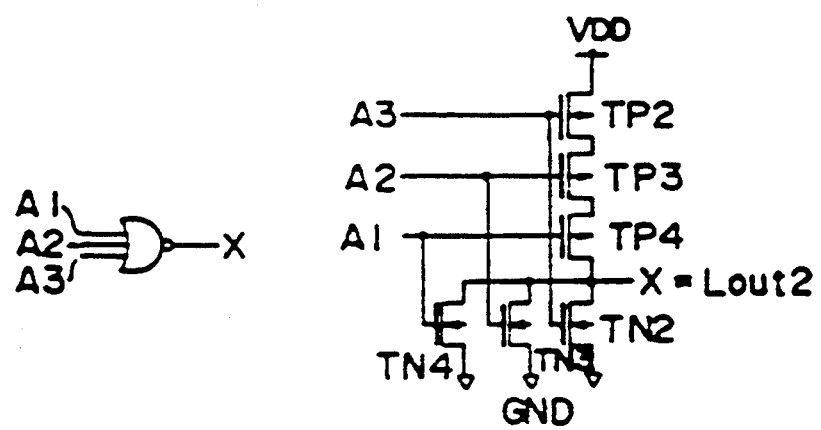

Accordingly, as shown in FIG. 108(b), it is possible to form a 3-input NOR circuit which includes the first through fourth transistors TP1 through TP4 and the fifth through eighth transistors TN1 through TN8 of the eleventh basic cell 11. This 3-input NOR circuit amplifies the logic (obtains a NOR) of input signals A1, A2 and A3 and outputs an output signal X via the second output wiring Lout2.

Figure 109A:
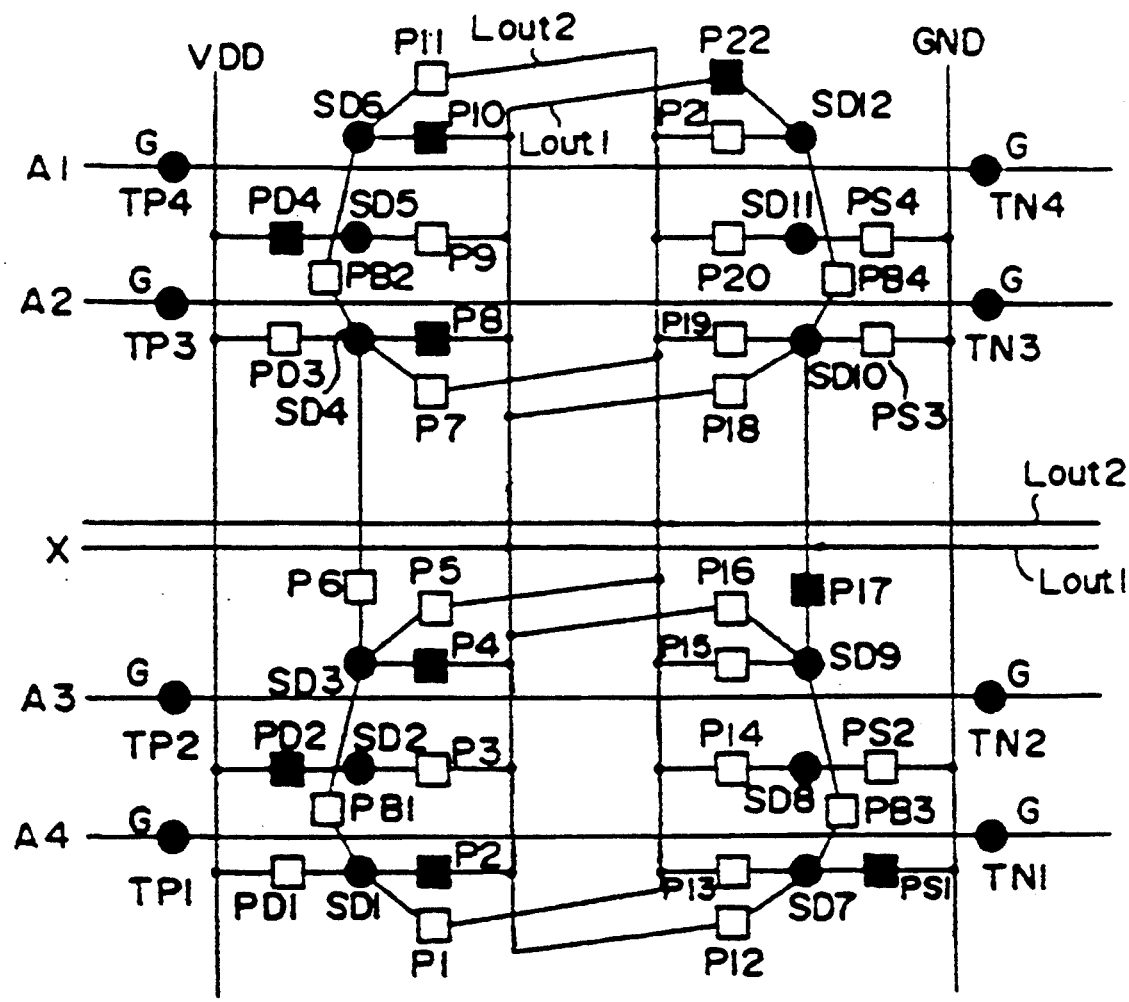
FIG. 109 in parts (*a*) and (*b*) is a diagram showing the structure of a 4-input NAND circuit which is obtained by programming the basic cell of the nineteenth embodiment.

FIG. 109 in parts (a) and (b) shows the structure of a 4-input NAND circuit which is obtained by programming the eleventh basic cell 11 of the nineteenth embodiment. In FIG. 109(a), the fuse elements, anti-fuse elements or, the p-type or n-type field effect transistors which form the second and fourth p-type power supply programmable switches PD2 and PD4, the first n-type power supply programmable switch PS1, and the second, fourth, eighth, tenth, seventeenth and twenty-second programmable switches P2, P4, P5, P10, P17 and P22 of the eleventh basic cell 11 are programmed.

Figure 109B:
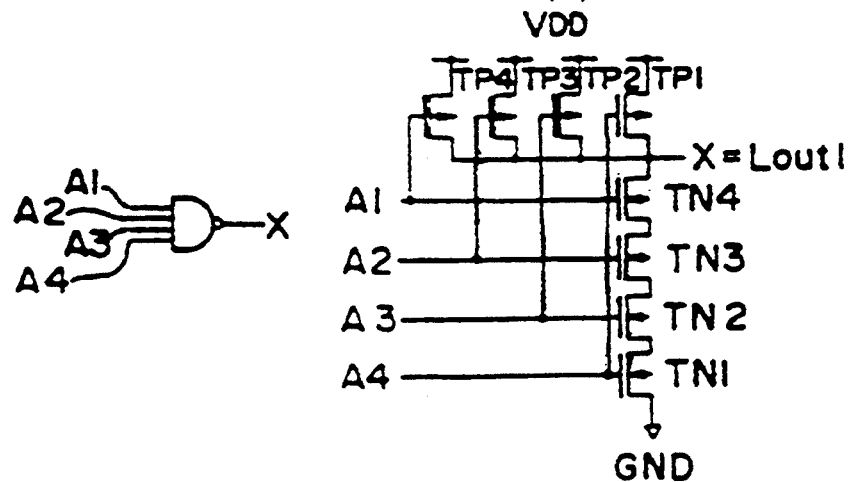

Accordingly, as shown in FIG. 109(b), it is possible to form a 4-input NAND circuit which includes the first through fourth transistors TP1 through TP4 and the fifth through eighth transistors TN1 through TN4 of the eleventh basic cell 11. This 4-input NAND circuit amplifies the logic (obtains a NAND) of input signals A1, A2, A3 and A4 and outputs an output signal X via the first output wiring Lout1.

Figure 110A:
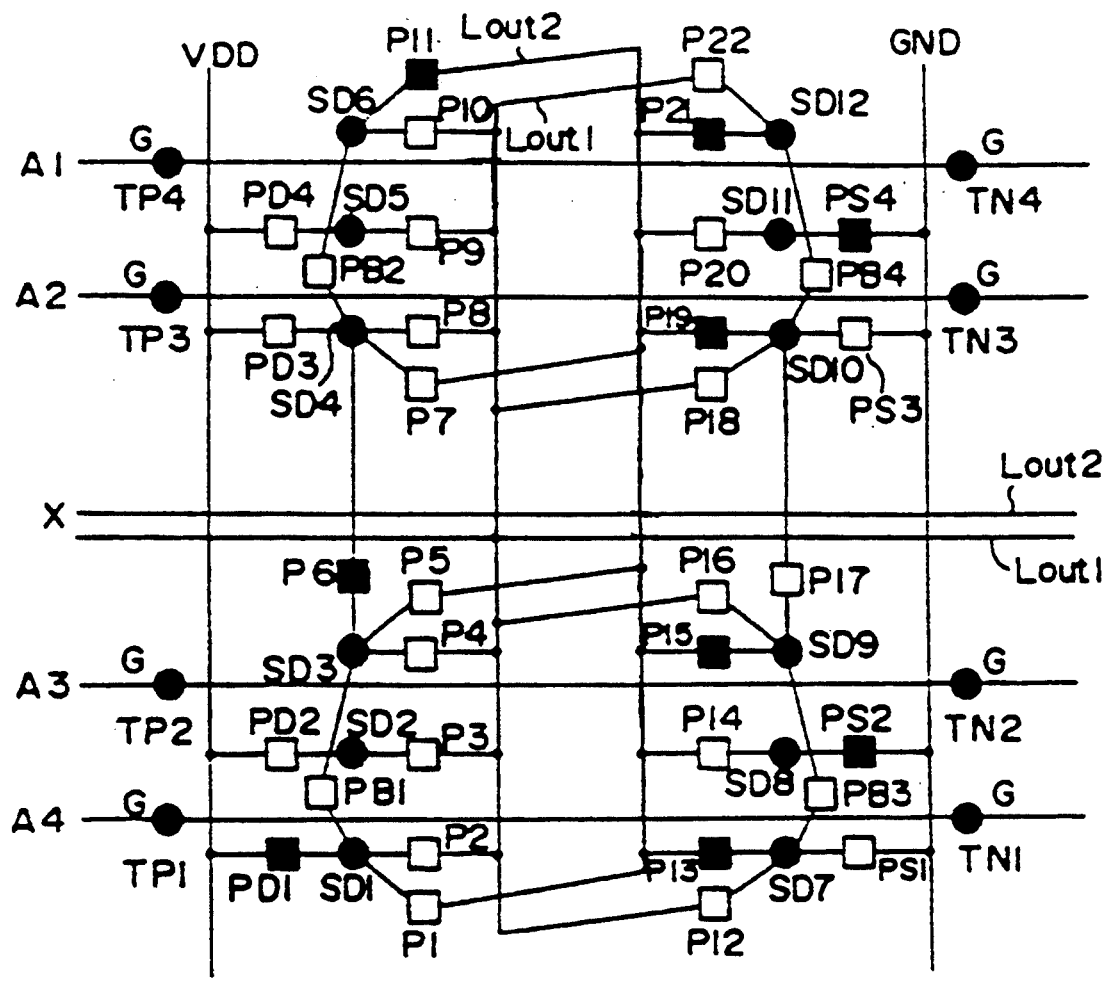
FIG. 110 in parts (*a*) and (*b*) is a diagram showing the structure of a 4-input NOR circuit which is obtained by programming the basic cell of the nineteenth embodiment.

FIG. 110 in parts (a) and (b) shows the structure of a 4-input NOR circuit which is obtained by programming the eleventh basic cell 11 of the nineteenth embodiment. In FIG. 110(a), the fuse elements, anti-fuse elements or, the p-type or n-type field effect transistors which form the first p-type power supply programmable switch PD1, the second and fourth n-type power supply programmable switches PS2 and PS4, and the sixth, eleventh, thirteenth, fifteenth, nineteenth and twenty-first programmable switches P6, P11, P13, P15, P19 and P21 of the eleventh basic cell 11 are programmed.

Figure 110B:
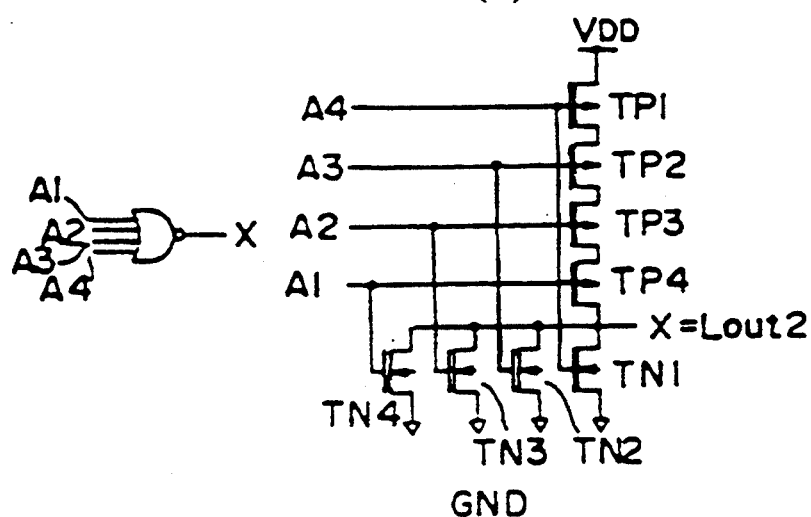

Accordingly, as shown in FIG. 110(b), it is possible to form a 4-input NOR circuit which includes the first through fourth transistors TP1 through TP4 and the fifth through eighth transistors TN1 through TN4 of the eleventh basic cell 11. This 4-input NOR circuit amplifies the logic (obtains a NOR) of input signals A1, A2, A3 and A4 and outputs an output signal X via the second output wiring Lout2.

Figure 111A:
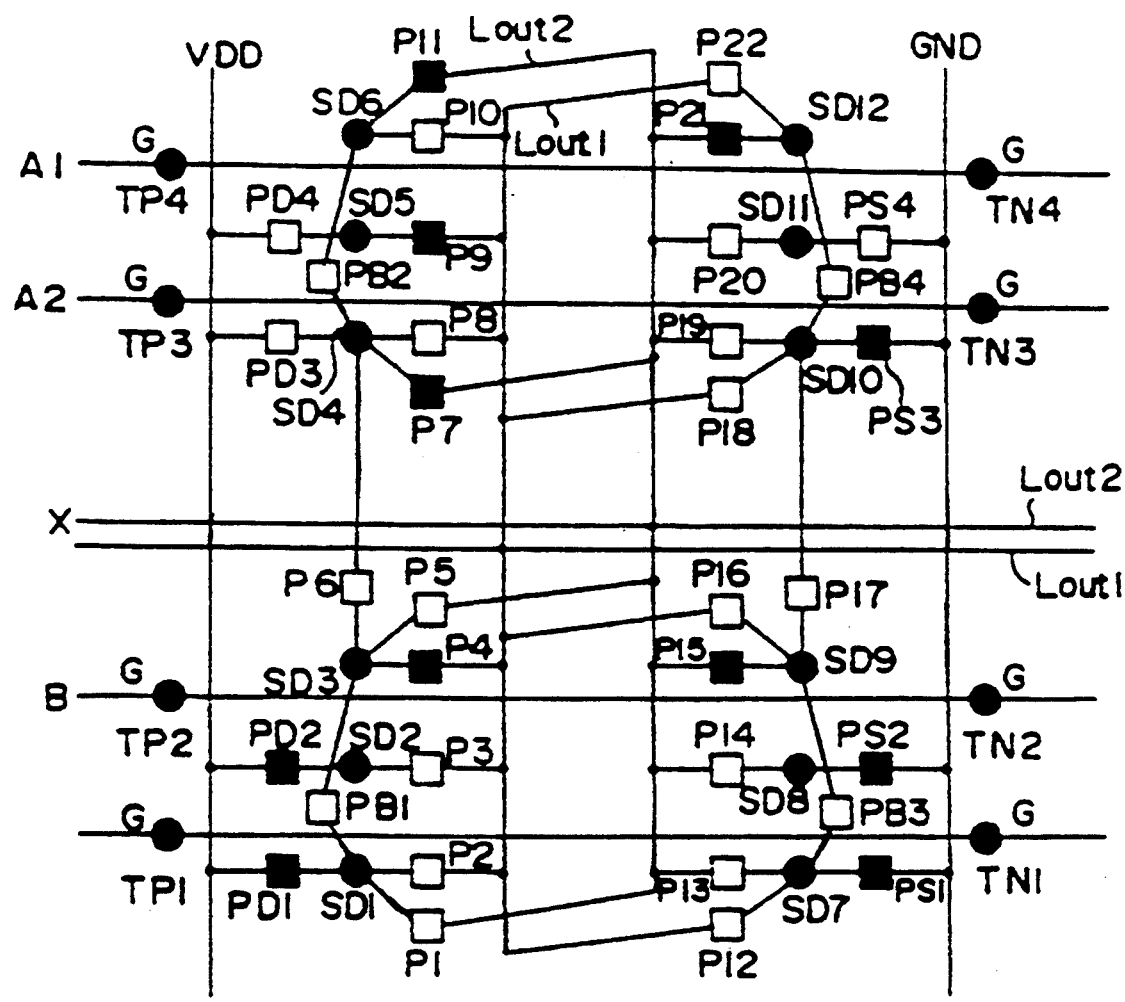
FIG. 111 in parts (*a*) and (*b*) is a diagram showing the structure of a 3-input AND-OR inverter circuit which is obtained by programming the basic cell of the nineteenth embodiment.

FIG. 111 in parts (a) and (b) shows the structure of a 3-input AND-OR inverter circuit which is obtained by programming the eleventh basic cell 11 of the nineteenth embodiment. In FIG. 111(a), the fuse elements, anti-fuse elements or, the p-type or n-type field effect transistors which form the first and second p-type power supply programmable switches PD1 and PD2, the first, second and third n-type power supply programmable switches PS1, PS2 and PS3, and the fourth, seventh, ninth, eleventh, fifteenth and twenty-first programmable switches P4, P7, P9, P11, P15 and P21 of the eleventh basic cell 11 are programmed.

Figure 111B:
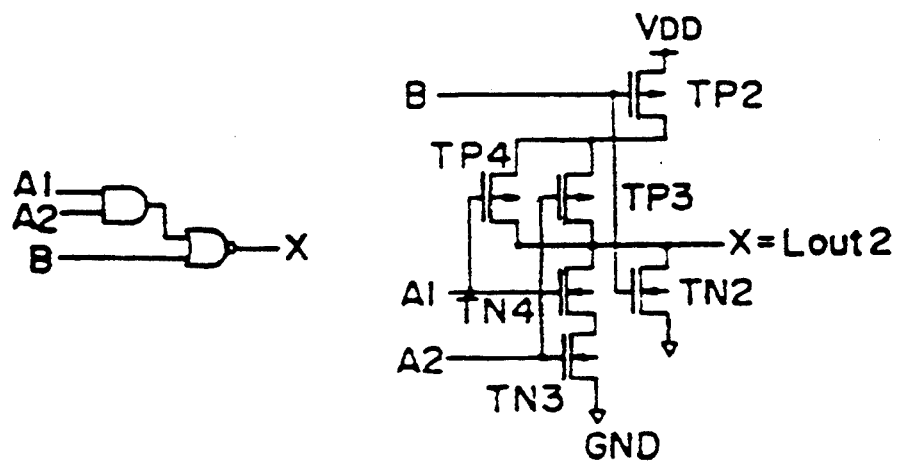

Accordingly, as shown in FIG. 111(b), it is possible to form a 3-input AND-OR inverter circuit which includes the first through fourth transistors TP1 through TP4 and the fifth through eighth transistors TN1 through TN4 of the eleventh basic cell 11. This 3-input AND-OR inverter circuit amplifies the logic (obtains an AND) of input signals A1 and A2, amplifies the logic (obtains an OR inversion) of a resulting signal and an input signal B, and outputs an output signal X via the second output wiring Lout2.

Figure 112A:
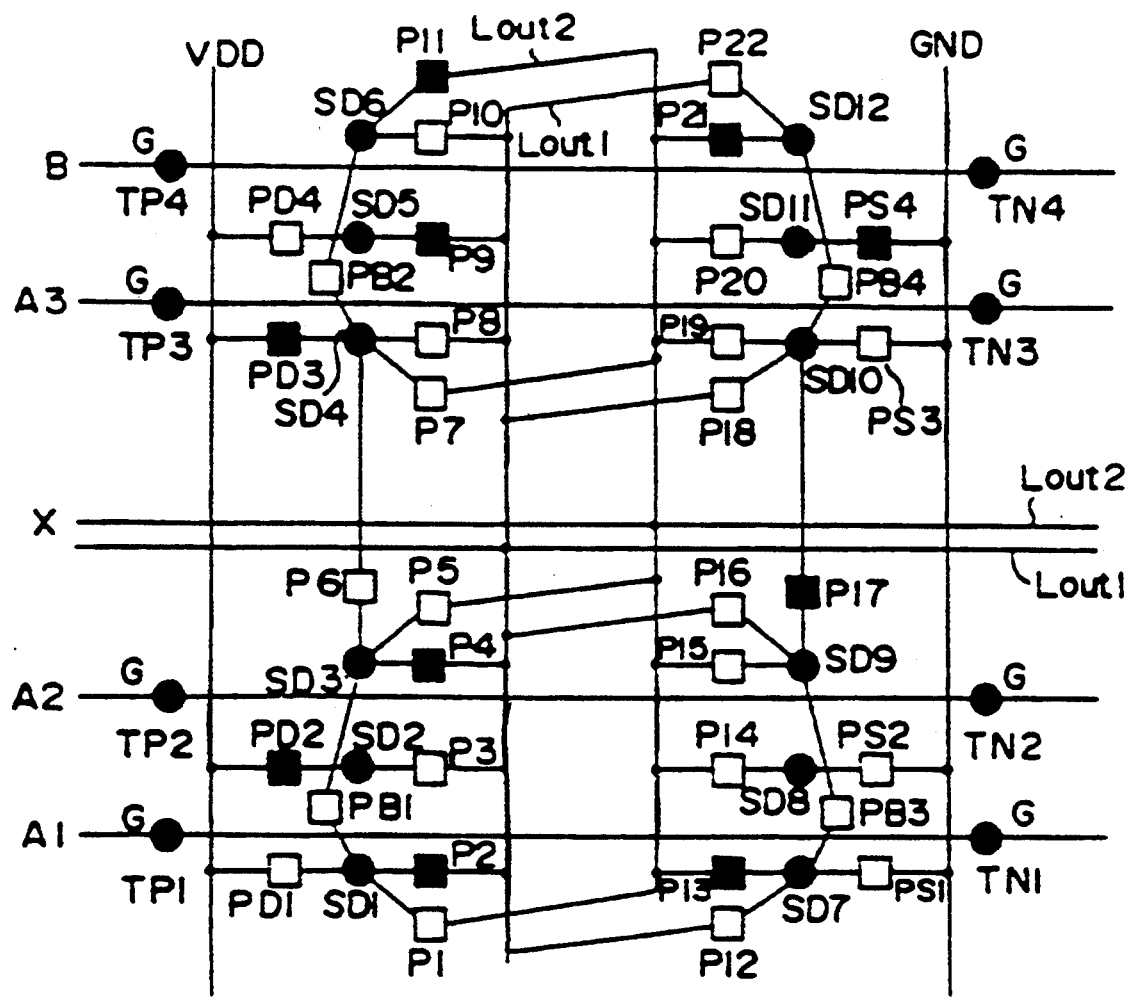
FIG. 112 in parts (*a*) and (*b*) is a diagram showing the structure of a 4-input AND-OR inverter circuit which is obtained by programming the basic cell of the nineteenth embodiment.

FIG. 112 in parts (a) and (b) shows the structure of a 4-input AND-OR inverter circuit which is obtained by programming the eleventh basic cell 11 of the nineteenth embodiment. In FIG. 112(a), the fuse elements, anti-fuse elements or, the p-type or n-type field effect transistors which form the second and third p-type power supply programmable switches PD2 and PD3, the fourth n-type power supply programmable switch PS4,and the second, fourth, ninth, eleventh, thirteenth, seventeenth and twenty-first programmable switches P2, P4, P9, P11, P13, P17 and P21 of the eleventh basic cell 11 are programmed.

Figure 112B:
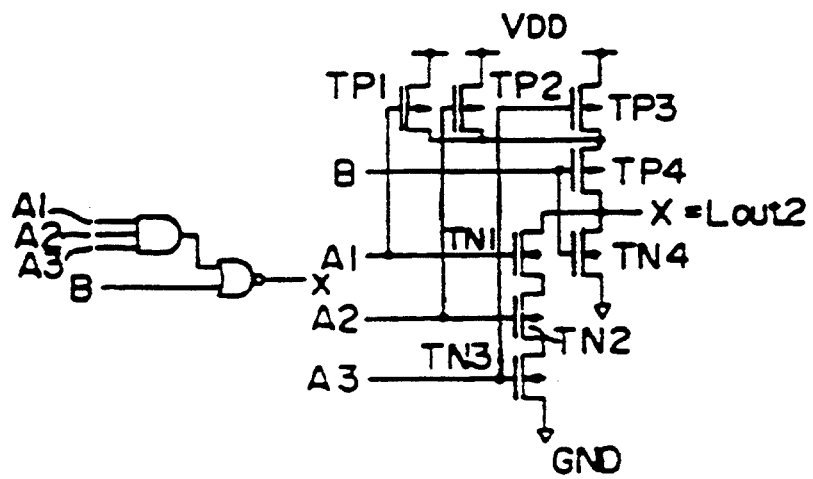

Accordingly, as shown in FIG. 112(b), it is possible to form a 4-input AND-OR inverter circuit which includes the first through fourth transistors TP1 through PT4 and the fifth through eighth transistors TN1 through TN4 of the eleventh basic cell 11. This 4-input AND-OR inverter circuit amplifies the logic (obtains an AND) of input signals A1, A2 and A3, amplifies the logic (obtains an OR inversion) of a resulting signal and an input signal B, and outputs an output signal X via the second output wiring Lout2.

Figure 113A:
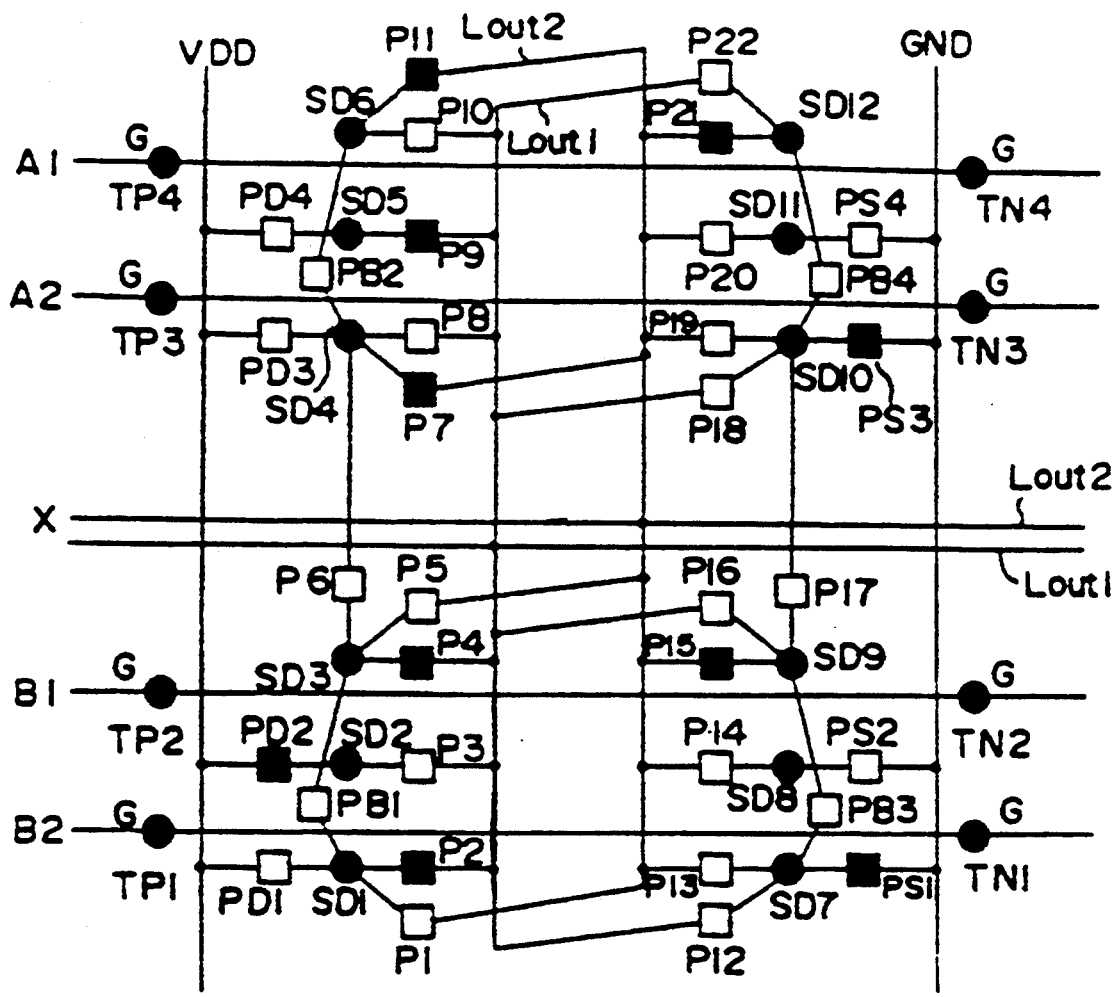
FIG. 113 in parts (*a*) and (*b*) is a diagram showing the structure of a 4-input AND-OR inverter circuit which is obtained by programming the basic cell of the nineteenth embodiment.

FIG. 113 in parts (a) and (b) shows the structure of a 4-input AND-OR inverter circuit which is obtained by programming the eleventh basic cell 11 of the nineteenth embodiment. In FIG. 113(a), the fuse elements, anti-fuse elements or, the p-type or n-type field effect transistors which form the second p-type power supply programmable switch PD2, the first and third n-type power supply programmable switches PS1 and PS3, and the second, fourth, seventh, ninth, eleventh, fifteenth and twenty-first programmable switches P2, P4, P7, P9, P11, P15 and P21 of the eleventh basic cell 11 are programmed.

Figure 113B:
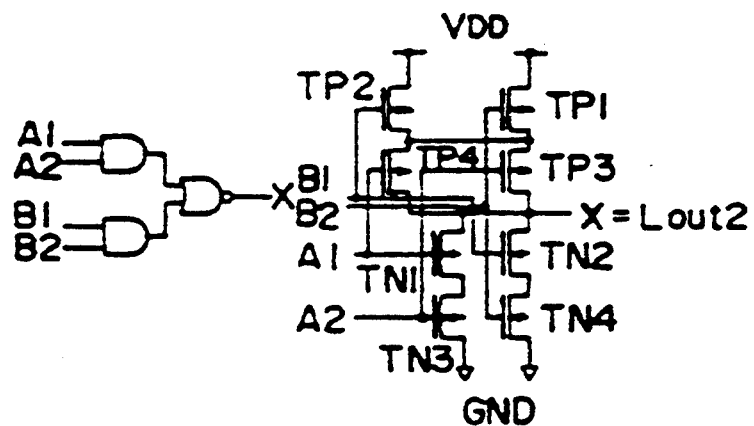

Accordingly, as shown in FIG. 113(b), it is possible to form a 4-input AND-OR inverter circuit which includes the first through fourth transistors TP1 through TP4 and the fifth through eighth transistors TN1 through TN4 of the eleventh basic cell 11. This 4-input AND-OR inverter circuit amplifies the logic (obtains an AND) of input signals A1 and A2, amplifies the logic (obtains an AND) of input signals B1 and B2, amplifies the logic (obtains an OR inversion) of resulting two signals, and outputs an output signal X via the second output wiring Lout2.

Figure 114A:
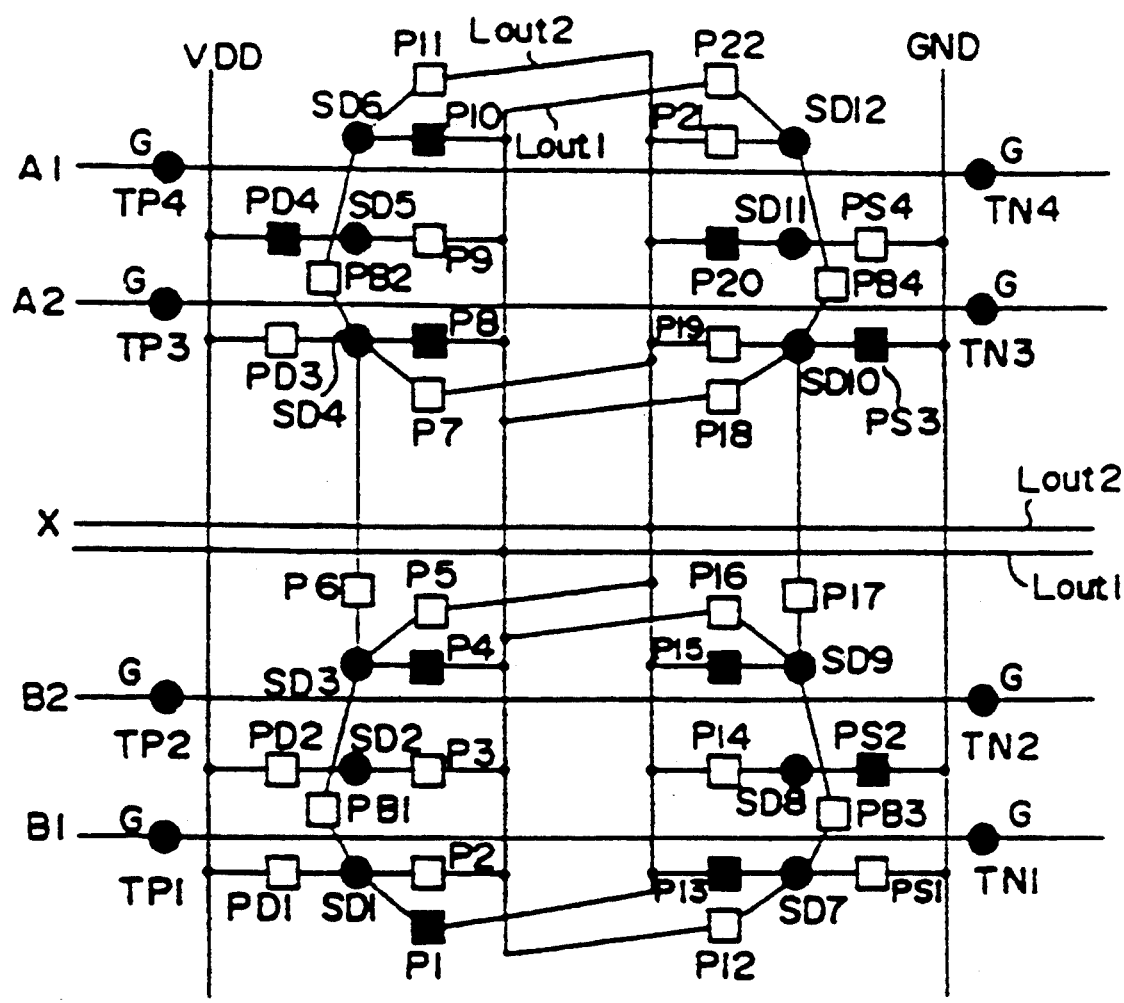
FIG. 114 in parts (*a*) and (*b*) is a diagram showing the structure of a 4-input AND-OR inverter circuit which is obtained by programming the basic cell of the nineteenth embodiment.

FIG. 114 in parts (a) and (b) shows the structure of a 4-input AND-OR inverter circuit which is obtained by programming the eleventh basic cell 11 of the nineteenth embodiment. In FIG. 114(a), the fuse elements, anti-fuse elements or, the p-type or n-type field effect transistors which form the fourth p-type power supply programmable switch PD4, the second and third n-type power supply programmable switches PS2 and PS3, and the first, fourth, eighth, tenth, thirteenth, fifteenth and twentieth programmable switches P1, P4, P5, P10, P13, P15 and P20 of the eleventh basic cell 11 are programmed.

Figure 114B:
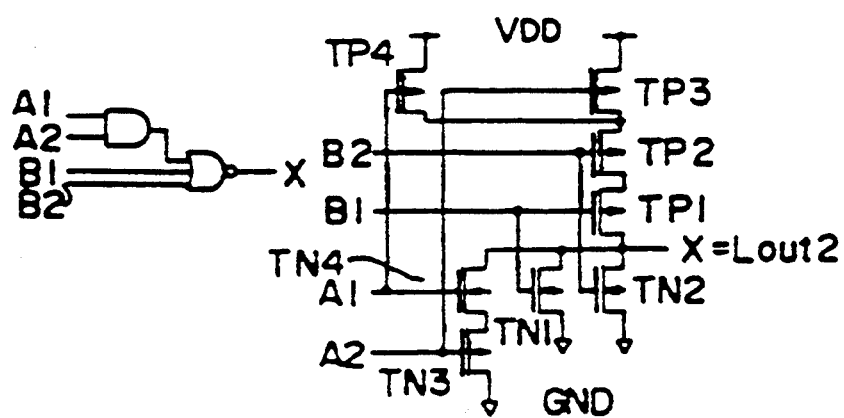

Accordingly, as shown in FIG. 114(b), it is possible to form a 4-input AND-OR inverter circuit which includes the first through fourth transistors TP1 through TP4 and the fifth through eighth transistors TN1 through TN4 of the eleventh basic cell 11. This 4-input AND-OR inverter circuit first amplifies the logic (obtains an AND) of input signals A1 and A2, amplifies the logic (obtains an OR inversion) of a resulting signal and input signals B1 and B2, and outputs an output signal X via the second output wiring Lout2.

Figure 115A:
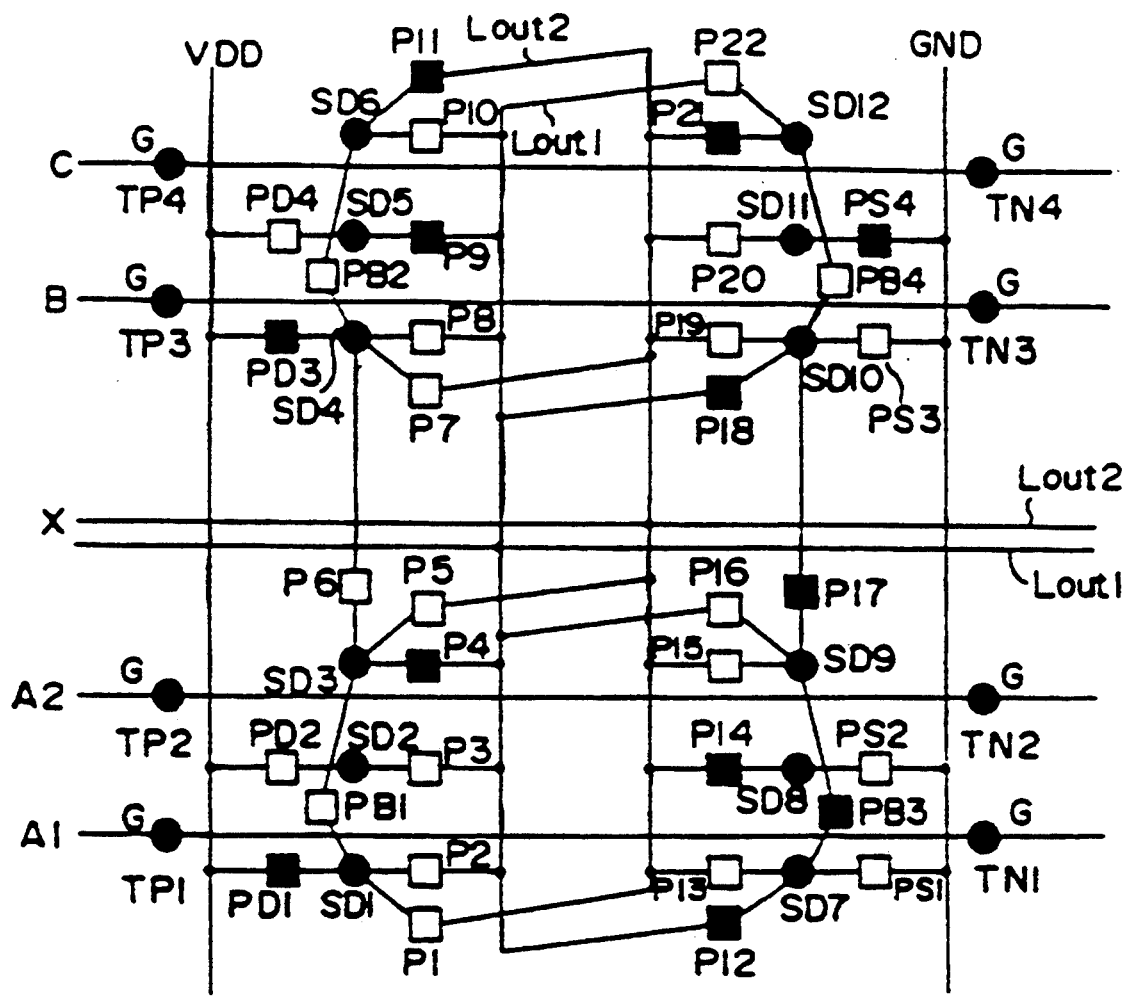
FIG. 115 in parts (*a*) and (*b*) is a diagram showing the structure of a 4-input AND-OR inverter circuit which is obtained by programming the basic cell of the nineteenth embodiment.

FIG. 115 in parts (a) and (b) shows the structure of a 4-input AND-OR inverter circuit which is obtained by programming the eleventh basic cell 11 of the nineteenth embodiment. In FIG. 115(a), the fuse elements, anti-fuse elements or, the p-type or n-type field effect transistors which form the first and third p-type power supply programmable switches PS1 and PS3, the fourth n-type power supply programmable switch PS4, the third bypass programmable switch PB3, and the fourth, ninth, eleventh, twelfth, fourteenth, seventeenth, eighteenth and twenty-first programmable switches P4, P9, P11, P12, P14, P17, P18 and P21 of the eleventh basic cell 11 are programmed.

Figure 115B:
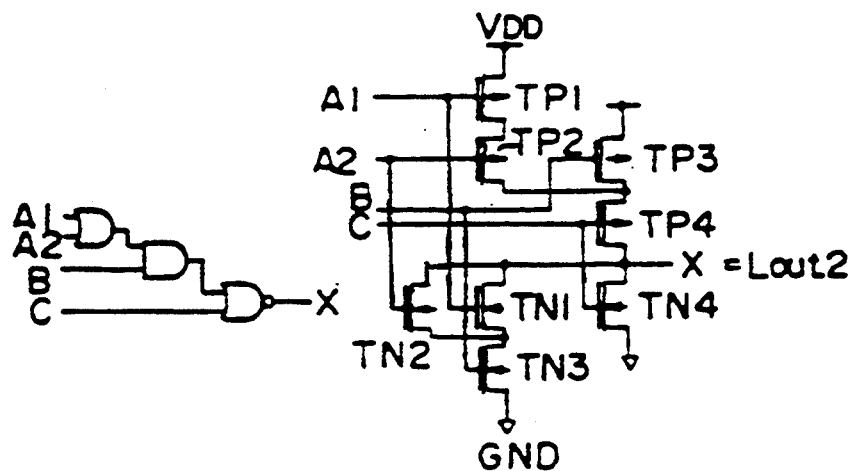

Accordingly, as shown in FIG. 115(b), it is possible to form a 4-input AND-OR inverter circuit which includes the first through fourth transistors TP1 through TP4 and the fifth through eighth transistors TN1 through TN4 of the eleventh basic cell 11. This 4-input AND-OR inverter circuit first amplifies the logic (obtains an OR) of input signals A1 and A2, amplifies the logic (obtains an AND) of a resulting signal and an input signal B, amplifies the logic (obtains an OR inversion) of a resulting signal and an input signal C, and outputs an output signal X via the second output wiring Lout2.

Figure 116:
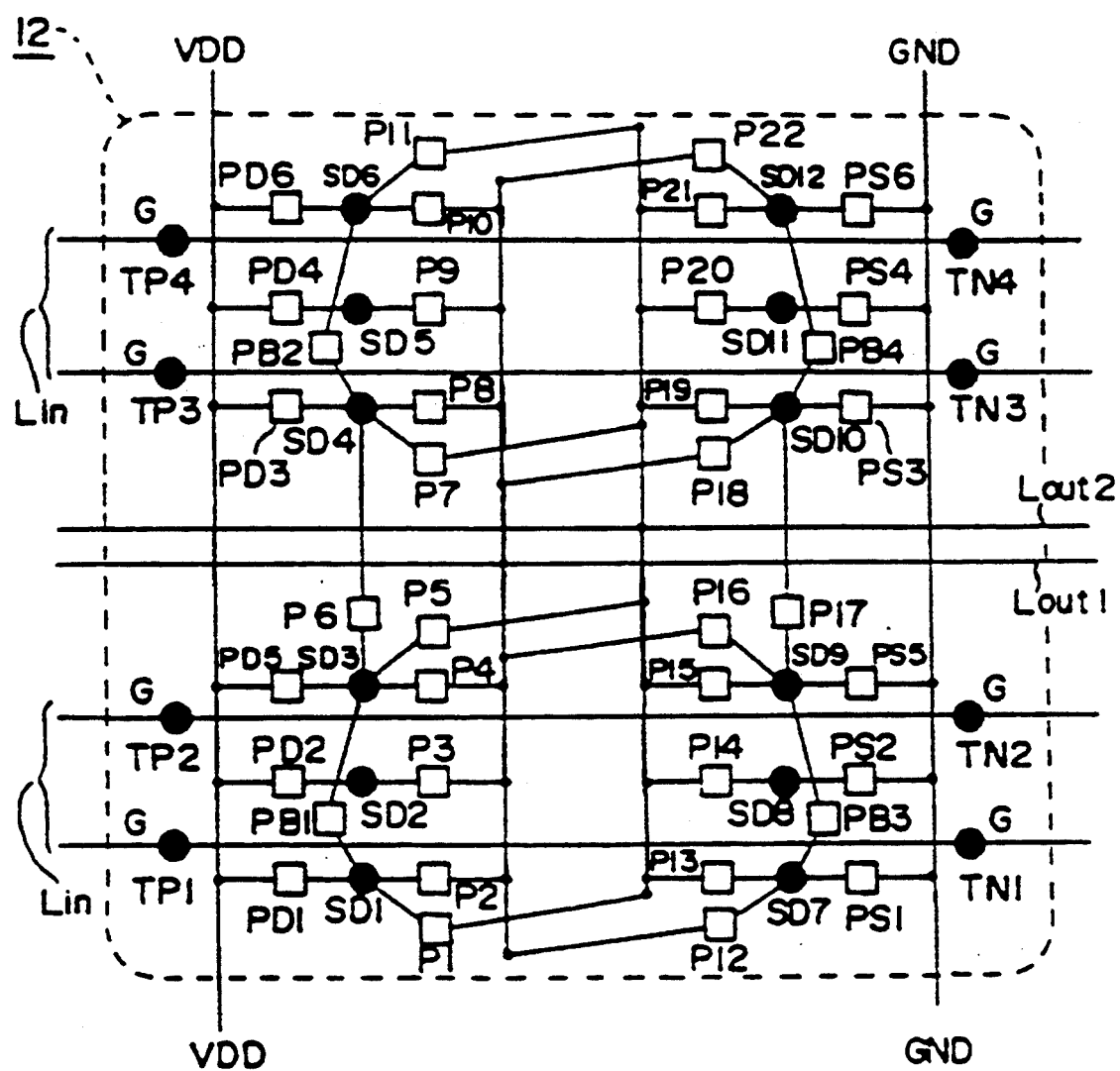
FIG. 116 is a diagram showing the structure of a basic cell of a twentieth embodiment of the programmable logic circuit according to the present invention.

(12) Twentieth Embodiment:

FIG. 116 shows the structure of a twelfth basic cell 12 of the twentieth embodiment. The twelfth basic cell 12 differs from the ninth basic cell 9 in that the twelfth basic cell 12 is provided with fifth and sixth p-type power supply programmable switches PD5 and PD6, fifth and sixth n-type power supply programmable switches PS5 and PS6, and first through fourth bypass programmable switches PB1 through PB4.

In other words, the twelfth basic cell 12 includes the first through eighth transistors TP1 through PT4 and TN1 through TN4, and thirty-eight programmable switches PD1 through PD6, PS1 through PS6, PB1 through PB4, and P1 through P22 for connecting these transistors TP1 through TP4 and TN1 through TN4 and the wirings.

For example, the fifth p-type power supply programmable switch PD5 is coupled between the source or drain draw-out electrode SD3 of the second transistor TP2 and the power supply line VDD, and the sixth p-type power supply programmable switch PD6 is coupled between the source or drain draw-out electrode SD6 of the fourth transistor TP4 and the power supply line VDD.

In addition, the fifth n-type ground programmable switch PS5 is coupled between the source or drain draw-out electrode SD9 of the sixth transistor TN2 and the ground line GND, and the sixth n-type ground programmable switch PS6 is coupled between the source or drain draw-out electrode SD12 of the eighth transistor TN4 and the ground line GND. Furthermore, the first bypass programmable switch PB1 is coupled between the source or drain draw-out electrodes SD1 and SD3 of the first and second transistors TP1 and TP2, and the second bypass programmable switch PB2 is coupled between the source or drain draw-out electrodes SD4 and SD6 of the third and fourth transistors TP3 and TP4.

Moreover, the third bypass programmable switch PB3 is coupled between the source or drain draw-out electrodes SD7 and SD9 of the fifth and sixth transistors TN1 and TN2, and the fourth bypass programmable switch PB4 is coupled between the source or drain draw-out electrodes SD10 and SD12 of the seventh and eighth transistors TN3 and TN4. Otherwise, the structure of the twelfth basic cell 12 is the same as that of the ninth basic cell 9, and a description thereof will be omitted.

According to the twelfth basic cell 12, there are provided the first through eighth transistors TP1 through TP4 and TN1 through TN4, and the thirty-eight programmable switches PD1 through PD6, PS1 through PS6, PB1 through PB4, and P1 through P22 for connecting these transistors TP1 through TP4 and TN1 through TN4 and the wirings, as shown in FIG. 116. The fifth p-type power supply programmable switch PD5 is coupled between the source or drain draw-out electrode SD3 of the second transistor TP2 and the power supply line VDD, and the sixth p-type power supply programmable switch PD6 is coupled between the source or drain draw-out electrode SD6 of the fourth transistor TP4 and the power supply line VDD. In addition, the fifth n-type ground programmable switch PS5 is coupled between the source or drain draw-out electrode SD9 of the sixth transistor TN2 and the ground line GND, and the sixth n-type ground programmable switch PS6 is coupled between the source or drain draw-out electrode SD12 of the eighth transistor TN4 and the ground line GND.

Furthermore, the first bypass programmable switch PB1 is coupled between the source or drain draw-out electrodes SD1 and SD3 of the first and second transistors TP1 and TP2, and the second bypass programmable switch PB2 is coupled between the source or drain draw-out electrodes SD4 and SD6 of the third and fourth transistors TP3 and TP4. Moreover, the third bypass programmable switch PB3 is coupled between the source or drain draw-out electrodes SD7 and SD9 of the fifth and sixth transistors TN1 and TN2, and the fourth bypass programmable switch PB4 is coupled between the source or drain draw-out electrodes SD10 and SD12 of the seventh and eighth transistors TN3 and TN4.

Therefore, the twelfth basic cell 12 which forms the minimum unit is made up of eight transistors TP1 through TP4 and TN1 through TN4, and a total of thirty-eight programmable switches PD1 through PD6, PS1 through PS6, PB1 through PB4, and P1 through P22. For example, the fuse elements, the anti-fuse elements, or p-type or n-type field effect transistors forming the third p-type power supply programmable switch PD3, the second n-type ground programmable switch PS2, the first and fourth bypass programmable switches PB1 and PB4, and the first, third, tenth, thirteenth and eighteenth programmable switches P1, P3, P10, P13 and P18 within the twelfth basic cell 12 are programmed, so as to form a 4-input AND-OR inverter circuit.

Accordingly, compared to the ninth basic cell 9, the number of programmable switches required in the twelfth basic cell 12 increases by eight. However, by appropriately programming the thirty-eight programmable switches PD1 through PD6, PS1 through PS6, PB1 through PB4, and P1 through P22 as will be described hereinafter in conjunction with FIGS. 117 through 125, it is possible to form a basic logic cell such as the 3-input NAND circuit, the 3-input NOR circuit, the 4-input NAND circuit, the 4-input NOR circuit, the 3-input AND-OR inverter circuit and the 4-input AND-OR inverter circuit.

Next, a description will be given of the programming of the twelfth basic cell 12 of the twentieth embodiment.

Figure 117A:
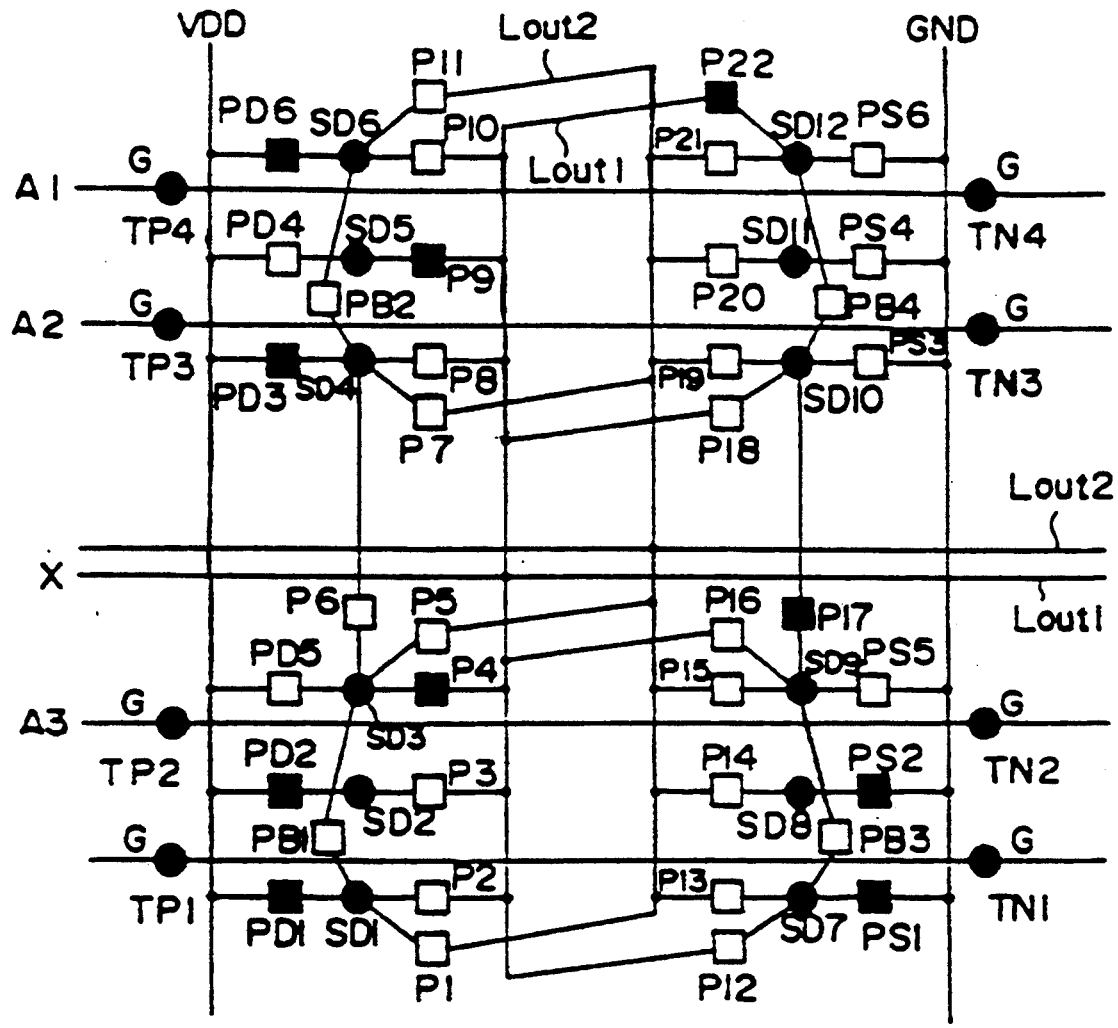
FIG. 117 in parts (*a*) and (*b*) is a diagram showing the structure of a 3-input NAND circuit which is obtained by programming the basic cell of the twentieth embodiment.

FIG. 117 in parts (a) and (b) shows the structure of a 3-input NAND circuit which is obtained by programming the twelfth basic cell 12 of the twentieth embodiment. In FIG. 117(a), the fuse elements, anti-fuse elements or, the p-type or n-type field effect transistors which form the first through third and sixth p-type power supply programmable switches PD1 through PD3 and PD6, the first and second n-type power supply programmable switches PS1 and PS2, and the fourth, ninth, seventeenth and twenty-second programmable switches P4, P9, P17 and P22 of the twelfth basic cell 12 are programmed.

Figure 117B:
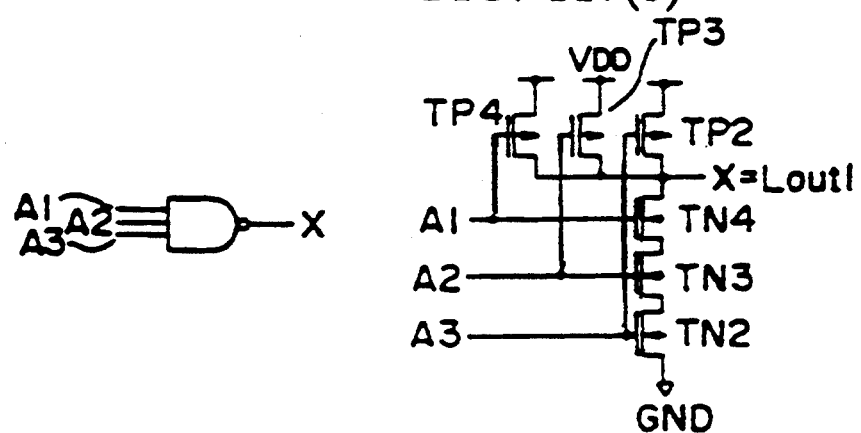

Accordingly, as shown in FIG. 117(b), it is possible to form a 3-input NAND circuit which includes the first through fourth transistors TP1 through TP4, and the fifth through eighth transistors TN1 through TN4 of the twelfth basic cell 12. This 3-input NAND circuit amplifies the logic (obtains a NAND) of input signals A1, A2 and A3 and outputs an output signal X via the first output wiring Lout1.

Figure 118A:
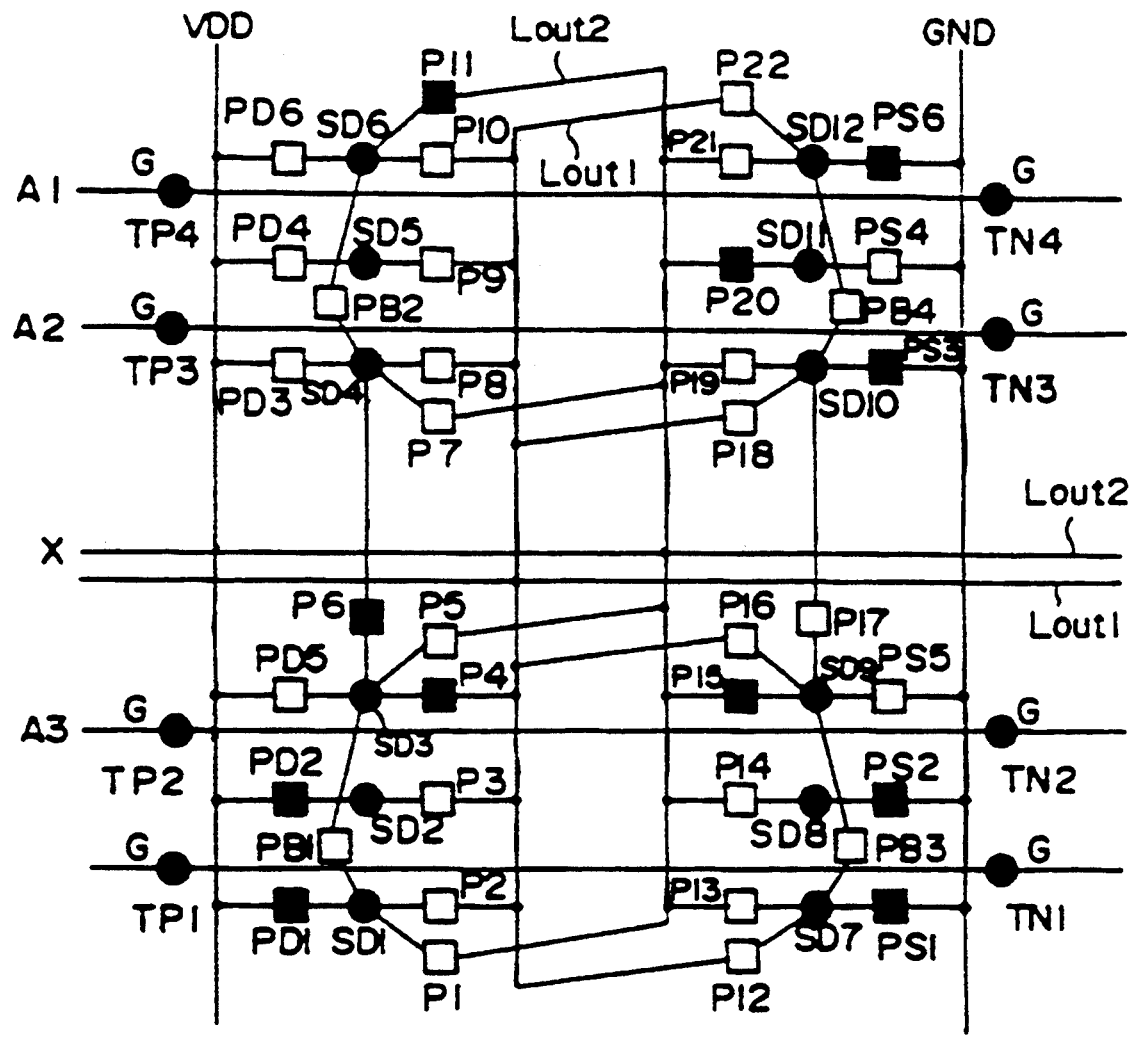
FIG. 118 in parts (*a*) and (*b*) is a diagram showing the structure of a 3-input NOR circuit which is obtained by programming the basic cell of the twentieth embodiment.

FIG. 118 in parts (a) and (b) shows the structure of a 3-input NOR circuit which is obtained by programming the twelfth basic cell 12 of the twentieth embodiment. In FIG. 118(a), the fuse elements, anti-fuse elements or, the p-type or n-type field effect transistors which form the first and second p-type power supply programmable switches PD1 and PD2, the first through third and sixth n-type power supply programmable switches PS1, PS2 and PS4, and the fourth, sixth, eleventh, fifteenth and twentieth programmable switches P4, P6, P11, P15 and P20 of the twelfth basic cell 12 are programmed.

Figure 118B:
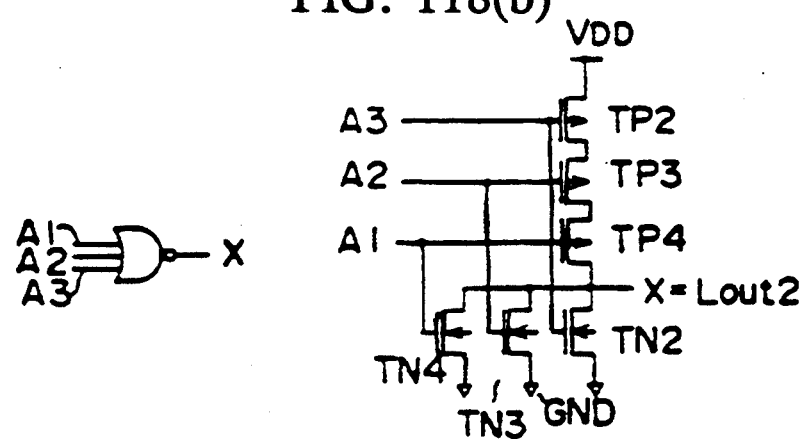

Accordingly, as shown in FIG. 118(b), it is possible to form a 3-input NOR circuit which includes the first through fourth transistors TP1 through TP4 and the fifth through eighth transistors TN1 through TN8 of the twelfth basic cell 12. This 3-input NOR circuit amplifies the logic (obtains a NOR) of input signals A1, A2 and A3 and outputs an output signal X via the second output wiring Lout2.

Figure 119A:
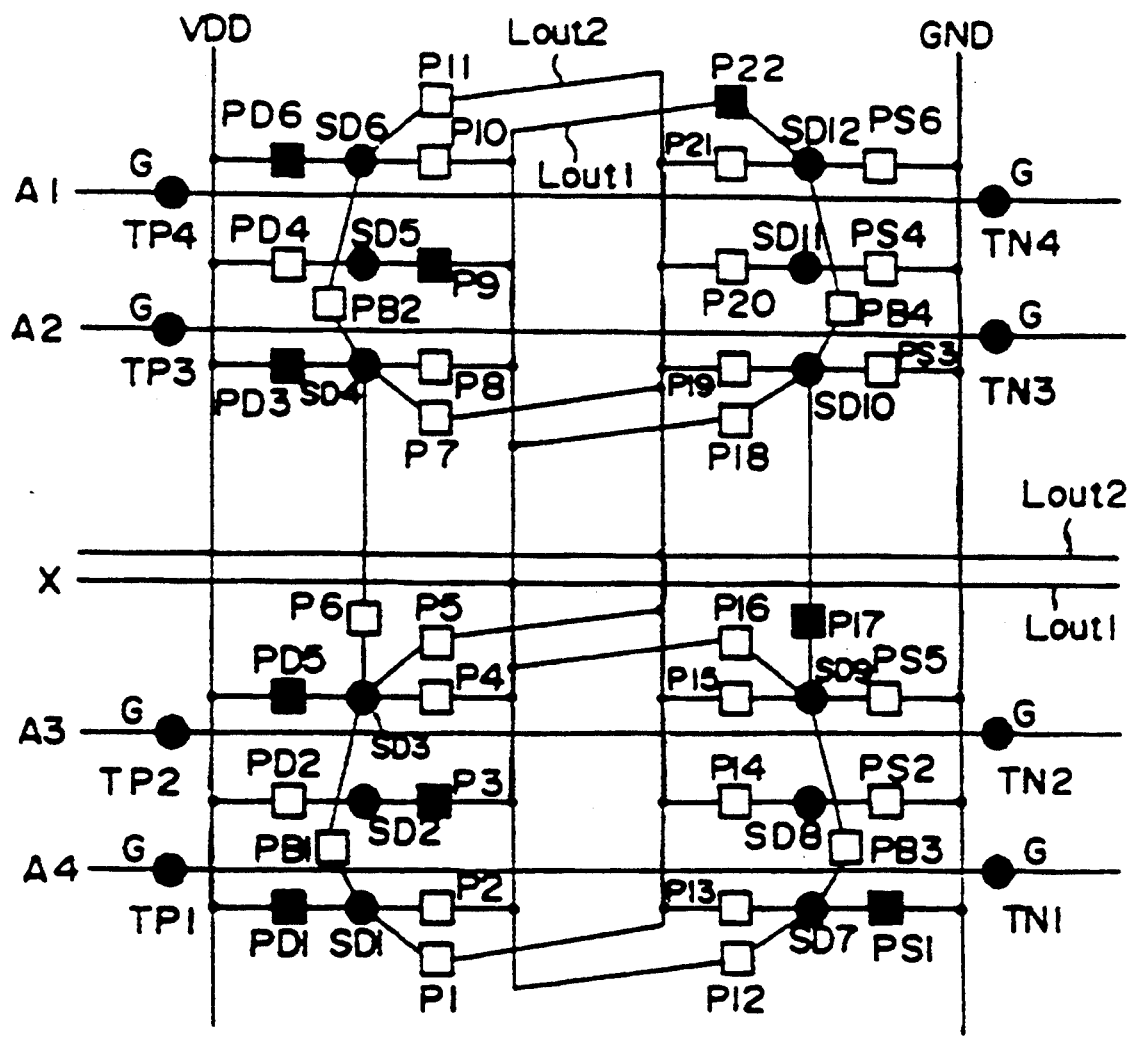
FIG. 119 in parts (*a*) and (*b*) is a diagram showing the structure of a 4-input NAND circuit which is obtained by programming the basic cell of the twentieth embodiment.

FIG. 119 in parts (a) and (b) shows the structure of a 4-input NAND circuit which is obtained by programming the twelfth basic cell 12 of the twentieth embodiment. In FIG. 119(a), the fuse elements, anti-fuse elements or, the p-type or n-type field effect transistors which form the first, third, fifth and sixth p-type power supply programmable switches PD1, PD3, PD5 and PD6, the first n-type power supply programmable switch PS1, and the third, ninth, seventeenth and twenty-second programmable switches P3, P9, P17 and P22 of the twelfth basic cell 12 are programmed.

Figure 119B:
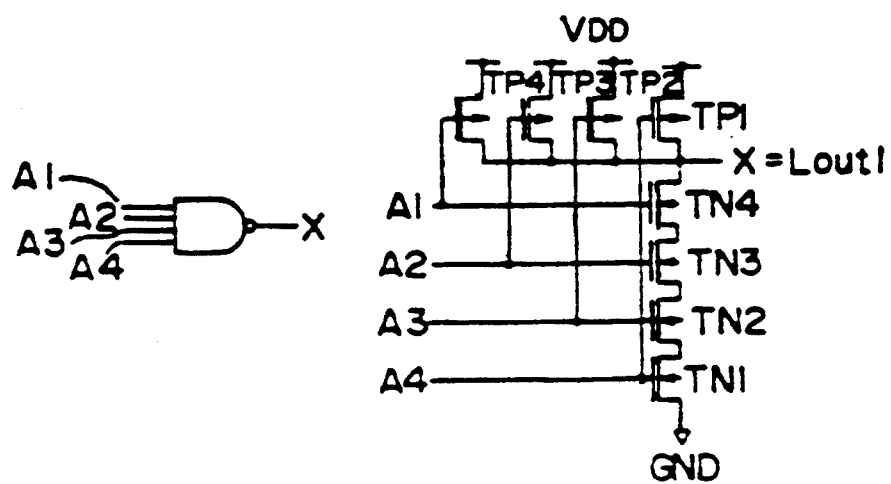

Accordingly, as shown in FIG. 119(b), it is possible to form a 4-input NAND circuit which includes the first through fourth transistors TP1 through TP4 and the fifth through eighth transistors TN1 through TN4 of the twelfth basic cell 12. This 4-input NAND circuit amplifies the logic (obtains a NAND) of input signals A1, A2, A3 and A4 and outputs an output signal X via the first output wiring Lout1.

Figure 120A:
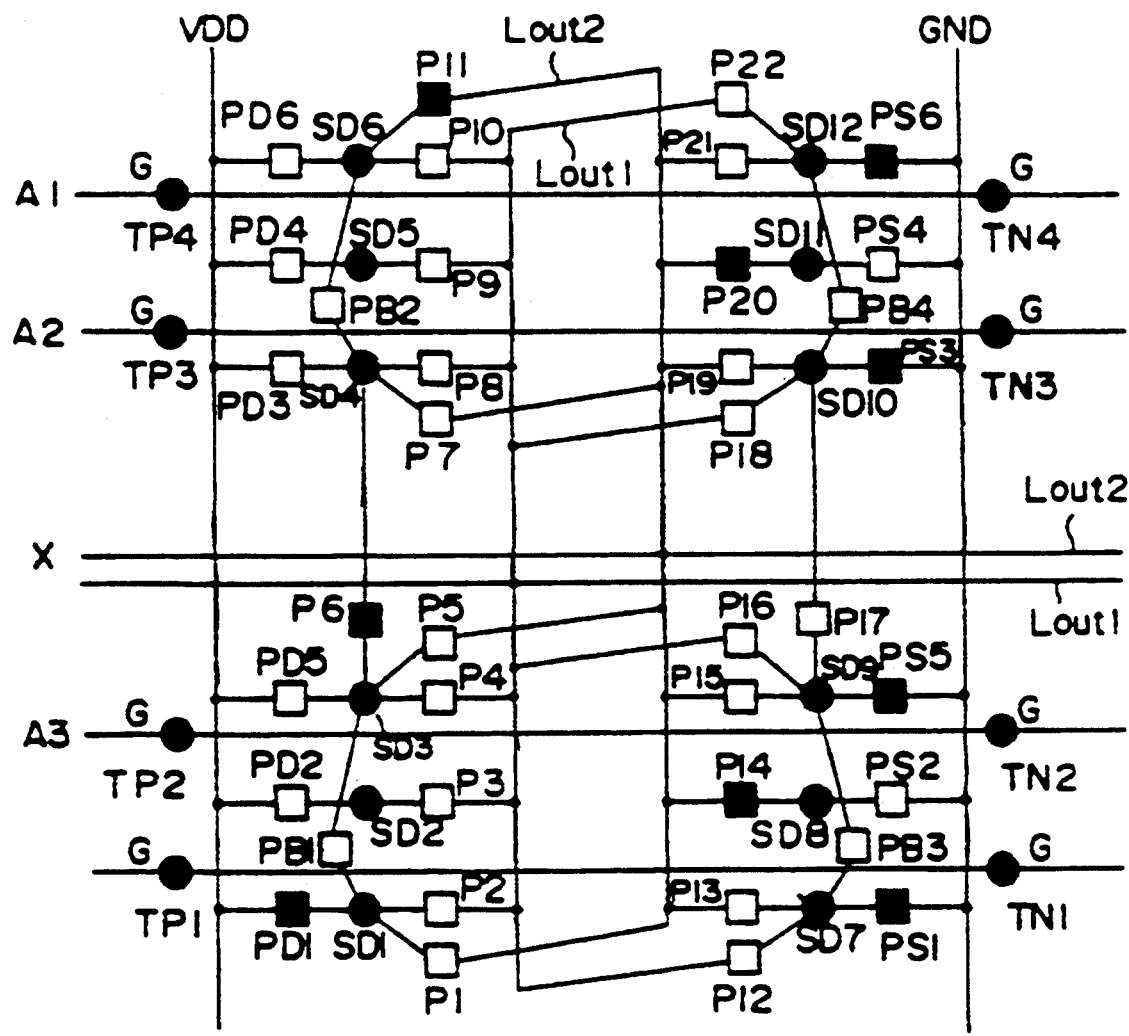

FIG. 120 in parts (a) and (b) shows the structure of a 4-input NOR circuit which is obtained by programming the twelfth basic cell 12 of the nineteenth embodiment. In FIG. 120(a), the fuse elements, anti-fuse elements or, the p-type or n-type field effect transistors which form the first p-type power supply programmable switch PD1, the first, third, fifth and sixth n-type power supply programmable switches PS1, PS3, PS5 and PS6, the sixth, eleventh, fourteenth and twentieth programmable switches P6, P11, P14 and P20 of the twelfth basic cell 12 are programmed.

Figure 120B:
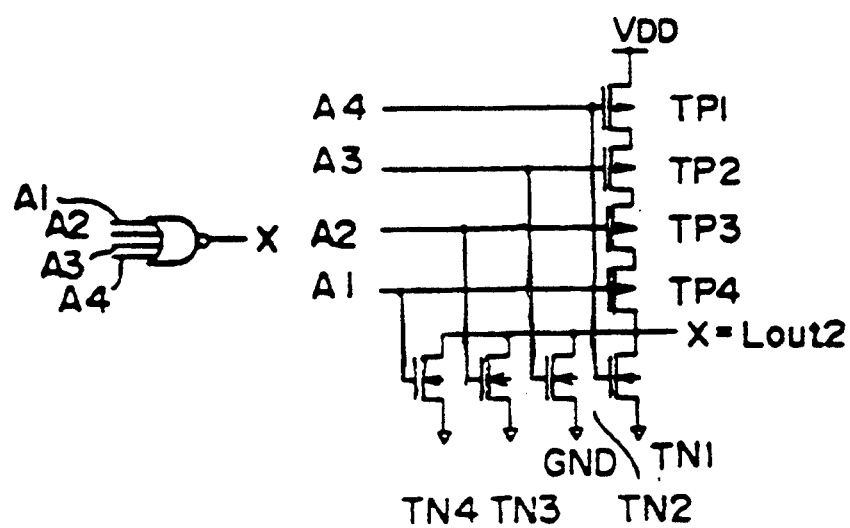

Accordingly, as shown in FIG. 120(b), it is possible to form a 4-input NOR circuit which includes the first through fourth transistors TP1 through TP4 and the fifth through eighth transistors TN1 through TN4 of the twelfth basic cell 12. This 4-input NOR circuit amplifies the logic (obtains a NOR) of input signals A1, A2, A3 and A4 and outputs an output signal X via the second output wiring Lout2.

Figure 121A:
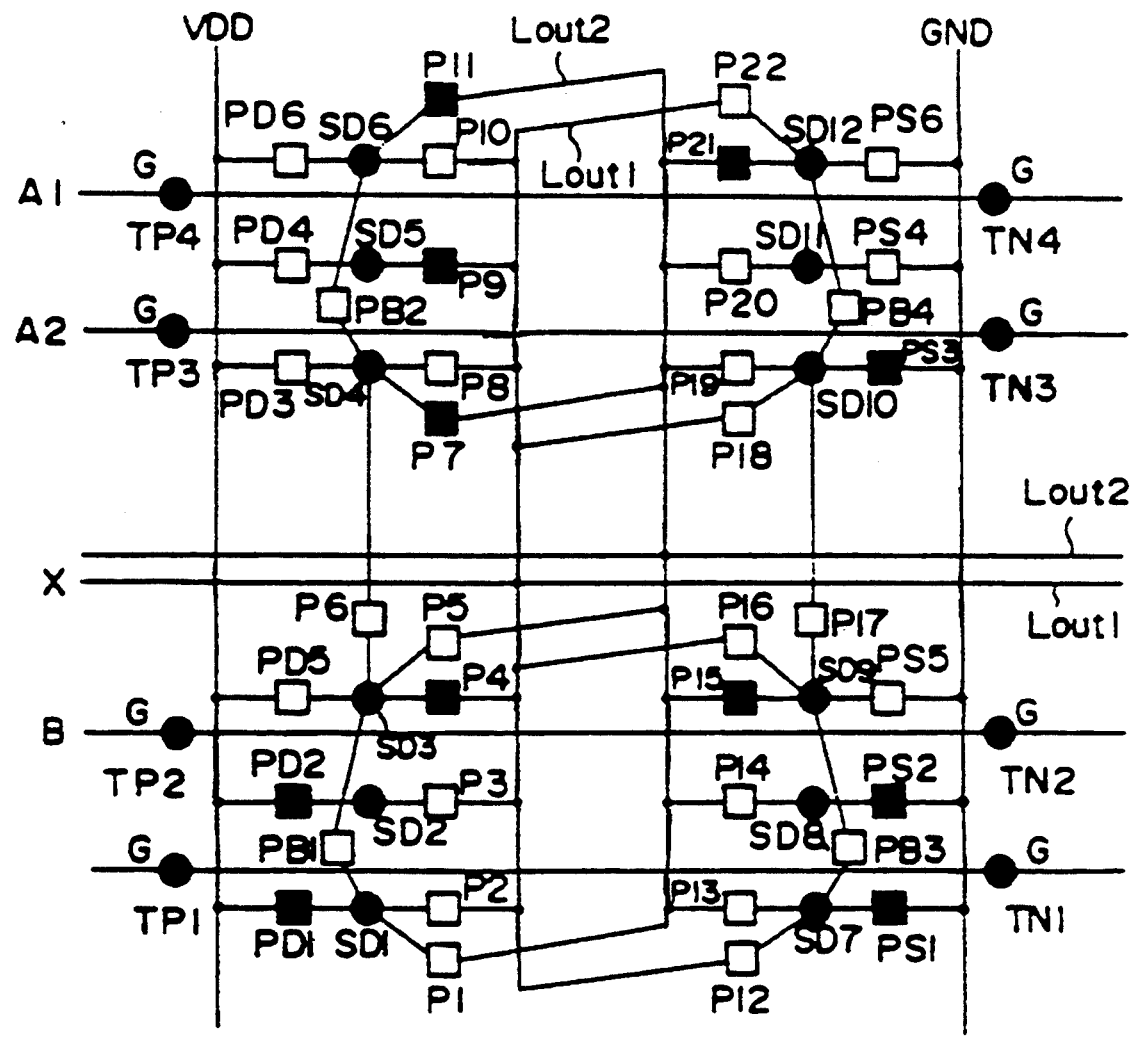

FIG. 121 in parts (a) and (b) shows the structure of a 3-input AND-OR inverter circuit which is obtained by programming the twelfth basic cell 12 of the twentieth embodiment. In FIG. 121(a), the fuse elements, anti-fuse elements or, the p-type or n-type field effect transistors which form the first and second p-type power supply programmable switches PD1 and PD2, the first through third n-type power supply programmable switches PS1 through PS3, and the fourth, seventh, ninth, eleventh, fifteenth and twenty-first programmable switches P4, P7, P9, P11, P15 and P21 of the twelfth basic cell 12 are programmed.

Figure 121B:
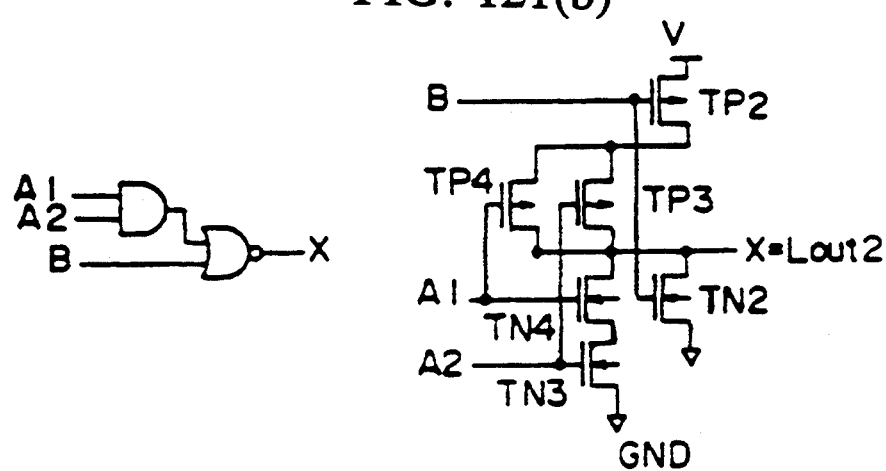

Accordingly, as shown in FIG. 121(b), it is possible to form a 3-input AND-OR inverter circuit which includes the first through fourth transistors TP1 through TP4 and the fifth through eighth transistors TN1 through TN4 of the twelfth basic cell 12. This 3-input AND-OR inverter circuit amplifies the logic (obtains an AND) of input signals A1 and A2, amplifies the logic (obtains an OR inversion) of a resulting signal and an input signal B, and outputs an output signal X via the second output wiring Lout2.

Figure 122A:
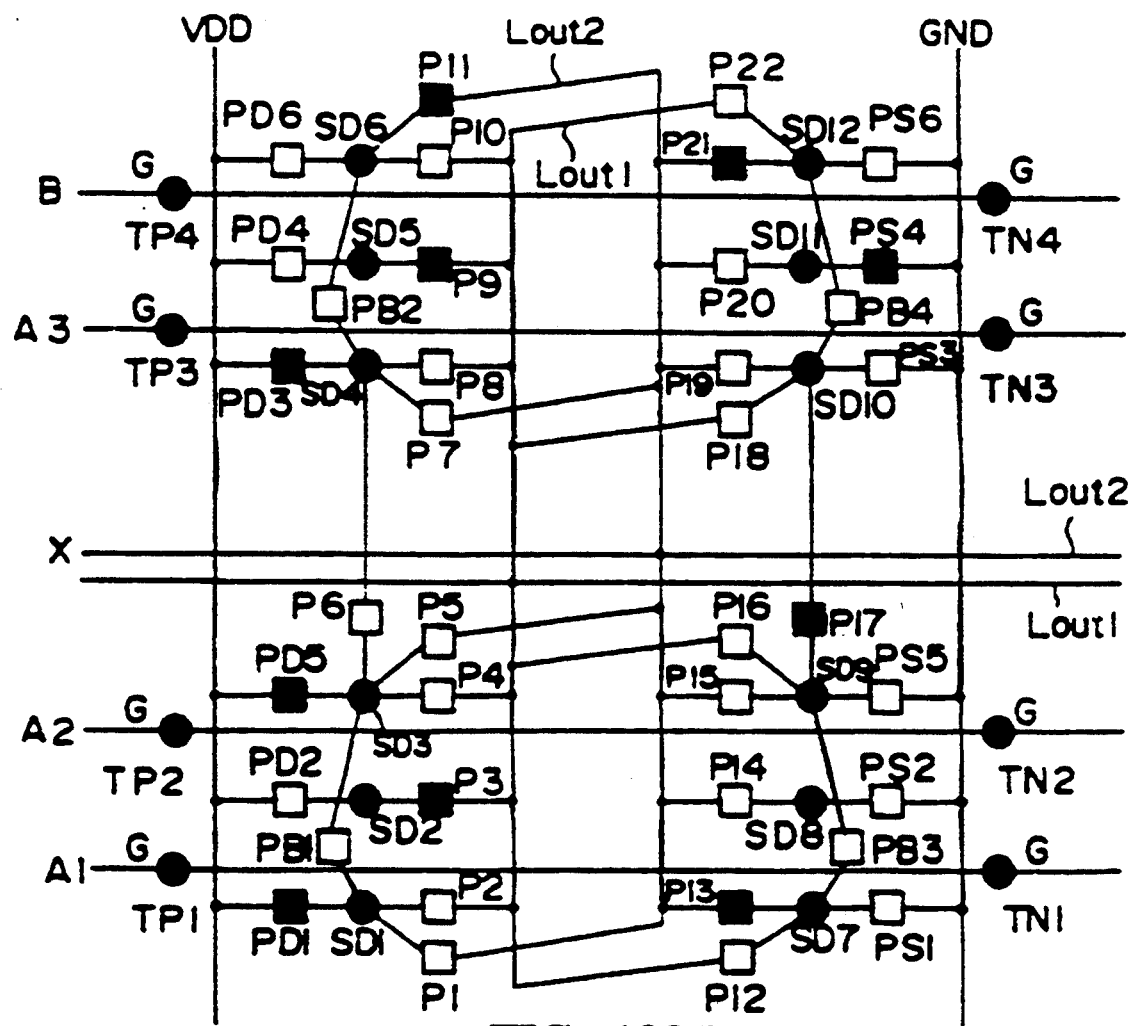

FIG. 122 in parts (a) and (b) shows the structure of a 4-input AND-OR inverter circuit which is obtained by programming the twelfth basic cell 12 of the twentieth embodiment. In FIG. 122(a), the fuse elements, anti-fuse elements or, the p-type or n-type field effect transistors which form the first, third and fifth p-type power supply programmable switches PD1, PD3 and PD5, the fourth n-type power supply programmable switch PS4, and the third, ninth, eleventh, thirteenth, seventeenth and twenty-first programmable switches P3, P9, P11, P13, P17 and P21 of the twelfth basic cell 12 are programmed.

Figure 122B:
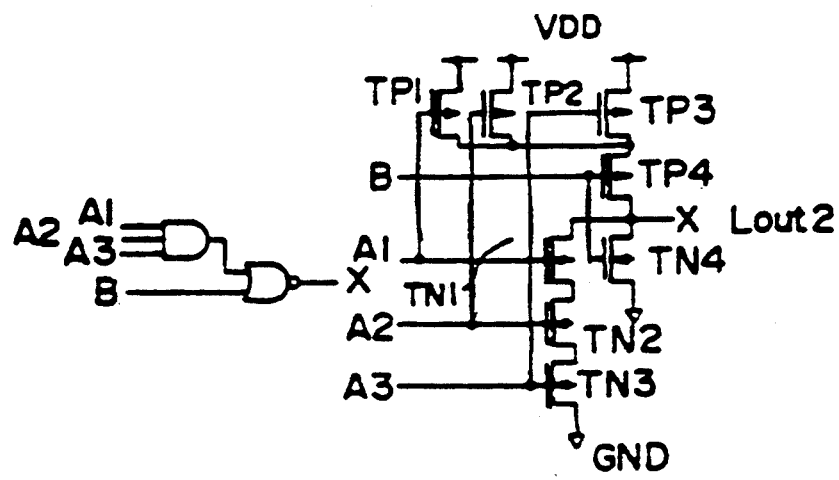

Accordingly, as shown in FIG. 122(b), it is possible to form a 4-input AND-OR inverter circuit which includes the first through fourth transistors TP1 through PT4 and the fifth through eighth transistors TN1 through TN4 of the twelfth basic cell 12. This 4-input AND-OR inverter circuit amplifies the logic (obtains an AND) of input signals A1, A2 and A3, amplifies the logic (obtains an OR inversion) of a resulting signal and an input signal B, and outputs an output signal X via the second output wiring Lout2.

Figure 123A:
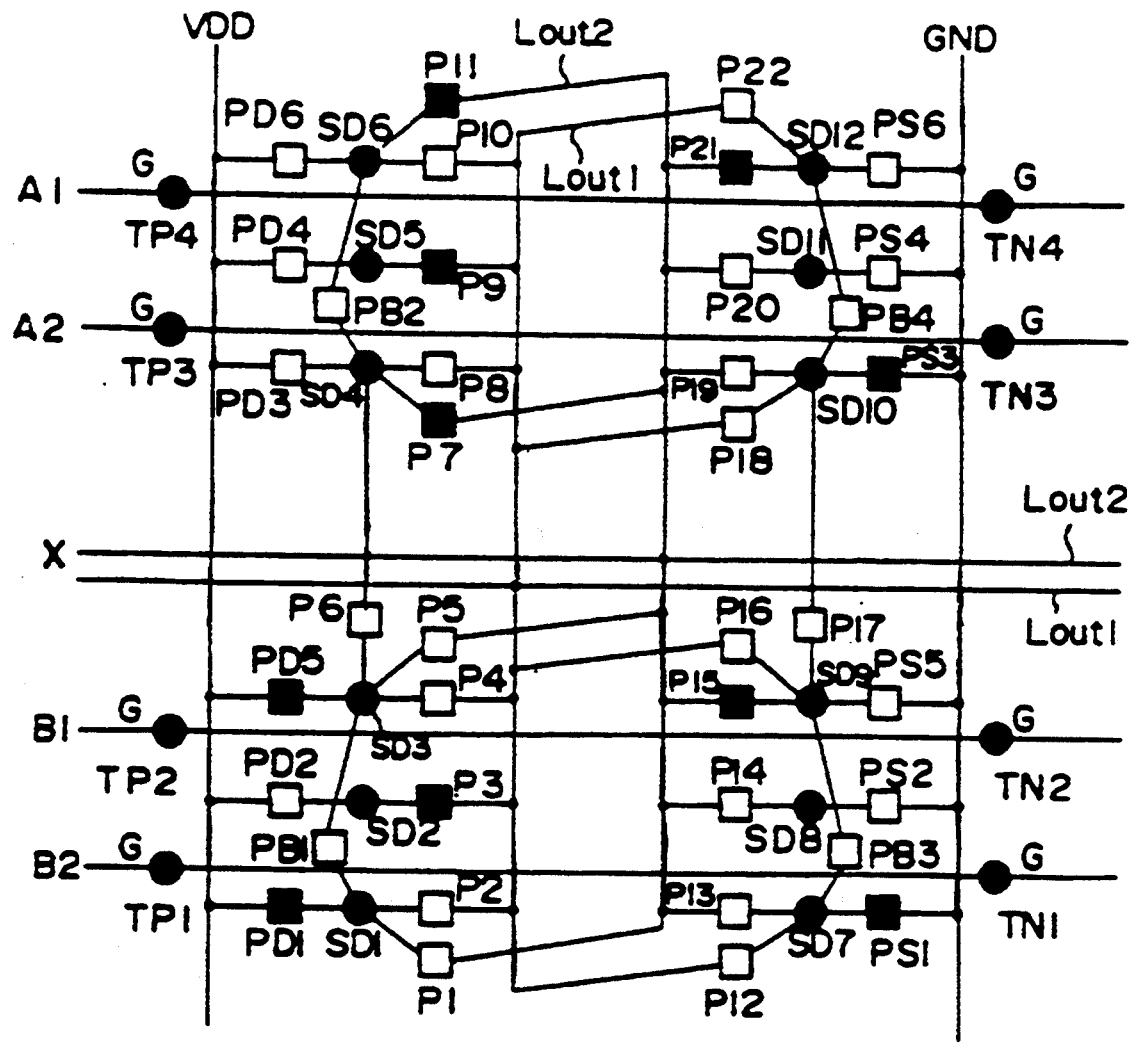

FIG. 123 in parts (a) and (b) shows the structure of a 4-input AND-OR inverter circuit which is obtained by programming the twelfth basic cell 12 of the twentieth embodiment. In FIG. 123(a), the fuse elements, anti-fuse elements or, the p-type or n-type field effect transistors which form the first and fifth p-type power supply programmable switches PD1 and PD5, the first and third n-type power supply programmable switches PS1 and PS3, and the third, seventh, ninth, eleventh, fifteenth and twenty-first programmable switches P3, P7, P9, P11, P15 and P21 of the twelfth basic cell 12 are programmed.

Figure 123B:
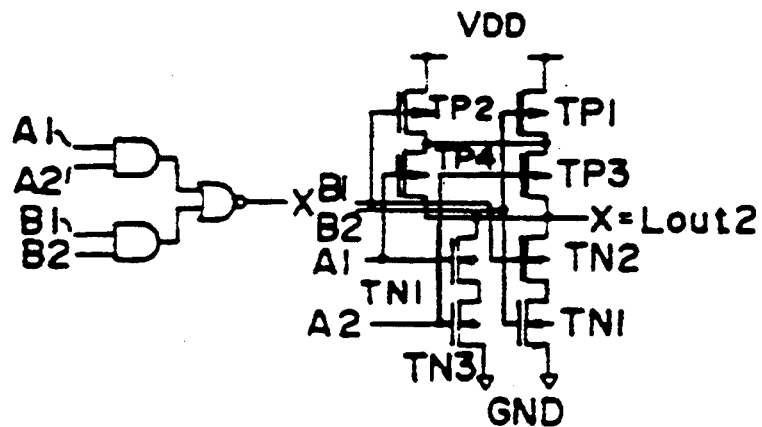

Accordingly, as shown in FIG. 123(b), it is possible to form a 4-input AND-OR inverter circuit which includes the first through fourth transistors TP1 through TP4 and the fifth through eighth transistors TN1 through TN4 of the twelfth basic cell 12. This 4-input AND-OR inverter circuit amplifies the logic (obtains an AND) of input signals A1 and A2, amplifies the logic (obtains an AND) of input signals B1 and B2, amplifies the logic (obtains an OR inversion) of resulting two signals, and outputs an output signal X via the second output wiring Lout2.

Figure 124A:
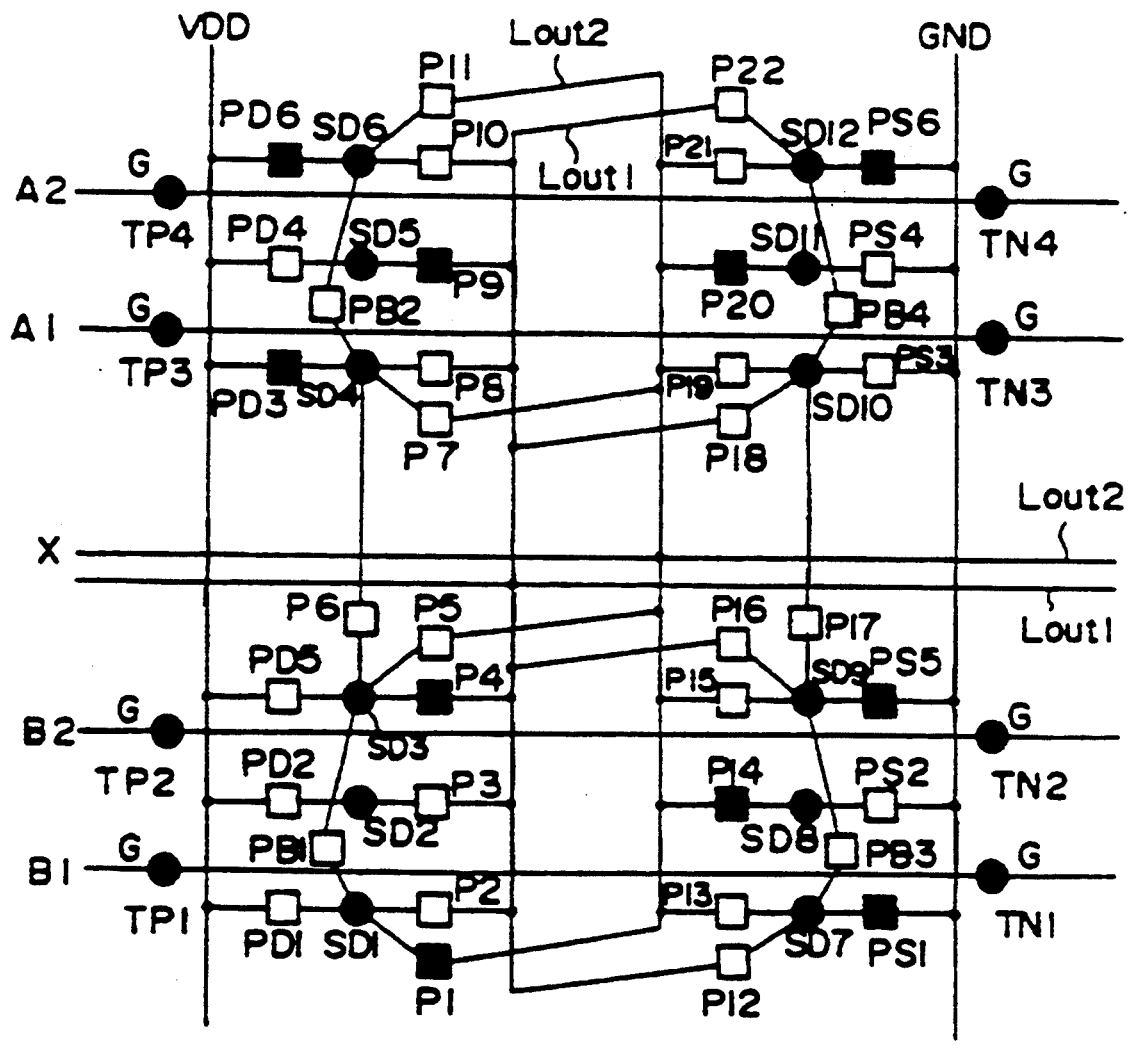

FIG. 124 in parts (a) and (b) shows the structure of a 4-input AND-OR inverter circuit which is obtained by programming the twelfth basic cell 12 of the twentieth embodiment. In FIG. 124(a), the fuse elements, anti-fuse elements or, the p-type or n-type field effect transistors which form the third and sixth p-type power supply programmable switches PD3 and PD6, the first, fifth and sixth n-type power supply programmable switches PS1, PS5 and PS6, and the first, fourth, ninth, fourteenth and twentieth programmable switches P1, P4, P9, P14 and P20 of the twelfth basic cell 12 are programmed.

Figure 124B:
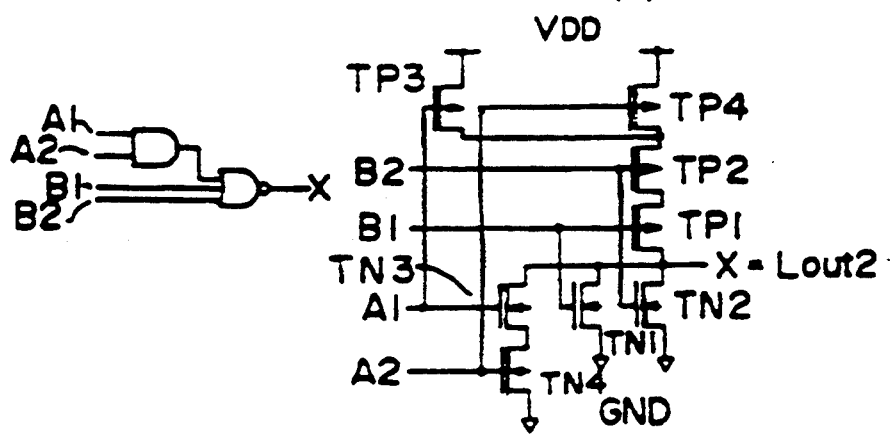

Accordingly, as shown in FIG. 124(b), it is possible to form a 4-input AND-OR inverter circuit which includes the first through fourth transistors TP1 through TP4 and the fifth through eighth transistors TN1 through TN4 of the twelfth basic cell 12. This 4-input AND-OR inverter circuit first amplifies the logic (obtains an AND) of input signals A1 and A2, amplifies the logic (obtains an OR inversion) of a resulting signal and input signals B1 and B2, and outputs an output signal X via the second output wiring Lout2.

Figure 125A:
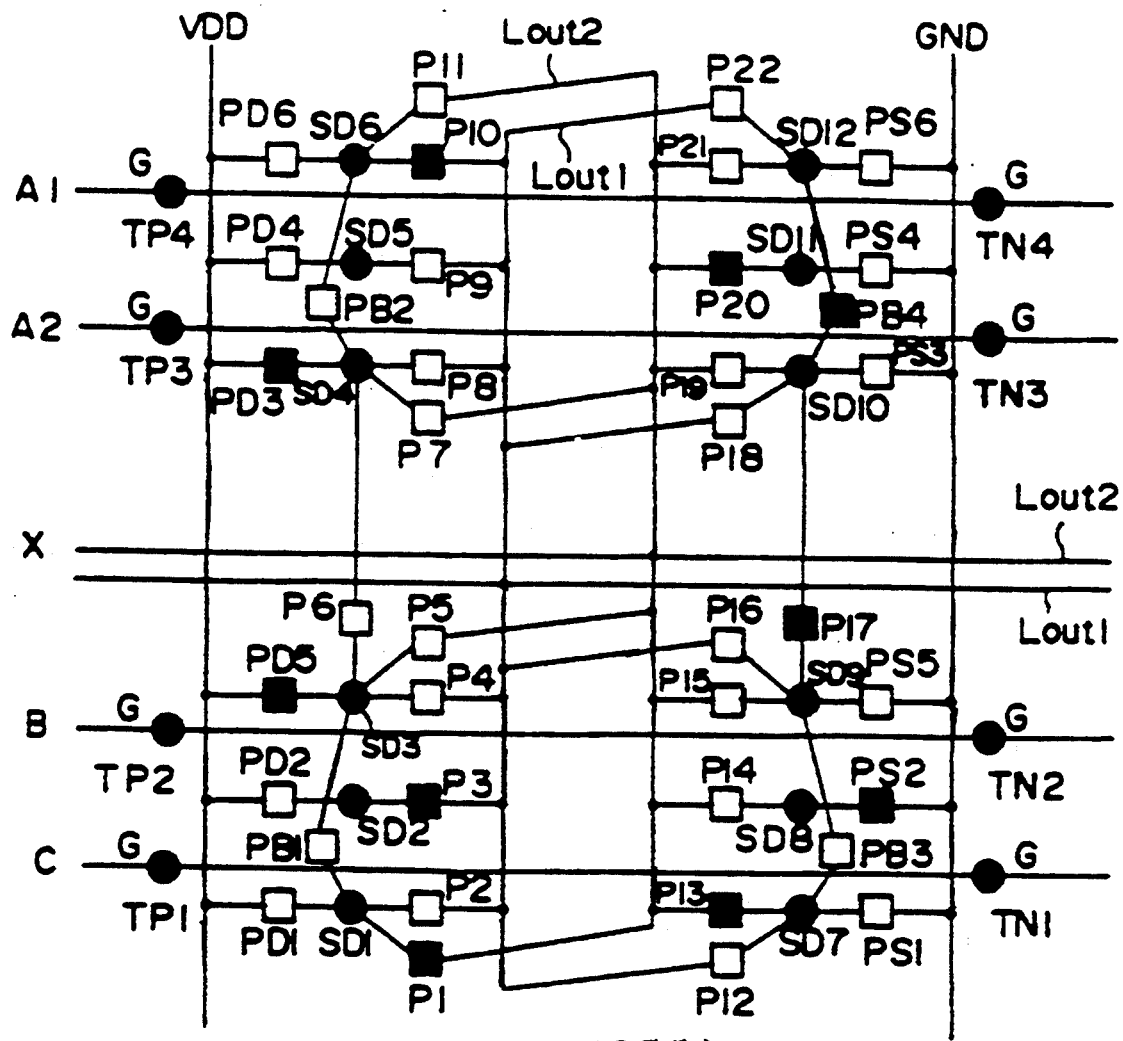

FIG. 125 in parts (a) and (b) shows the structure of a 4-input AND-OR inverter circuit which is obtained by programming the twelfth basic cell 12 of the twentieth embodiment. In FIG. 125(a), the fuse elements, anti-fuse elements or, the p-type or n-type field effect transistors which form the third and fifth p-type power supply programmable switches PD3 and PD5, the second n-type power supply programmable switch PS2, the fourth bypass programmable switch PB4, and the first, third, tenth, thirteenth, seventeenth and twentieth programmable switches P1, P3, P10, P13, P17 and P20 of the twelfth basic cell 12 are programmed.

Figure 125B:
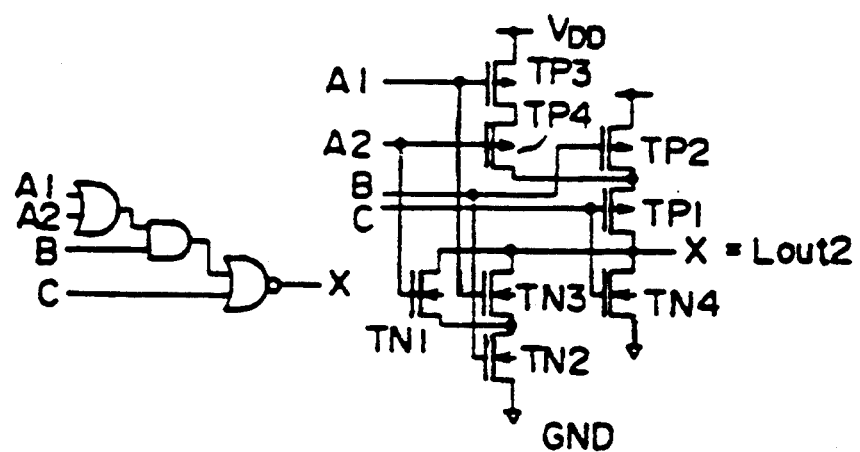

Accordingly, as shown in FIG. 125(b), it is possible to form a 4-input AND-OR inverter circuit which includes the first through fourth transistors TP1 through TP4 and the fifth through eighth transistors TN1 through TN4 of the twelfth basic cell 12. This 4-input AND-OR inverter circuit first amplifies the logic (obtains an OR) of input signals A1 and A2, amplifies the logic (obtains an AND) of a resulting signal and an input signal B, amplifies the logic (obtains an OR inversion) of a resulting signal and an input signal C, and outputs an output signal X via the second output wiring Lout2.

Therefore, by using the basic cell or connecting two or mope basic cells according to any of the ninth through twentieth embodiments, it is possible to realize various kinds of logic circuits. Hence, it is possible to realize a FPGA which can be programmed to form a semiconductor integrated circuit having a high performance and various functions.

The following Table shows the number of programmable switches and the minimum unit used in the basic cells of each of the ninth through twentieth embodiments described above. In the Table, the minimum unit is shown by taking four transistors as a reference unit. Hence, the number "1" under the column "minimum unit" means that there are four transistors in the minimum unit. In addition, the number of program switches is shown in the Table by taking the number of basic cells as a unit. Thus, the number "18" under the column "No. of Switches" means that there are eighteen programmable switches per basic cell.

TABLE

| Embodiment | Minimum Unit | No. of Switches |
| --- | --- | --- |
| 9th | 1 | 18 |
| 10th | 1 | 20 |
| 11th | 1 | 20 |
| 12th | 1 | 22 |
| 13th | 1 | 20 |
| 14th | 1 | 22 |
| 15th | 1 | 22 |
| 16th | 1 | 24 |
| 17th | 2 | 15 |
| 18th | 2 | 17 |
| 19th | 2 | 17 |
| 20th | 2 | 19 |

As may be seen from the Table above, the ninth embodiment can minimize the number of programmable switches to eighteen in the first basic cell 1. Although the 3-input AND-OR inverter circuit, the 4-input AND-OR inverter circuit, the 4-input OR-AND inverter circuit and the 6-input AND-OR inverter circuit cannot be formed by the first basic cell 1, it is still possible to form sixteen kinds of other basic logic cells.

The ninth embodiment uses first and second p-type field effect transistors, third and fourth n-type field effect transistors, and a plurality of programmable switches for connecting these first through fourth field effect transistors and wirings. Hence, the first basic cell 1 which forms the minimum unit is made up of four transistors and a total of eighteen programmable switches. Accordingly, it is possible to form a basic logic cell such as an inverter circuit, a power type inverter circuit, a transmission gate circuit, a 2-input NAND circuit and a 2-input NOR circuit by programming the programmable switches of the first basic cell 1.

On the other hand, although the 4-input AND-OR inverter circuit, the 4-input OR-AND inverter circuit and the 6-input AND-OR inverter circuit cannot be formed by the second basic cell 2 of the tenth embodiment, it is still possible to form eighteen kinds of other basic logic cells.

The tenth embodiment uses a third high potential side programmable switch and a third low potential side programmable switch, in addition to the first through fourth transistors and the programmable switches. Hence, the second basic cell 2 which forms the minimum unit is made up of four transistors and a total of twenty programmable switches. Accordingly, it is possible to form a basic logic cell such as a 4-input AND-OR inverter circuit.

According to the third basic cell 3 of the eleventh embodiment, the elements forming the third basic cell 3 are arranged non-symmetrically with respect to the top and bottom and with respect to the right and left within the third basic cell 3.

The eleventh embodiment uses first and second bypass programmable switches in addition to the first through fourth transistors and the programmable switches. Hence, the third basic cell 3 which forms the minimum unit is made up of four transistors and a total of twenty programmable switches. Although the number of programmable switches increases by two compared to that of the first basic cell 1 of the ninth embodiment, it is possible to efficiently form a basic logic cell such as a 4-input AND-OR inverter circuit and a 6-input AND-OR inverter circuit by connecting two or three third basic cells 3 and using the first and second bypass programmable switches.

On the other hand, according to the fourth basic cell 4 of the twelfth embodiment, the elements forming the fourth basic cell 4 are arranged symmetrically with respect to the top and bottom and with respect to the right and left within the fourth basic cell 4.

The twelfth embodiment uses a third high potential side programmable switch, a third low potential side programmable switch, and first and second bypass programmable switches in addition to the first through fourth transistors and the programmable switches. Hence, the fourth basic cell 4 which forms the minimum unit is made up of four transistors and a total of twenty-two programmable switches. Although the number of programmable switches increases by four compared to that of the first basic cell 1 of the ninth embodiment, it is possible to efficiently form a basic logic cell such as a 4-input AND-OR inverter circuit and a 6-input AND-OR inverter circuit by connecting two or three fourth basic cells 4 and using the third high and low potential side programmable switches and the first and second bypass programmable switches.

According to the fifth through eighth basic cells 5 through 8 of the thirteenth through sixteenth embodiments, the first and second output wirings Lout1 and Lout2 can be used as through wirings.

The thirteenth embodiment uses a fifteenth programmable switch for connecting the high potential side protection wiring and the first output wiring and a sixteenth programmable switch for connecting the low potential side protection wiring and the second output wiring, in addition to the first through fourth transistors and the programmable switches. Hence, the fifth basic cell 5 which forms the minimum unit is made up of four transistors and a total of twenty programmable switches. Although the number of programmable switches increases by two compared to that of the first basic cell 1, it is possible to make the first and second output wirings have the through-wiring function by programming the fifteenth and sixteenth programmable switches. It is thus possible to form a basic logic cell such as an inverter circuit, a power type inverter circuit, a transmission gate circuit, a 2-input NAND circuit and a 2-input NOR circuit.

The fourteenth embodiment uses fifteenth and sixteenth programmable switches and third high and low potential side programmable switches, in addition to the first through fourth transistors and the programmable switches. Hence, the sixth basic cell 6 which forms the minimum unit is made up of four transistors and a total of twenty-two programmable switches. Compared to the first basic cell 1, the number of programmable switches in the sixth basic cell 6 increases by four. However, it is possible to make the first and second output wirings have the through-wiring function, similarly to the fifth basic cell 5, by programming the fifteenth and sixteenth programmable switches.

The fifteenth embodiment uses fifteenth and sixteenth programmable switches and first and second bypass programmable switches, in addition to the first through fourth transistors and the programmable switches. Hence, the seventh basic cell 7 which forms the minimum unit is made up of four transistors and twenty-two programmable switches. Compared to the first basic cell 1, the number of programmable switches required in the seventh basic cell 7 increases by four. However, it is possible to form various kinds of basic logic cells by programming the first and second bypass programmable switches and utilizing the through-wiring function similarly as in the case of the fifth basic cell 5.

The sixteenth embodiment uses fifteenth and sixteenth programmable switches, third high and low potential side programmable switches, and first and second bypass programmable switches, in addition to the first through fourth transistors and the programmable switches. Hence, the eighth basic cell 8 which forms the minimum unit is made up of four transistors and a total of twenty-four programmable switches. In addition, although the number of programmable switches in the eighth basic cell 8 increases by four compared to that of the first basic cell 1, it is possible to form various kinds of basic logic cells by programming the high and low potential side programmable switches and the first and second bypass programmable switches and utilizing the through-wiring function similarly as in the case of the fifth basic cell 5.

In addition, according to the ninth through twelfth basic cells 9 through 12 of the seventeenth through twentieth embodiments, the number of programmable switches can be reduced to fifteen by taking two basic cells as forming one minimum unit.

The seventeenth embodiment uses first trough fourth p-type field effect transistors, fifth through eighth n-type field effect transistors, and a plurality of programmable switches for connecting these first through eighth field effect transistors and wirings. Hence, the ninth basic cell 9 which forms the minimum unit is made up of eight transistors and a total of thirty programmable switches. It is possible to efficiently form a basic logic cell such as a 3-input NAND circuit, a 3-input NOR circuit, a 4-input NAND circuit, a 4-input NOR circuit, a 3-input AND-OR inverter circuit and a 4-input AND-OR inverter circuit from the eight transistors by appropriately programming the thirty programmable switches.

The eighteenth embodiment uses fifth and sixth high and low potential side programmable switches, in addition to the first through eighth transistors and the programmable switches. Hence, the tenth basic cell 10 which forms the minimum unit is made up of eight transistors and a total of thirty-four programmable switches. Compared to the ninth basic cell 9, the number of programmable switches in the tenth basic cell 10 increases by four. However, it is possible to form various kinds of basic logic cells by appropriately programming the thirty-four programmable switches.

The nineteenth embodiment uses first through fourth bypass programmable switches in addition to the first through eighth transistors and the programmable switches. Hence, the eleventh basic cell 11 which forms the minimum unit is made up of eight transistors and a total of thirty-four programmable switches. Compared to the ninth basic cell 9, the number of programmable switches in the eleventh basic cell 11 increases by four. However, it is possible to form various kinds of basic logic cells by appropriately programming the thirty-four programmable switches.

The twentieth embodiment uses fifth and sixth high and low potential side programmable switches and first through fourth bypass programmable switches, in addition to the first through eighth transistors and the programmable switches. Hence, the twelfth basic cell 12 which forms the minimum unit is made up of eight transistors and a total of thirty-eight programmable switches. Compared to the ninth basic cell 9, the number of programmable switches in the twelfth basic cell 12 increases by eight. However, it is possible to form various kinds of basic logic cells by appropriately programming the thirty-eight programmable switches.

On the other hand, various kinds of logic circuits can be formed by connecting two or more basic cells according to the ninth through sixteenth embodiments. By using a combination of the basic cells of the ninth through sixteenth embodiments, it is possible to form a D flip-flop circuit using a smaller number of transistors compared to the conventional case. In addition, it is possible to more easily form the D flip-flop circuit compared to the conventional case where the two kinds of basic cells of the minimum units, that is, the transistor pair tile part and the RAM logic tile part, are used.

Similarly, various kinds of logic circuits can be formed by connecting two or more basic cells according to the seventeenth through twentieth embodiments. By using a combination of the basic cells of the seventeenth through twentieth embodiments, it is possible to easily form a logic circuit such as a multiple-input AND-OR inverter circuit.

Of course, it is possible to connect two or more basic cells which are different. That is, it is possible to form a logic circuit by connecting a first basic cell and a second basic cell, for example.

Further, the present invention is not limited to these embodiments, but various variations and modifications may be made without departing from the scope of the present invention.

What is claimed is:

1. A programmable logic circuit comprising:
   a plurality of logic cells including specific logic cells;
   at least two sub blocks, included in the specific logic cell, respectively having two or more inputs and one or more outputs and having only a predetermined combinational logic function by itself; and
   a switching circuit, included in the specific logic cell, and capable of independently connecting a path between the input and output of each sub block,
   an arbitrary combinational logic function and an arbitrary sequential logic function being realized by programming ON/OFF states of the switching circuit.

2. The programmable logic circuit as claimed in claim 1, which further comprises:
   an input/output path including a plurality of signal lines for inputting a signal to the logic cell and for outputting a signal from the logic cell,
   said switching circuit including a programmable switch which is capable of connecting arbitrary ones of the input and output of each sub block to the input/output path.

3. The programmable logic circuit as claimed in claim 2, wherein the programmable switch of said switching circuit is made up of a fuse element or an anti-fuse element and is fixedly controlled of its ON/OFF state.

4. The programmable logic circuit as claimed in claim 2, wherein the programmable switch of said switching circuit is made up of a switching element which is freely controlled of its ON/OFF state in response to a first control signal.

5. The programmable logic circuit as claimed in claim 4, which further comprises:
   means for generating the first control signal.

6. The programmable logic circuit as claimed in claim 5, wherein said means includes a memory for storing the first control signal.

7. The programmable logic circuit as claimed in claim 5, wherein said means includes a memory for storing control information, and a decoder for generating the first control signal based on the control information stored in the memory.

8. The programmable logic circuit as claimed in claim 7, wherein a relation $M \geq floor(log_2 N)$ always stands, where N denotes a number of programmable switches required to form said switching circuit, M denotes a number of bits of the memory that is required to control the ON/OFF states of all of the programmable switches, and an operation floor(F(x)) is defined as an operation which returns a minimum integer value not less than a value F(x).

9. The programmable logic circuit as claimed in claim 1, wherein the sub block includes a basic logic circuit which in a simplified form is made of at least one kind of circuit selected from a group consisting of an AND-OR circuit, an AND-NOR circuit, an OR-AND circuit, an OR-NAND circuit, a NAND-AND circuit, a NAND-NAND circuit, a NOR-OR circuit and a NOR-NOR circuit.

10. The programmable logic circuit as claimed in claim 9, wherein the sub block further includes an inverter circuit for inverting a logic of at least an arbitrary one of input and output signals of the basic logic circuit in response to a second control signal.

11. The programmable logic circuit as claimed in claim 1, wherein said switching circuit forms a feedback path by connecting a path between the input and output of the sub block depending on the ON/OFF state thereof and forms by one logic cell at least one kind of sequential logic circuit which is selected from a group consisting of a S-R flip-flop circuit, an RS-CK flip-flop circuit, a D flip-flop circuit and a J-K flip-flop circuit.

12. The programmable logic circuit as claimed in claim 1, wherein said switching circuit forms no feedback path by not connecting a path between the input and output of the sub block depending on the ON/OFF state thereof and forms by one logic cell at least one kind of combinational logic circuit which is selected from a group consisting of an AND circuit, a NAND circuit, an OR circuit, a NOR circuit, an exclusive-OR circuit, an exclusive-NOR circuit and a half adder circuit.

13. The programmable logic circuit as claimed in claim 1, which further comprises:
   an inter-cell path including two or more signal lines for mutually connecting the logic cells,
   a plurality of programmable switches being inserted in the signal lines of said inter-cell path and determining a connection between the logic cells by ON/OFF states thereof.

14. The programmable logic circuit as claimed in claim 13, which further comprises:
   input/output pads for inputting signals to and outputting signals from the logic cells; and
   input/output paths capable of connecting said inter-cell path and said input/output pads,
   connections between said input/output pads and said input/output paths being made via programmable switches.

15. The programmable logic circuit as claimed in claim 14, wherein said input/output path includes a loop-shaped signal line inserted with a plurality of programmable switches.

16. The programmable logic circuit as claimed in claim 14, wherein said input/output path includes a first signal line inserted with a plurality of programmable switches, and a second signal line for connecting two predetermined nodes out of nodes respectively located between mutually adjacent programmable switches.

17. The programmable logic circuit as claimed in claim 16, wherein a programmable switch is inserted in the second signal line.

18. The programmable logic circuit as claimed in claim 14, wherein the logic cells are arranged in a matrix arrangement within a cell region of the programmable logic circuit, said inter-cell path extends in vertical and horizontal directions along the matrix arrangement of the logic cells, said input/output pads are provided on an outer side of the logic cells which are located on an outermost peripheral part of the programmable logic circuit, and said input/output paths are located between the input/output pads and the logic cells which are located on the outermost peripheral part of the programmable logic circuit.

19. The programmable logic circuit as claimed in claim 14, wherein:
   said inter-cell path includes first mutual wirings and second mutual wirings which are connected in the shape of teeth of a comb via programmable switches;
   said logic cells are coupled via said inter-cell path and an internal bus; and
   said internal bus includes input signal lines coupled to inputs of the logic cell and to at least one of the first mutual wirings and the second mutual wirings via programmable switches, and an output line fixedly connected to an output of the logic cell and coupled to both the first mutual wiring and the second mutual wiring via programmable switches.

20. The programmable logic circuit as claimed in claim 19, wherein a relation $L \geq T+m$ stands, where L denotes a number of lines of the internal bus, T denotes a number of sum terms or product terms in an OR-AND representation within the logic cell, and m denotes a number of outputs of the logic cell.

21. The programmable logic circuit as claimed in claim 14, wherein:
   said inter-cell path includes first mutual wirings and second mutual wirings which are connected in the shape of teeth of a comb via programmable switches;
   said logic cells has an output coupled to said inter-cell path via a fixed signal line;
   said fixed signal line is coupled to both the first mutual wirings and the second mutual wirings via programmable switches; and
   each input of the logic cell is coupled to at least one of the first mutual wirings and the second mutual wirings via programmable switches.

22. A programmable logic circuit comprising:
   first through fourth transistors; and
   a plurality of programmable switches for coupling the first through fourth transistors and wirings,
   each gate of the first through fourth transistors being coupled to an input wiring,
   source or drain draw-out electrodes of the first through fourth transistors being coupled to arbitrary ones of first and second power supply lines, first and second output wirings, first and second high potential side protection wirings and first and second low potential side protection wirings via corresponding ones of first and second high potential side programmable switches, first and second low potential side programmable switches and first through fourteenth programmable switches.

23. The programmable logic circuit as claimed in claim 22, wherein:
   the source or drain draw-out electrode of the first transistor is coupled to the first power supply line via the first potential side programmable switch, to the second output wiring via the first programmable switch, to the first output wiring via the second programmable switch, and to the first high potential side protection wiring;
   the source or drain draw-out electrode of the first and second transistors is coupled to the first power supply line via the second high potential side programmable switch, and to the first output wiring via the third programmable switch;
   the source or drain draw-out electrode of the second transistor is coupled to the first output wiring via the fourth programmable switch, to the second output wiring via the fifth programmable switch, and to the first high potential side protection wiring via the sixth programmable switch;
   the source or drain draw-out electrode of the third transistor is coupled to the second power supply line via the first low potential side programmable switch, to the first output wiring via the eighth programmable switch, to the second output wiring via the ninth programmable switch, and to the first low potential side protection wiring;
   the source or drain draw-out electrode of the third and fourth transistors is coupled to the second power supply line via the second low potential side programmable switch, and to the second output wiring via the tenth programmable switch;
   the source or drain draw-out electrode of the fourth transistor is coupled to the second output wiring via the eleventh programmable switch, to the first output wiring via the twelfth programmable switch, and to the first low potential side protection wiring via the thirteenth programmable switch; and
   said first output wiring is coupled to the second high potential side protection wiring via the seventh programmable switch, and said second output wiring is coupled to the second low potential side protection wiring via the fourteenth programmable switch.

24. The programmable logic circuit as claimed in claim 22, which further comprises:
   a third high potential side programmable switch coupled between the source or drain draw-out electrode of the second transistor and the first power supply line; and
   a third low potential side programmable switch coupled between the source or drain draw-out electrode of the fourth transistor and the second power supply line.

25. The programmable logic circuit as claimed in claim 22, which further comprises:
   a first bypass programmable switch is coupled between the source or drain draw-out electrodes of the first and second transistors; and
   a second bypass programmable switch is coupled between the source or drain draw-out electrodes of the third and fourth transistors.

26. The programmable logic circuit as claimed in claim 22, which further comprises:
   a third high potential side programmable switch coupled between the source or drain draw-out electrode of the second transistor and the first power supply line;
   a third low potential side programmable switch coupled between the source or drain draw-out electrode of the fourth transistor and the second power supply line;

a first bypass programmable switch coupled between the source or drain draw-out electrodes of the first and second transistors; and a second bypass programmable switch coupled between the source or drain draw-out electrodes of the third and fourth transistors.

27. The programmable logic circuit as claimed in claim 22, wherein said first and second transistors are made up of p-type field effect transistors, and said third and fourth transistors are made up of n-type field effect transistors.

28. The programmable logic circuit as claimed in claim 22, wherein said programmable switches are made up of elements selected from a group consisting of fuse elements, anti-fuse elements, p-type field effect transistors and n-type field effect transistors.

29. A programmable logic circuit comprising:
first through fourth transistors; and
a plurality of programmable switches for coupling the first through fourth transistors and wirings,
each gate of the first through fourth transistors being coupled to an input wiring,
source or drain draw-out electrodes of the first through fourth transistors being coupled to arbitrary ones of first and second power supply lines, first and second output wirings, first and second high potential side protection wirings and first and second low potential side protection wirings via corresponding ones of first and second high potential side programmable switches, first and second low potential side programmable switches and first through sixteenth programmable switches.

30. The programmable logic circuit as claimed in claim 29, wherein:
the source or drain draw-out electrode of the first transistor is coupled to the first power supply line via the first potential side programmable switch, to the second high potential side protection wiring via the first programmable switch, to the second high protection side protection wiring via the second programmable switch, and to the first high potential side protection wiring;

the source or drain draw-out electrode of the first and second transistors is coupled to the first power supply line via the second high potential side programmable switch, and to the second high potential side protection wiring via the third programmable switch;

the source or drain draw-out electrode of the second transistor is coupled to the second high potential side protection wiring via the fourth programmable switch, to the second low potential side protection wiring via the fifth programmable switch, and to the first high potential side protection wiring via the sixth programmable switch;

the source or drain draw-out electrode of the third transistor is coupled to the second power supply line via the first low potential side programmable switch, to the second high potential side protection wiring via the eighth programmable switch, to the second low potential side protection wiring via the ninth programmable switch, and to the first low potential side protection wiring;

the source or drain draw-out electrode of the third and fourth transistors is coupled to the second power supply line via the second low potential side programmable switch, and to the second high potential side protection wiring via the tenth programmable switch;

the source or drain draw-out electrode of the fourth transistor is coupled to the second low potential side protection wiring via the eleventh programmable switch, to the second high potential side protection wiring via the twelfth programmable switch, and to the first low potential side protection wiring via the thirteenth programmable switch;

said second high potential side protection wiring is coupled to the seventh programmable switch, and said second low potential side protection wiring is coupled to the fourteenth programmable switch; and said second high potential side protection wiring is coupled to the first output wiring via the fifteenth programmable switch, and said second low potential side protection wiring is coupled to the second output wiring via the sixteenth programmable switch.

31. The programmable logic circuit as claimed in claim 29, which further comprises:
a third high potential side programmable switch coupled between the source or drain draw-out electrode of the second transistor and the first power supply line; and
a third low potential side programmable switch coupled between the source or drain draw-out electrode of the fourth transistor and the second power supply line.

32. The programmable logic circuit as claimed in claim 29, which further comprises:
a first bypass programmable switch is coupled between the source or drain draw-out electrodes of the first and second transistors; and
a second bypass programmable switch is coupled between the source or drain draw-out electrodes of the third and fourth transistors.

33. The programmable logic circuit as claimed in claim 29, which further comprises:
a third high potential side programmable switch coupled between the source or drain draw-out electrode of the second transistor and the first power supply line;
a third low potential side programmable switch coupled between the source or drain draw-out electrode of the fourth transistor and the second power supply line;
a first bypass programmable switch coupled between the source or drain draw-out electrodes of the first and second transistors; and
a second bypass programmable switch coupled between the source or drain draw-out electrodes of the third and fourth transistors.

34. The programmable logic circuit as claimed in claim 29, wherein said first and second transistors are made up of p-type field effect transistors, and said third and fourth transistors are made up of n-type field effect transistors.

35. The programmable logic circuit as claimed in claim 29, wherein said programmable switches are made up of elements selected from a group consisting of fuse elements, anti-fuse elements, p-type field effect transistors and n-type field effect transistors.

36. A programmable logic circuit comprising:
first through eighth transistors; and a plurality of programmable switches for coupling the first through eighth transistors and wirings, each gate of the first through eighth transistors being coupled to an input wiring, source or drain draw-out electrodes of the first through eighth transistors being coupled to arbitrary ones of first and second power supply lines and first and second output wirings via corresponding ones of first through fourth high potential side programmable switches, first through fourth low potential side programmable switches and first through twenty-second programmable switches.

37. The programmable logic circuit as claimed in claim 36, wherein:

the source or drain draw-out electrode of the first transistor is coupled to the first power supply line via the first high potential side programmable switch, to the second output wiring via the first programmable switch, and to the first output wiring via the second programmable switch;

the source or drain draw-out electrode of the first and second transistors is coupled to the first power supply line via the second high potential side programmable switch, and to the first output wiring via the third programmable switch;

the source or drain draw-out electrode of the second transistor is coupled to the first output wiring via the fourth programmable switch, to the second output wiring via the fifth programmable switch, and to the source or drain draw-out electrode of the third transistor via the sixth programmable switch;

the source or drain draw-out electrode of the third transistor is coupled to the first output wiring via the third high potential side programmable switch, to the second output wiring via the seventh programmable switch, and to the first output wiring via the eighth programmable switch;

the source or drain draw-out electrode of the third and fourth transistors is coupled to the first power supply line via the fourth high potential side programmable switch, and to the first output wiring via the ninth programmable switch;

the source or drain draw-out electrode of the fourth transistor is coupled to the first output wiring via the tenth programmable switch, and to the second output wiring via the eleventh programmable switch;

the source or drain draw-out electrode of the fifth transistor is coupled to the second power supply line via the first low potential side programmable switch, to the first output wiring via the twelfth programmable switch, and to the second output wiring via the thirteenth programmable switch;

the source or drain draw-out electrode of the fifth and sixth transistors is coupled to the second power supply line via the second low potential side programmable switch, and to the second output wiring via the fourteenth programmable switch;

the source or drain draw-out electrode of the sixth transistor is coupled to the second output wiring via the fifteenth programmable switch, to the first output wiring via the sixteenth programmable switch, and to the source or drain draw-out electrode of the seventh transistor via the seventeenth programmable switch;

the source or drain draw-out electrode of the seventh transistor is coupled to the second power supply line via the third low potential side programmable switch, to the first output wiring via the eighteenth programmable switch, and to the second output wiring via the nineteenth programmable switch;

the source or drain draw-out electrode of the seventh and eighth transistors is coupled to the second power supply line via the fourth low potential side programmable switch, and to the second output wiring via the twentieth programmable switch; and the source or drain draw-out electrode of the eighth transistor is coupled to the second output wiring via the twenty-first programmable switch, and to the first output wiring via the twenty-second programmable switch.

38. The programmable logic circuit as claimed in claim 36, which further comprises:

a fifth high potential side programmable switch coupled between the source or drain draw-out electrode of the second transistor and the first power supply line;

a sixth high potential side programmable switch coupled between the source or drain draw-out electrode of the fourth transistor and the first power supply line;

a fifth low potential side programmable switch coupled between the source or drain draw-out electrode of the sixth transistor and the second power supply line; and a sixth low potential side programmable switch coupled between the source or drain draw-out electrode of the eighth transistor and the second power supply line.

39. The programmable logic circuit as claimed in claim 36, which further comprises:

a first bypass programmable switch coupled between the source or drain draw-out electrodes of the first and second transistors;

a second bypass programmable switch coupled between the source or drain draw-out electrodes of the third and fourth transistors;

a third bypass programmable switch coupled between the source or drain draw-out electrodes of the fifth and sixth transistors; and a fourth bypass programmable switch coupled between the source or drain draw-out electrodes of the seventh and eighth transistors.

40. The programmable logic circuit as claimed in claim 36, which further comprises:

a fifth high potential side programmable switch coupled between the source or drain draw-out electrode of the second transistor and the first power supply line;

a sixth high potential side programmable switch coupled between the source or drain draw-out electrode of the fourth transistor and the first power supply line;

a fifth low potential side programmable switch coupled between the source or drain draw-out electrode of the sixth transistor and the second power supply line;

a sixth low potential side programmable switch coupled between the source or drain draw-out electrode of the eighth transistor and the second power supply line;

a first bypass programmable switch coupled between the source or drain draw-out electrodes of the first and second transistors;

a second bypass programmable switch coupled between the source or drain draw-out electrodes of the third and fourth transistors;

a third bypass programmable switch coupled between the source or drain draw-out electrodes of the fifth and sixth transistors; and a fourth bypass programmable switch coupled between the source or drain draw-out electrodes of the seventh and eighth transistors.

41. The programmable logic circuit as claimed in claim 36, wherein said first through fourth transistors are made up of p-type field effect transistors, and said fifth through eighth transistors are made up of n-type field effect transistors.

42. The programmable logic circuit as claimed in claim 36, wherein the programmable switches are made up of elements selected from a group consisting of fuse elements, anti-fuse elements, p-type field effect transistors and n-type field effect transistors.

43. The programmable logic circuit as claimed in claim 22, wherein a basic cell is formed by the first through fourth transistors and the programmable switches, and a logic circuit is formed by connecting two or more basic cells.

44. The programmable logic circuit as claimed in claim 29, wherein a basic cell is formed by the first through fourth transistors and the programmable switches, and a logic circuit is formed by connecting two or more basic cells.

45. The programmable logic circuit as claimed in claim 36, wherein a basic cell is formed by the first through fourth transistors and the programmable switches, and a logic circuit is formed by connecting two or more basic cells.

* * * * *

UNITED STATES PATENT AND TRADEMARK OFFICE
CERTIFICATE OF CORRECTION

PATENT NO. : 5,442,246
DATED : August 15, 1995
INVENTOR(S) : Azegami et al.

It is certified that error appears in the above-indentified patent and that said Letters Patent is hereby corrected as shown below:

Col. 11, line 38, change "C7 C5 C1 C3 C7" to --C7→C5→C1→C3→C7--;
    line 39, change "C7 C6 C2 C4 C7" to --C7→C6→C2→C4→C7--, after "3" insert --,--.
Col. 12, line 59, change "8" to --6--.
Col. 15, line 44, change "28" to --26--;
    line 55, change "C8" to --C6--.
Col. 18, line 32, change "shoes" to --shows--.
Col. 19, line 11, change "C7 C5 C11 C12 C7" to --C7→C5→C11→C12→C7--;
    line 12, change "C7 C6 C21 C22 C7" to --C7→C6→C21→C22→C7--.
Col. 24, line 14, change "$\geq$" to --$\geq$--.
Col. 27, line 44, change "i" to --1--;
    line 47, change "i" to --1--.
Col. 28, line 23 change "$\geq$" to --$\geq$--;
    line 32, change "$\geq$" to --$\geq$--;
    line 57, change "PS'" to --P8'--;
    line 68, "SWS" to --SW8--.
Col. 31, line 51, change "PS" to --P8--.
Col. 35, line 51, change "P18" to --P16--;
    line 53, change "P18" to --P16--;
    line 59, change "P18" to --P15 and P16--.
Col. 36, line 10, change "8" to --6--.
Col. 45, line 13, change "108" to --106--.

UNITED STATES PATENT AND TRADEMARK OFFICE
CERTIFICATE OF CORRECTION

PATENT NO. : 5,442,246
DATED : August 15, 1995
INVENTOR(S) : Azegami et al.

It is certified that error appears in the above-indentified patent and that said Letters Patent is hereby corrected as shown below:

Col. 49, line 15, change "PS" to --P8--.
Col. 54, line 2, "The" begins a new paragraph.
Col. 55, line 9, change "rS3" to --PS3--;

Col. 56, line 15, change "PS, PS" to --P5, P8--.
Col. 59, line 65, change "410" to --4---.
Col. 64, line 10, change "PS1" (second occurrence) to --PS2--.
Col. 65, line 40, change "8" to --6--;
     line 41, change "8" to --6--.
Col. 66, line 49, change "P18" to --P16--.
Col. 67, line 16, before "through" insert --PS1--.
Col. 69, line 26, change "PS" TO --P8--.
Col. 71, lines 66 and 67 should be l line.
Col. 72, line 7, change "2" to --3--;
     line 29, change "PS" to --P8--.
Col. 73, line 1, change "PS" to --P8--.
Col. 74, line 38, change "PS" to --P8--.

UNITED STATES PATENT AND TRADEMARK OFFICE
CERTIFICATE OF CORRECTION

PATENT NO. : 5,442,246
DATED : August 15, 1995
INVENTOR(S) : Azegami et al.

It is certified that error appears in the above-indentified patent and that said Letters Patent is hereby corrected as shown below:

Col. 83, line 25, change "cell" to --cells--;
 line 28, after "in" insert --each of--, and change "cell" to --cells--.
 line 38, after "the" insert --specific--, and change "cell" to --cells--;
 line 39, after "the" insert --specific--, and change "cell" to --cells--;
 line 65, change "≥" to --≥--.
Col. 85, line 27, change "≥" to --≥--.

Signed and Sealed this

Sixteenth Day of January, 1996

Attest:

BRUCE LEHMAN

*Attesting Officer*   *Commissioner of Patents and Trademarks*

UNITED STATES PATENT AND TRADEMARK OFFICE
CERTIFICATE OF CORRECTION

PATENT NO. : 5,442,246  
DATED : August 15, 1995  
INVENTOR(S) : Azegami et al.

Page 1 of 3

It is certified that error appears in the above-indentified patent and that said Letters Patent is hereby corrected as shown below:

Col. 11, line 38, change "C7 C5 C1 C3 C7" to --C7→C5→C1→C3→C7--;
    line 39, change "C7 C6 C2 C4 C7" to --C7→C6→C2→C4→C7--, after "3" insert --,--.
Col. 12, line 59, change "8" to --6--.
Col. 15, line 44, change "28" to --26--;
    line 55, change "C8" to --C6--.
Col. 18, line 32, change "shoes" to --shows--.
Col. 19, line 11, change "C7 C5 C11 C12 C7" to --C7→C5→C11→C12→C7--;
    line 12, change "C7 C6 C21 C22 C7" to --C7→C6→C21→C22→C7--.
Col. 24, line 14, change "$\geqq$" to --$\geq$--.
Col. 27, line 44, change "i" to --1--;
    line 47, change "i" to --1--.
Col. 28, line 23 change "$\geqq$" to --$\geq$--;
    line 32, change "$\geqq$" to --$\geq$--;
    line 57, change "PS'" to --P8'--;
    line 68, "SWS" to --SW8--.
Col. 31, line 51, change "PS" to --P8--.
Col. 35, line 51, change "P18" to --P16--;
    line 53, change "P18" to --P16--;
    line 59, change "P18" to --P15 and P16--.
Col. 36, line 10, change "8" to --6--.
Col. 45, line 3, change "108" to --106--.

UNITED STATES PATENT AND TRADEMARK OFFICE
CERTIFICATE OF CORRECTION

PATENT NO. : 5,442,246

DATED : August 15, 1995

INVENTOR(S) : Azegami et al.

It is certified that error appears in the above-indentified patent and that said Letters Patent is hereby corrected as shown below:

Col. 49, line 15, change "PS" to --P8--.
Col. 54, line 2, "The" begins a new paragraph.
Col. 55, line 9, change "rS3" to --PS3--;

Col. 56, line 15, change "PS, PS" to --P5, P8--.
Col. 59, line 65, change "410" to --4--.
Col. 64, line 10, change "PS1" (second occurrence) to --PS2--.
Col. 65, line 40, change "8" to --6--;
     line 41, change "8" to --6--.
Col. 66, line 49, change "P18" to --P16--.
Col. 67, line 16, before "through" insert --PS1--.
Col. 69, line 26, change "PS" TO --P8--.
Col. 71, lines 66 and 67 should be 1 line.
Col. 72, line 7, change "2" to --3--;
     line 29, change "PS" to --P8--.
Col. 73, line 1, change "PS" to --P8--.
Col. 74, line 38, change "PS" to --P8--.

UNITED STATES PATENT AND TRADEMARK OFFICE
CERTIFICATE OF CORRECTION

PATENT NO. : 5,442,246
DATED : August 15, 1995
INVENTOR(S) : Azegami et al.

It is certified that error appears in the above-indentified patent and that said Letters Patent is hereby corrected as shown below:

Col. 83, line 25, change "cell" to --cells--;
    line 28, after "in" insert --each of--, and change "cell" to --cells--.
    line 38, after "the" insert --specific--, and change "cell" to --cells--;
    line 39, after "the" insert --specific--, and change "cell" to --cells--;
    line 65, change "$\geq$" to --$\geq$--.
Col. 85, line 27, change "$\geq$" to --$\geq$--.

This certificate supersedes Certificate of Correction issued January 16, 1996.

Signed and Sealed this

Twenty-fifth Day of June, 1996

Attest:

BRUCE LEHMAN

*Attesting Officer*       *Commissioner of Patents and Trademarks*